(12) United States Patent
Fukasawa et al.

(10) Patent No.: US 6,881,611 B1
(45) Date of Patent: Apr. 19, 2005

(54) METHOD AND MOLD FOR MANUFACTURING SEMICONDUCTOR DEVICE, SEMICONDUCTOR DEVICE AND METHOD FOR MOUNTING THE DEVICE

(75) Inventors: Norio Fukasawa, Kawasaki (JP);
Toshimi Kawahara, Kawasaki (JP);
Muneharu Morioka, Kawasaki (JP);
Mitsunada Osawa, Ushiku (JP);
Yasuhiro Shinma, Kawasaki (JP);
Hirohisa Matsuki, Kawasaki (JP);
Masanori Onodera, Kawasaki (JP);
Junichi Kasai, Kawasaki (JP);
Shigeyuki Maruyama, Kawasaki (JP);
Masao Sakuma, Kawasaki (JP);
Yoshimi Suzuki, Kawasaki (JP);
Masashi Takenaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 328 days.

(21) Appl. No.: 09/635,124

(22) Filed: Aug. 8, 2000

Related U.S. Application Data

(62) Division of application No. 09/029,608, filed as application No. PCT/JP97/02405 on Jul. 10, 1997.

(30) Foreign Application Priority Data

| Jul. 12, 1996 | (JP) | ............................................. 8-183844 |
| Oct. 18, 1996 | (JP) | ............................................. 8-276634 |
| Jan. 23, 1997 | (JP) | ............................................. 9-010683 |
| Jul.  7, 1997 | (JP) | ............................................. 9-181132 |

(51) Int. Cl.[7] .......................... H01L 21/44; H01L 21/48; H01L 21/50; H01L 21/301
(52) U.S. Cl. ........................ 438/114; 438/126; 438/127; 438/462; 438/465; 264/272.17
(58) Field of Search ..................... 264/272.17; 438/114, 438/126, 127, 462, 465, FOR 387

(56) References Cited

U.S. PATENT DOCUMENTS

| 3,024,323 A | * | 3/1962 | See .............................. 381/400 |
| 3,512,051 A | | 5/1970 | Noll |
| 3,608,186 A | | 9/1971 | Hutson |
| 3,693,244 A | | 9/1972 | Behn et al. |

(Continued)

FOREIGN PATENT DOCUMENTS

| EP | 0 295 914 | 12/1988 |
| EP | 0 427 151 | 11/1989 |
| EP | 0 372 880 | 6/1990 |
| EP | 0 385 787 | 9/1990 |

(Continued)

OTHER PUBLICATIONS

Full Translation of Japanese Patent Application 08–064725A.
Translation of JP8–64725.
Translation of JP7–45649.

*Primary Examiner*—David E. Graybill
(74) *Attorney, Agent, or Firm*—Westerman, Hattori, Daniels & Adrian, LLP

(57) ABSTRACT

A method includes a resin sealing step of placing, in a cavity 28 of a mold 20, a substrate 16 to which semiconductor elements 11 on which bumps 12 are arranged, a resin sealing step of supplying resin 35 to positions of the bumps 12 so that a resin layer 13 sealing the bumps 12 is formed, a protruding electrode exposing step of exposing at least ends of the bumps 12 sealed by the resin layer 13 so that ends of the bumps 12 are exposed from the resin layer 13, and a separating step of cutting the substrate 16 together with the resin layer 13 so that the semiconductor elements 11 are separated from each other.

24 Claims, 131 Drawing Sheets

U.S. PATENT DOCUMENTS

| | | | |
|---|---|---|---|
| 3,706,129 A | | 12/1972 | McCann |
| 3,771,219 A | * | 11/1973 | Tuzi et al. .................. 257/735 |
| 3,924,323 A | | 12/1975 | Trevail et al. |
| 3,959,874 A | | 6/1976 | Coucoulas |
| 3,978,578 A | * | 9/1976 | Murphy ..................... 427/240 |
| 4,027,383 A | * | 6/1977 | Herndon et al. ............. 29/827 |
| 4,070,689 A | | 1/1978 | Coleman et al. |
| 4,172,907 A | | 10/1979 | Mones et al. |
| 4,259,682 A | | 3/1981 | Gamo |
| 4,530,152 A | * | 7/1985 | Roche et al. ................ 29/856 |
| 4,741,787 A | | 5/1988 | Shimizu et al. |
| 4,813,129 A | | 3/1989 | Karnezos |
| 4,833,568 A | * | 5/1989 | Berhold ...................... 361/690 |
| 4,887,149 A | * | 12/1989 | Romano' .................... 257/718 |
| 4,956,132 A | | 9/1990 | Kitaura et al. |
| 4,980,555 A | | 12/1990 | Hartley et al. |
| 5,019,673 A | | 5/1991 | Juskey et al. |
| 5,053,357 A | | 10/1991 | Lin et al. |
| 5,128,746 A | | 7/1992 | Pennisi et al. |
| 5,136,365 A | * | 8/1992 | Pennisi et al. ............... 148/24 |
| 5,138,438 A | | 8/1992 | Masayuki et al. |
| 5,139,969 A | * | 8/1992 | Mori .......................... 438/123 |
| 5,143,865 A | | 9/1992 | Hideshima et al. |
| 5,157,480 A | | 10/1992 | McShane et al. |
| 5,219,796 A | * | 6/1993 | Quinn et al. ......... 148/DIG. 28 |
| 5,229,916 A | * | 7/1993 | Frankeny et al. ........... 174/254 |
| 5,258,577 A | | 11/1993 | Clements |
| 5,266,528 A | | 11/1993 | Yamada |
| 5,272,114 A | * | 12/1993 | van Berkum et al. ........... 225/2 |
| 5,288,943 A | | 2/1994 | Walker et al. |
| 5,302,849 A | | 4/1994 | Cavasin |
| 5,307,561 A | | 5/1994 | Feigenbaum et al. |
| 5,309,021 A | | 5/1994 | Shimamoto et al. |
| 5,334,875 A | | 8/1994 | Sugano et al. |
| 5,337,216 A | * | 8/1994 | McIver ....................... 257/676 |
| 5,340,640 A | * | 8/1994 | Bientz ........................ 174/254 |
| 5,356,838 A | | 10/1994 | Kim ............................ 437/226 |
| 5,362,656 A | | 11/1994 | McMahon |
| 5,363,277 A | | 11/1994 | Tanaka |
| 5,373,190 A | | 12/1994 | Ichiyama |
| 5,381,032 A | * | 1/1995 | Kokawa et al. ............. 257/412 |
| 5,394,303 A | * | 2/1995 | Yamaji ....................... 174/260 |
| 5,408,320 A | | 4/1995 | Katagiri et al. |
| 5,424,250 A | * | 6/1995 | Sawada ....................... 257/788 |
| 5,428,190 A | * | 6/1995 | Stopperan ................... 174/250 |
| 5,431,328 A | | 7/1995 | Chang et al. |
| 5,434,751 A | | 7/1995 | Cole, Jr. et al. |
| 5,444,301 A | * | 8/1995 | Song et al. ................. 257/737 |
| 5,448,511 A | * | 9/1995 | Paurus et al. ................ 257/686 |
| 5,455,455 A | * | 10/1995 | Badehi ........................ 257/690 |
| 5,480,839 A | | 1/1996 | Ezawa et al. |
| 5,496,775 A | * | 3/1996 | Brooks ........................ 438/127 |
| 5,508,228 A | | 4/1996 | Nolan et al. |
| 5,517,057 A | | 5/1996 | Beilstein, Jr. et al. |
| 5,517,754 A | | 5/1996 | Beilstein, Jr. et al. |
| 5,554,887 A | * | 9/1996 | Sawai et al. ................ 257/737 |
| 5,567,656 A | * | 10/1996 | Chun .......................... 438/112 |
| 5,568,363 A | | 10/1996 | Kitahara |
| 5,641,997 A | * | 6/1997 | Ohta et al. ................... 257/788 |
| 5,646,446 A | * | 7/1997 | Nicewarner et al. ........ 257/723 |
| 5,656,863 A | * | 8/1997 | Yasunaga et al. ........... 257/778 |
| 5,665,655 A | | 9/1997 | White |
| 5,668,404 A | * | 9/1997 | Abe et al. ................... 257/668 |
| 5,683,942 A | | 11/1997 | Kata et al. |
| 5,698,465 A | * | 12/1997 | Lynch et al. ............. 228/180.22 |
| 5,720,843 A | * | 2/1998 | Lee ............................ 156/276 |
| 5,766,972 A | | 6/1998 | Takahashi et al. ........... 438/127 |
| 5,776,797 A | * | 7/1998 | Nicewarner et al. ........ 438/107 |
| 5,790,380 A | * | 8/1998 | Frankeny .................... 257/686 |
| 5,805,422 A | * | 9/1998 | Otake et al. ................ 257/737 |
| 5,824,569 A | * | 10/1998 | Brooks et al. ............... 438/127 |
| 5,855,063 A | | 1/1999 | Schreiber et al. |
| 5,874,782 A | | 2/1999 | Palagonia |
| 5,897,337 A | * | 4/1999 | Kata et al. ................... 438/114 |
| 5,925,934 A | * | 7/1999 | Lim ........................... 174/52.4 |
| 5,930,603 A | * | 7/1999 | Tsuji et al. .................. 438/127 |
| 5,969,426 A | * | 10/1999 | Baba et al. .................. 257/778 |
| 6,020,217 A | * | 2/2000 | Kuisl et al. .................. 438/106 |
| 6,043,564 A | | 3/2000 | Brooks et al. |
| 6,069,408 A | * | 5/2000 | Honda et al. ................ 257/787 |
| 6,073,829 A | | 6/2000 | Pienimaa |
| 6,083,811 A | * | 7/2000 | Riding et al. ............... 438/416 |
| 6,204,074 B1 | | 3/2001 | Bertolet et al. |
| 6,211,572 B1 | | 4/2001 | Fjelstad et al. |
| 6,294,830 B1 | * | 9/2001 | Fjelstad ...................... 257/724 |
| 6,307,261 B1 | * | 10/2001 | Val et al. .................... 257/690 |
| 6,365,500 B1 | | 4/2002 | Chang et al. |
| 2002/0030258 A1 | | 3/2002 | Fukasawa et al. |

FOREIGN PATENT DOCUMENTS

| | | | | |
|---|---|---|---|---|
| EP | 0 684 641 A2 | | 11/1995 | |
| EP | 0 689 240 | | 12/1995 | |
| EP | 0 689 245 A2 | | 12/1995 | |
| EP | 0 704 896 A2 | | 4/1996 | |
| JP | 54-45570 | | 1/1979 | |
| JP | 54-111281 | | 8/1979 | |
| JP | 59-225534 | | 12/1984 | |
| JP | 60-130129 | | 7/1985 | |
| JP | 61-253826 | | 11/1986 | |
| JP | 63-308329 | | 12/1988 | |
| JP | 63308329 A | * | 12/1988 | ........... H01L/21/56 |
| JP | 64-37854 | | 2/1989 | |
| JP | 1-134938 | | 5/1989 | |
| JP | 2-180036 | | 7/1990 | |
| JP | 3-62927 | | 3/1991 | |
| JP | 03293740 | | 12/1991 | |
| JP | 4-006841 | | 1/1992 | |
| JP | 5-20921 | | 1/1993 | |
| JP | 05003183 | | 1/1993 | |
| JP | 5-55278 | | 3/1993 | |
| JP | 5-62981 | | 3/1993 | |
| JP | 5-82717 | | 4/1993 | |
| JP | 5-175396 | | 7/1993 | |
| JP | 5-211149 | | 8/1993 | |
| JP | 05283456 A | * | 10/1993 | ........... H01L/21/56 |
| JP | 05283457 A | * | 10/1993 | ........... H01L/21/56 |
| JP | 05283608 A | * | 10/1993 | ......... H01L/25/065 |
| JP | 05291218 A | * | 11/1993 | ......... H01L/21/304 |
| JP | 5-291322 | | 11/1993 | |
| JP | 05291322 A | * | 11/1993 | ........... H01L/21/56 |
| JP | 05343458 | | 12/1993 | |
| JP | 05343458 A | * | 12/1993 | ........... H01L/21/56 |
| JP | 6-29165 | | 2/1994 | |
| JP | 06112369 A | * | 4/1994 | ........... H01L/23/29 |
| JP | 6-151487 | | 5/1994 | |
| JP | 06151487 A | * | 5/1994 | ........... H01L/21/56 |
| JP | 6-163617 | | 6/1994 | |
| JP | 6-236887 | | 8/1994 | |
| JP | 6-246770 | | 9/1994 | |
| JP | 6-302604 | | 10/1994 | |
| JP | 6-318609 | | 11/1994 | |
| JP | 06342794 | | 12/1994 | |
| JP | 7-45649 | | 2/1995 | |
| JP | 07235618 | | 9/1995 | |
| JP | 7-283260 | | 10/1995 | |
| JP | 7-321248 | | 12/1995 | |
| JP | 7-326850 | | 12/1995 | |
| JP | 8-8278 | | 1/1996 | |
| JP | 8-008278 | | 1/1996 | |
| JP | 08017855 | | 1/1996 | |
| JP | 08031869 | | 2/1996 | |

| | | | | | | |
|---|---|---|---|---|---|---|
| JP | 8-64725 | 3/1996 | | JP | 8-288293 | 11/1996 |
| JP | 8-72092 | 3/1996 | | JP | 9-17827 | 1/1997 |
| JP | 8-97217 | 4/1996 | | JP | 9-45818 | 2/1997 |
| JP | 8-97312 | 4/1996 | | JP | 9-64049 | 3/1997 |
| JP | 8-97315 | 4/1996 | | KR | 86-859 | 7/1986 |
| JP | 08-097217 | 4/1996 | | WO | WO 96/01495 | 1/1996 |
| JP | 08148608 | 6/1996 | | | | |
| JP | 08156029 | 6/1996 | | | | |
| JP | 8-255868 | 10/1996 | | | | |

* cited by examiner

METHOD AND MOLD FOR MANUFACTURING SEMICONDUCTOR DEVICE, SEMICONDUCTOR DEVICE AND METHOD FOR MOUNTING THE DEVICE

This application is a division of prior application Ser. No. 09/029,608, filed May 15, 1998, which is a §317 of international application No. PCT/JP97/02405, filed Jul. 10, 1997.

TECHNICAL FIELD

The present invention relates to a method and mold for manufacturing a semiconductor device, and a semiconductor device, and more particularly to a method and mold for manufacturing a semiconductor device having a chip-size package structure, and such a semiconductor device.

Recently, there has been activity in down-sizing of semiconductor devices and increasing the integration density thereof in order to meet requirements of down-sizing of electronic devices and apparatus. A semiconductor device having a so-called chip-size package structure has been proposed in which the shape of the semiconductor device is arranged so as to be as similar to that of a semiconductor element (chip) as possible.

As an increased number of pins is employed to increase the integration density and the size of the semiconductor device is reduced, external connection terminals are arranged at a reduced pitch. Hence, protruding electrodes (bumps) are used as external connection terminals because a comparatively large number of protection electrodes can be arranged on a reduced space.

BACKGROUND ART

FIG. 1(A) shows an example of a semiconductor device used for conventional bare chip (flip chip) mounting. A semiconductor device 1 shown in that figure is generally made up of a semiconductor element (semiconductor chip) 2, and a large number of protruding electrodes (bumps) 4.

The protruding electrodes 4 serving as external connection terminals are arranged, for example, in a matrix formation, on a lower surface of the semiconductor element 2. The protruding electrodes 4 are formed of a soft metal such as solder, and are thus liable to take scratches. Thus, it is difficult to handle and test the protruding electrodes. Similarly, the semiconductor element 2 is in a bare chip formation and is thus liable to take scratches. Thus, it is also difficult to handle and test the semiconductor element 2 as in the case of the protruding electrodes 4.

As shown in FIG. 1(B), the above semiconductor device 1 is mounted on a mount board 5 (for example, a printed wiring board) as follows. First, the protruding electrodes 4 of the semiconductor device 1 are bonded to electrodes 5a formed on the mount board 5. Subsequently, as shown in FIG. 1(C), a so-called under fill resin 6 (indicated by a pear-skin illustration) is provided between the semiconductor element 2 and the mount board 5.

The under fill resin 6 is formed so that a space 7 (approximately equal to the height of the protruding electrodes 4) formed between the semiconductor element 2 and the mount board 5 is filled with a resin having a flowability.

The under fill resin 6 thus formed is provided to prevent occurrence of a break of a bonded portion between the protruding electrodes 4 and the electrodes 5a of the mount board 5 or a bonded portion between the protruding electrodes 4 and the electrodes of the semiconductor element 2 due to stress resulting from a difference in thermal expansion between the semiconductor element 2 and the mount board 5 and stress generated when heat applied at the time of mounting is removed.

As described above, the under fill resin 6 is effective because it functions to prevent occurrence of a break of the bonded portion between the protruding electrodes 4 and the mount board 5 (particularly, a break of the bonded portion between the electrodes of the mount board 5 and the protruding electrodes 4). However, a troublesome filling work is required because the under fill resin 6 is provided in the narrow space 7 between the semiconductor element 2 and the mount board 5. Further, it is difficult to uniformly provide the under fill resin 6 in the whole space 7. Hence, the efficiency in fabrication of the semiconductor device is reduced. Further, the bonded portion between the protruding electrodes 4 and the electrodes 5a or the bonded portion between the protruding electrodes 4 and the semiconductor element 2 may be damaged though the under fill resin 6 is provided. Hence, the reliability in mounting is degraded.

A Further, the above semiconductor device 1 is mechanically weak and a low reliability because the semiconductor element 2 is mounted on the mount board 5 in a state in which the semiconductor element 2 is exposed.

Furthermore, the protruding electrodes 4 are formed directly on electrode pads formed on the lower surface of the semiconductor element 2. Hence, the layout of the electrode pads is automatically equal to the layout of the protruding electrodes 4. That is, the semiconductor device 1 does not have degree of freedom in routing wiring lines within the inside thereof, and has a low degree of freedom in layout of the protruding electrodes 4 serving as the external connection terminals.

The present invention is made taking into account the above disadvantages, and has an object to provide a method and mold for fabricating a semiconductor device and a semiconductor device, and a semiconductor device having an improved efficiency in fabrication and improved reliability.

The present invention has another object to provide a semiconductor device, a method for fabricating the same and a method for mounting the semiconductor device having an increased degree of freedom in layout of terminals and improved reliability.

DISCLOSURE OF THE INVENTION

The above problems can be solved by the following measures.

A method for fabricating a semiconductor device of the present invention is characterized by comprising: a resin sealing step of loading a substrate on which semiconductor elements having protruding electrodes are formed, and supplying a sealing resin to positions of the protruding electrodes so as to form a resin layer which seals the protruding electrodes and the substrate; a protruding electrode exposing step of exposing at least ends of the protruding electrodes from the resin layer; and a separating step of cutting the substrate together with the resin layer so that the semiconductor elements are separated from each other.

By the resin sealing step, the protruding electrodes which are too delicate to be subjected to a handling test are sealed by the resin layer. The resin layer realizes a surface protection and functions to relax stress generated at interfaces between the electrodes of the semiconductor element and the protruding electrodes. The subsequent protruding electrode exposing step exposes at least ends of the protruding electrodes from the resin layer. When the protruding electrode exposing step is completed, the protruding electrodes can electrically be connected to an external circuit board or the like. The subsequent separating step cuts the substrate on which the resin layer is formed together with the resin layer, so that the semiconductor elements are separated from each other. Hence, the individual semiconductor chips can be obtained. Since the resin layer is formed in the resin sealing step, it is not required to provide the under fill resin at the time of mounting the semiconductor device. Hence, the mounting operation can easily be carried out. The sealing resin used to form the resin layer is not provided in the narrow space between the semiconductor device and the mounting board, but is provided to the surface of the substrate on which the protruding electrodes are arranged and is thus shaped by molding. Hence, the resin layer can definitely be provided to the entire surface of the substrate on which the protruding electrodes are arranged. Since the resin layer functions to protect all the protruding, it is possible to definitely prevent connections between the protruding electrodes and the electrodes on the mounting board and connections between the protruding electrodes and the electrodes on the semiconductor element from being broken during a heating process. Thus, the reliability of the semiconductor device can be improved.

The above structure may be configured so that the sealing resin used in the resin sealing step has an amount which causes the resin layer to have a height approximately equal to that of the protruding electrodes. Thus, it is possible to prevent excess resin from flowing out from the mold in the resin sealing step and to prevent occurrence of a situation in which the sealing resin is too short to definitely seal the protruding electrodes.

The above method for fabricating the semiconductor device may be configured so that the resin sealing step disposes a film between the protruding electrodes and the mold, which thus contacts the sealing resin through the film. Hence, it is possible to improve the detachability because the resin layer does not directly contact the mold and to use a highly reliable resin having high contactability without a detachment agent. Since the resin layer is attached to the film, the film can be used as a carrier. This contributes to automation of the process for fabricating the semiconductor device.

The above method for fabricating the semiconductor device may be configured so that: the mold used in the resin sealing step comprises an upper mold which can be elevated, and a lower mold having a first lower mold half body which is kept stationary and a second lower mold half body which can be elevated with respect to the first lower mold half body; and the resin sealing step comprises: a substrate loading step of placing the substrate on which the semiconductor elements having the protruding electrodes are arranged in a cavity defined by a cooperation of the first and second lower mold half bodies and providing the sealing resin in the cavity; a resin layer forming step of moving down the upper mold and the second lower mold half body so that the sealing resin is heated, melted and compressed so that the resin layer sealing the protruding electrodes is formed; and a detaching step of moving up the first mold so as to detach the upper mold from the resin layer, and then moving down the second lower mold half body from the first lower mold half body so that the substrate to which the resin layer is provided is detached from the mold.

According to the above structure, the resin layer is heated, melted and compression-molded by using the mold in the resin layer forming step. Hence, it is possible to definitely form the entire surface of the substrate. Hence, all the protruding electrodes formed on the substrate can definitely be sealed by the resin layer. Since the lower mold is mad up of a lower mold having a first lower mold half body which is kept stationary and a second lower mold half body which can be elevated with respect to the first lower mold half body, the detachment function can be facilitated, so that the substrate to which the resin layer is formed can be taken out of the mold.

The above method for fabricating the semiconductor device may be configured so that: an excess resin removing mechanism is provided in the mold used in the resin sealing step; and the excess resin removing mechanism removes excess resin and controls a pressure applied to the sealing resin in the mold. Hence, it is possible to easily measure the amount of sealing resin and to precisely seal the protruding electrodes with an appropriate volume. It is also possible to control the pressure applied to the sealing resin in the mold and to thus uniform the pressure during molding. Thus, it is possible to prevent occurrence of babbles in the sealing resin.

The method for fabricating the semiconductor device may be configured so that the resin sealing step uses a sheet-shaped resin as the sealing resin. Hence, the resin layer can definitely be formed on the entire surface of the substrate. Further it is possible to reduce the time it takes the sealing resin to flow from the central portion to the end portion when the sealing resin is placed in the central portion. Hence, the time necessary to complete the resin sealing step can be reduced.

The method for fabricating the semiconductor device may be configured so that the sealing resin is provided to the film before the resin sealing step is executed. Hence, it is possible to perform the film providing work and the sealing resin filling work at one time, so that the work can efficiently be done.

The method for fabricating the semiconductor device may be configured so that a plurality of sealing resins are provided to the film, and the resin sealing step is continuously carried out while the film is moved. Hence, it is possible to realize automation of the resin sealing step and improve the efficiency in fabricating the semiconductor devices.

The method may be configured so that a reinforcement plate is loaded onto the mold before the substrate is loaded onto the mold in the resin sealing step. Hence, it is possible to prevent the substrate from being deformed due to heat and stress applied in the resin sealing step and to calibrate a warp inherent in the substrate. Hence, the yield can be improved.

The method may be configured so that the reinforcement plate comprises a substance having a heat radiating performance. Hence, the reinforcement plate functions as a heat radiating plate, so that the semiconductor device has improved heat radiating performance.

The method for fabricating the semiconductor device may be configured so that the protruding electrode exposing step uses means for exposing the ends thereof from the resin layer, said means being at least one of a laser beam projection, eximer laser, etching, mechanical polishing, and blasting. When the laser beam projection or eximer laser is used, it is possible to easily and precisely expose the ends of the protruding electrodes. When etching, mechanical polishing or blasting is used, it is possible to expose the ends of the protruding electrodes at low cost.

The method may be configured so that: the film used in the resin sealing step is formed of an elastically deformable substance, and the ends of the protruding electrodes are caused to fall in the film when the resin layer is formed by using the mold; and the film is detached from the resin layer in the protruding electrode exposing step so that the ends of the protruding electrodes can be exposed from the resin layer. Hence, it is possible to prevent the ends of the protruding electrodes from being covered by the resin layer. Hence, it is possible to expose the ends of the protruding electrodes from the resin layer by merely detaching the film from the resin layer. Hence, it is possible to simplify the process for exposing the ends of the protruding electrodes from the resin layer after the resin layer is formed and to thus simplify the protruding electrode exposing step.

The method for fabricating the semiconductor device may be configured so that the sealing resin used in the resin sealing step comprises a plurality of sealing resins having different characteristics. Hence, if the different resins are stacked, the outer resin among them can be formed of hard resin, and the inner resin can be formed of soft resin. It is also possible to provide hard resin in a peripheral portion of the semiconductor element and provide soft resin in an area surrounded by the hard resin. Hence, the semiconductor element can be protected by the hard resin, and stress applied to the protruding electrodes can be relaxed by the soft resin.

In the resin sealing step, a reinforcement plate to which the sealing resin is provided may be provided beforehand. The method may also be configured so that a frame extending towards the substrate in a state in which the reinforcement plate is loaded onto the mold is formed to define a recess portion; and the resin layer is formed on the substrate by using, as a cavity for resin sealing, the recess portion in the resin sealing step. Hence, the reinforcement plate can be used as part of the mold, so that the sealing resin may directly contact the mold at only some points or does not contact the mold at all. Hence, it is possible to omit the work for removing unwanted resin required previously and to simplify the resin sealing step.

The method for fabricating the semiconductor device may be configured so that a second resin layer is formed so as to cover a back surface of the substrate after (or at the same time as) the first, resin layer is formed, in the resin sealing step, on the surface of the substrate on which the protruding electrodes are arranged. Hence, the semiconductor device can be well balanced. That is, an arrangement in which only the first resin layer is provided to the front surface of the substrate has a possibility that a difference in thermal expansion may occur between the front and back sides of the substrate because the semiconductor element and the sealing resin have different thermal expansion ratios and a warp may occur in the semiconductor element. In contrast, according to the above structure, the front and back surfaces of the substrate are covered by the respective resin layers and so that the states of the front and back surfaces of the substrate can be equalized and the semiconductor device can be well balanced. Hence, it is possible to prevent occurrence of a warp in the semiconductor device during the thermal process. The sealing resin provided to the lower surface of the semiconductor element has a characteristic different from that of the sealing resin provided to the upper surface thereof. For example, the sealing resin formed on the front surface on which the protruding electrodes are arranged may be formed of resin having performance which can relax stress applied to the protruding electrodes. The sealing resin formed on the back surface may be formed of resin having performance which can protect the semiconductor element from external force exerted on the semiconductor element.

It is also possible to use, in the resin sealing step, the film having protruding portions located in positions facing the protruding electrodes so that the resin layer is formed in a state in which the protruding portions are pressed against the protruding electrodes. The sealing resin does not adhere to the interfaces between the protruding portions and the protruding electrodes. Hence, by removing the film, the parts of the protruding electrodes (against which the protruding portions are pressed) are exposed from the resin layer. Hence, it is possible to easily and definitely expose the parts of the protruding electrodes from the resin layer.

The protruding electrode exposing step may be configured so that an external connection protruding electrode forming step is executed which forms external connection protruding electrodes on the ends of the protruding electrodes after the ends of the protruding electrodes are exposed from the resin layer. Hence, it is possible to improve the mounting performance at the time of mounting the semiconductor device on the mounting board. That is, the protruding electrodes are formed on the electrodes formed on the semiconductor element, and are necessarily required to be small. Thus, an arrangement in which the small protruding electrodes are used as external connection terminals to be electrically connected to the mounting board has a possibility that the protruding electrodes may not definitely be connected to the mounting board. On the other hand, the external connection protruding electrodes are provided separately from the protruding electrodes formed on the semiconductor element, and can freely be designed so as to be suitable for the structure of the mounting board. Hence, by forming the external connection protruding electrodes to the ends of the small-size protruding electrodes formed on the semiconductor element, it is possible to improve the mounting performance between the semiconductor device and the mounting board.

The external connection protruding electrode forming step may be configured so that the protruding electrodes and the external connection protruding electrodes are joined by a bonding member having a stress relaxing function. Hence, even if external force is applied to the external connection protruding electrodes, stress caused by the external force is relaxed by the adhesive interposed between the external connection protruding electrodes and the protruding electrodes, so that the stress can be prevented from being transferred to the protruding electrodes. Hence, it is possible to prevent the semiconductor element from being damaged by external stress and to improve the reliability of the semiconductor device.

The method for fabricating the semiconductor device may be configured so that: cutting position grooves are formed, before the resin sealing step is carried out, in the substrate so as to be located in positions in which the substrate is cut in the separating step; and the substrate is cut in the cutting position grooves filled with the sealing resin. Hence, it is possible to prevent a crack from occurring in the substrate and the sealing resin. If the cutting position grooves as defined above are not formed, the separating step cuts the substrate to which the comparatively thing resin layer is formed. In this case, a crack may occur in the resin layer. Further, a large magnitude of stress is applied to the cutting positions, and a crack may occur in the substrate. In contrast, the cutting position grooves are filled with the sealing resin in the resin sealing step. In the separating step, the substrate and the sealing resin are cut in the cutting position grooves full of the sealing resin. The sealing resin in the cutting position grooves is enough thick to prevent a crack from occurring in the sealing resin during the cutting process.

Further, the sealing resin has a hardness less than that of the substrate and functions to absorb stress. Thus, stress caused by the cutting process is absorbed by the sealing resin and is thus weakened. Then, the weakened stress is applied to the substrate and prevents a crack from occurring in the substrate.

It is also possible to form a pair of stress relaxing grooves prior to the resin sealing step, so as to sandwich a position in which the substrate is to be cut, whereby the substrate is cut in the position interposed between the pair of stress relaxing grooves in the separating step. Hence, it is possible to prevent outer portions (where the protruding electrodes and electronic circuits are formed) of the substrate located further out than the pair of stress relaxing grooves from being affected by stress caused in the separating step. That is, even if stress occurs in the cutting position and a crack occurs in the substrate and the resin layer, the stress will be absorbed by the stress relaxing grooves which sandwich the cutting position (and are full of the sealing resin). Hence, it is possible to prevent a crack from occurring in the areas in which the protruding electrodes and the electronic circuits are formed.

There is also provided a method for fabricating semiconductor devices characterized by comprising: a first separating step of cutting a substrate on which semiconductor elements having protruding electrodes are formed so that the semiconductor elements are separated from each other; a resin sealing step of arranging the separated semiconductor elements on a base member and sealing a sealing resin so that a resin layer is formed; a protruding electrode exposing step of exposing at least ends of the protruding electrodes from the resin layer; and a second separating step of cutting the resin layer together with the base member in positions between adjacent semiconductor elements, so that the semiconductor elements to which the resin layer is formed are separated from each other. By the first separating step, the substrate on which the semiconductor elements are formed is cut so that individual semiconductor elements can be obtained. In the resin sealing step, the separated semiconductor elements are arranged on the base member. In this case, the semiconductor elements of different types can be mounted on the base member. The semiconductor elements mounted on the base member are sealed by the resin layer of the sealing resin. In the subsequent protruding electrode exposing step, at least the ends of the protruding electrodes are exposed from the resin layer. In the second separating step, the resin layer is cut together with the base member in the boundaries between the adjacent semiconductor elements. Hence, the semiconductor device in which the different semiconductor devices are covered by the same sealing resin. In the second separating step, as in the case of claim 14, it is possible to prevent a crack from occurring in the substrate and the resin layer due to stress generated when cutting.

There is also provided a method for fabricating semiconductor devices characterized by comprising: a resin sealing step of loading a substrate on which semiconductor elements having external connection electrodes formed on surfaces of the semiconductor elements onto a mold and supplying a resin to the surfaces so that a resin layer sealing the external connection electrodes and the substrate is formed; and a separating step of cutting the substrate together with the resin layer in positions in which the external connection electrodes are formed, so that the semiconductor elements are separated from each other. By the resin sealing step, the external connection electrodes are covered by the resin layer. In the subsequent separating step, the semiconductor elements are separated from each other so that the external connection electrodes are exposed at the interfaces between the substrate and the resin layer in the cut positions. Hence, the external connection electrodes exposed from the side portions of the semiconductor devices can be used to electrically connect the semiconductor devices to the mounting board. The terminal portions can be exposed from the resin layer by merely cutting the substrate in the position in which the external connection electrodes are formed. Hence, the semiconductor devices can be produced very easily.

The method may be configured so that the external connection electrodes are commonly owned by adjacent ones of the semiconductor elements before the separating step is executed. Hence, by preforming the step only one time, two semiconductor devices can be provided so that the separated external connection electrodes are exposed. Hence, the semiconductor devices can efficiently be fabricated. In addition, it is possible to suppress occurrence of unwanted portions on the substrate and to efficiently utilize the substrate.

The method for fabricating the semiconductor device may be configured so that positioning grooves are formed on a back surface of the resin layer or the substrate after the resin sealing step is executed and before the separating step is executed. For example, when the semiconductor devices thus fabricated are tested, the semiconductor devices can be loaded onto the test apparatus by referring to the positioning grooves. Since the positioning grooves are formed before the separating step, the positioning grooves for a plurality of semiconductor devices can be formed only one time and can thus be formed efficiently.

The positioning grooves can be formed by subjecting the back surface to half scribing, which is generally used for the separating process. Hence, it is possible to easily and precisely form the positioning grooves.

The method for fabricating the semiconductor device may be configured so that: the film used in the resin sealing step has projection or recess portions located in positions in which the film is not interfered with the projecting electrodes; and recess or projection portions formed on the resin layer by the projection or recess portions are used for positioning after the resin sealing step is completed. Hence, in the resin sealing step, the projection or recess portions are formed, which can be used as positioning portions for the semiconductor devices. For example, when the semiconductor devices thus fabricated are tested, the semiconductor devices can be loaded onto the test apparatus by referring to the projection or recess grooves.

The method for fabricating the semiconductor device may be configured so that the sealing resin is processed in positions in which positioning protruding electrodes are formed in order to discriminate the protruding electrodes and the positioning protruding electrodes from each other. Hence, the semiconductor device can be loaded onto the test apparatus by referring to the positioning protruding electrodes. The resin sealing process for discriminating the positioning protruding electrodes may use eximer laser, etching, mechanical polishing, or blasting, which are also used in the protruding electrode exposing step. Hence, it is not required to greatly modify the fabrication facility.

There is provided a mold for fabricating a semiconductor device characterized by comprising: an upper mold which can be elevated; and a lower mold having a first lower mold half body which is kept stationary and a second lower mold half body which is provided so as to surround the first lower mold half body and can be elevated with respect to the first lower mold half body, a cavity being defined by a cooperation of the upper and lower molds and being filled with resin. By moving the second half mold half body with respect to the first lower mold half body, the detaching function of detaching the substrate from the mold can be provided, so that the substrate to which the resin layer is formed can be detached from the mold.

The mold for fabricating the semiconductor device may be configured so that there is provided an excess resin removing mechanism is provided in the mold used in the resin sealing step, wherein the excess resin removing mechanism removes excess resin and controls a pressure applied to the sealing resin in the mold. Hence, it is possible to measure the mount of the sealing resin to be supplied and to always execute the sealing process for the protruding electrodes with an appropriate resin amount. It is also possible to control the pressure applied to the sealing resin in the mold and to thus make uniform pressure applied to the sealing resin. Hence, the occurrence of babbles ran be prevented.

It is also possible to provide an attachment/detachment mechanism which attaches the substrate to a position of the first lower mold half body and detaches the substrate therefrom. When the mechanism performs the sucking operation, the substrate is fixed to the first lower mold half body, and it is thus possible to prevent occurrence of a deformation in the substrate such as a warp and to calibrate a warp inherent in the substrate. When the attachment/detachment mechanism performs the detachment operation, the substrate is urged toward the detaching direction from the first lower mold half body. Hence the detachability of the substrate from the mold can be improved.

The attachment/detachment mechanism may comprise: a porous member arranged in the position of the first lower mold half body onto which the substrate is loaded; and an intake/exhaust device preforming a gas suction and supply process for the porous member. The porous member is supplied with a gas from an intake/exhaust apparatus, and injects the gas towards the substrate. When the gas is injected towards the substrate through the porous member at the time of detaching the substrate from the mold, the detachability of the substrate from the mold can be improved. When the intake/exhaust apparatus performs the sucking process, the substrate is sucked towards the porous member. Hence, it is possible to prevent occurrence of a deformation of the substrate such as a warp and to calibrate a warp inherent in the substrate. Since the porous member is disposed to the position on the first lower mold half body, the porous member is covered by the substrate in the sealing resin is supplied in the resin sealing step. Hence, the sealing resin cannot enter the porous member. In addition, the back surface of the substrate is directly urged along the detaching direction at the time of detaching the substrate from the mold, the detachability can be improved.

The mold may be configured so that an area enclosed by the second lower mold half body is wider than an area of an upper portion of the first lower mold half body in a state in which the cavity is formed. Hence, the detachability can be moved, and a rectangular step portion can easily be defined by the above arrangement.

There is provided a semiconductor device characterized by comprising: a semiconductor element having a surface on which protruding electrodes are directly formed; and a resin layer which is formed on the surface of the semiconductor element and seals the protruding electrodes except for ends thereof. The resin layer functions to protect the semiconductor element, the protruding electrodes, the mounting board and the connections therebetween. Since the resin layer is already formed in the semiconductor device before the mounting step, it is not required to perform the conventional process for providing under fill resin at the time of mounting the semiconductor device to the mounting board, so that the mounting process can easily be performed.

The semiconductor device may be configured so that there is provided a heat radiating member provided on a back surface of the semiconductor element opposite to the surface thereof on which the protruding electrodes are provided. Hence, it is possible to improve the heat radiating performance of the semiconductor device and improve the strength thereof.

There is also provided a semiconductor device characterized by comprising: a semiconductor element having a surface on which external connection electrodes are provided which are to be electrically connected to external terminals; and a resin layer provided on the surface of the semiconductor element so as to cover the external connection electrodes, wherein the external connection electrodes are laterally exposed at an interface between the semiconductor element and the resin layer. Hence, the semiconductor device can be mounted by using the external connection electrodes rather than the protruding electrodes. Since the present semiconductor device does not have the protruding electrodes, the structure thereof can be simplified and the fabrication cost can be reduced. Since the external connection electrodes are exposed from the sides from the semiconductor device, the semiconductor device can be mounted on the mounting board so that it vertically stands thereon. Hence, the mounting density can be improved.

The semiconductor device may be configured so that the resin layer is made up of a plurality of resins. Hence, if the different resins are stacked, the outer resin among them can be formed of hard resin, and the inner resin can be formed of soft resin. It is also possible to provide hard resin in a peripheral portion of the semiconductor element and provide soft resin in an area surrounded by the hard resin. Hence, the semiconductor element can be protected by the hard resin, and stress applied to the protruding electrodes can be relaxed by the soft resin.

There is also provided a semiconductor device characterized by comprising: a semiconductor element having protruding electrodes formed on a surface thereof; a first resin layer that is formed on the surface of the semiconductor element and seals the protruding electrodes except for ends thereof; and a second resin layer provided so as to cover at least a back surface of the semiconductor element. Hence, the semiconductor device can be well balanced. That is, an arrangement in which only the first resin layer is provided to the front surface of the substrate (on which the protruding electrodes are provided) has a possibility that a difference in thermal expansion may occur between the front and back sides of the substrate because the semiconductor element and the sealing resin have different thermal expansion ratios and a warp may occur in the semiconductor element. In contrast, according to the above structure, the front and back surfaces of the substrate are covered by the respective resin layers and so that the states of the front and back surfaces of the substrate can be equalized and the semiconductor device can be well balanced. Hence, it is possible to prevent occurrence of a warp in the semiconductor device during the thermal process. The sealing resin provided to the lower surface of the semiconductor element has a characteristic different from that of the sealing resin provided to the upper surface thereof. For example, the sealing resin formed on the front surface on which the protruding electrodes are arranged may be formed of resin having performance which can relax stress applied to the protruding electrodes. The sealing resin formed on the back surface may be formed of resin having performance which can protect the semiconductor element from external force exerted on the semiconductor element.

There is also provided a semiconductor device characterized by comprising: a semiconductor element having protruding electrodes formed on a surface thereof; a resin layer which is formed on the surface of the semiconductor element and seals the protruding electrodes except for ends thereof; and external connection protruding electrodes provided to the ends of the protruding electrodes exposed from the resin layer. Hence, it is possible to improve the mounting performance at the time of mounting the semiconductor device on the mounting board. That is, the protruding electrodes are formed on the electrodes formed on the semiconductor element, and are necessarily required to be small. Thus, an arrangement in which the small protruding electrodes are used as external connection terminals to be electrically connected to the mounting board has a possibility that the protruding electrodes may not definitely be connected to the mounting board. On the other hand, the external connection protruding electrodes are provided separately from the protruding electrodes formed on the semiconductor element, and can freely be designed so as to be suitable for the structure of the mounting board. Hence, by forming the external connection protruding electrodes to the ends of the small-size protruding electrodes formed on the semiconductor element, it is possible to improve the mounting performance between the semiconductor device and the mounting board.

There is provided a method for mounting the semiconductor device characterized in that a plurality of semiconductor elements are arranged side by side so as to vertically stand by supporting members. Hence, the mounting density can be improved.

The method for mounting the semiconductor device may be configured so that a plurality of semiconductor elements are arranged side by side so that adjacent ones of the semiconductor elements are bonded by an adhesive. Hence, the semiconductor devices can be handled as a unit and can be mounted on the mounting board for each unit. Hence, the mounting efficiency can be improved.

The method for mounting the semiconductor device may be configured so that the semiconductor device is mounted on a mounting board through an interposer. Hence, the degree of freedom in mounting the semiconductor devices on the mounting board can be improved. If the interposer includes a multilayer substrate, the routing of wiring lines can arbitrarily be determined, so that the interchangeability between the electrodes (protruding electrodes and external connection electrodes) of the semiconductor devices and those of the mounting board can easily be established.

The above-mentioned structures of the present invention correspond to first through twenty ninth embodiments (FIGS. 1 through 77) of the present invention, which will be described later.

The following structures of the present invention correspond to thirtieth through fifty third embodiments (FIGS. 1 through 117E), which will be described later.

There is provided a method for fabricating a semiconductor device comprising: a resin sealing step of loading a wiring board having a flexible member on which a semiconductor element and leads are arranged onto a mold and supplying sealing resin to the semiconductor element so as to seal the semiconductor element; and a protruding electrode forming step of forming protruding electrodes so as to be electrically connected to the leads formed on the wiring board, the resin sealing step uses a compression-molding process. In the resin sealing step, the wiring board is loaded onto the mold, and the semiconductor element is sealed by the sealing resin. In the protruding electrode forming step, the protruding electrodes are formed so as to be electrically connected to the leads formed on the wiring board. A compression molding method is used as means for sealing the semiconductor element in the resin sealing step. Hence, it is possible to definitely provide the resin to a narrow gap between the semiconductor element and the wiring board. Since the compression-molding process uses a comparatively low forming pressure, it is possible to prevent, in the resin molding step, the substrate from being deformed and prevent a load from being applied to electrical connections between the semiconductor elements and the wiring board. Hence, it is possible to the connection between the semiconductor element and the wiring board from being broken during the resin sealing process.

The method for fabricating the semiconductor device may be configured so that a frame having a cavity portion in which the semiconductor element is accommodated is provided when the wiring board is formed. Hence, the substrate having flexibility can be supported by the frame, which can also protect the semiconductor element.

The method for fabricating the semiconductor device may be configured so that a film having a detachability with respect to the sealing resin is provided in a position of the mold facing the wiring board, so that the mold contacts the sealing resin through the film. In the above-described resin sealing step, as claimed in claim 6, connection electrodes to be connected to the semiconductor element are provided on end portions of extending portions, and the element connecting step of connecting the semiconductor element and the connection electrodes is carried out after the bending step. At the time of executing the bending step, the semiconductor element and the connection electrodes are not connected, so that the reliability of the connections between the semiconductor element and the connection electrodes can be improved.

That is, if the bending step is executed in the state in which the semiconductor element and the connection electrodes are connected, a load (generated by the bending step) may be applied to the connections at the time of bending the extending portions. If a large load is applied, the connections between the semiconductor element and the connection electrodes may be destroyed. In contrast, by executing the element connecting step after the bending step, no problem due to the load caused when bending the extending portions occurs. Hence, the reliability of the connections between the semiconductor element and the connection electrodes can be improved.

The method for fabricating the semiconductor device may be configured so that a plate member having a detachability with respect to the sealing resin is provided in a position of the mold facing the wiring board, so that the mold contacts the sealing resin through the plate member. Since the sealing resin does not directly contact the mold, the detachability can be improved and highly reliable resin having good contactability can be used without a detachment agent.

The method for fabricating the semiconductor device may be configured so that the plate member is formed of a substance having a heat radiating performance. Hence, heat generated in the semiconductor element is radiated through the plate member serving as a heat radiating plate, and thus the semiconductor device has improved heat radiating performance.

The method for fabricating the semiconductor device may be configured so that there is provided an excess resin removing mechanism is provided in the mold used in the resin sealing step, wherein the excess resin removing mechanism removes excess resin and controls a pressure applied to the sealing resin in the mold. Hence, it is possible to measure the amount of sealing resin and to always execute the sealing process for the protruding electrodes with an appropriate amount. It is also possible to control the pressure applied to the sealing resin in the mold and to thus make uniform pressure applied to the sealing resin. Hence, the occurrence of babbles can be prevented.

The method for fabricating the semiconductor device may be configured so that: extending portions are formed to the wiring board so that the extending portions laterally extend from a position in which the semiconductor element is placed; and a bending step of bending the extending portions is executed after the resin sealing step is completed and before the protruding electrode forming step is executed. The method may also be configured so that: extending portions are formed to the wiring board so that the extending portions laterally extend from apposition in which the semiconductor element is placed; a bending step of bending the extending portions is carried out before the resin sealing step is executed; and the resin sealing step and the protruding electrode forming step are carried out after the bending step is executed. Thus, a comparatively wide area for the formation of the protruding electrodes. Hence, it is possible to increase the arrangement pitch for the protruding electrodes and to arrange an increased number of protruding electrodes. The bending step may be executed before or after the resin sealing step.

The method for fabricating the semiconductor device may be configured so that: connection electrodes to be connected to the semiconductor element are formed to ends of the extending portions; and an element connecting step of connecting the semiconductor element and the connection electrodes is executed after the bending step is carried out. Since the semiconductor element and the connection electrodes are not yet connected at the time of binding the extending portions, the reliability of the connections between the semiconductor element and the connection electrodes can be improved.

The method for fabricating the semiconductor device may be configured so that the connection electrodes are arranged in an interdigital formation, and have curved corners. Hence, it is possible to increase the areas of the connection electrodes and to thus simplify the process for making connections with the semiconductor element. When the connections between the semiconductor element and the connection electrodes are made by a wire bonding method, stress generated when a bonding tool (ultrasonic welding tool) touches the connection electrodes can be decentralized because the corner portions of the connection electrodes are curved. Hence the process for electrically connecting the semiconductor element and the connection electrodes can definitely be carried out.

There is also provided a semiconductor device characterized by comprising: a semiconductor element; protruding electrodes functioning as external connection terminals; a wiring board having a flexible base on which leads are formed, the leads having ends connected to the semiconductor element and other ends connected to the protruding electrodes; and a sealing resin sealing the semiconductor element, there are provided extending portions that are formed to the wiring board so that the extending portions laterally extend from a position in which the semiconductor element is placed, the protruding electrodes being formed on the extending portions. A comparatively wide area can be obtained for forming the protruding electrodes. Hence, it is possible to increase the arrangement pitch for the protruding electrodes or arrange an increased number of protruding electrodes. The bending step may be carried out before or after the resin sealing step.

The semiconductor device may be configured so that there is provided a frame which supports the wiring board and has a cavity which accommodates the semiconductor element. Hence, the flexible wiring board can be supported by the frame and thus the semiconductor element can also be supported thereby.

The semiconductor device may be configured so that the protruding electrodes are mechanical bumps obtained by plastic-deforming the leads. The bumps can be obtained by processing the leads, and thus ball members are not required to form the bumps. The plastic deformation directed to merely deforming the leads can easily form the protruding electrodes at low cost.

The following structures of the present invention correspond to fifty fourth through seventy third embodiments (FIGS. 118A to 177), which will be described later.

There is also provided a semiconductor device characterized by comprising: a single or a plurality of semiconductor elements; a sealing resin which seals partially or totally the semiconductor element or elements; and an electrode plate which is provided in the sealing resin and is electrically connected to the semiconductor element or elements, the electrode plate having portions which are exposed from side surfaces of the sealing resin and function as external connection electrodes. The electrode plate is provided in the sealing resin for protecting the semiconductor element(s) and functions to reinforce the sealing resin. Hence, the reliability of the semiconductor device can be improved. The electrode plate is interposed between the semiconductor element(s) and the external connection terminals, and thus makes it possible to route the wiring lines between the semiconductor element(s) and the external connection terminals. This differs from an arrangement in which the external connection terminals are directly connected to the semiconductor element. The electrode plate increases the degree of freedom in layout of terminals of the semiconductor device. The electrode plate is formed of an electrically conductive metal having a better thermal conductivity than the sealing resin. Hence, heat generated in the semiconductor element(s) can efficiently be radiated through the electrode plate. The external connection terminals of the electrode plate are exposed from the side surfaces of the sealing resin. Thus, it is possible to conduct an operation test for the semiconductor element(s) using the external connection terminals after the semiconductor device is mounted on the mounting board.

The semiconductor device may be configured so that the semiconductor element or elements are connected to the electrode plate in a flip-chip bonding formation. Hence, the semiconductor element(s) can definitely be bonded to the electrode plate in a comparatively narrow space, so that the semiconductor device can be down sized. Further, the connections have short wiring lengths, which reduces the impedance and meets a requirement for an increased number of pins.

The semiconductor device may be configured so that the electrode plate is exposed from a bottom surface of the sealing resin in addition to the side surfaces thereof, so that portions of the electrode plates exposed from the bottom surface function as external connection terminals. Hence, the semiconductor device can be mounted on the mounting board not only by one of the side surfaces but also the bottom surface. Hence, the degree of freedom in the mounting arrangement can be improved. For example, the semiconductor device can meet a requirement for face-down bonding which realizes a comparatively narrow space for mounting.

The semiconductor device may be configured so that protruding terminals are provided to the electrode plate, and are exposed from a bottom surface of the sealing resin, so that the protruding terminals function as external connection terminals. Hence, the external connection terminals can definitely be mounted on the mounting board. Since the electrode plate is embedded in the sealing resin except for the external connection terminals, the adjacent external connection terminals are isolated from each other by the sealing resin. Hence, there is no possibility that the adjacent external connection terminals are short-circuited due to solder, so that the reliability of mounting can be improved.

The semiconductor device may be configured so that the protruding terminals are formed integrally with the electrode plate by plastic deforming the electrode plate. Hence, the number of components can be reduced and the protruding terminals can easily be formed, as compared to the protruding terminals are formed separately from the electrode plate.

The protruding terminals may be protruding electrodes formed in the electrode plate. Hence, the semiconductor device can be handled like a BGA (Ball Grid Array), and the mounting performance can be improved.

The semiconductor device may be configured so that the semiconductor element or elements are partially exposed from the sealing resin. The semiconductor device may also be configured so that there is provided a heat radiating member in a position close to the semiconductor element or elements. Hence, heat generated in the semiconductor element(s) can efficiently be radiated.

There is also provided a method for fabricating a semiconductor device characterized by comprising: an electrode plate forming step of forming a pattern on a metallic base so that an electrode plate is formed; a chip mounting step of mounting semiconductor elements on the electrode plate and electrically connecting the semiconductor elements thereto; a sealing resin forming step of forming a sealing resin which seals the semiconductor elements and the electrode plate; and a cutting step of cutting the sealing resin and the electrode plate at boundaries between adjacent ones of the semiconductor elements so that the semiconductor devices are separated from each other. In the pattern forming process, an arbitrary routing pattern can be selected by the electrode plate. Hence, a certain degree of freedom in layout of the external connection terminals formed on the electrode plate. Further, the semiconductor elements and the electrode plate are sealed and protected by the sealing resin. Hence, the reliability of the semiconductor device can be improved. The subsequent cutting step cuts the sealing resin and the electrode plate at the boundaries between the semiconductor devices, so that the individual semiconductor devices can be formed. The electrode plate is exposed in the cut positions, and the exposed portions of the electrode plate can be used as external connection terminals.

The method for fabricating the semiconductor device may be configured so that the pattern is formed in the electrode plate forming step by etching or press processing. The etching or press processing is generally employed as a lead frame forming method. Hence, the electrode plate can be formed from the lead frame. Hence, the electrode plate forming step can be executed without increase in the fabrication facility.

The method for fabricating the semiconductor device may be configured so that the semiconductor elements are mounted, in the chip mounting step, on the electrode plate in a flip-chip bonding formation. Hence, the semiconductor elements and the electrode plate can definitely be connected in a narrow space. This leads to down sizing of the semiconductor devices. The connecting portions have a short length, and the impedance thereof can be reduced. Further, the above arrangement can meet a requirement for an increased number of pins.

The method for fabricating the semiconductor device may be configured so that: a chip attachment step of positioning the semiconductor elements on the heat radiating member and attaching the semiconductor elements thereto before the chip mounting step is executed; and the semiconductor elements attached to the heat radiating member are mounted to the electrode plate in the chip mounting step. Hence, the semiconductor elements can be mounted to the electrode plate in the state in which the semiconductor elements are positioned on the heat radiating member. Hence, it is not required to perform the positioning process for each of the individual semiconductor elements, but to position the heat radiating member having a large size and the electrode plate only. Hence, the positioning process can easily be carried out.

The method for fabricating the semiconductor device may be configured so that protruding terminals protruding from the electrode plate are formed in the electrode plate forming step, and the sealing resin is formed so that the protruding terminals are exposed from the sealing resin in the sealing resin forming step. Also, according to the invention of claim 13, the protruding terminals are formed from the electrode plate, so that the protruding terminals and the electrode plate can simultaneously be formed. Hence, the method for fabricating the semiconductor device can be simplified. Also, in the sealing resin forming step, the sealing resin is formed so that the protruding terminals are exposed from the sealing resin. Hence, the external connection terminals can definitely be connected to the mounting board and occurrence of a shortcircuit between adjacent external connection terminals can be prevented.

There is also provided an mounting arrangement for mounting the above semiconductor device on a mounting board, characterized by comprising: a socket having an attachment portion to which the semiconductor device is attached, and lead parts provided so as to be connected to the external connection terminals exposed from the sealing resin, the semiconductor device being attached to the socket, and the lead parts and the external connection terminals being connected, the lead parts being connected to the mounting board. Since the semiconductor device can be attached to the mounting board using the socket, the semiconductor device can easily be attached and detached. Thus, for example, if a situation takes place in which the mounted semiconductor device is required to be replaced by new one, the replacement process can easily be carried out. Also, the lead parts provided to the socket are arranged to the side portions of the thereof to which the semiconductor device is attached. Further, the external connection terminals of the semiconductor device are exposed from the side surfaces of the sealing resin. Hence, the lead parts and the external connection terminals face each other in the attached state, and can thus be connected without extending the lead parts. As a result, the structure of the socket can be simplified.

There is also provided a mounting arrangement for mounting the above semiconductor device a mounting board, characterized by comprising: bumps arranged to the protruding terminals for forming the external connection terminals, the semiconductor device being connected to the mounting board through the bumps. Hence the semiconductor device can be mounted in the same manner as the BGA (Ball Grid Array). Hence, the mounting performance can be improved and an increased number of pins can be employed.

There is also provided a mounting arrangement for mounting the semiconductor device as claimed in any of claims 59 to 64 on a mounting board, characterized by comprising: a mounting member including connection pins that are flexibly deformable and are located in positions corresponding to those of the external connection terminals, and a positioning member positioning the connection pins, upper ends of the connection pins being connected to the external connection terminals of the semiconductor device, and lower ends thereof being connected to the mounting board. Hence, the connection pins are interposed between the external connection terminals and the mounting board. The connection pins are flexible, and are capable of absorbing stress due to a difference in thermal expansion coefficient between the semiconductor device and the mounting board during a thermal process. Hence, the connections between the external connection terminals and the mounting board can definitely be maintained irrespective of the stress, so that the reliability of mounting can be improved. The connection pins are positioned by the positioning member so as to be located in positions corresponding to those of the external connection terminals. Hence, it is not required to position the individual connection pins and the external connection terminals or the mounting board, so that the mounting operation can easily be carried out.

There is also provided a semiconductor device characterized by comprising: a semiconductor device main body having a semiconductor element having a surface on which protruding electrodes are directly formed, and a resin layer which is formed on the surface of the semiconductor element and seals the protruding electrodes except for ends thereof; an interposer to which the semiconductor device main body is attached, a wiring pattern to which the semiconductor device main body is connected being formed on a base member of the interposer; an anisotropic conductive film which has an adhesiveness and a conductivity in a pressed direction and is interposed between the semiconductor device main body and the interposer, the anisotropic conductive film fixing the semiconductor device main body to the interposer and electrically connecting them; and external connection terminals which are connected to the wiring pattern through holes formed in the base member and are arranged on a surface of the semiconductor device main body opposite to the surface on which the protruding electrodes are provided. Thus, the resin layer protects the semiconductor element and the protruding electrodes, and also functions as an under fill resin. Further, the semiconductor device main body is attached to the interposer, and the wiring pattern is formed on the base member. Hence, the wiring pattern can arbitrarily be formed on the base member. The external connection terminals are connected to the wiring pattern via the holes formed in the base member. Since the wiring pattern can arbitrarily be set, the external connection terminals can be determined independently of the positions of the protruding electrodes provided on the semiconductor device main body. Hence, the degree of freedom in layout of the external connection terminals can be increased. Further, since the anisotropic conductive film has an adhesiveness and a conductivity in the pressing direction, the semiconductor device main body and the interposer can be connected by the anisotropic terminals. The adhesiveness of the anisotropic conductive film mechanically bonds the semiconductor device main body and the interposer, and the anisotropic conductivity electrically bonds (connects) them. As described above, the anisotropic conductive film has both the adhesiveness and the conductivity, it is possible to reduce the number of components and the number of assembly steps, as compared to an arrangement in which the adhesiveness and the conductivity are implemented by respective members. Further, the anisotropic conductive film has flexibility, and is provided between the semiconductor device main body and the interposer. Hence, the anisotropic conductive film functions as a buffer film. Hence, the anisotropic conductive film is capable of relaxing stress generated between the semiconductor device main body and the interposer.

The semiconductor device may be configured so that an arrangement pitch for the protruding electrodes provided on the semiconductor device main body is equal to that for the external connection terminals provided on the interposer. Hence, the size of the interposer can be reduced, and the semiconductor device can be down sized.

The semiconductor device may be configured so that an arrangement pitch for the external connection terminals provided on the interposer is greater than that for the protruding electrodes provided on the semiconductor device. Hence, the degree of freedom in routing the wiring pattern on the interposer can be improved.

The semiconductor device may be configured so that there is provided an insulating member which is provided on the interposer and has holes located in positions facing the protruding electrodes. Hence, the pressing pressure applied when the semiconductor device main body is attached to the interposer concentrates on the holes. Thus, the conductivity at the holes can be enhanced, and thus the semiconductor device main body and the interposer can definitely be connected.

The semiconductor device may be configured so that the interposer comprises a TAB (Tape Automated Bonding) tape. The TAB tape is available as a component of the semiconductor devices at low cost. Hence, the use of the TAB tape contributes to reducing the cost.

There is also provided a method for fabricating a semiconductor device, characterized by comprising: a semiconductor device main body forming step of forming a semiconductor device main body having a semiconductor element having a surface on which protruding electrodes are directly formed, and a resin layer which is formed on the surface of the semiconductor element and seals the protruding electrodes except for ends thereof; an interposer forming step of forming an interposer to which the semiconductor device main body is attached, a wiring pattern to which the semiconductor device main body is connected being formed on a base member of the interposer; a bonding step of bonding the semiconductor device main body and the interposer by an anisotropic conductive film which has an adhesiveness and a conductivity in a pressed direction, the anisotropic conductive film fixing the semiconductor device main body to the interposer and electrically connecting them; and an external connection terminal forming step of forming external connection terminals which are connected to the wiring pattern through holes formed in the base member and are arranged on a surface of the semiconductor device main body opposite to the surface on which the protruding electrodes are provided. Since the resin layer is provided to the surface of the semiconductor device main body so that the ends thereof remain, the resin layer protects the semiconductor element and the protruding electrodes, and functions as an under fill resin. The semiconductor device main body is attached to the interposer, and the wiring pattern to which the semiconductor device main body is connected is formed on the base member. Hence, the wiring pattern can arbitrarily be formed on the base member. The external connection terminals are connected to the wiring pattern via the holes formed in the base member. Since the wiring pattern can arbitrarily be set, the external connection terminals can be determined independently of the positions of the protruding electrodes provided on the semiconductor device main body. Hence, the degree of freedom in layout of the external connection terminals can be increased. Further, since the anisotropic conductive film has an adhesiveness and a conductivity in the pressing direction, the semiconductor device main body and the interposer can be connected by the anisotropic terminals. The adhesiveness of the anisotropic conductive film mechanically bonds the semiconductor device main body and the interposer, and the anisotropic conductivity electrically bonds (connects) them. As described above, the anisotropic conductive film has both the adhesiveness and the conductivity, it is possible to reduce the number of components and the number of assembly steps, as compared to an arrangement in which the adhesiveness and the conductivity are implemented by respective members. Further, the anisotropic conductive film has flexibility, and is provided between the semiconductor device main body and the interposer. Hence, the anisotropic conductive film functions as a buffer film. Hence, the anisotropic conductive film is capable of relaxing stress generated between the semiconductor device main body and the interposer.

There is also provided a semiconductor device comprising: a semiconductor device main body having a semiconductor element having a surface on which protruding electrodes are directly formed, and a resin layer which is formed on the surface of the semiconductor element and seals the protruding electrodes except for ends thereof; an interposer to which the semiconductor device main body is attached, a wiring pattern to which the semiconductor device main body is connected being formed on a base member of the interposer; an adhesive which is provided between the semiconductor device main body and the interposer and which bonds the semiconductor device main body to the interposer; a conductive member which electrically connects the semiconductor device main body and the interposer; and external connection terminals which are connected to the wiring pattern through holes formed in the base member and are arranged on a surface of the semiconductor device main body opposite to the surface on which the protruding electrodes are provided. Since the resin layer is provided to the surface of the semiconductor device main body so that the ends thereof remain, the resin layer protects the semiconductor element and the protruding electrodes, and functions as an under fill resin. The semiconductor device main body is attached to the interposer, and the wiring pattern to which the semiconductor device main body is connected is formed on the base member. Hence, the wiring pattern can arbitrarily be formed on the base member. The external connection terminals are connected to the wiring pattern via the holes formed in the base member. Since the wiring pattern can arbitrarily be set, the external connection terminals can be determined independently of the positions of the protruding electrodes provided on the semiconductor device main body. Hence, the degree of freedom in layout of the external connection terminals can be increased. Further, the adhesive mechanically bonds the semiconductor device main body and the interposer, and the conductive member electrically bonds (connects) the semiconductor device main body and the interposer. As described above, the mechanical bonding and electrical bonding can separately be implemented by the respective members, so that substances respectively optimal to implementation of the functions (the mechanical bonding function and electrical bonding function) can be selected. Hence, the mechanical and electrical connections between the semiconductor device main body and the interposer can definitely be realized, and the reliability of the semiconductor device can be improved.

The adhesive has a given flexibility after it is hardened, and is provided between the semiconductor device main body and the interposer. Hence, the adhesive functions as a buffer film, and relaxes stress generated between the semiconductor device main body and the interposer.

The semiconductor device may be configured so that the conductive member is a conductive paste. Hence, a conductive member can be provided merely by coating the protruding electrodes or the wiring pattern of the interposer with the conductive paste. Thus, the work of assembling the semiconductor device can easily be performed. The conductive paste can be coated by a known transfer method or printing method, so that the conductive member can efficiently be provided.

The semiconductor device may be configured so that the conductive member comprises stud bumps. Hence, the protruding electrodes of the semiconductor element and the wiring pattern of the interposer can be connected through the stud bumps, so that electrical connections can definitely be made.

The semiconductor device may be configured so that the conductive member comprises flying leads, which are integrally formed with the wiring pattern and bypasses the adhesive so as to be connected to the protruding electrodes. Hence, there is no adhesive provided to the contacts between the flying leads and the protruding electrodes, and the reliability thereof can be improved. The flying leads have a spring performance, and thus the flying leads are pressed against the protruding electrodes due to the spring function. This also improves the reliability of the electrical contacts between the flying leads and the protruding electrodes.

The semiconductor device may be configured so that connections between the protruding electrodes and the flying leads are sealed by resin. Hence, it is possible to prevent the flying leads from being deformed due to external force and to thus improve the reliability of the semiconductor device.

The semiconductor device may be configured so that the conductive member comprises: connection pins that are flexibly deformable and are located in positions corresponding to those of the protruding electrodes; and a positioning member positioning the connection pins, upper ends of the connection pins being connected to the protruding electrodes of the semiconductor device, and lower ends thereof being connected to the external connection terminals. Since the connection pins are flexible, even if stress is generated between the semiconductor device main body and the interposer due to a difference in thermal expansion coefficient therebetween, the stress will be absorbed by the connection pins. Hence, the connections between the external connection terminals and the protruding electrodes can definitely be maintained. Further, the connection pins are positioned by the positioning member so as to be located in positions corresponding to those of the protruding electrodes. Thus, it is not required to perform the positioning between the individual connection pins and the protruding electrodes or external connection terminals, so that the mounting work can easily be conducted.

The semiconductor device may be configured so that the positioning member is formed of a flexible member. Thus, even if the connection pins are deformed, the positioning member is capable of following the above deformation and thus absorbing stress generated between the semiconductor device main body and the interposer.

There is also provided a method for fabricating a semiconductor device, characterized by comprising: a semiconductor device main body forming step of forming a semiconductor device main body having a semiconductor element having a surface on which protruding electrodes are directly formed, and a resin layer which is formed on the surface of the semiconductor element and seals the protruding electrodes except for ends thereof; an interposer forming step of forming an interposer to which the semiconductor device main body is attached, a wiring pattern to which the semiconductor device main body is connected being formed on a base member of the interposer; a conductive member arranging step of arranging a conductive member to at least one of the semiconductor device main body and the interposer; a bonding step of bonding the semiconductor device main body and the interposer by an adhesive and connecting them electrically; and an external connection terminal forming step of forming external connection terminals which are connected to the wiring pattern through holes formed in the base member and are arranged on a surface of the semiconductor device main body opposite to the surface on which the protruding electrodes are provided. Since the resin layer is provided to the surface of the semiconductor device main body so that the ends thereof remain, the resin layer protects the semiconductor element and the protruding electrodes, and functions as an under fill resin. The semiconductor device main body is attached to the interposer, and the wiring pattern to which the semiconductor device main body is connected is formed on the base member. Hence, the wiring pattern can arbitrarily be formed on the base member. The external connection terminals are connected to the wiring pattern via the holes formed in the base member. Since the wiring pattern can arbitrarily be set, the external connection terminals can be determined independently of the positions of the protruding electrodes provided on the semiconductor device main body. Hence, the degree of freedom in layout of the external connection terminals can be increased. Further, the adhesive mechanically bonds the semiconductor device main body and the interposer, and the conductive member electrically bonds (connects) the semiconductor device main body and the interposer. As described above, the mechanical bonding and electrical bonding can separately be implemented by the respective members, so that substances respectively optimal to implementation of the functions (the mechanical bonding function and electrical bonding function) can be selected. Hence, the mechanical and electrical connections between the semiconductor device main body and the interposer can definitely be realized, and the reliability of the semiconductor device can be improved.

BRIEF DESCRIPTION OF THE DRAWINGS

FIG. 120 is a diagram (part 2) showing a method for fabricating the semiconductor device according to the fifty fourth embodiment of the present invention.

FIG. 121 is a diagram (part 3) showing a method for fabricating the semiconductor device according to the fifty fourth embodiment of the present invention.

FIG. 122 is a diagram (part 4) showing a method for fabricating the semiconductor device according to the fifty fourth embodiment of the present invention.

FIG. 123 is a diagram showing a semiconductor device according to a fifty fifth embodiment of the present invention.

FIG. 124 is a diagram showing a semiconductor device according to a fifty sixth embodiment of the present invention.

FIG. 125 is a diagram showing a semiconductor device according to a fifty seventh embodiment of the present invention.

FIG. 126 is a diagram (part 1) showing a method for fabricating the semiconductor device according to the fifty fifth embodiment of the present invention.

FIG. 127 is a diagram (part 2) showing a method for fabricating the semiconductor device according to the fifty fifth embodiment of the present invention.

FIG. 128 is a diagram showing a mounting arrangement for a semiconductor device according to a fifty fourth embodiment of the present invention.

FIG. 129 is a diagram showing a mounting arrangement for a semiconductor device according to a fifty fifth embodiment of the present invention.

FIG. 130 is a diagram showing a mounting arrangement for a semiconductor device according to a fifty sixth embodiment of the present invention.

FIG. 131 is a diagram showing a mounting arrangement for a semiconductor device according to a fifty seventh embodiment of the present invention.

Figure 132:
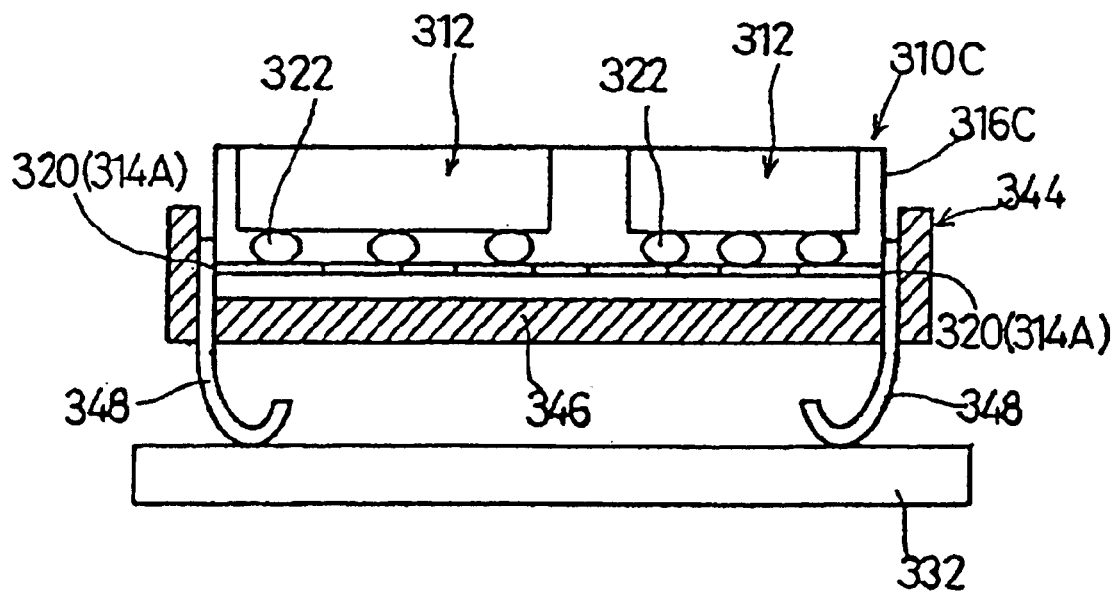

FIG. 132 is a diagram showing a mounting arrangement for a semiconductor device according to a fifty eighth embodiment of the present invention.

Figure 133:
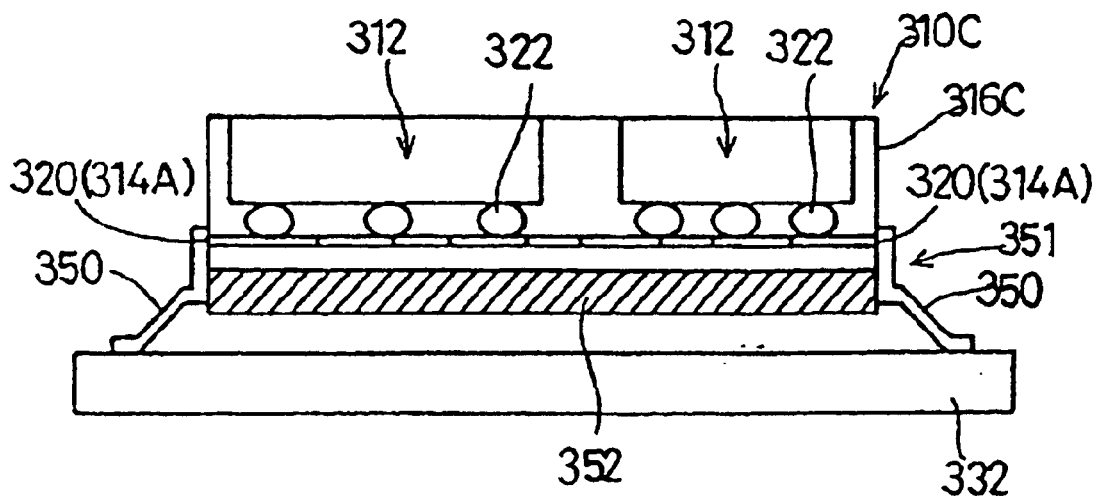

FIG. 133 is a diagram showing a mounting arrangement for a semiconductor device according to a fifty ninth embodiment of the present invention.

Figure 134:
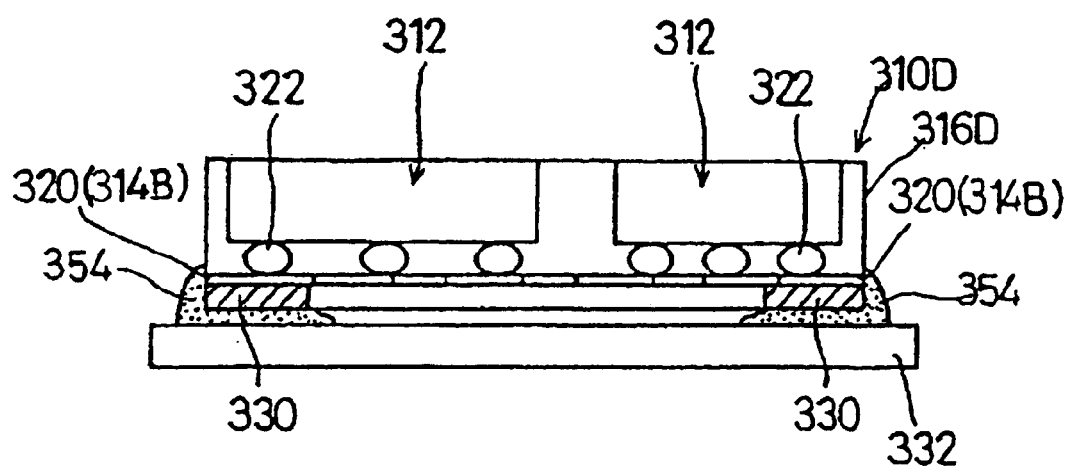

FIG. 134 is a diagram showing a mounting arrangement for a semiconductor device according to a sixtieth embodiment of the present invention.

Figure 135:
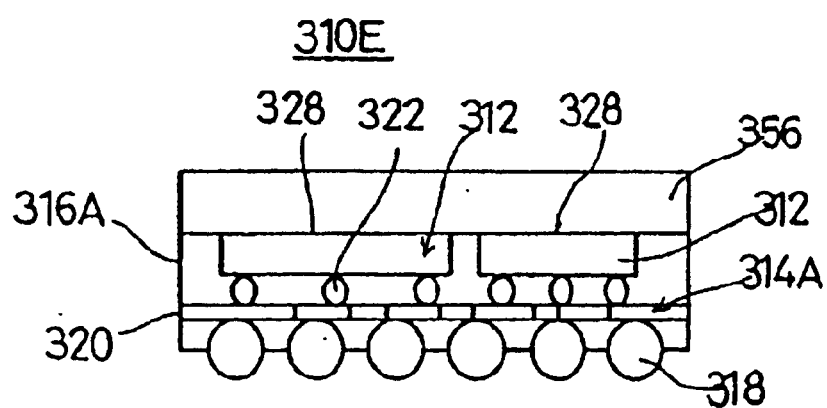

FIG. 135 is a diagram showing a semiconductor device according to a fifth seventh embodiment of the present invention.

Figure 136:
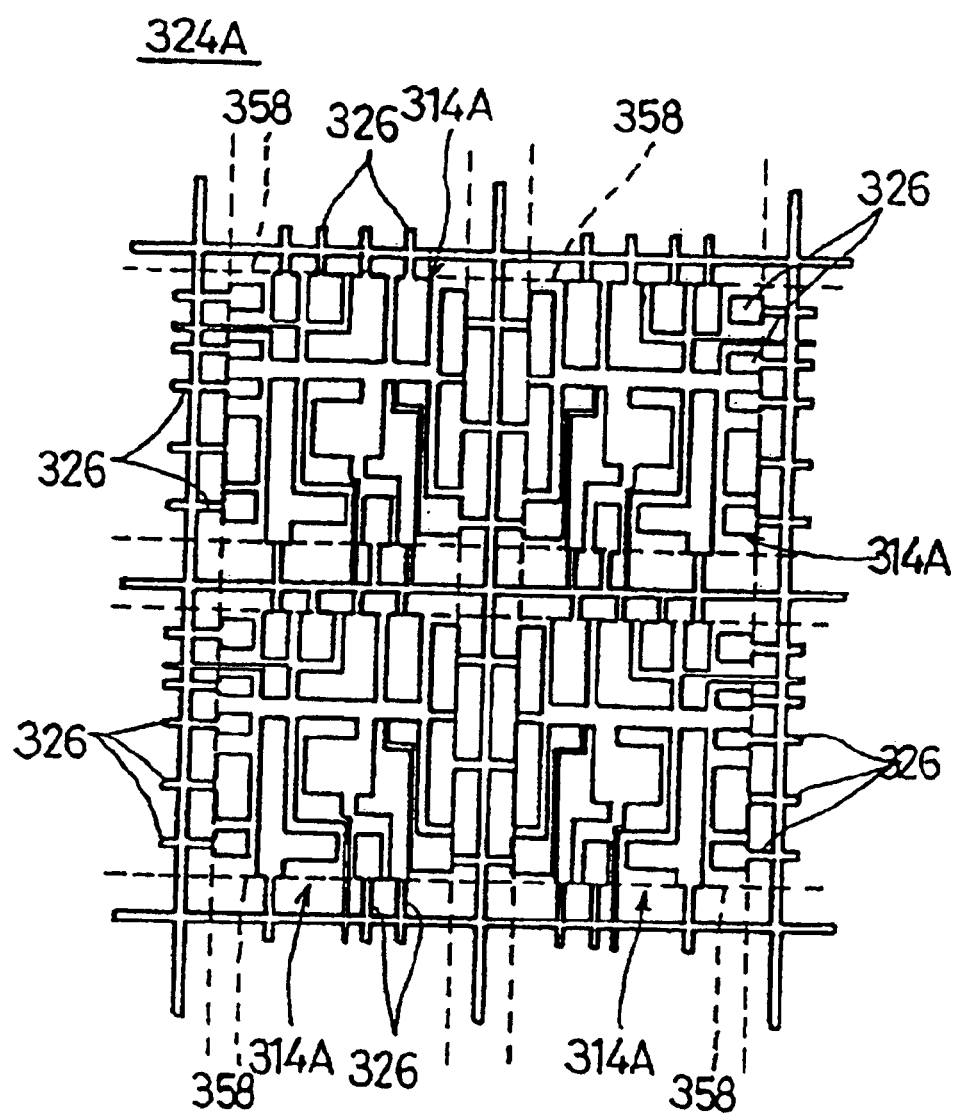

FIG. 136 is a diagram (part 1) showing a method for fabricating a semiconductor device according to a fifty sixth embodiment of the present invention.

Figure 137:
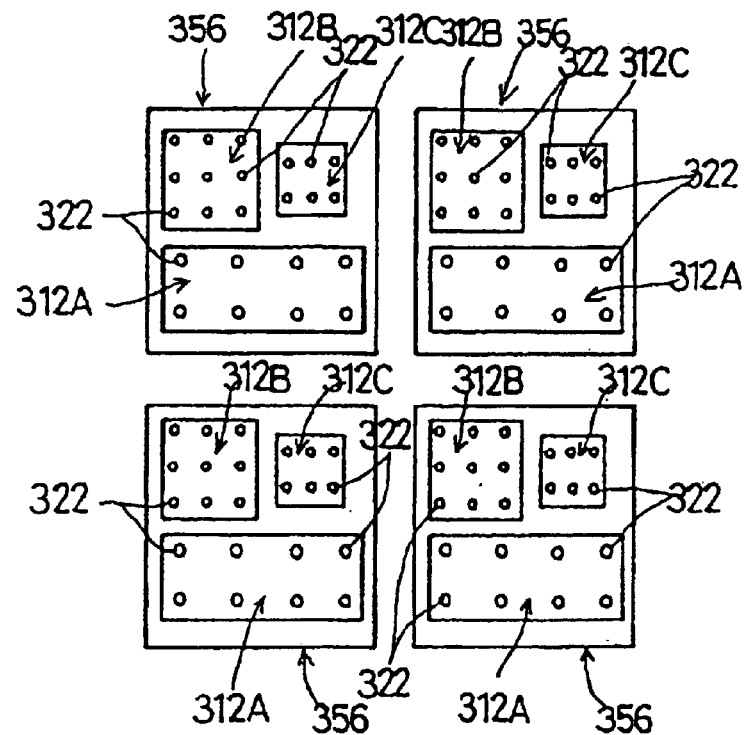

FIG. 137 is a diagram (part 2) showing a method for fabricating the semiconductor device according to the fifty sixth embodiment of the present invention.

Figure 138:
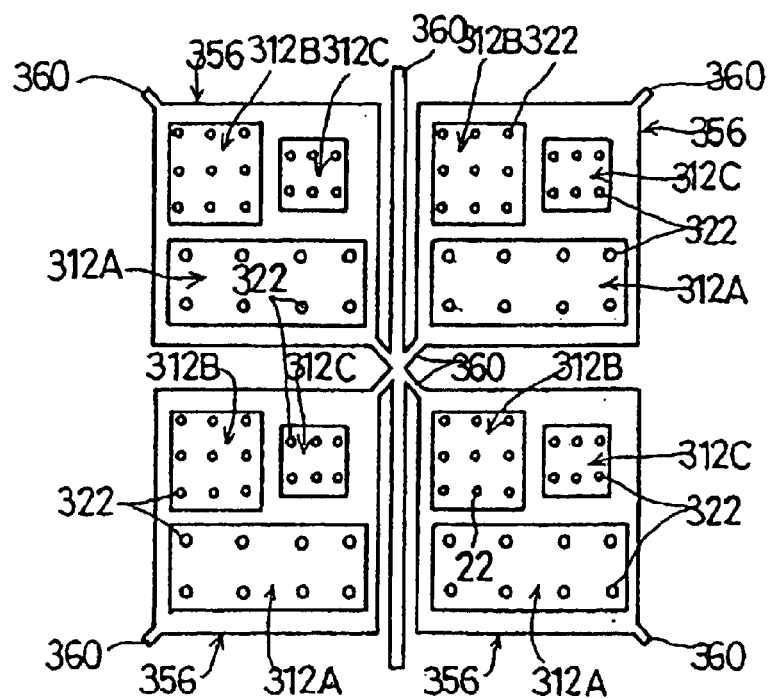

FIG. 138 is a diagram (part 3) showing a method for fabricating the semiconductor device according to the fifty sixth embodiment of the present invention.

Figure 139:
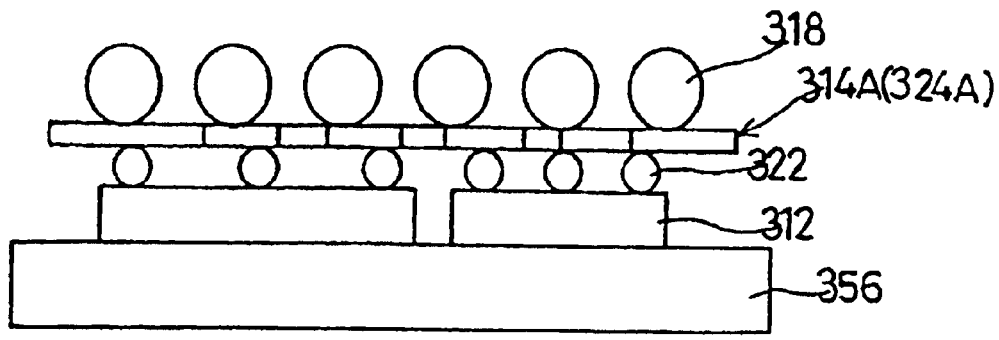

FIG. 139 is a diagram (part 4) showing a method for fabricating the semiconductor device according to the fifty sixth embodiment of the present invention.

Figure 140:
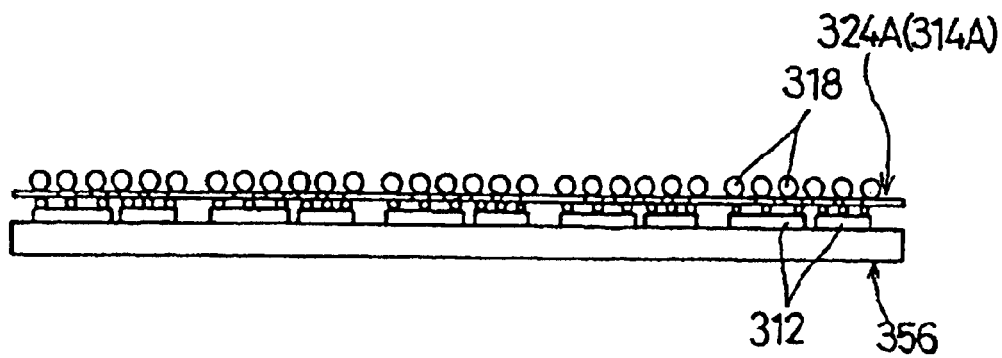

FIG. 140 is a diagram (part 5) showing a method for fabricating the semiconductor device according to the fifty sixth embodiment of the present invention.

Figure 141:
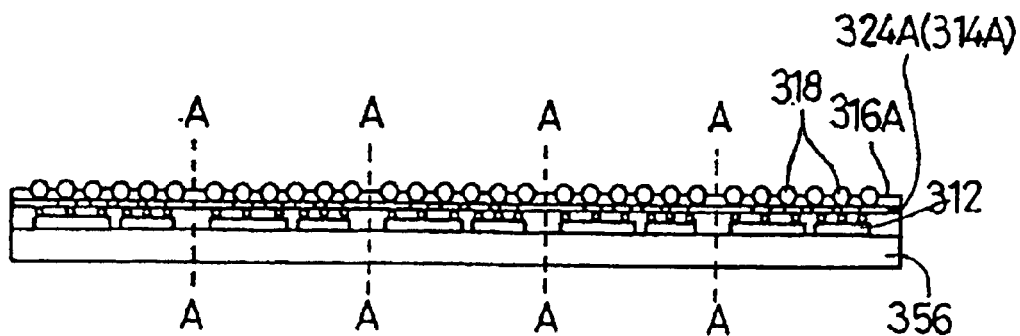

FIG. 141 is a diagram (part 6) showing a method for fabricating the semiconductor device according to the fifty sixth embodiment of the present invention.

Figure 142:
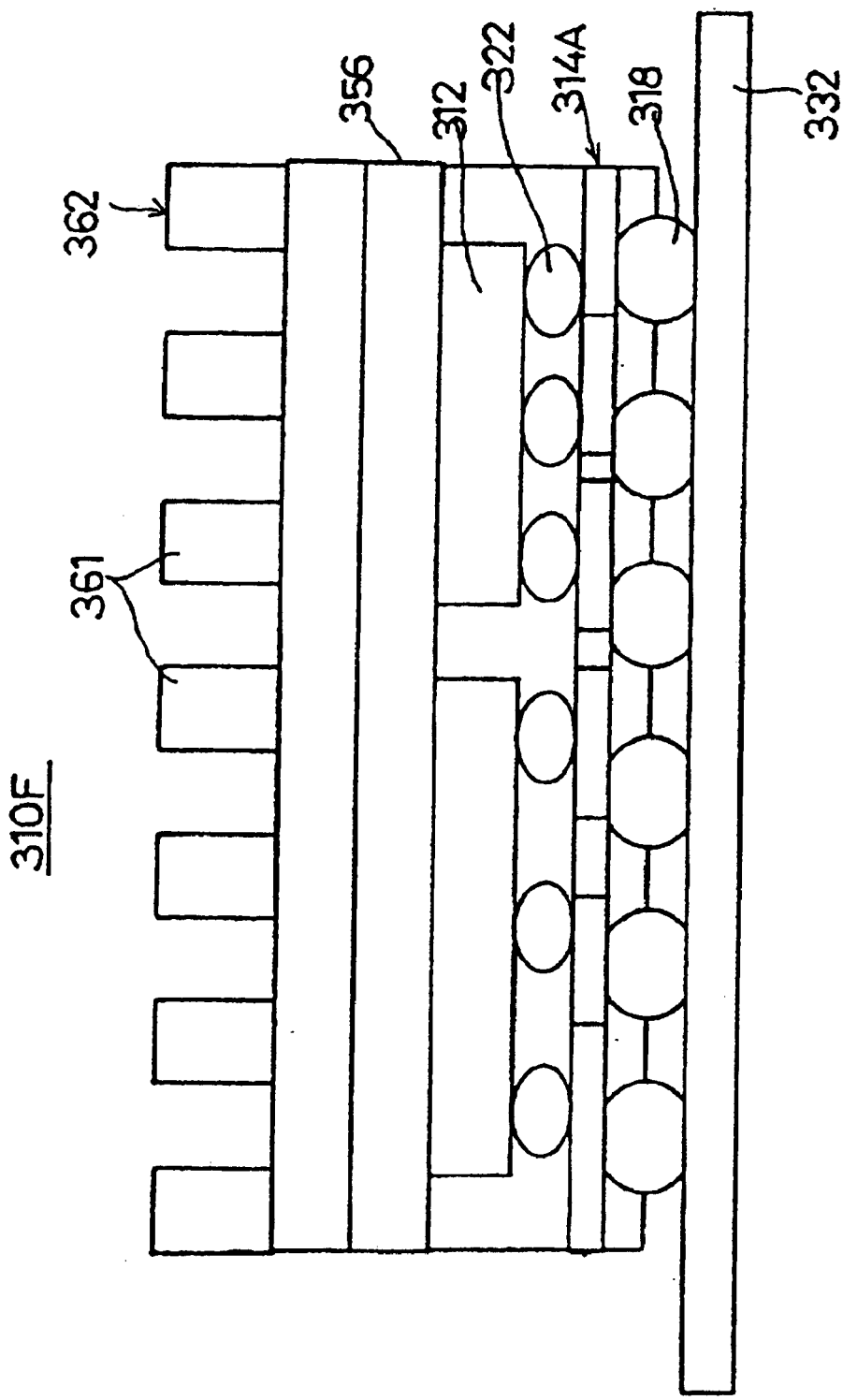

FIG. 142 is a diagram showing a semiconductor device according to a fifty ninth embodiment of the present invention.

Figure 143:
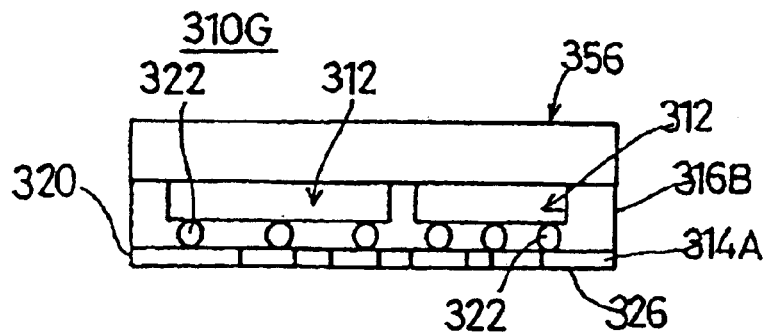

FIG. 143 is a diagram showing a semiconductor device according to a sixtieth embodiment of the present invention.

Figure 144:
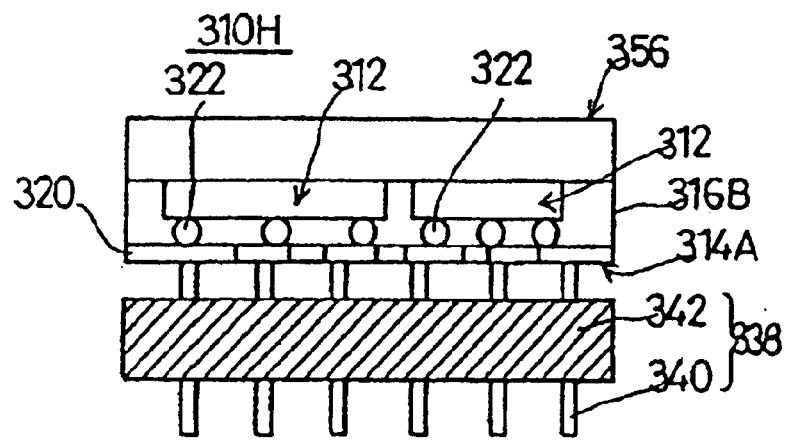

FIG. 144 is a diagram showing a semiconductor device according to a sixty first embodiment of the present invention.

Figure 145:
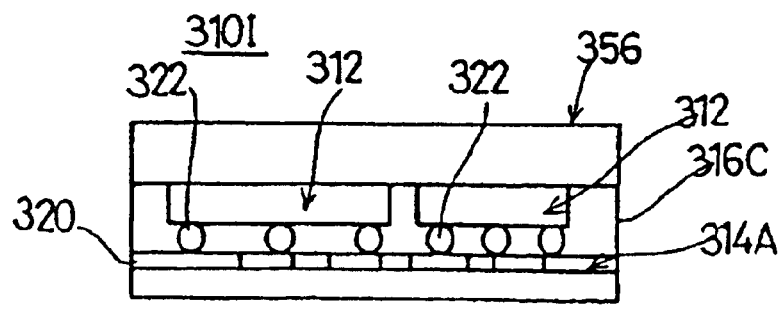

FIG. 145 is a diagram showing a semiconductor device according to a sixty second embodiment of the present invention.

Figure 146:
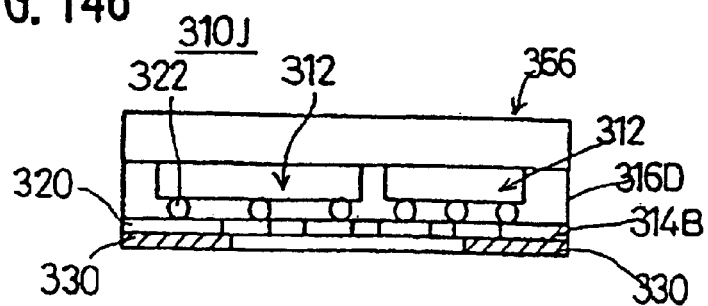

FIG. 146 is a diagram showing a semiconductor device according to a sixty third embodiment of the present invention.

Figure 147:
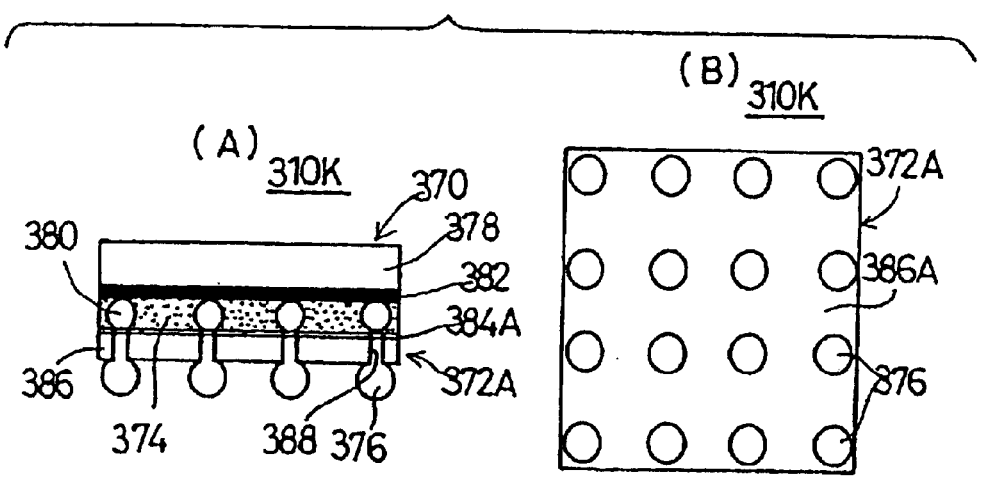

FIG. 147 is a diagram showing a semiconductor device according to a sixty fourth embodiment of the present invention.

Figure 148:
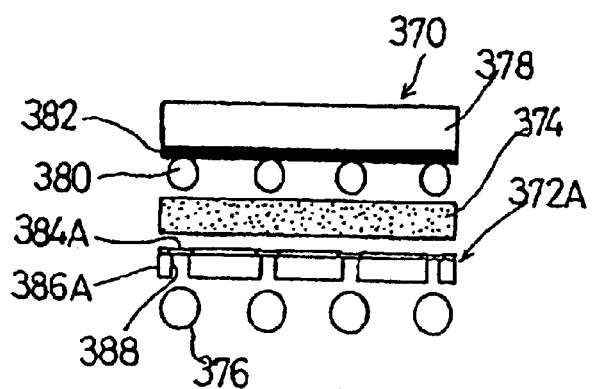

FIG. 148 is a diagram showing a method for fabricating a semiconductor device according to a fifty seventh embodiment of the present invention.

Figure 149:
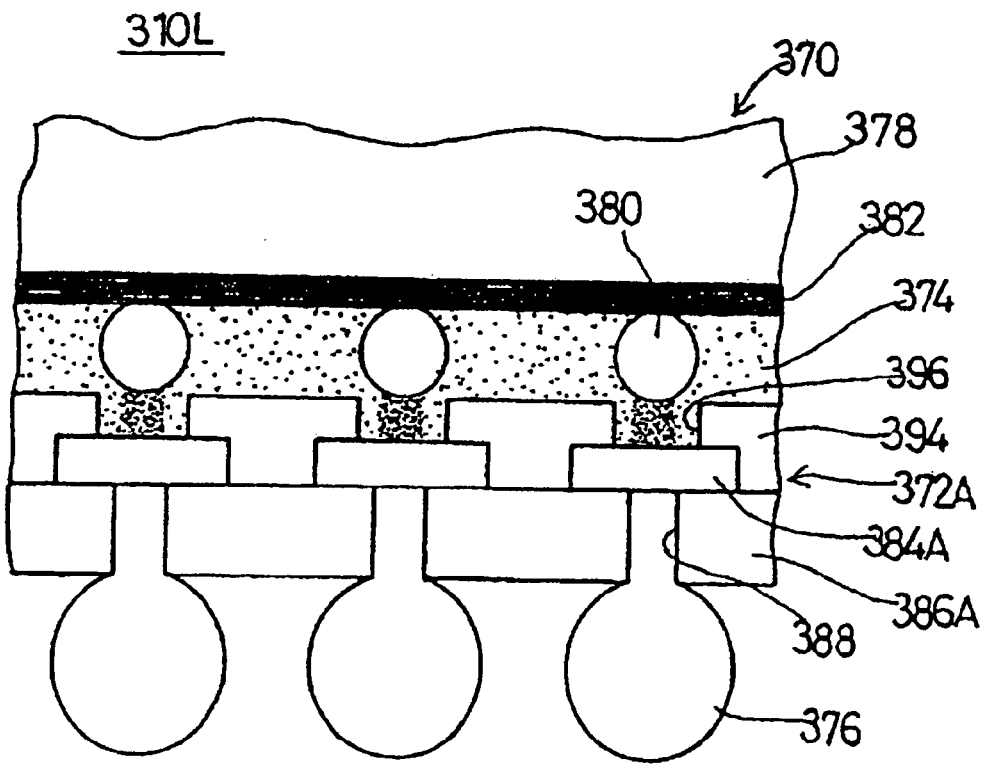

FIG. 149 is a diagram showing a semiconductor device according to a sixty fifth embodiment of the present invention.

Figure 150:
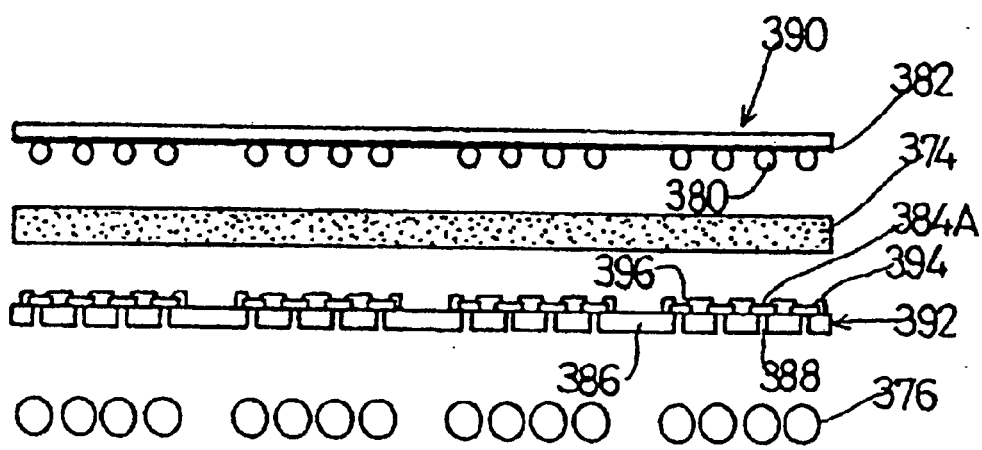

FIG. 150 is a diagram showing a method for fabricating a semiconductor device according to a fifty eighth embodiment of the present invention (part 1).

Figure 151:
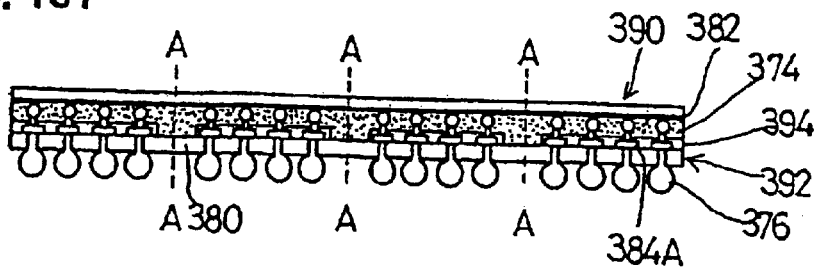

FIG. 151 is a diagram showing a method for fabricating a semiconductor device according to the fifty eighth embodiment of the present invention (part 2).

Figure 152:
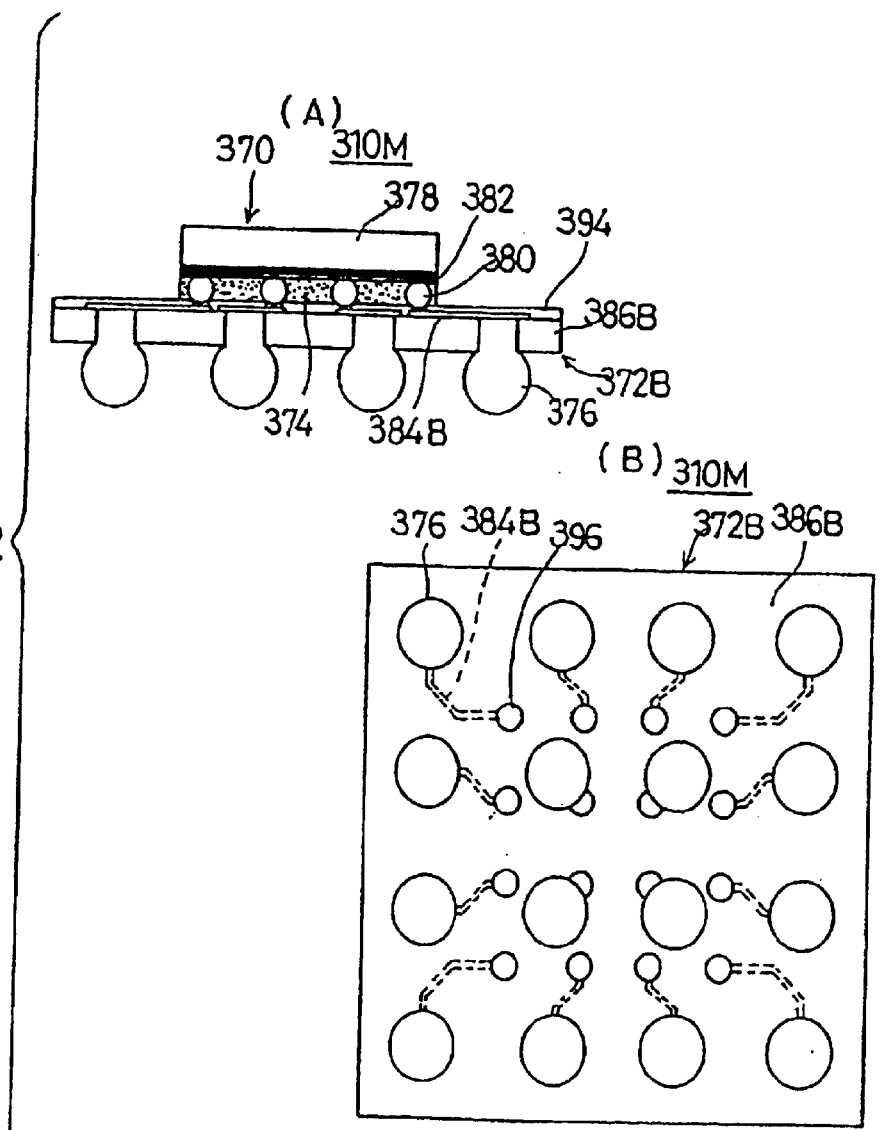

FIG. 152 is a diagram showing a semiconductor device according to a sixty sixth embodiment of the present invention.

Figure 153:
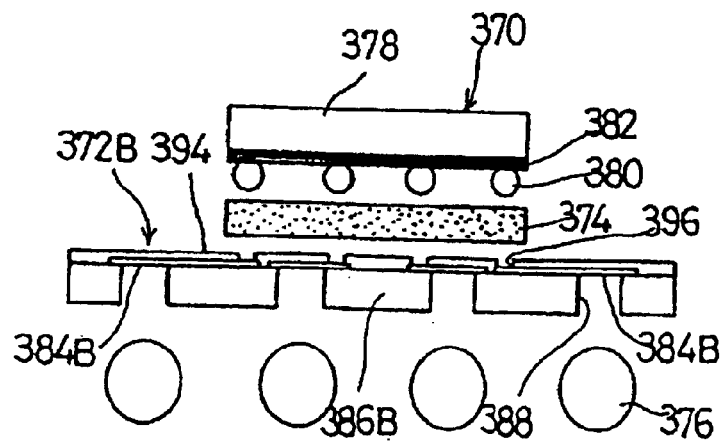

FIG. 153 is a diagram showing a method for fabricating a semiconductor device according to a fifty ninth embodiment of the present invention.

Figure 154:
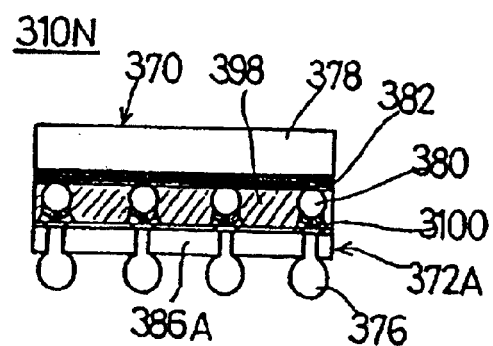

FIG. 154 is a diagram showing a semiconductor device according to a sixty seventh embodiment of the present invention.

Figure 155:
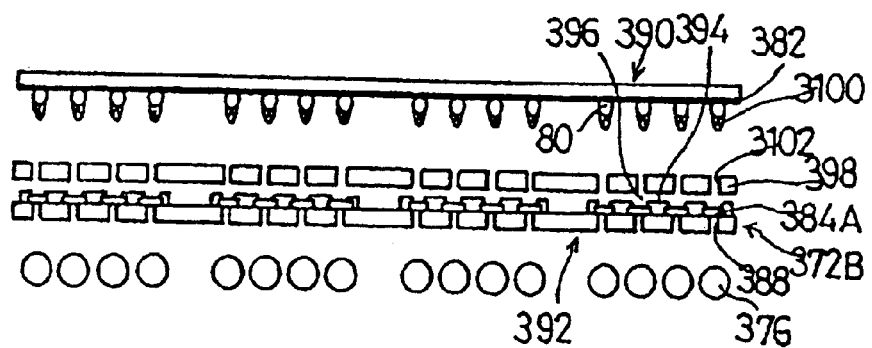

FIG. 155 is a diagram showing a method for fabricating a semiconductor device according to a sixtieth embodiment of the present invention (part 1).

Figure 156:
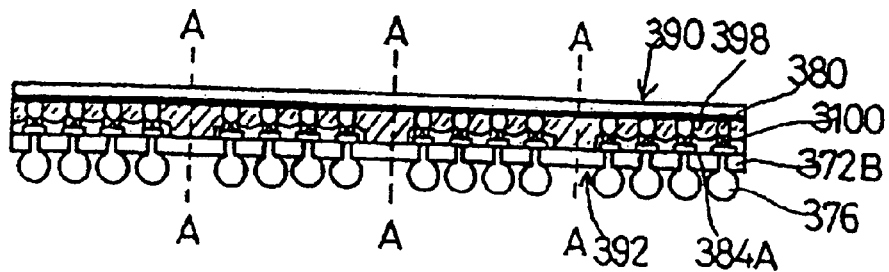

FIG. 156 is a diagram showing the method for fabricating a semiconductor device according to the sixtieth embodiment of the present invention (part 2).

Figure 157:
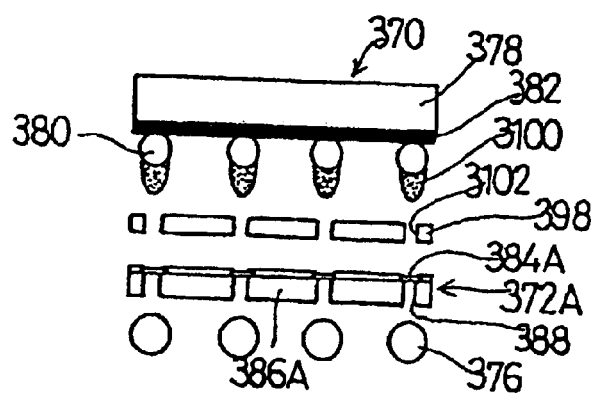

FIG. 157 is a diagram showing the method for fabricating a semiconductor device according to the sixtieth embodiment of the present invention (part 3).

Figure 158:
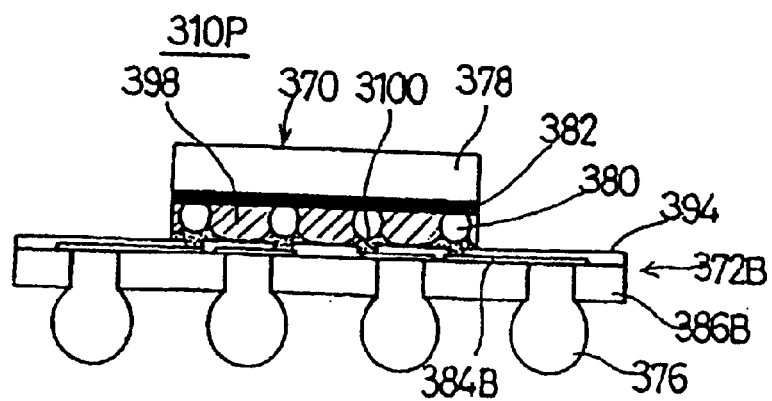

FIG. 158 is a diagram showing a semiconductor device according to a sixty eighth embodiment of the present invention.

Figure 159:
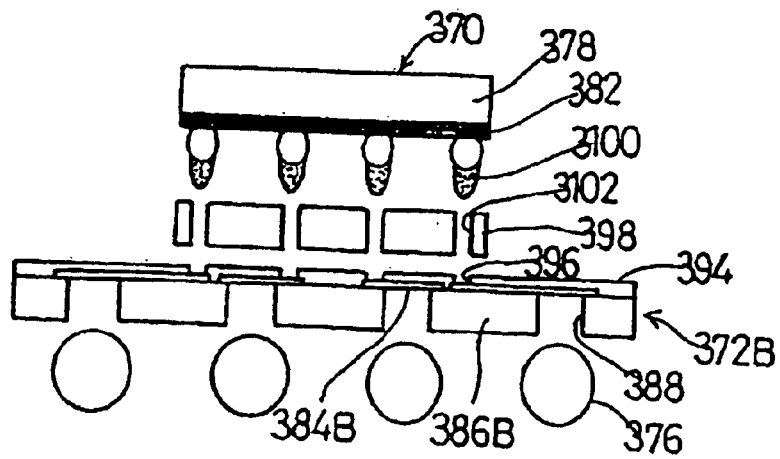

FIG. 159 is a diagram showing a method for fabricating a semiconductor device according to a sixty first embodiment of the present invention.

Figure 160:
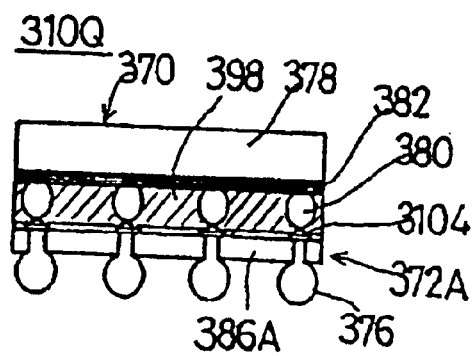

FIG. 160 is a diagram showing a semiconductor device according to a sixty ninth embodiment of the present invention.

Figure 161:
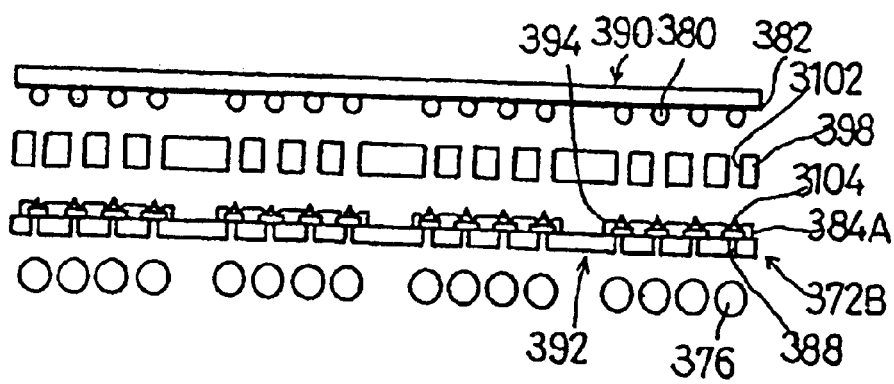

FIG. 161 is a diagram showing a method for fabricating a semiconductor device according to a sixty second embodiment of the present invention (part 1).

Figure 162:
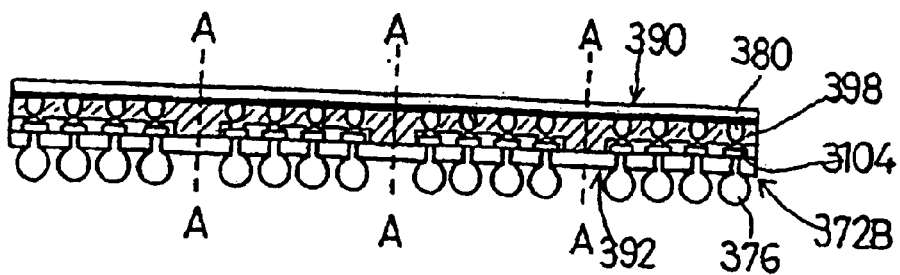

FIG. 162 is a diagram showing the method for fabricating a semiconductor device according to the sixty second embodiment of the present invention (part 2).

Figure 163:
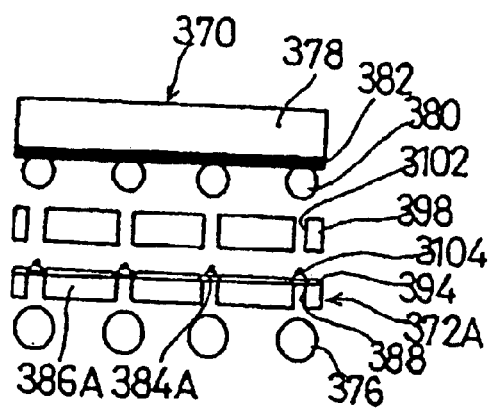

FIG. 163 is a diagram showing the method for fabricating a semiconductor device according to the sixty second of the present invention (part 3).

Figure 164:
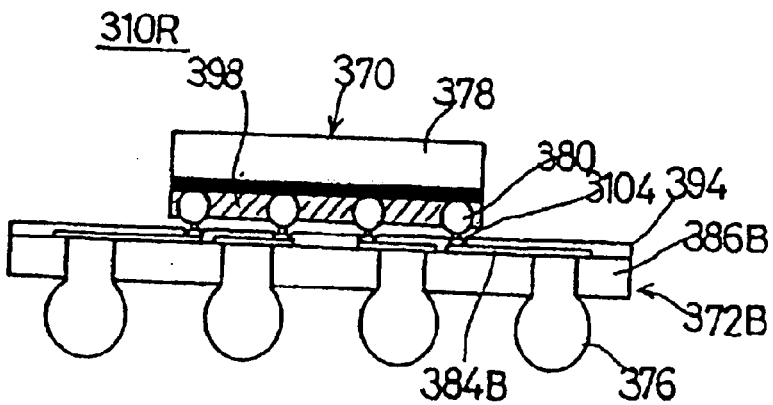

FIG. 164 is a diagram showing a semiconductor device according to a seventieth embodiment of the present invention.

Figure 165:
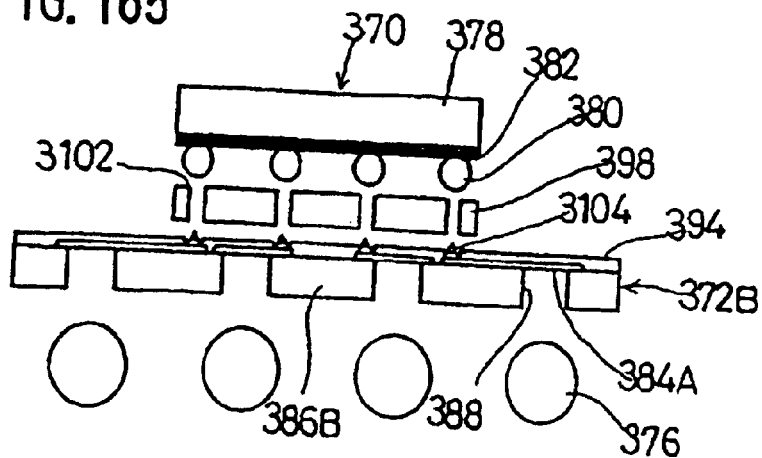

FIG. 165 is a diagram showing a method for fabricating a semiconductor device according to a sixty third embodiment of the present invention.

Figure 166:
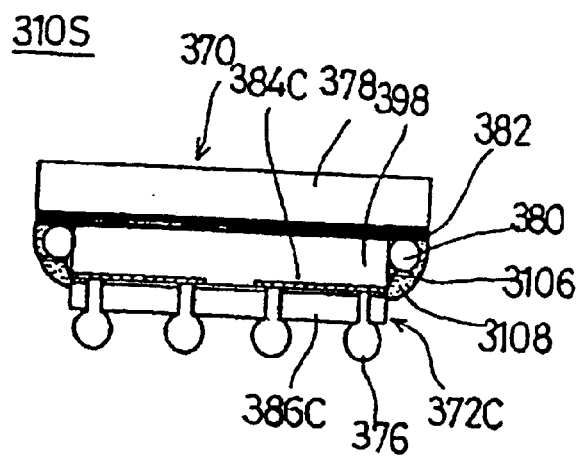

FIG. 166 is a diagram showing a semiconductor device according to a seventy first embodiment of the present invention.

Figure 167:
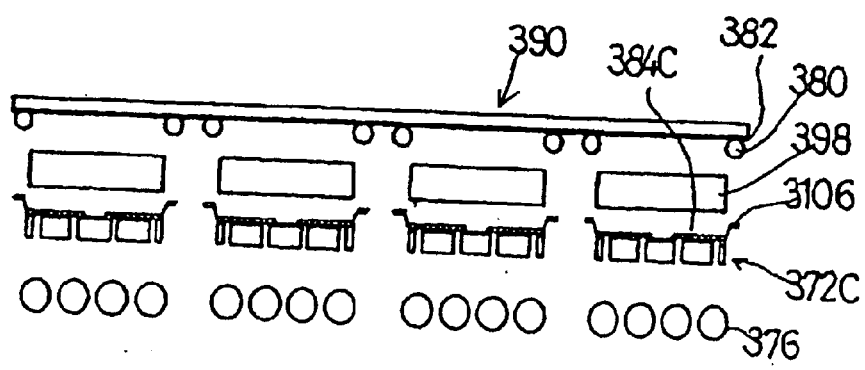

FIG. 167 is a diagram showing a method for fabricating a semiconductor device according to a sixty fourth embodiment of the present invention (part 1).

Figure 168:
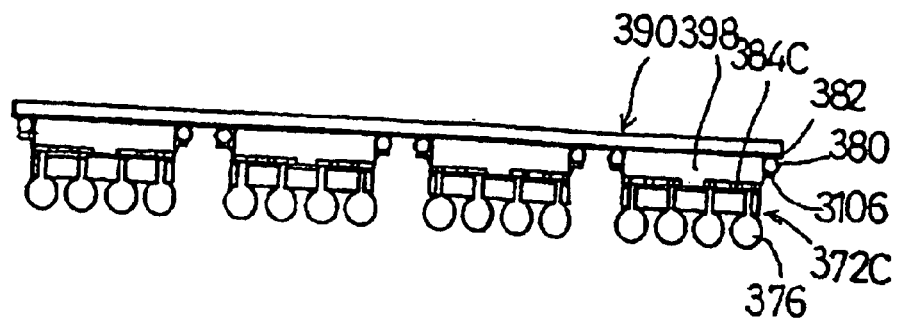

FIG. 168 is a diagram showing the method for fabricating a semiconductor device according to the sixty fourth embodiment of the present invention (part 2).

Figure 169:
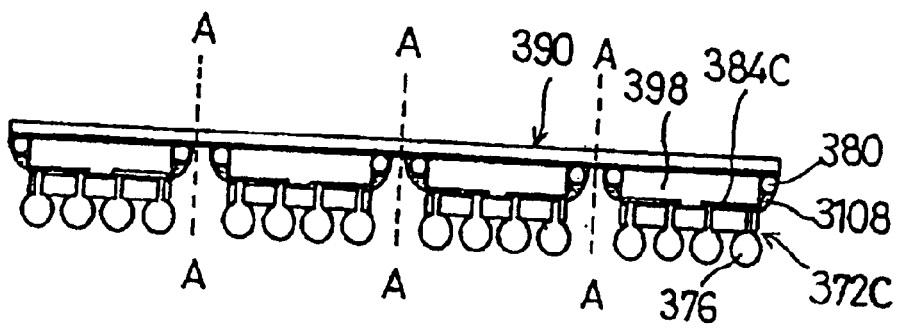

FIG. 169 is a diagram showing the method for fabricating a semiconductor device according to the sixty fourth of the present invention (part 3).

Figure 170:
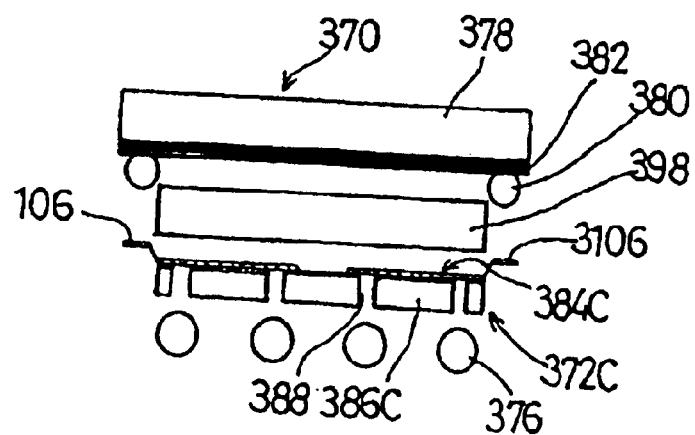

FIG. 170 is a diagram showing the method for fabricating a semiconductor device according to the sixty fourth embodiment of the present invention (part 4).

Figure 171:
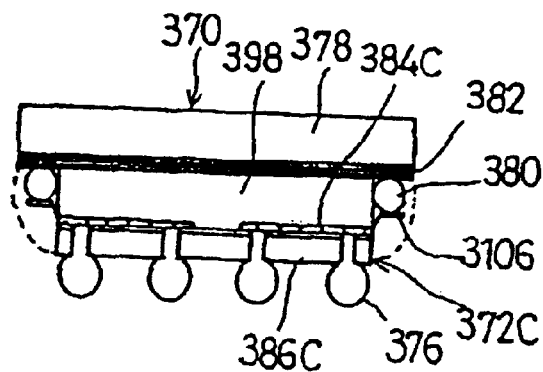

FIG. 171 is a diagram showing the method for fabricating a semiconductor device according to the sixty fourth of the present invention (part 5).

Figure 172:
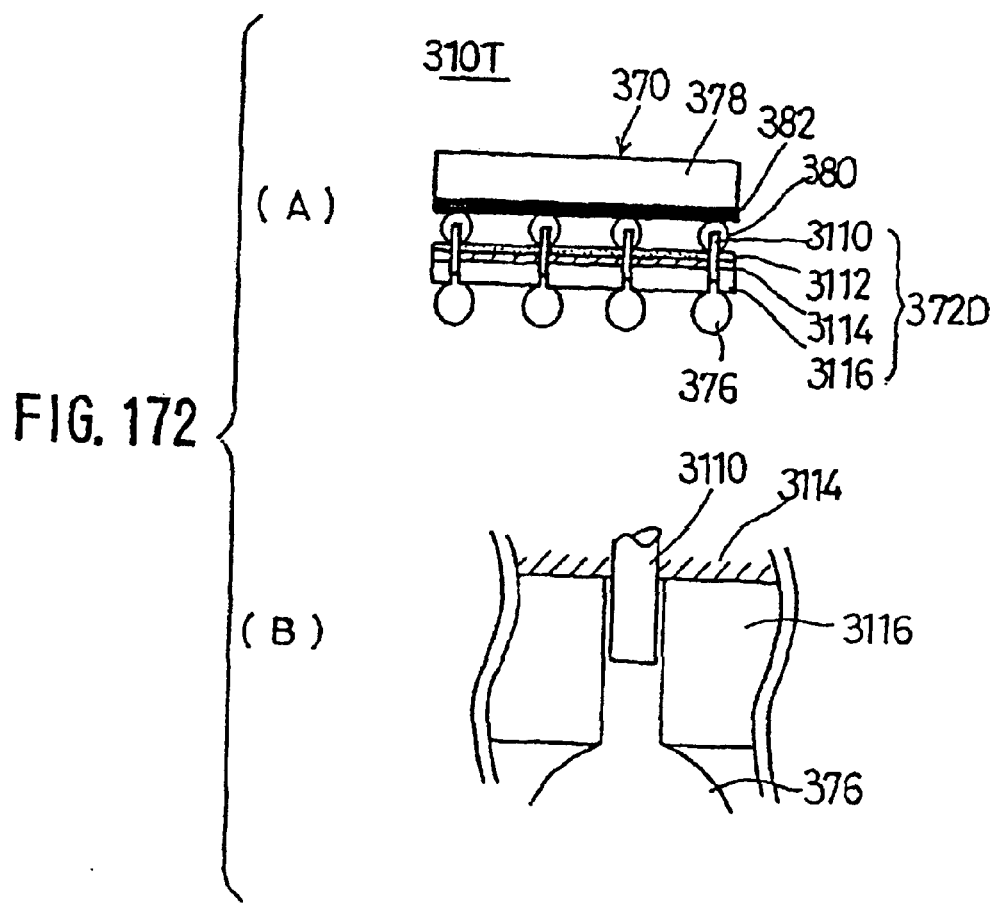

FIG. 172 is a diagram showing a semiconductor device according to a seventy second embodiment of the present invention.

Figure 173:
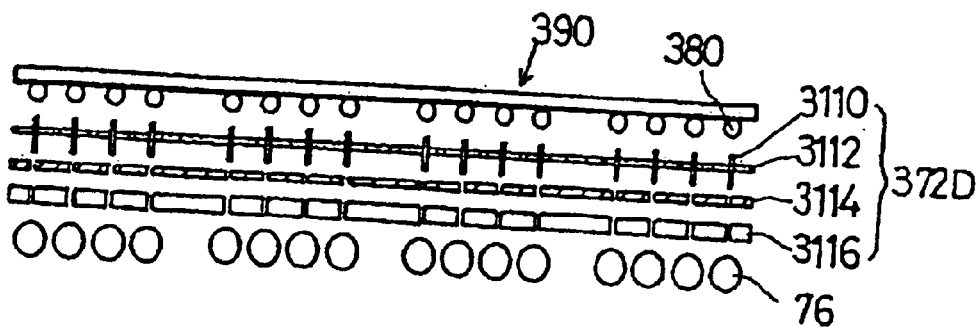

FIG. 173 is a diagram showing a method for fabricating a semiconductor device according to a sixty fifth embodiment of the present invention (part 1).

Figure 174:
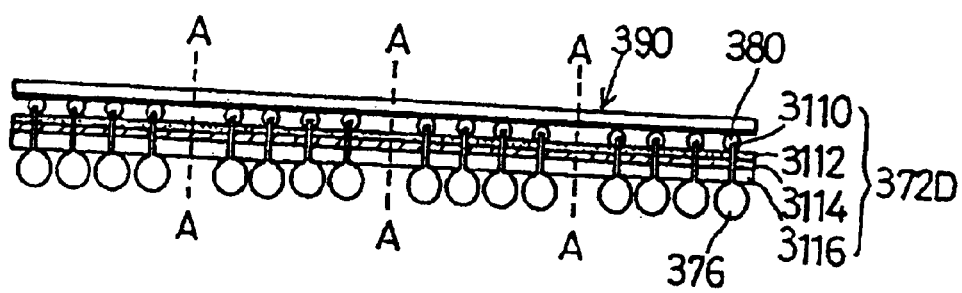

FIG. 174 is a diagram showing the method for fabricating a semiconductor device according to the sixty fifth embodiment of the present invention (part 2).

Figure 175:
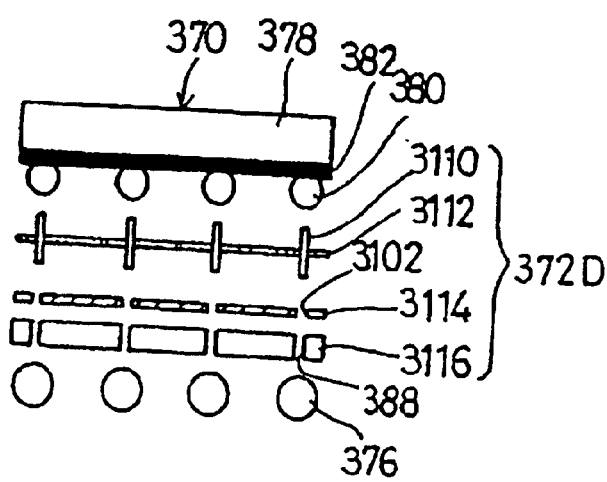

FIG. 175 is a diagram showing the method for fabricating a semiconductor device according to the sixty fifth of the present invention (part 3).

Figure 176:
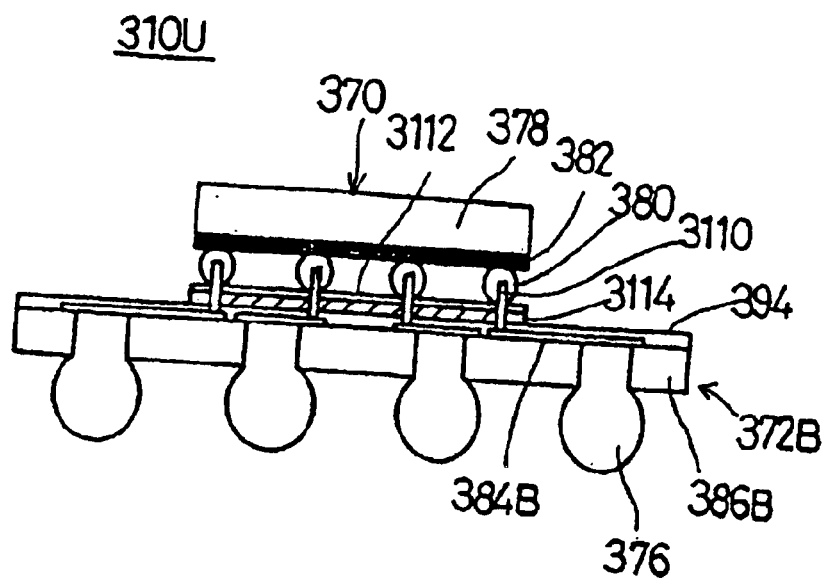

FIG. 176 is a diagram showing a semiconductor device according to a seventy third embodiment of the present invention.

Figure 177:
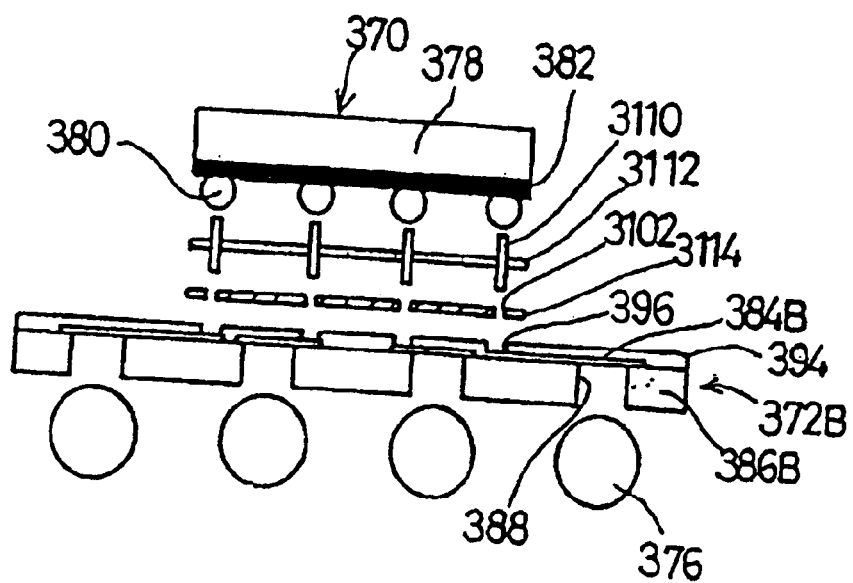

FIG. 177 is a diagram showing a method for fabricating a semiconductor device according to a sixty sixth embodiment of the present invention.

BEST MODES CARRYING OUT THE INVENTION

A description will be given, with reference to the accompanying drawings, of embodiments of the present invention.

FIGS. 1 through 8 show a method for fabricating a semiconductor device according to a first embodiment of the present invention in accordance with a production sequence. FIG. 9 shows a semiconductor device 10 fabricated by the fabrication method according to the first embodiment of the present invention.

First, referring to parts (A) and (B) of FIG. 9, a description will be given of the semiconductor device 10 fabricated by the fabrication method shown in FIGS. 1 through 8 according to the first embodiment of the present invention. The semiconductor device 10 has a very simple structure, which is generally made up of a semiconductor element 11, bumps 12 serving as protruding electrodes, and a resin layer 13.

The semiconductor element 11 (semiconductor chip) has a semiconductor substrate on which electronic circuits are formed. A large number of bumps 12 are arranged on a mount surface of the semiconductor substrate. The bumps 12 are provided by, for example, arranging semiconductor balls on the mount surface by a transfer method, and function as external connection electrodes. In the present embodiment, the bumps 12 are provided directly on electrode pads (not shown) formed on the semiconductor element 11.

The resin layer 13 (indicated by a pear-skin illustration) is formed of, for example, thermosetting resin such as polyimide and epoxy resin (PPS, PEK, PES and thermoplastic resin such as heat-resistant liquid crystal resin), and is provided on the whole bump formation surface of the semiconductor element 11. Hence, the bumps 12 arranged on the semiconductor element 11 are sealed by the resin layer 13 so that ends of the bumps 12 are exposed from the resin layer 13. That is, the resin layer 13 is provided to the semiconductor element 11 so as to seal the bumps 12 except for the ends thereof.

The semiconductor device 10 having the above structure has a chip-size package structure in which the whole size thereof is approximately equal to the size of the semiconductor chip 11. Hence, the semiconductor 10 sufficiently meets a recent requirement for down sizing.

As described above, the semiconductor device 10 has the resin layer 13 which is provided on the semiconductor element 11 and seals the bumps 12 so that the ends thereof are exposed. Hence, the bumps 12 which are liable to take scratches are protected by the resin layer 13, which thus has the same function as the under fill resin 6 conventionally used (see FIG. 78).

That is, it is possible to prevent occurrence of a break of the bonded portions between the semiconductor element 11, the bumps 12, a mount board 14, the bumps 12 and connection electrodes 15 and a break of the bonded portions between the bumps 12 and the semiconductor element 11.

FIG. 9(B) is a diagram for explaining a method for mounting the semiconductor device 10 on the mount board 14. The connection electrodes 15 formed on the mount board 14 and the bumps 12 are positioned in order to mount the semiconductor device 10 on the mount board 14.

Before the above mounting process, the resin layer 13 are provided beforehand to the semiconductor element 11 of the semiconductor device 10. Hence, it is not necessary to fill the space between the semiconductor element 11 and the mount board 14 with the under fill resin in the step of mounting the semiconductor device 10 on the mount board 14. Hence, the mounting process can be performed easily.

In the mounting process, a heat process is executed in order to bond the solder bumps 12 to the connection electrodes 15. The bumps 12 provided to the semiconductor element 11 are protected by the resin layer 13. Hence, even if a difference in thermal expansion between the semiconductor element 11 and the mount board 14 occurs, the mounting process can definitely be carried out.

Even if heat is applied after the semiconductor device 10 is mounted on the mount board 14 and a thermal expansion difference occurs, the bumps 12 can definitely be retained by the resin layer 13 and can thus be prevented from flaking off the connection electrodes 15. Hence, the reliability of mounting the semiconductor device 10 can be improved.

A description will be given, with reference to FIGS. 2 through 9, of the method for fabricating the semiconductor device 10 (a fabrication method according to the first embodiment of the present invention.

The semiconductor device 10 can be fabricated by a fabrication process which is generally made up of a semiconductor element forming step, a bump formation step, a resin sealing step, a protruding electrodes exposure step, and a mold detaching step. The semiconductor element forming step is directed to forming a circuit on the substrate by using the eximer laser technique or the like. The bump formation step is directed to forming the bumps 12 on the surface of the semiconductor element 11 on which a circuit is formed by the transfer method.

The semiconductor element formation step and the bump formation step can be performed by the well-known technique, while the present invention has essential features mainly related to the resin sealing step and following steps. Thus, the following description is mainly addressed to the resin sealing step and some steps following the resin sealing step.

FIGS. 1 through 5 show the resin sealing step.

The resin sealing step is further subdivided into a substrate loading step, a resin layer forming step, and a mold detaching step. The resin sealing step commences loading a substrate 16 (wafer) onto a mold 20 for fabricating semiconductor devices, a large number of bumps 12 being formed on the substrate 16 through the semiconductor element formation step and the bump formation step.

A description will now be given of the mold 20 for use in fabrication of semiconductor devices (hereinafter merely referred to as mold 20) according to the first embodiment of the present invention.

The mold 20 is made up of an upper mold 21 and a lower mold 22, which are respectively equipped with heaters that are not shown. A sealing resin 35 which will be described later can be heated and fused by the heaters.

The upper mold 21 can be elevated in directions Z1 and Z2 indicated by an arrow by means of an elevating apparatus that is not shown. The lower surface of the upper mold 21 is a cavity surface 21a, which is flat. The upper mold 21 has a very simple shape, which can be produced at a less-expensive cost.

The lower mold 22 is made up of a first lower mold half body 23 and a second lower mold half body 24. The first lower mold half body 23 has a shape that corresponds to the shape of the substrate 16, and is, more particularly, slightly greater than the substrate 16. The substrate 16 is loaded onto a cavity surface 25 formed on the upper surface of the first lower mold half body 23.

The second lower mold half body 24 has an approximately ring shape which surrounds the first lower mold half body 23. The second lower mold half body 24 can be elevated in the directions indicated by the arrows Z1 and Z2 by means of an elevating apparatus which is not shown. The second lower mold half body 24 has an inner peripheral wall which defines a cavity surface 26. A slant surface 27 facilitating a mold detaching step is formed in a given upper range of the cavity surface 26.

Figure 1:
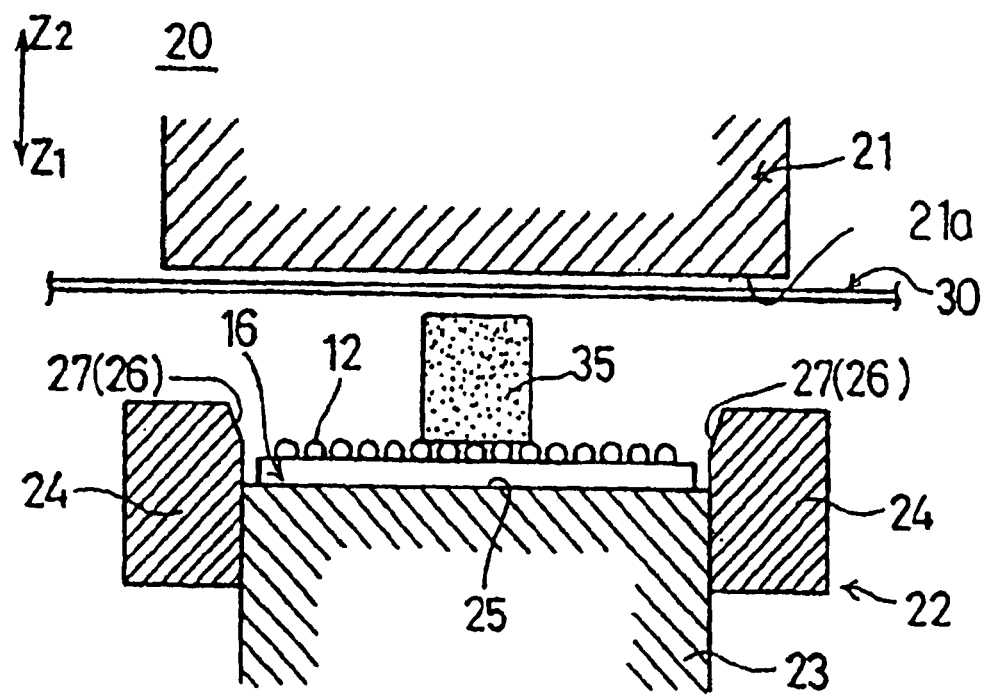
FIG. 1 is a diagram of a resin sealing step of a method for fabricating a semiconductor device according to a first embodiment of the present invention and a mold for fabricating a semiconductor device according to the first embodiment of the present invention.
Figure 1A:
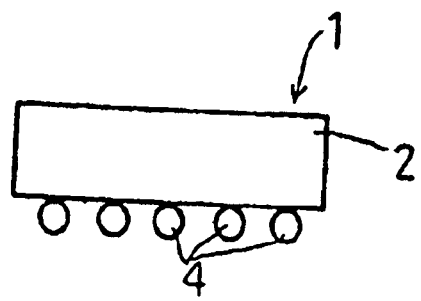
FIGS. 1A-1C are diagrams showing a conventional semiconductor device and its fabrication method.
Figure 1B:
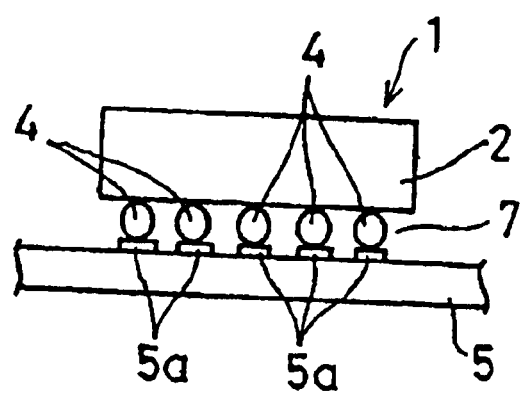
Figure 1C:
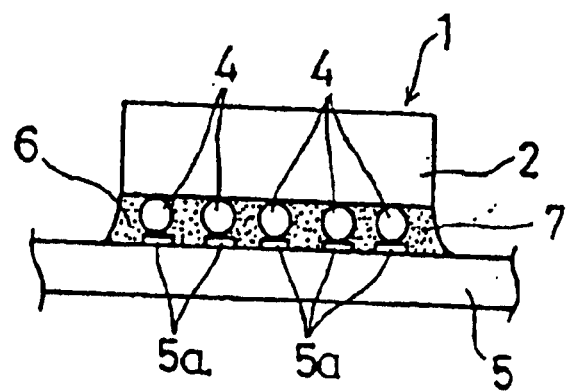

In the state immediately after the resin sealing step is started, as shown in FIG. 1, the second lower mold half body 24 is located above the first lower mold half body 23 in the direction Z2. Hence, the substrate 16 can be placed in a recess (cavity) defined by the first and second mold half bodies 23 and 24. The substrate 16 is loaded so that the surface on which the bumps 12 are provided faces upwards. Hence, the bumps 12 on the substrate 16 in the loaded state face the upper mold 21.

After the substrate 16 is loaded onto the lower mold 22, a film 30 is provided below the upper mold 21 so that it does not have any deformation. Then, the sealing resin is placed on the bumps 12 of the substrate 16.

The film 30 can be formed of, for example, polyimide, chloroethylene, PC, Pet, statical resin, paper such as synthetic paper, metallic foil or a composition thereof, and is required not to be degraded by heat applied at the time of molding the resin. Further, the film 30 is required to have a given elasticity in addition to the above heat-resistance performance. The given elasticity is defined so that it allows the ends of the bumps 12 to fall in the film 30 at the time of sealing, which will be described later.

Figure 2:
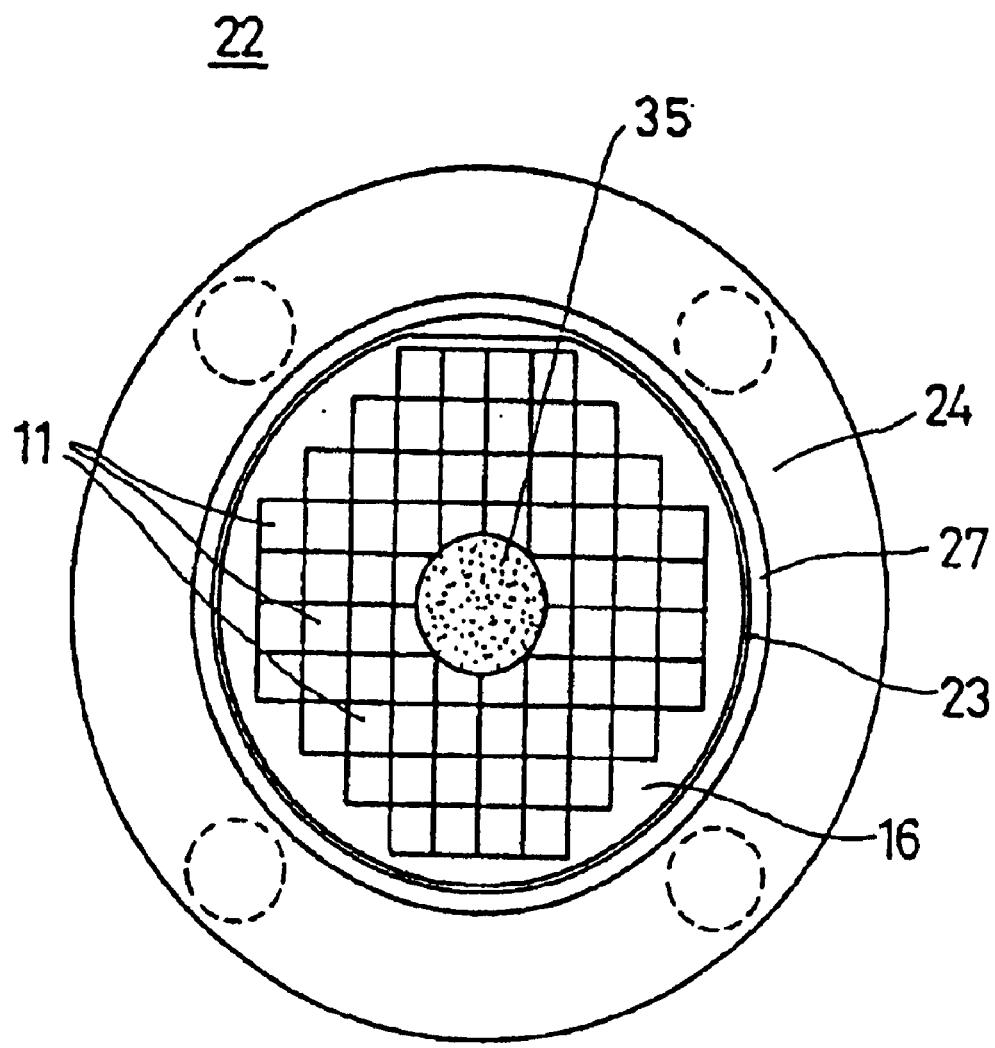
FIG. 2 is a diagram showing the resin sealing step in the method for fabricating the semiconductor device according to the first embodiment of the present invention.

The sealing resin 35 is formed of resin such as polyimide, epoxy resin (PPS, PEEK, PES and thermoplastic resin such as heat-resistant liquid crystal resin). In the present embodiment, the sealing resin 35 has a cylindrical shape. The sealing resin 35 is positioned in the center of the substrate 16, as shown in FIG. 2 (which is a plan view of the lower mold 22). The above is the substrate loading step.

In the substrate loading step, the arranging of the film 30 is not limited to the time after the substrate 16 is loaded onto the lower mold 22 but may be carried out before the substrate 16 is loaded.

Subsequent to the substrate loading step, the resin layer forming step is carried out. After the resin layer forming step is initiated, it is confirmed that the temperature of the sealing resin 35 is raised, due to heating through the mold 20, to a level which can fuse the resin 35 (it will not be required to confirm the temperature of the resin 35 if the resin 35 is not high). Then, the upper mold 21 is moved in the direction Z1.

Figure 3:
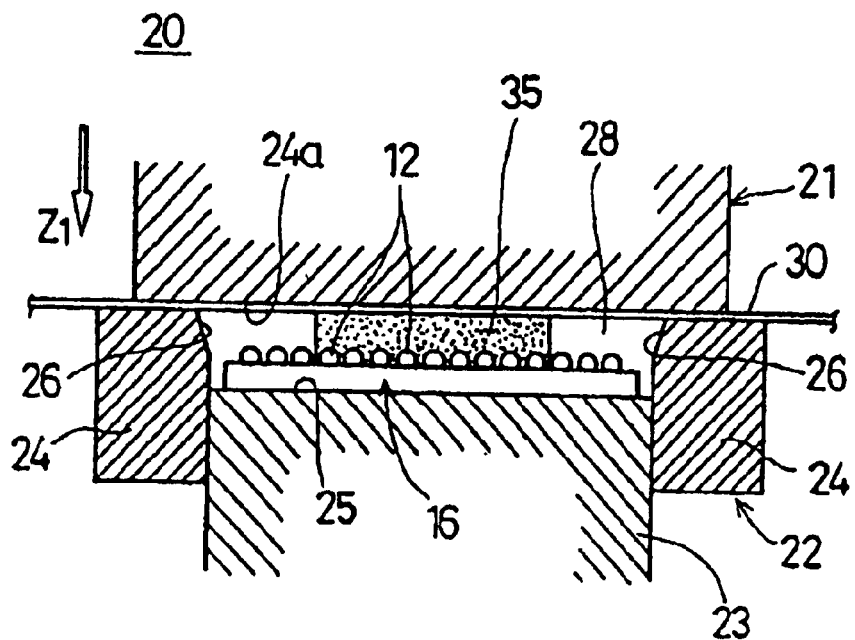
FIG. 3 is another diagram showing the resin sealing step in the method for fabricating the semiconductor device according to the first embodiment of the present invention.

Then, the upper mold 21 comes into contact with the upper surface of the lower mold half body 24. Then, the film arranged below the upper mold 21 is cramped between the upper mold 21 and the second lower mold half body 24, as shown in FIG. 3. At this time, the cavity 28 is defined in the mold 21 by the cavity surfaces 24a, 25 and 26.

The sealing resin 35 is compression-urged by the upper mold 21 moving the direction Z1 through the film 30, and is heated to the temperature which fuses the sealing resin 35. Thus, as shown, the sealing resin 35 becomes wider on the substrate 16.

After the upper mold 21 comes into contact with the second lower mold half body 24, the upper mold 21 and the second lower mold half body 24 maintain the film 30 in the cramped state and integrally moves down in the direction Z1. That is, the upper mold 21 and the second lower mold half body 24 move together in the direction Z1.

The first lower mold half body 23 of the lower mold 22 is maintained in the fixed state. Hence, the volume of the cavity 28 is decreased as the upper mold 12 the second lower mold half body 24 move in the direction Z1. Hence, the sealing resin 35 is compressed and molded in the cavity 28 (the above resin molding method is called compression molding method).

More specifically, the sealing resin 35 placed in the center of the substrate 16 is softened by heating and is compressed by the descent of the upper mold 21. Hence, the sealing resin 35 is pressed and widened so that it extends towards the outer peripheral from the center position. Thus, the bumps 12 provided on the substrate 16 are successively sealed by the sealing resin 35 towards the outer periphery from the center portion.

During the above step, if the upper mold 21 and the second lower mold half body 24 move at a relatively high speed, the compression pressure generated by the compression molding will be increased to a level which may damage the bumps 12. If the upper mold 21 and the second lower mold half body 24 move at a relatively low speed, the efficiency in fabrication will be degraded. With the above in mind, the moving speed of the upper mold 21 and the second lower mold half body 24 is selected to an appropriate value at which the above two problems do not occur.

Figure 4:
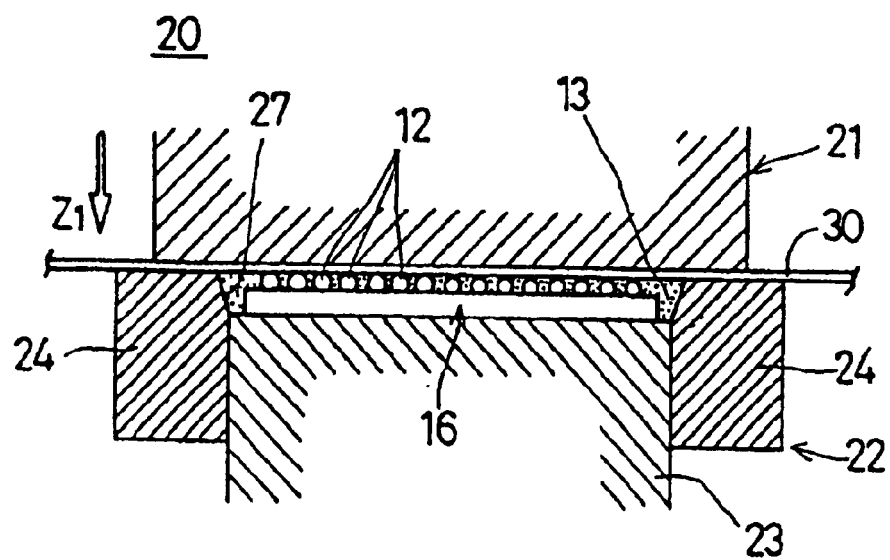
FIG. 4 is yet another diagram showing the resin sealing step in the method for fabricating the semiconductor device according to the first embodiment of the present invention.

The upper mold 21 and the second lower mold half body 24 move down until the film 30 clamped comes into contact with the bumps 12 with pressure. In the state in which the film 30 contacts the bumps 20 with a pressure, the sealing resin 35 seals all the bumps 12 and the substrate 16. FIG. 4 shows a state in which the resin layer forming step is completed. In this state, the film 30 is urged towards the substrate 16 and is in contact therewith with a pressure. Hence, the ends of the bumps 12 fall in the film 30. Further, the sealing resin 35 is provided on the entire surface of the substrate 16, so that the resin layer 13 sealing the bumps 12 is formed.

The amount of resin of the resin layer 35 is obtained, beforehand so that the resin layer 13 has a height approximately equal to that of the bumps 12 when the resin layer forming step is completed. By selecting an appropriate amount of resin beforehand, it is possible to prevent excessive resin from flowing out of the mold 20 and prevent occurrence of incomplete sealing of the bumps 12 and the substrate 16 by an insufficient amount of resin.

The resin layer forming step is followed by the mold detaching step. The mold detaching step commences moving up the upper mold 21 in the direction Z2. The resin layer 13 is fixed to the slant portion 27 of the second lower mold half body 24. Hence, the substrate 16 and the resin layer 13 are retained in the lower mold 22. Hence, only upper mold 21 is detached from the film 30 by lifting the upper mold 21.

Figure 5:
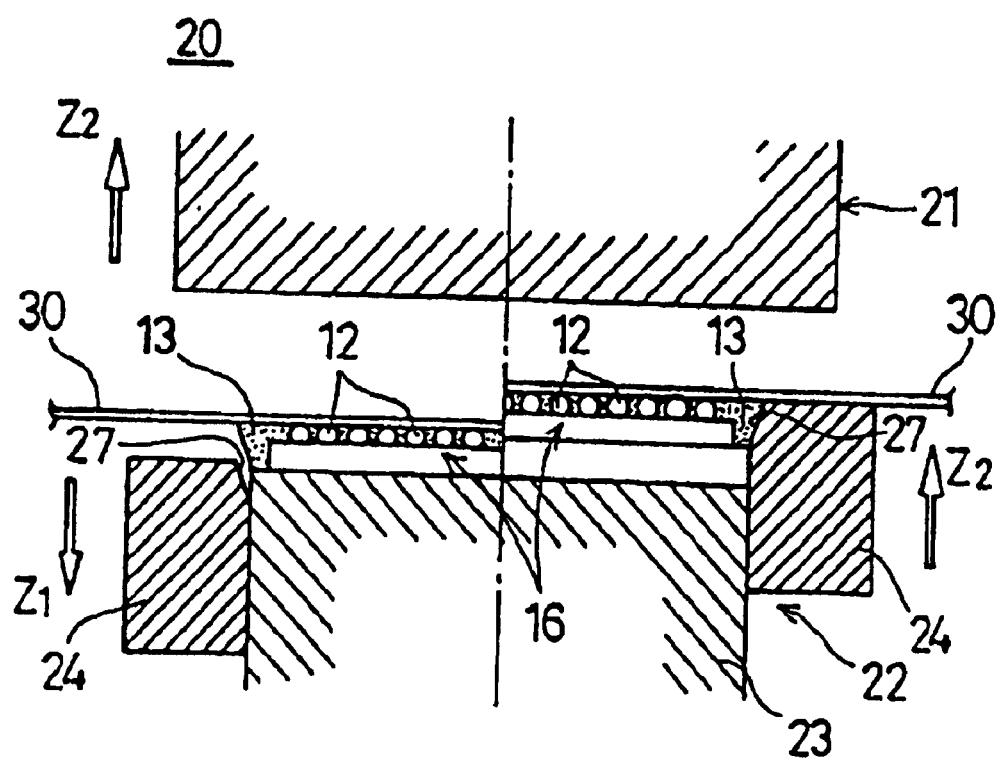
FIG. 5 is a further diagram showing the resin sealing step in the method for fabricating the semiconductor device according to the first embodiment of the present invention.

Subsequently, the second lower mold half body 24 is slightly moved in the direction Z1 with respect to the first lower mold half body 23. The left side with respect to the center line shown in FIG. 5 shows that the upper mold 21 is moved up and the second lower mold half body 24 is slightly moved in the direction Z1. By moving the second lower mold half body 24 in the direction Z1 with respect to the first lower mold half body 23, it becomes possible to detach the slant portion 27 and the resin layer 13 from each other.

The slant portion 27 and the resin layer 13 are detached from each other, and then the second lower mold half body 24 starts to move in the direction Z2. Hence, the upper surface of the second lower mold half body 24 comes into contact with the film 30, and the slant portion 27 comes into contact with the side wall of the resin layer 13. Hence, the substrate 16 is urged in the direction Z2 by the ascent of the second lower mold half body 24.

The film 30, which is still fixed to the resin layer 13, is moved and urged. Hence, the substrate 16 to which the resin layer 13 is provided is detached from the first lower mold half body 23. Thus, as shown on the right side with respect to the center line in FIG. 5, the substrate 16 to which the resin layer 13 is provided is detached from the mold 20.

In the example shown in FIG. 5, there is an interface portion in which the first lower mold half body 23 and the resin layer 13 are fixed to each other. The above interface portion is comparatively narrow and adhesive force exerted on the interface portion is weak. Hence, by moving the second lower mold half body 24 in the direction Z2, the substrate 16 to which the resin layer 13 is provided can definitely be detached from the first lower mold half body 23.

As described above, the resin layer 13 is compression-molded by the mold 20 in the resin layer forming step. In addition, the sealing resin 35 from which the resin layer 13 is formed is not provided between the conventional narrow space between the semiconductor device 1 and the mount board 5 (see FIG. 78). That is, the sealing resin 35 is mounted on the surface of the substrate 16 on which the bumps 12 are arranged, and is then molded.

Hence, the resin layer 13 can definitely be provided on the whole surface of the substrate 16 on which the bumps 12 are formed, and can definitely be provided in a narrow space having a height approximately equal to the height of the bumps 12. Hence, all the bumps 12 formed on the substrate 16 can definitely be sealed by the resin layer 13, which thus supports the all the bumps 12. Hence, at the time of applying heat as described with reference to FIG. 9, it is possible to definitely prevent occurrence of a break of a bonded portion between the bumps 12 and the mount board 14 and improve the reliability of the semiconductor device 10.

As described previously, the lower mold 22 of the mold 20 is made up of the fixed first lower mold half body 23 and the second lower mold half body 24 that can be elevated with respect to the first lower mold half body 23. Hence, by elevating the second lower mold half body 24 with respect to the first lower mold half body 23 after the resin layer 13 is formed, the substrate 16 to which the resin layer 13 is provided can easily be taken out of the mold 20.

Figure 6:
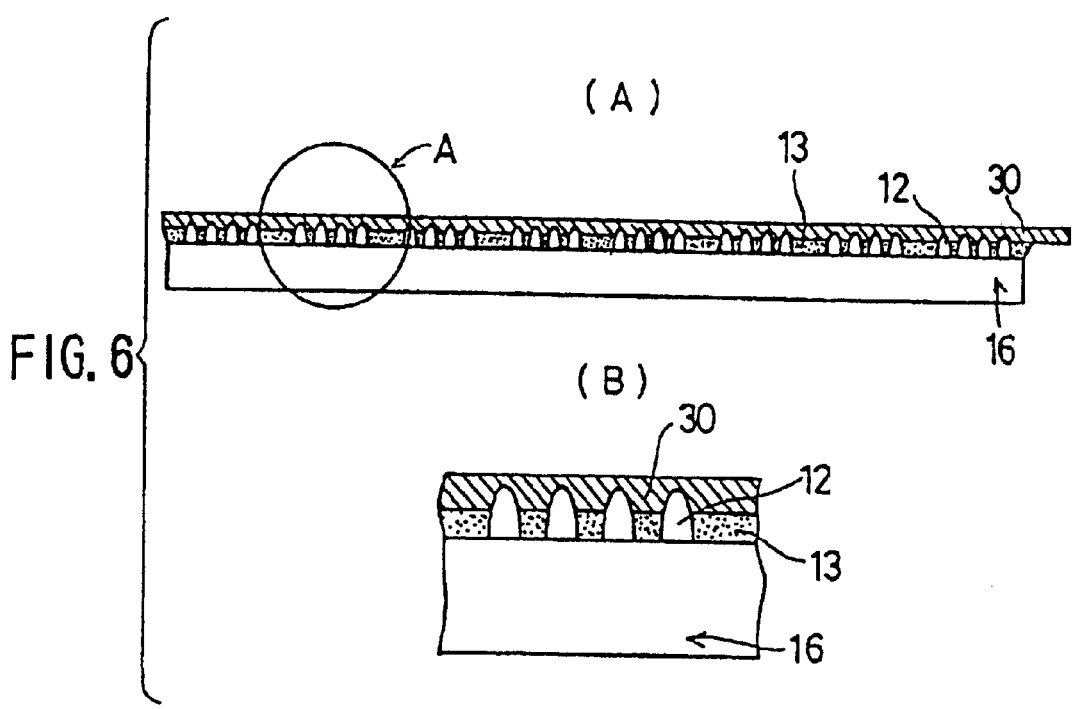
FIG. 6 is a diagram showing a protruding electrode exposing step in the method for fabricating the semiconductor device according to the first embodiment of the present invention, wherein (A) shows a substrate observed immediately after the resin sealing step is completed, and (B) is a diagram of an enlarged view of a part indicated by arrow A in (A).
Figure 7:
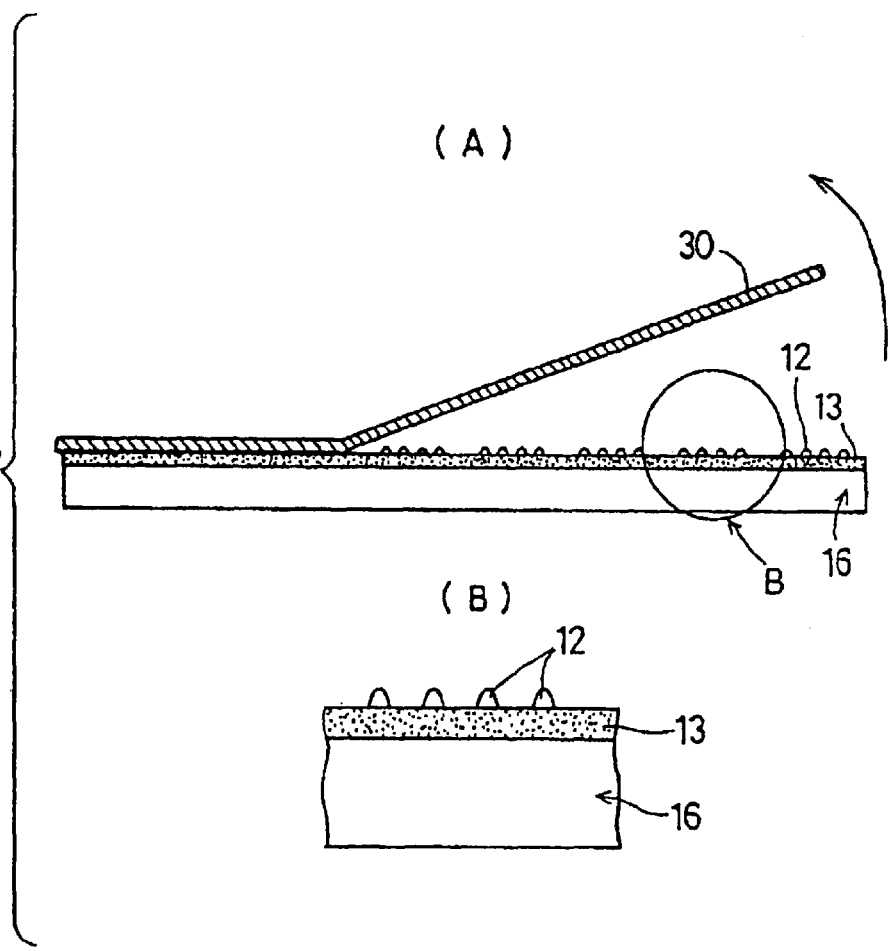
FIG. 7 is another diagram showing the protruding electrode exposing step in the method for fabricating the semiconductor device according to the first embodiment of the present invention, wherein (A) shows the substrate observed when a film is flaking off, and (B) is a diagram of an enlarged view of a part indicated by arrow B in (B).

After the above resin sealing step, the protruding electrode exposing step is carried out. FIGS. 6 and 7 show the protruding electrode exposing step. When the resin sealing step is completed, as shown in FIG. 6, the film 30 is fixed to the resin layer 13. Since the film 30 is made of an elastic material, the ends of the bumps 12 fall in the film 30 through the resin layer 13. That is, the ends of the bumps 12 are not covered by the resin layer 13 (this state is enlarged in FIG. 6(B)).

In the protruding electrode exposing step of the present embodiment, as shown in FIG. 7(A), the film 30 is detached from the resin layer 13. Hence, as shown in FIG. 7(B), the ends of the bumps 12 are exposed from the resin 13, and the mounting step can be carried out by using the exposed ends of the bumps 12.

As described above, the protruding electrode exposing step of the present embodiment is a simple process of merely detaching the film 30 from the resin layer 13, and can be executed efficiently and easily.

As has been described previously, the film 30 is attached to the mold 20 so that it does not have any deformation. The cavity surface 24a of the upper mold 21 is flat. The film 30 has a uniform quality and even elasticity on the whole surface thereof. Hence, the bumps 12 equally fall in the film 30.

Hence, the ends of the bumps 12 equally protrude from the resin layer 13, and the semiconductor devices 10 have a uniform quality and uniform contacts with the connection electrodes 15.

In the above description, the ends of the bumps 12 are completely exposed from the resin layer 13 after the film 30 is detached from the resin layer 13 by the protruding electrode exposing step. Alternatively, the ends of the bumps 12 may slightly be covered by a resin film (the sealing resin 35) after the film 30 is detached. With the above structure, the upper ends of the bumps 12 that are liable to take scratches are protected by the resin film, so that the bumps 12 can be prevented from contacting outside air and being oxidized.

The resin film is unnecessary to mount the bumps 12 on a mount board and is thus required to be removed. The removing step can be carried out any time before the mounting.

A separating step follows the above protruding electrode exposing step.

Figure 8:
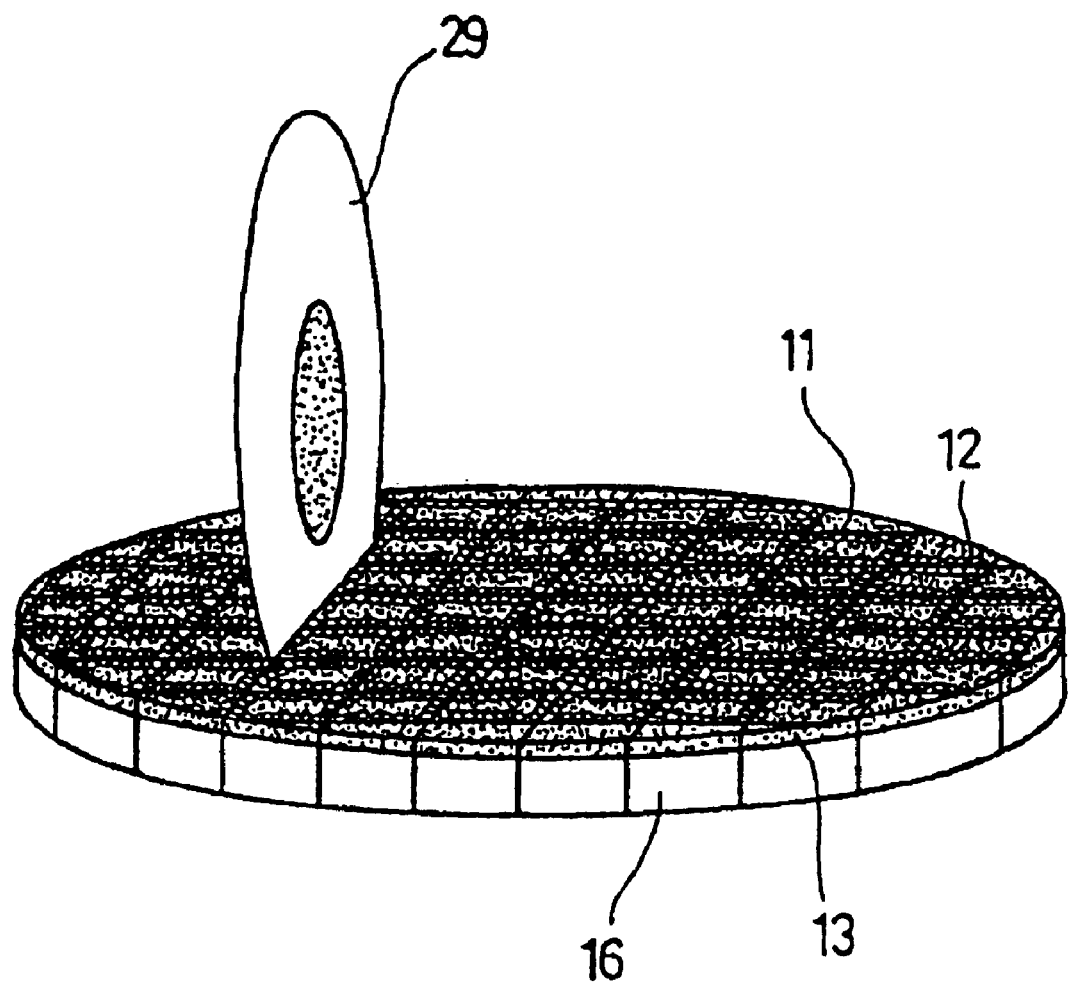
FIG. 8 is a diagram showing a separating step in the method for fabricating the semiconductor device according to the first embodiment of the present invention.
Figure 9:
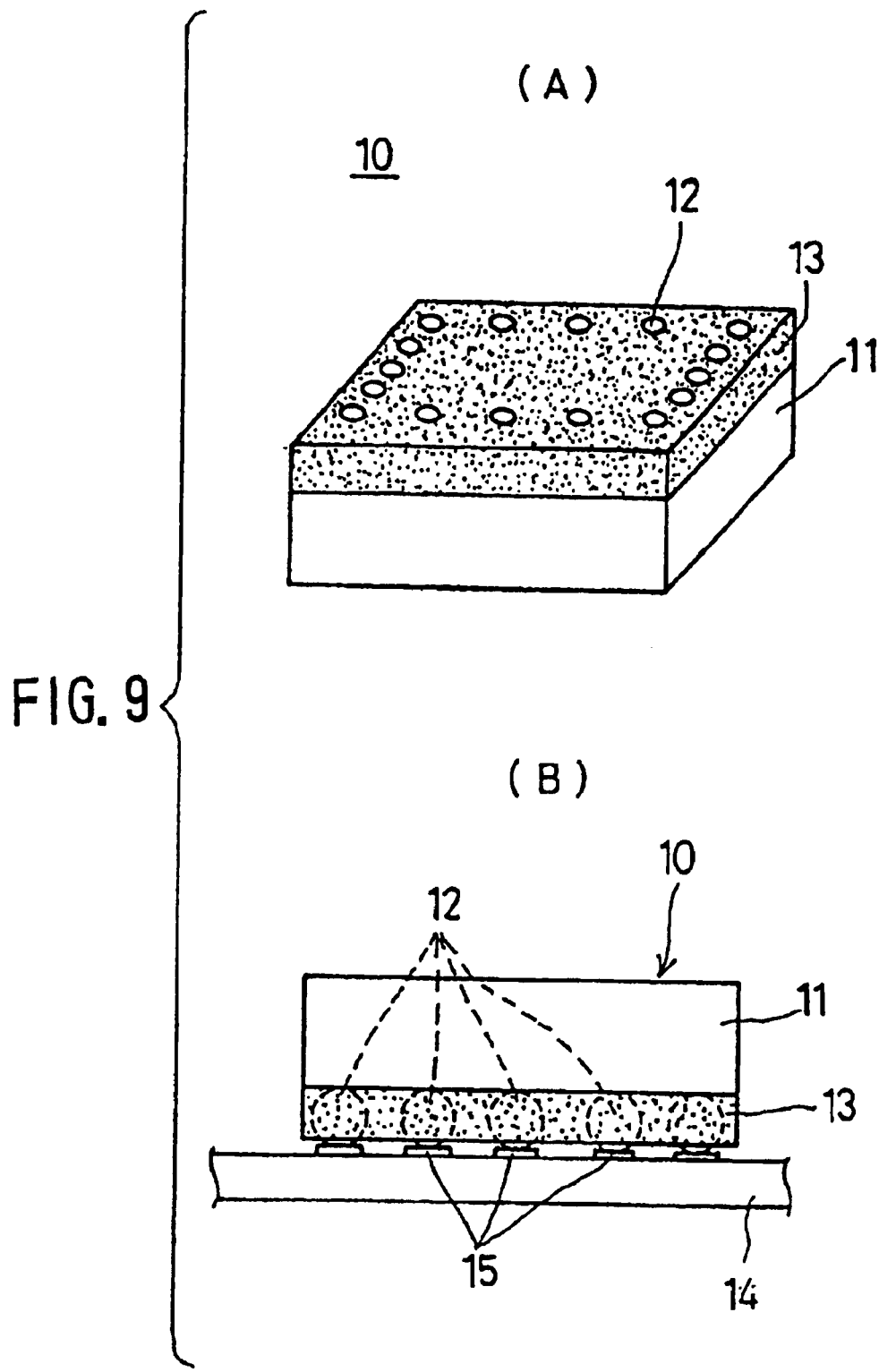
FIG. 9 is a diagram showing a semiconductor device according to the first embodiment of the present invention.

FIG. 8 shows the separating step. As shown in this figure, the separating step cuts the substrate 16 along with the resin layer 13 by using a dicer 29 so that the semiconductor elements 11 can be obtained. Thus, the semiconductor device 10 shown in FIG. 9 is obtained.

The dicing step using the dicer 29 is employed in general methods of fabricating semiconductor devices and does not have a particular difficulty. Although the resin layer 13 is provided on the substrate 16, the dicer 29 can easily cut the resin layer 13.

Figure 10:
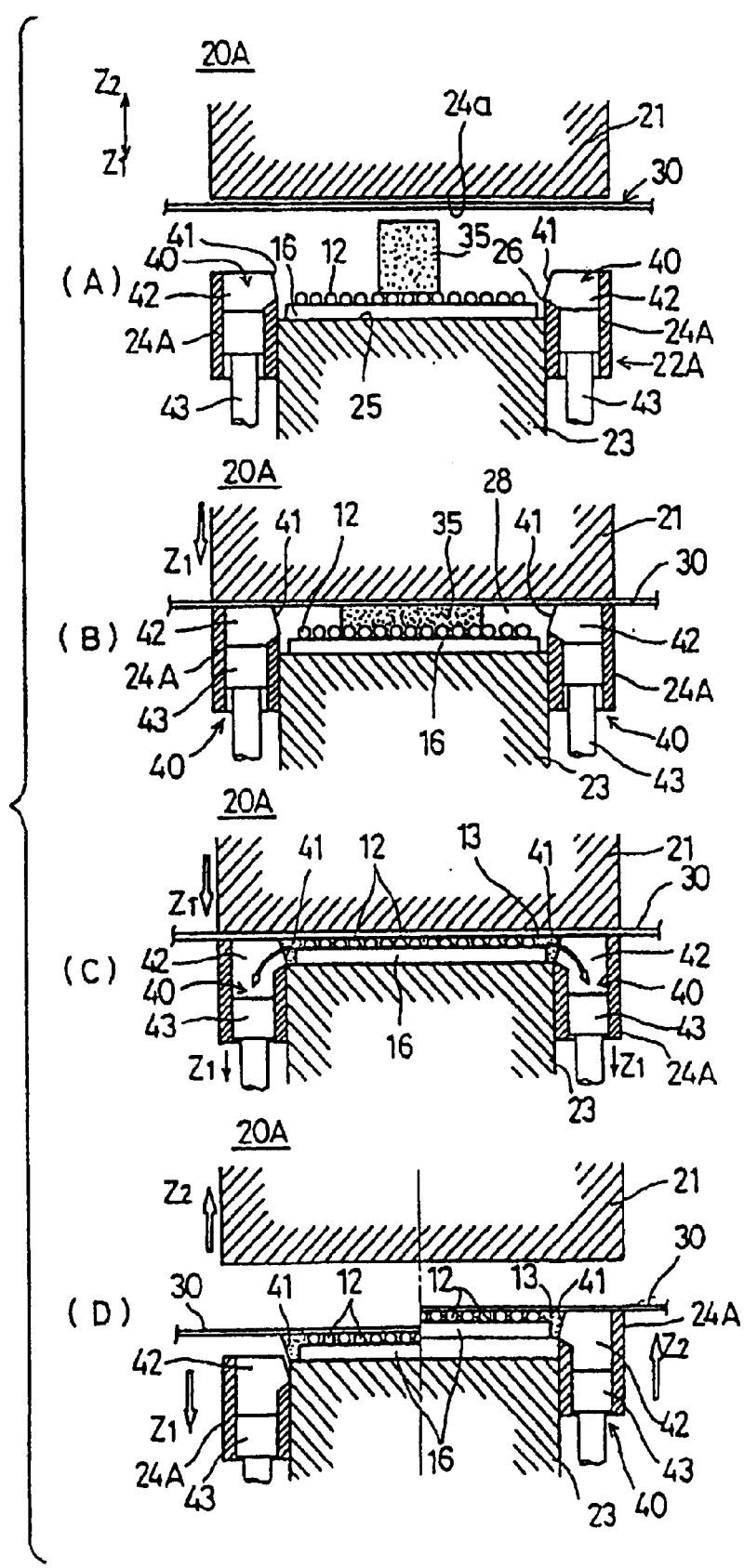
FIG. 10 is a diagram showing a method for fabricating a semiconductor device according to a second embodiment of the present invention and a mold for fabricating a semiconductor device according to a second embodiment of the present invention.

A description will now be given, with reference to FIG. 10, of a semiconductor device fabrication method and a mold 20A for fabricating semiconductor devices (hereinafter simply referred to as mold 20A) according to a second embodiment of the present invention. In FIG. 10, parts that have the same structures as those of parts of the first embodiment described with reference to FIGS. 1 through 9 are given the same reference numbers, and a description thereof will be omitted.

The mold 20A used in the present embodiment is generally composed of the upper mold 21 and a lower mold 22A. The upper mold 21 and the first lower mold half body 23 of the lower mold 22A are the same as those of the first embodiment. The second embodiment has a feature in which a second lower mold half body 24A is equipped with an excess resin removing mechanism 40.

The excess resin removing mechanism 40 is generally made up of an opening part 41, a pot part 42, and a pressure control rod 43. The opening part 41 is an opening formed in a part of the slant portion 27 formed in the second lower mold half body 24A, and is connected to the pot part 42.

The pot part 42 has a cylinder structure. The pressure control rod 43 having a piston structure is slidably provided in the pot part 42. The pressure control rod 43 is connected to a driving mechanism which is not shown, and can be elevated with respect to the second lower mold half body 24A in the direction Z1 and Z2.

Next, a description will be given of the semiconductor device fabrication method using the mold 20A equipped with the excess resin removing mechanism 40 according to the second embodiment of the present invention. The second embodiment is characterized in the resin sealing step, and only a description thereof will be given below.

The resin sealing step commences executing a substrate loading step, in which the substrate 16 is loaded onto the mold 20A as shown in FIG. 10(A).

As shown in this figure, the second lower mold half body 24A is spaced apart from the first lower mold half body 23 along the direction Z2 immediately after the resin sealing step is initiated. Further, the pressure control rod 43 of the excessive resin removing mechanism 40 is placed in a position in the direction Z2.

After the substrate 16 is loaded onto the lower mold 22A, the film 30 is disposed to the part 24a of the upper mold 21, and the sealing resin 35 is placed on the substrate 16 or the bumps 12 provided thereon.

After the above substrate loading step is completed, a resin layer forming step is executed. The upper mold 21 is moved in the direction Z1. Then, as shown in FIG. 10(B), the upper mold 21 and the second lower mold half body 24A come into contact with each other, so that the film 30 is brought in the clamped state.

At this time, the cavity 28 is defined in the mold 20A by the cavity surfaces 24a, 25 and 26. The opening part 41 of the excess resin removing mechanism 40 is opened to the cavity 28.

After the upper mold 21 comes into contact with the second lower mold half body 24A, the upper mold 21 and the second lower mold half body 24A maintains the film 30 in the clamped state while moving in the direction Z1 as a whole. Hence, the resin 35 is compressed and molded in the cavity 28.

In order to prevent the bumps 12 from being damaged and appropriately fill the whole cavity 28 with the resin 35, it is necessary to select an appropriate moving speed of the upper mold 21 and the second lower mold half body 24A in the direction Z1, as has been described previously. The appropriate value selecting of the speed of the upper mold 21 and the second lower mold half body 24A in the direction Z1 is equivalent to the appropriate value selecting of the pressure applied to the resin 35 in the cavity 28.

According to the second embodiment of the present invention, the mold 20A is equipped with the excess resin removing mechanism 40. Hence, it is possible to control not only the moving speed of the upper mold 21 and the second lower mold half body 24A in the direction Z1 but also the compression pressure applied to the resin 35 using the pressure control rod 43. When the pressure control rod 43 reduces a pressure exerted in the direction Z2, the sealing resin 35 receives a reduced pressure in the cavity 28. When the pressure control rod 43 increases a pressure exerted in the direction Z2, the sealing resin 35 receives an increased pressure in the cavity 28.

For example, if the amount of the sealing resin 35 is greater than the volume of the resin layer 13 and the cavity 28 has an increased pressure due to excess resin, the resin molding may be performed appropriately. In such a case, as shown in FIG. 10(C), the pressure control rod 43 of the excess resin removing mechanism 40 is moved down in the direction Z1, so that the excess resin can be transferred to the pot part 42 via the opening part 41.

As described above, the excess resin removing mechanism 40 removes excess resin when the resin layer 13 is formed, and the resin molding can always be carried out with en appropriate pressure. Hence, the resin layer 13 can be formed appropriately. It is also possible to prevent excess resin from leaking from the mold 20A. It is not required to precisely determine the amount of the sealing resin 35, as compared with the first embodiment of the present invention. Hence, it is easy to measure the amount of the sealing resin 35 to be supplied.

After the resin layer 13 is formed by the resin forming step, mold detaching step is carried out. The operation of the mold 20A in the mold detaching step is the same as that of the first embodiment of the present invention. That is, the upper mold 21 is moved in the direction Z2 first, and the second lower mold half body 24A is slightly moved with respect to the first lower mold half body 23 in the direction Z1.

The left side with respect to the central line shown in FIG. 10(D) shows that the upper mold 21 is moved in the direction Z2, and the second lower mold half body 24A is slightly moved in the direction Z1. By slightly moving the second lower mold half body 24A with respect to the first lower mold half body 23 in the direction Z1, the resin layer 13 can be detached from the slant portion 27.

In the second embodiment of the present invention, there is a possibility that the excess resin removing mechanism 40 may form a flash in the position in which the opening part 41 is located. Such a flash can be removed by moving the second lower mold half body 24A in the direction Z1.

After the resin layer 13 is separated from the slant portion 27, the second lower mold half body 24A is moved in the direction Z2, so that the upper surface of the half body 24A comes into contact with the film 30 and the slant portion 27 comes into contact with the resin layer 13 again. Hence, the substrate 16 is urged in the direction along which it is away from the mold 20A. Hence, as shown in the right side with respect to the center line in FIG. 10(D), the substrate 16 to which the resin layer 13 is provided is separated from the mold 20A.

In the fabrication method of the second embodiment of the present invention, the pressure in the cavity 28 can be regulated at the predetermined level. Hence, It is possible to prevent air from remaining in the resin 35 and prevent babbles (voids) from being formed in the resin layer 13. If babbles occur in the resin layer 13, these bobbles are expanded in a thermal process and a damage such as a crack may occur in the resin layer 13.

The excess resin removing mechanism 40 can prevent babbles from being formed in the resin layer 13 and prevent the resin layer from being damaged in the thermal process. Hence, the reliability of the semiconductor device 10 can be improved.

A description will now be given of a semiconductor device fabrication method according to third and fourth embodiments of the present invention.

Figure 11:
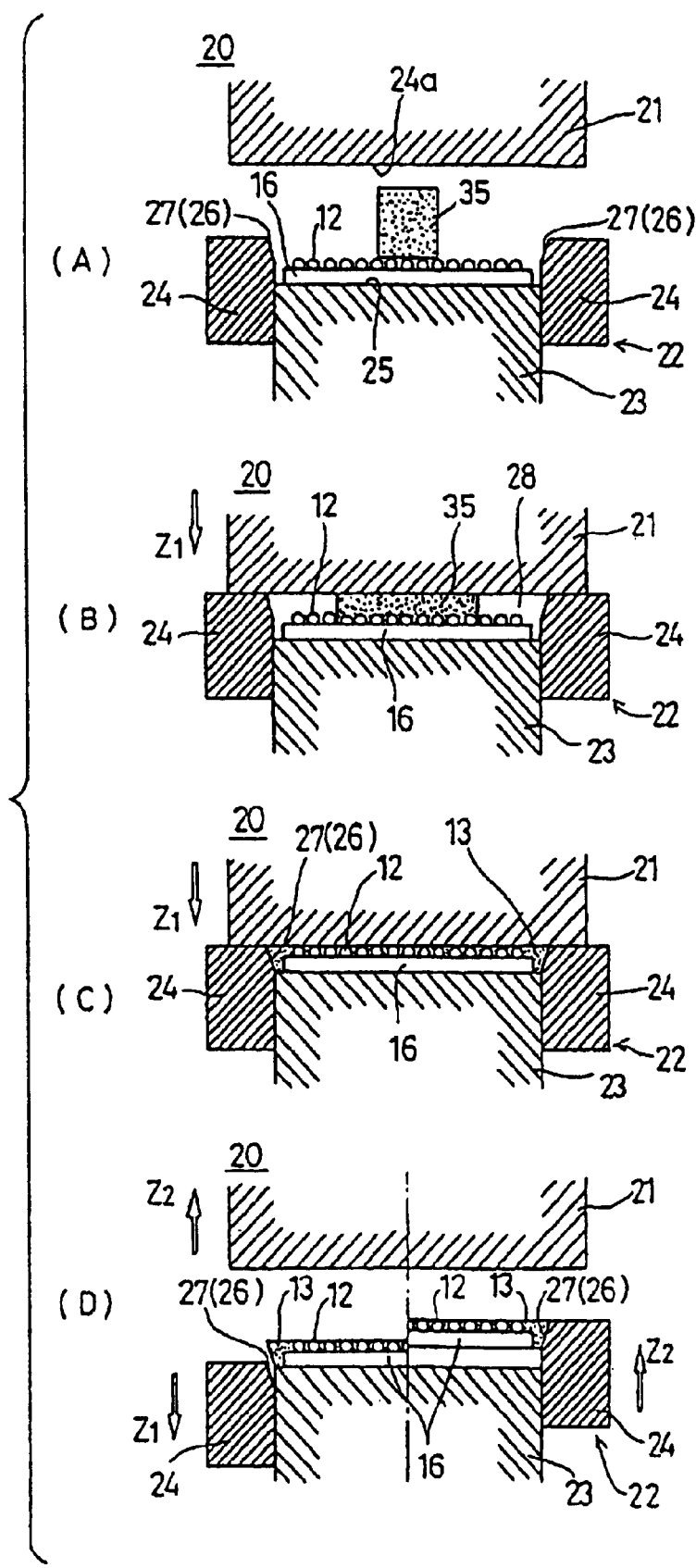
FIG. 11 is a diagram showing a method for fabricating a semiconductor device according to a third embodiment of the present invention.
Figure 12:
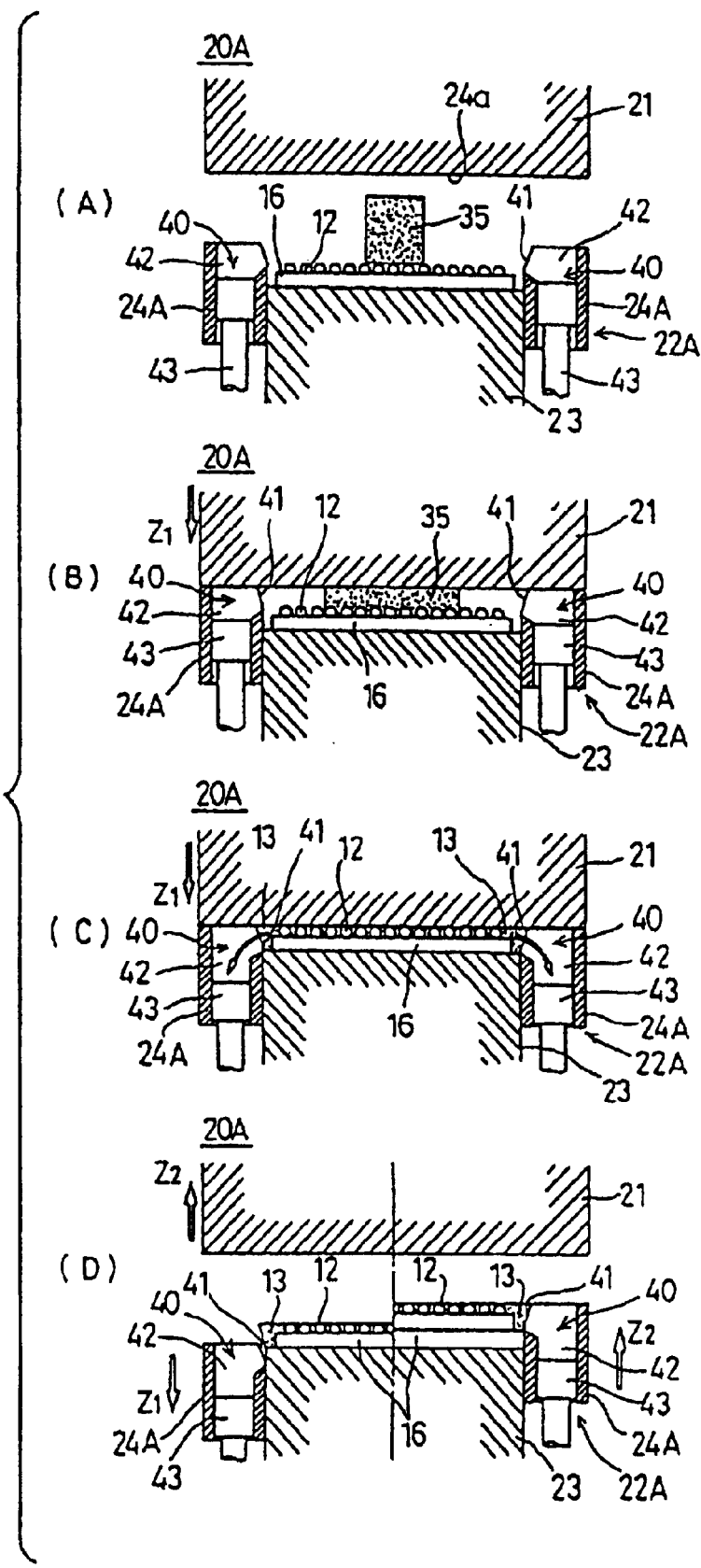
FIG. 12 is a diagram showing a method for fabricating a semiconductor device according to a fourth embodiment of the present invention.

FIG. 11 shows the semiconductor device fabrication method according to the third embodiment of the present invention, and FIG. 12 shows the semiconductor device fabrication method according to the fourth embodiment of the present invention. In FIG. 11, parts that have the same structures as those of the first embodiment of the present invention which has been described with reference to FIGS. 1 through 9 are given the same reference numbers. In FIG. 12, parts that have the same structures as those of the first embodiment of the present invention which has been described with reference to FIG. 10 are given the same reference numbers.

The fabrication methods according to the third and fourth embodiments of the present invention are characterized in that the resin layer 13 is formed without using the film 30. As shown in FIGS. 11(A) and 12(A), the film 30 is not arranged to the portion 24a of the upper mold 21 in the substrate loading. This differs from the first and second embodiments of the present invention.

Hence, in the resin layer forming step subsequent to the substrate loading step, as shown in FIGS. 11(B), 11(C), 12(B) and 12(C), the upper mold 21 directly pushes the sealing resin 35, which is compression-molded. Since the cavity surface 24a of the upper mold 21 is flat, the resin layer 13 is molded under the good condition. The removing process is the same as that of the first or second embodiment of the present invention, and a description thereof will be omitted.

The resin layer 13 can be formed without using the resin layer 13. It should be noted that the bumps 12 completely fall in the resin layer 13 when the resin layer 13 is formed because the film 30 is not employed.

Hence, it is necessary to expose only the ends of the bumps 12 in the protruding electrode exposing step that is carried out after the resin sealing step. The step of exposing only the ends of the bumps 12 will be described later for the sake of convenience.

A description will now be given of a semiconductor device fabrication method according to a fifth embodiment of the present invention.

Figure 13:
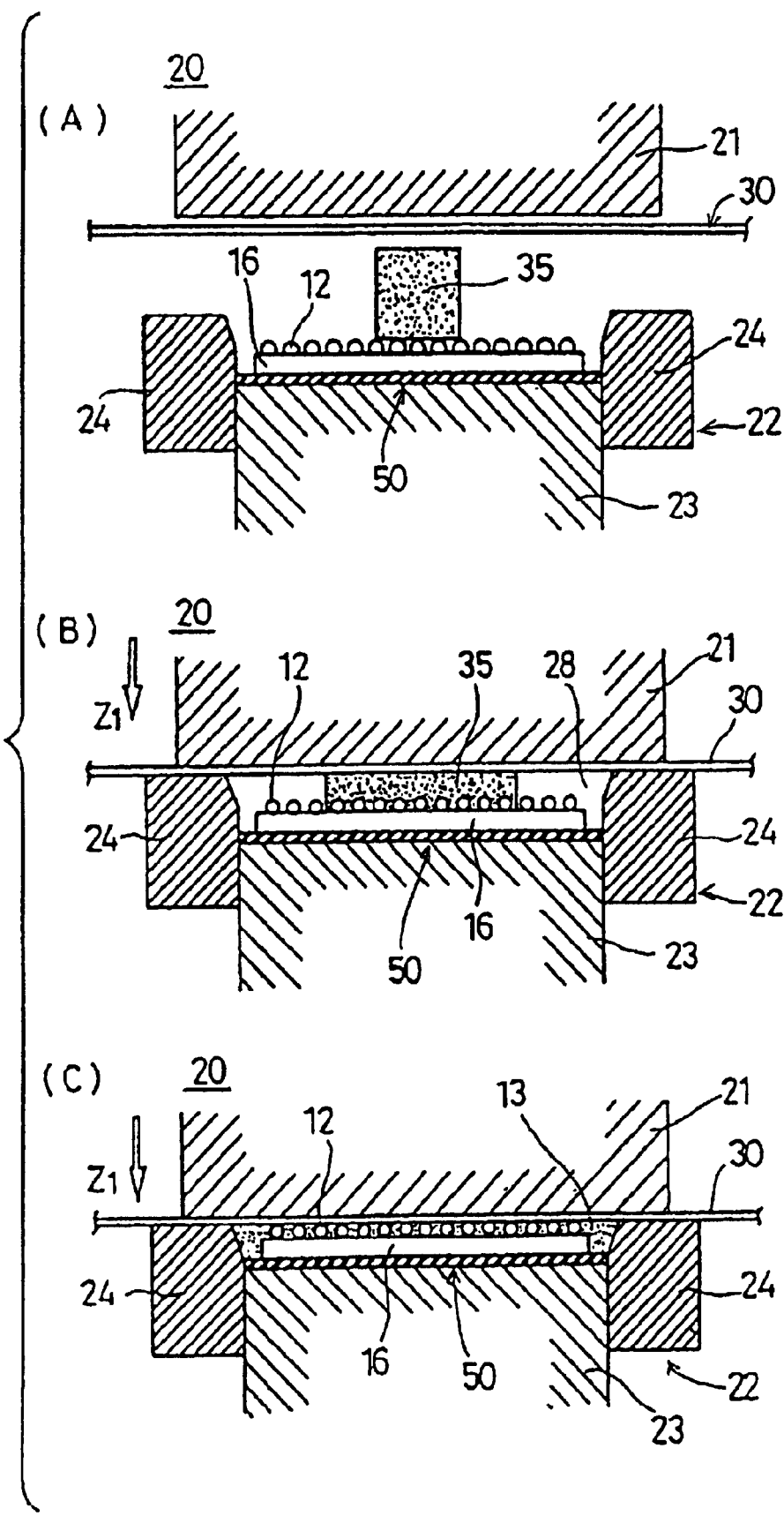
FIG. 13 is a diagram showing a method for fabricating a semiconductor device according to a fifth embodiment of the present invention.
Figure 14:
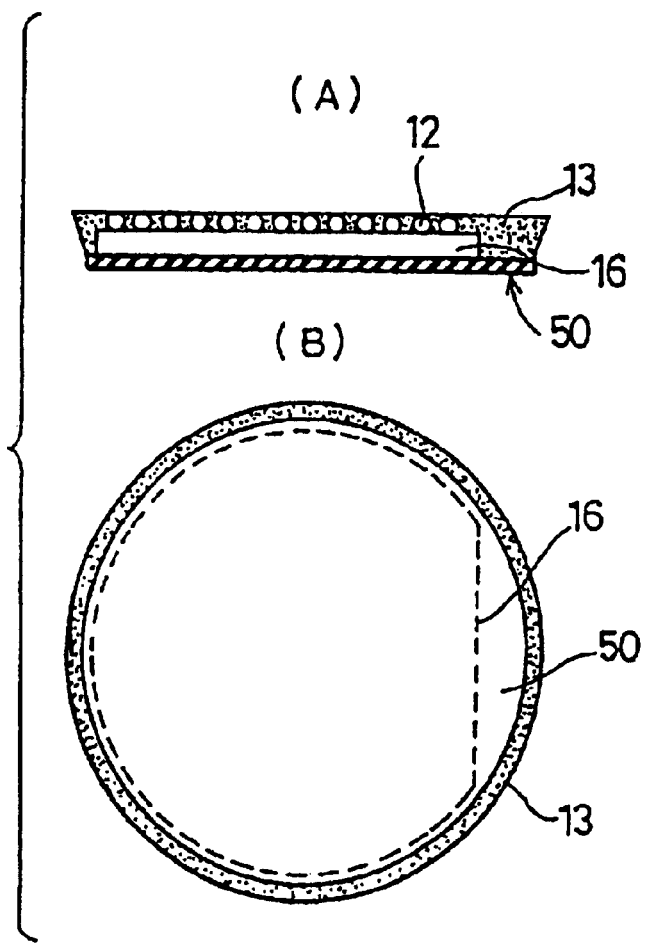
FIG. 14 is another diagram showing a method for fabricating a semiconductor device according to a third embodiment of the present invention.

FIGS. 13 and 14 show the semiconductor device fabrication method according to the fifth embodiment of the present invention. In FIGS. 13 and 14, parts that have the same structures as those of the first embodiment of the present invention which has been described with reference to FIGS. 1 through 9 are given the same reference numbers, and a description thereof will be omitted.

According to the present embodiment, as shown in FIG. 13(A), a reinforcement plate 50 is attached to the first lower mold half body 23 before the substrate 16 is loaded onto the mold 20 in the substrate loading step. The reinforcement plate 50 is made of a substance having a predetermined mechanical strength and a predetermined heat radiation performance, and is formed of, for example, an aluminum plate. The diameter of the reinforcement plate 50 is slightly greater than that of the substrate 16. A surface of the reinforcement plate 50 is coated with a thermosetting adhesive (not shown).

The reinforcement plate 50 is loaded onto the mold 20 by merely placing it on the first lower mold half body 23 with ease. Hence, the use of the reinforcement plate 50 does not make the resin sealing step complicate.

A description will now be given of the functions of the reinforcement step used in the resin sealing step.

The resin layer forming step executed after the substrate loading step commences moving the upper mold 21 and the second lower mold half body 24 in the direction Z1 so that the step of sealing the bumps 12 by the sealing resin 35 is initiated. At this time, the mold 20 is heated up to a temperature at which the sealing resin 35 can be fused. The above-mentioned thermosetting adhesive is formed of a material which is thermohardened at a comparatively low temperature. Hence, the reinforcement plate 50 is unified to the substrate 16 with a relatively short time after the initiation of the resin layer forming step. The reinforcement plate 50 may adhere to the substrate 16 beforehand.

As shown in FIGS. 13(B) and 13(C), the resin layer 13 is formed by the compression molding method even in the fifth embodiment of the present invention. In the above method, the resin in the fused state is pressed by the upper mold 21, and the substrate receives a large pressure.

The formation of the resin layer 13 requires fusing of the sealing resin 35. Hence, the mold 20 is equipped with a heater. Heat generated by the heater is applied to the substrate 16 loaded onto the mold 20. Hence, the substrate 16 may be deformed due to the pressure in the compression molding and the heat of the heater. According to the fifth embodiment of the present invention, the reinforcement plate 50 is loaded before the substrate 16 is loaded onto the mold 20 in the substrate loading step, and is bonded to the substrate 16. Hence, the substrate 16 is reinforced by the reinforcement plate 50 in the resin layer forming step. Hence, even if the substrate 16 receives a pressure in the compression molding and heat of the heater, the substrate 16 can be prevented from being deformed and the yield can be improved.

FIG. 14 shows the substrate 16 which has been removed from the mold 20 after the resin layer 13 is completely formed. As shown in that figure, the reinforcement plate 50 is still attached to the substrate 16 even after the substrate 16 is removed from the mold 20. In the separating step (see FIG. 8) carried out by the resin layer forming step, the reinforcement plate 50 is cut by the dicer 29.

Thus, the separated semiconductor chips have the respective pieces of the reinforcement plate 50. As described before, the reinforcement plate 50 is made of a substance having a good heat radiation performance. Hence, the pieces of the reinforcement plate 50 of the semiconductor devices function as heat radiating plates. Thus, each semiconductor device has an improved heat radiating performance.

Figure 15:
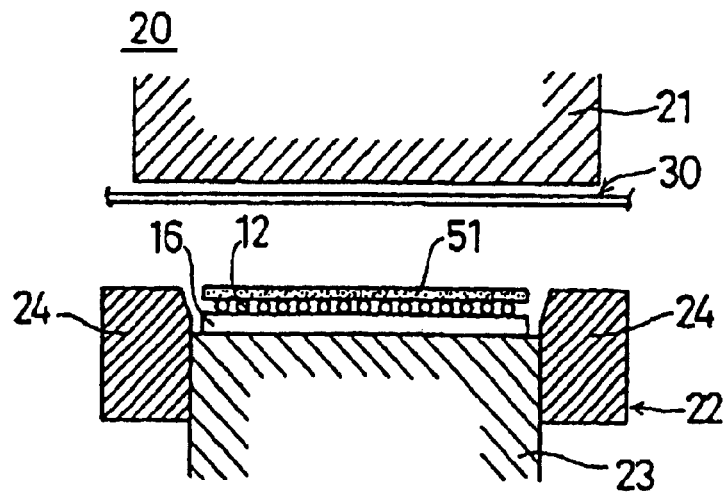
FIG. 15 is a diagram showing an arrangement in which a sheet resin is used as the sealing resin.
Figure 16:
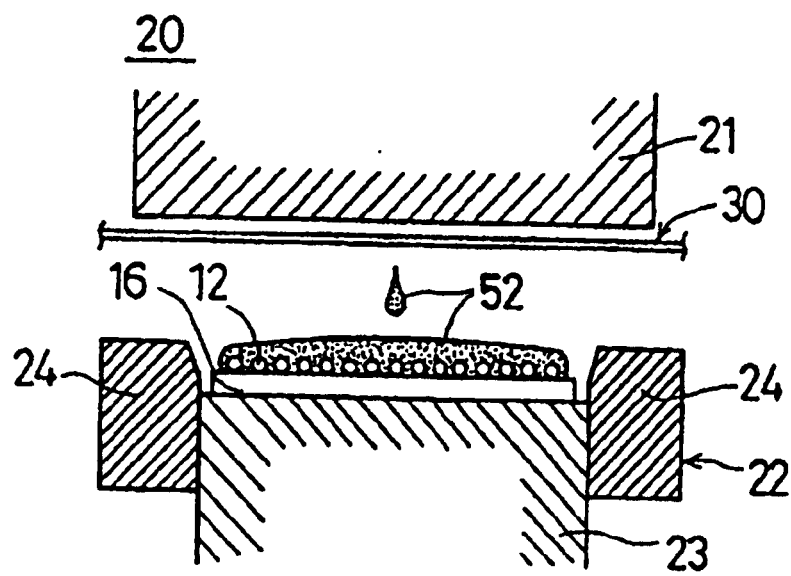
FIG. 16 is a diagram showing an arrangement in which potting is used as a means for supplying the sealing resin.
Figure 17:
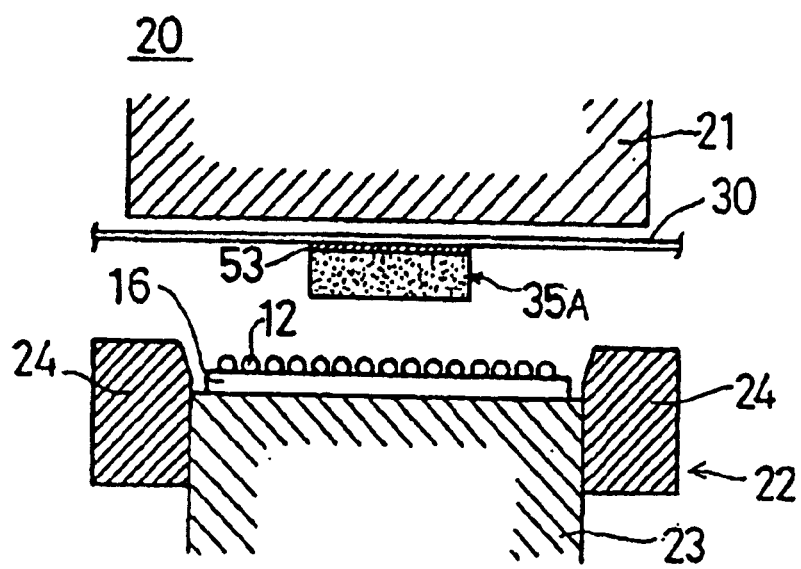
FIG. 17 is a diagram showing an arrangement in which the sealing resin is provided to the film.

FIGS. 15 through 17 show variations of the above-mentioned embodiments of the present invention. In these figures, parts that have the same structures as those of the aforementioned embodiments of the present invention are given the same reference numbers.

In the above-mentioned embodiments of the present invention, the sealing resin 35 is placed on the substrate 16 on the mold 20 or 20A. In the variations shown in FIGS. 15 through 17, sealing resin is supplied in different manners.

The variation shown in FIG. 15 is characterized by using a sheet resin 51. The sheet resin 51 makes it possible to definitely form the resin layer 13 on the whole substrate 16.

When the sealing resin 35 is disposed on the center of the substrate 16, it takes a long resin formation time for melted resin to flow to the ends of the substrate 16 from the center thereof. In contrast, the sheet resin 51 is arranged so as to cover the upper portion of the substrate 16, the melted resin directly seals the bumps 12 located below the sheet resin 51 rather than flowing to the ends of the substrate 16. Hence, the time necessary to complete the resin sealing step can be reduced.

The variation shown in FIG. 16 is characterized by using a fluid resin 52 for resin sealing. The fluid resin 52 has a high flowability and thus definitely seals the bumps 12 with a short time.

The variation shown in FIG. 17 is characterized by arranging a sealing resin 35A to the film 30 by an adhesive 53 before the resin sealing step. Alternatively, it is possible to provide the melted sealing resin 35 to the film 30 and harden it so that the sealing resin 35 is arranged to the film 30.

By arranging the sealing resin 35A to the film 30 rather than the substrate 16, it is possible to integrally perform the work of loading the film 30 and the work of supplying the sealing resin 35A and to thus improve the efficiency of the substrate loading step.

Figure 18:
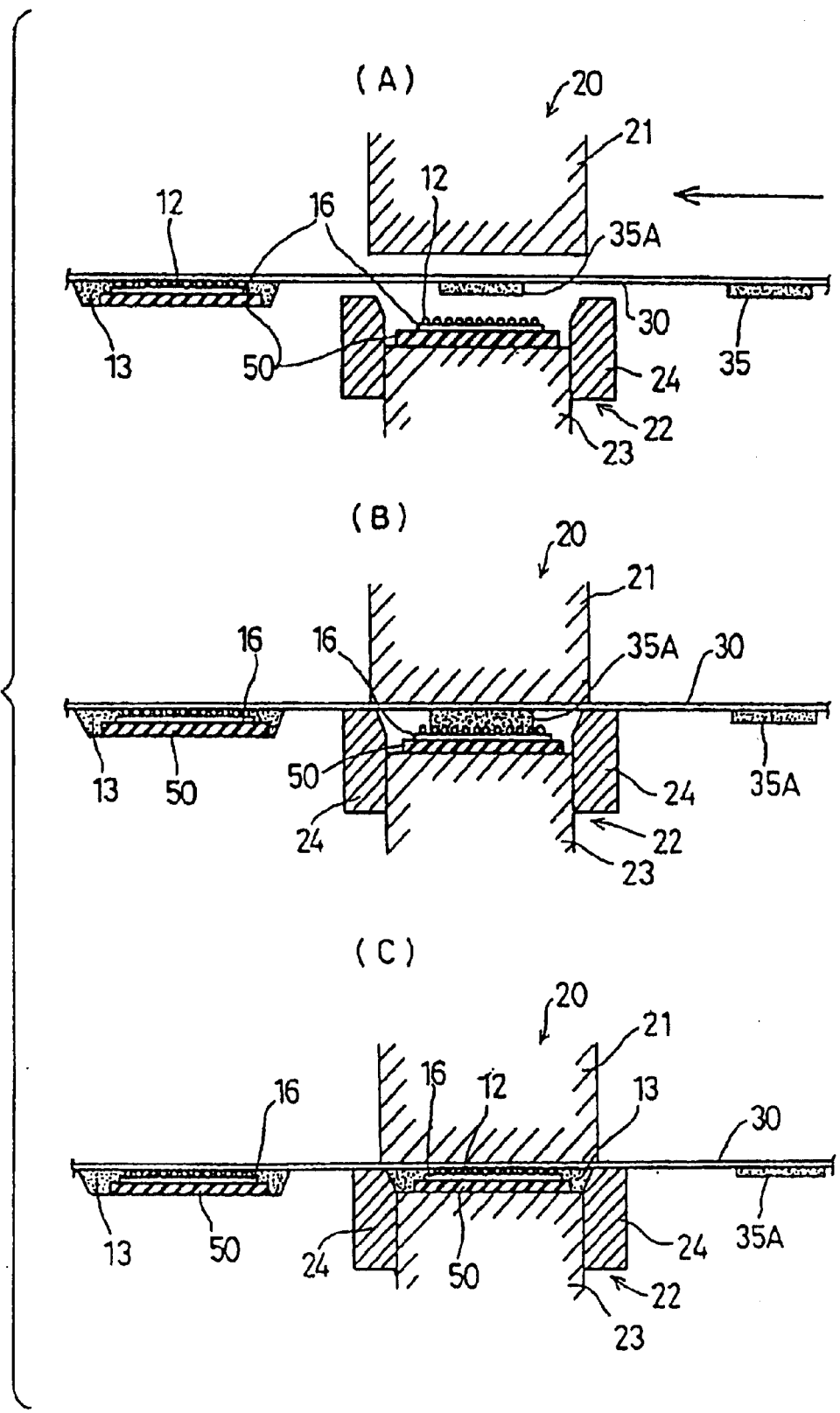
FIG. 18 is a diagram showing a method for fabricating a semiconductor device according to a sixth embodiment of the present invention.

A description will now be given of a semiconductor device fabrication method according to a sixth embodiment of the present invention. FIG. 18 shows a resin sealing step of the fabrication method of the sixth embodiment of the present invention. in FIG. 18, parts that have the same structures as those of the first embodiment of the present invention are given the same reference numbers, and a description thereof will be omitted.

A description was given, with reference to FIG. 17, of the method for providing only one sealing resin 35A to the film 30 before the resin sealing step. In the sixth embodiment of the present invention, a large number of sealing resins 35A is aligned on the film 30 at given intervals. The film 30 is transported in the direction indicated by an arrow by a transporting apparatus which is not shown.

FIG. 18(A), the substrate which 16 to the resin layer 13 is attached is located at the left side of the mold 20. The resin 13 is fixed to the film 30 and thus the substrate 16 is fixed to the film 30. The sealing resin 35A located in the mold 20 is subjected to the resin sealing step for this time. The sealing resin 35A located at the right side of the mold 20 is subjected to the resin sealing step for the next time.

FIG. 18(A) shows a state in which the substrate loading step is completed and shows the substrate 16 has been loaded onto the mold 20. The present embodiment employs the reinforcement plate 50 before the substrate 16 is loaded.

As shown in FIG. 18(B), the resin sealing step is initiated after the substrate loading step is completed, and the upper mold 21 and the second lower mold half body 24 are moved in the direction Z1 in order to seal the bumps 12 by the sealing resin 35A. Further, the upper mold 21 and the second lower mold half body 24 are moved in the direction Z1. Hence, as shown in FIG. 18(C), the resin layer 13 is formed on the substrate 16.

After the resin sealing step, the mold detaching step is carried out in the same manner as that which has been described with reference to FIG. 5. Hence, the substrate 16 to which the resin layer 13 is attached is detached from the mold 20. Since the resin layer 13 is fixed to the film 30, the substrate 16 is also fixed to the film 30.

As the above resin sealing step is completed, the transporting apparatus for the film 30 is activated, and transports the film 30 to the position in which the next sealing resin 35A is loaded onto the mold 20. Along with the operation of transporting the film 30, the reinforcement plate 50 and the substrate 16 (to which the resin layer 13 is not provided) are loaded onto the mold 20 (that is, the substrate loading step is executed). Hence, the state shown in FIG. 18(A) is obtained. Then, the above process is repeatedly carried out.

According to the method of this embodiment, the sealing resins 35A are arranged so as to be spaced apart from each other at given intervals which do not affect the resin sealing step. The film 30 is transported when the resin sealing step is completed. The sealing resin 35A for the next resin sealing step is automatically loaded onto the mold 20. Hence, the resin sealing step is repeatedly carried out, and the efficiency in fabrication of the semiconductor devices can be improved.

Figure 19:
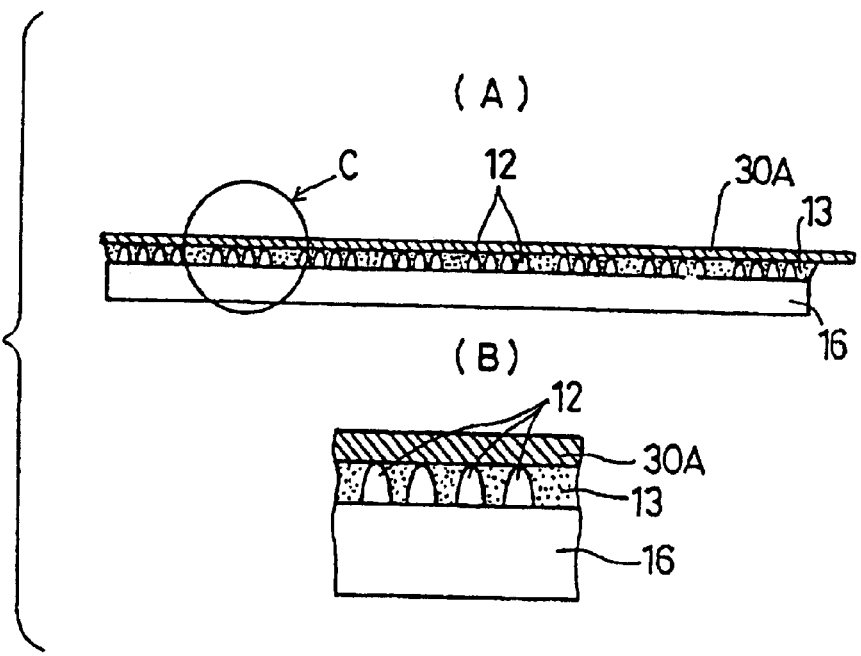
FIG. 19 is a diagram showing a method for fabricating a semiconductor device according to a seventh embodiment of the present invention, wherein (A) shows a substrate observed immediately after the resin sealing step is completed, and (B) is a diagram of an enlarged view of a part indicated by arrow C in (C).
Figure 20:
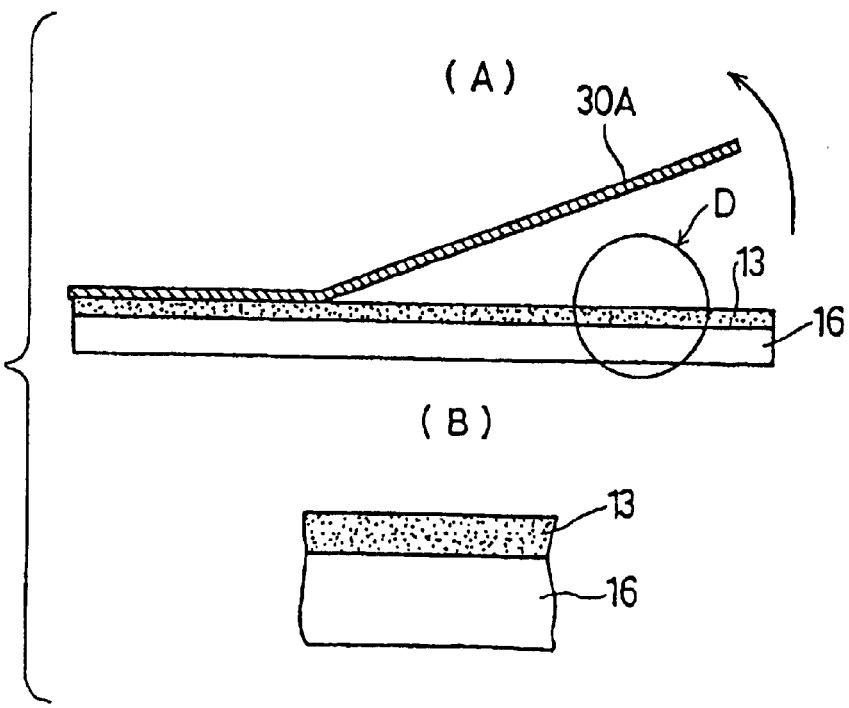
FIG. 20 is another diagram showing the method for fabricating a semiconductor device according to the seventh embodiment of the present invention, wherein (A) shows the substrate observed when the film is flaking off, and (B) is a diagram of an enlarged view of a part indicated by arrow D in (B).
Figure 21:
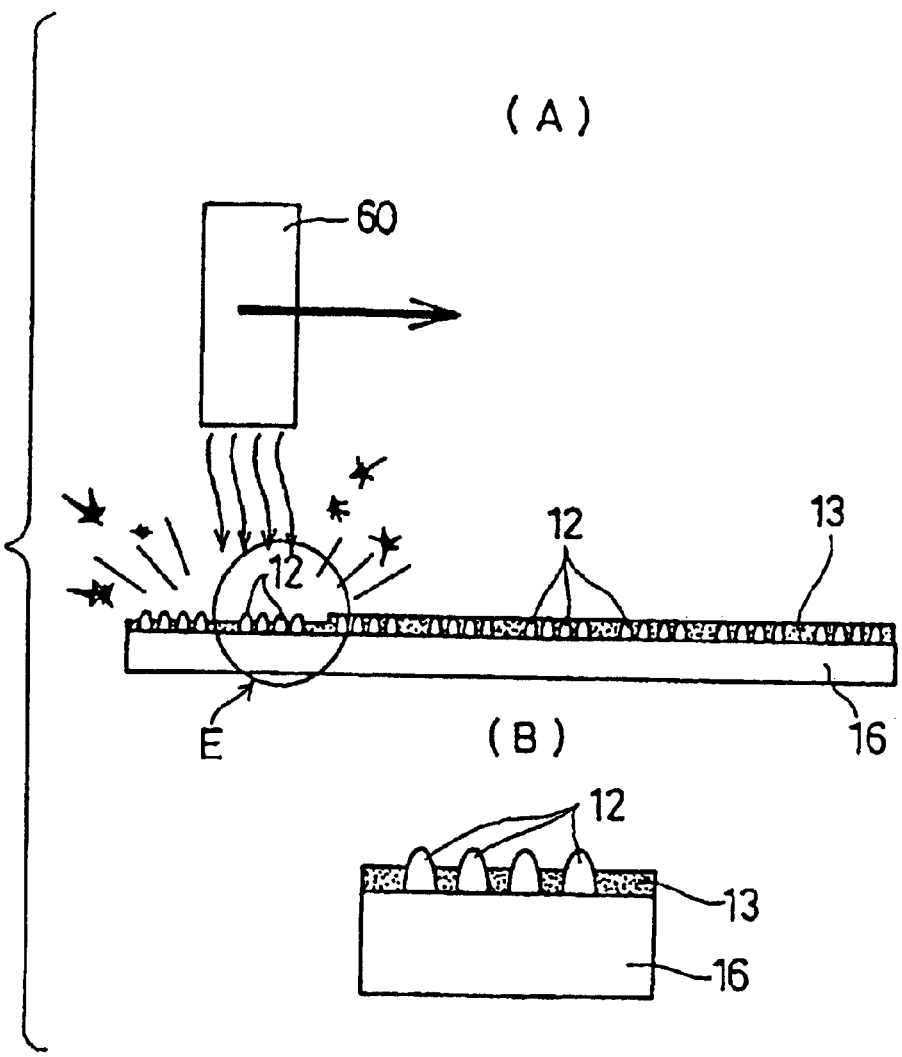
FIG. 21 is yet another diagram showing the method for fabricating a semiconductor device according to the seventh embodiment of the present invention.

FIGS. 19 through 21 are diagrams for explaining a method for fabricating a semiconductor device according to a seventh embodiment of the present invention. In FIGS. 19 through 21, parts that have the same structures as those of the first embodiment of the present invention which has been described with reference to FIGS. 1 through 9 are given the same reference numbers, and a description thereof will be omitted.

In the aforementioned fabrication method according to the first embodiment of the present invention, the film 30 is formed of a flexible substance which is elastically deformable. In the resin sealing step, the ends of the bumps 12 are make to fall in the film 30. Hence, merely by detaching the film 30 from the resin layer 13 in the protruding electrode exposing step, the ends of the bumps 12 are exposed.

It may be slightly difficult to arrange the film 30 having an elasticity which allows only the ends of the bumps 1 to fall in the film 30. In the case where the film 30 is used as a carrier for transportation as shown in FIG. 18, the film 30 made of an elastically deformable substance is deformed while being transported. Hence, the substrate 16 and the sealing resin 35A may be transported appropriately.

In order to avoid the above problem, it is necessary to use a film 30A which is not or little deformed elastically (the above will be hereinafter described integrally so that the film 30A is not deformed elastically). In the present embodiment, the film 30A is made of a substance which is not deformed elastically. Even when the film 30A is made of a substance which is not deformed elastically, the process carried out in the resin sealing step can be carried out in the same manner as that which has been described with reference to FIGS. 1 through 5.

FIGS. 19 through 21 shows a protruding electrode exposing step employed in the seventh embodiment of the present invention when the resin sealing step is completed, the film 30A is fixed to the resin layer 13, as shown in FIG. 19. Since the film 30A is made of a material which is not deformed elastically, the bumps 12 do not fall in the film 30, but are totally sealed by the resin layer 13 (such a state is enlarged in FIG. 19(B).

In this state, as shown In FIG. 20(A), the film 30A which is fixed to the resin layer 13 is detached therefrom. As shown in FIG. 20(B) which shows an enlarged state, the bumps 12 are completely sealed by the resin layer 13 even when the film 30A is detached from the resin layer 13.

The state shown in FIG. 20(B) in which the bumps 12 are completely sealed by the resin layer 13 is observed when the resin sealing step that does not use the films 30 and 30A is executed as has been described with reference to FIGS. 11 and 12.

It will be noted that an electrical connection to the mount board 14 cannot be made in the state in which the bumps 12 are completely sealed by the resin layer 13. Hence, it is required to expose the ends of the bumps 12 from the resin layer 13. FIG. 21(A) shows a manner for exposing the ends of the bumps 12 from the resin layer 13.

In the present embodiment, as shown in FIG. 21(A), a laser projecting device 60 is employed as a means for exposing the ends of the bumps 12 from the resin layer 13. The laser projecting device 60 may be a carbon dioxide layer, which is capable of processing resin well.

The depth of the removed portion of the resin layer 13 can be adjusted by appropriately changing energy of the lasher protruding device 60. Hence, it is possible to precisely define the length of the ends of the bumps 12 exposed from the resin layer 13.

As shown in FIG. 21(A), the laser beam emitted by the laser projecting device 60 is projected onto the resin layer 13. Hence, the ends of all the bumps 12 can be exposed from the resin layer 13. FIG. 21(B) shows a state in which the laser processing step is completed and thus the ends of the bumps 12 protrude from the resin layer 13.

The step of exposing the ends of the bumps 12 from the resin layer 13 makes it possible to make electronic connections with terminals of the mount board 14 irrespective of whether the film 30A is formed of a substance that is not deformable elastically or the resin sealing step which does not use the films 30 and 30A is employed as has been described with reference to FIGS. 11 and 12.

The step of exposing the ends of the bumps 12 from the resin layer 13 is not limited to use of the laser projection, but can be realized by using eximer laser, etching, mechanical polishing and blasting. If eximer laser is used, the ends of the bumps 12 can precisely be exposed with ease. If etching, mechanical polishing or blasting is used, the ends of the bumps 12 can be exposed at a comparatively low cost.

A description will now be given, with reference to FIGS. 22 through 25, of a mold 20C for the semiconductor device fabrication method according to the third embodiment of the present invention (hereinafter simply referred to as mold 20C). In FIGS. 22 through 25, parts that have the same structures as those of the mold 20 shown in FIG. 1 are given the same reference numbers, and a description thereof will be omitted.

The mold 20C is characterized by providing a fixing/detaching mechanism 70 for fixing the substrate 16 to the first lower mold half body 23C or detaching it therefrom to the position in which the first lower mold half body 23C is placed. The fixing/detaching mechanism 70 is generally made up of a porous member 71, an intake/exhaust device 73 and a pipe 74.

The porous member 71 is formed of a porous ceramic, a porous metal or a porous resin, through which a gas (such as air) can pass.

The pipe 73 is arranged below the porous member 71, and is connected to the intake/exhaust device 72. The intake/exhaust device 72 may be a compressor or a negative pressure generator, and has a compressed gas feed mode in which compressed air is fed to the pipe 73, and a suction mode in which a suction process is carried out for the pipe 73. The intake/exhaust device 72 can switch between the above two modes.

When the intake/exhaust device 72 operates in the compressed gas feed mode, the compressed air is supplied to the porous member 71 via the pipe 73, and is then injected to the outside of the device 72. At this time, if the substrate 16 is placed on the first lower mold half body 23C, the substrate 16 is urged in the direction in which the substrate 16 is detached. The above state is shown on the right side with respect to the center line shown in FIG. 22, and will be referred to as a detached state.

When the intake/exhaust device 72 operates in the suction mode, the intake/exhaust device 72 performs the suction process through the pipe 73. Hence, negative pressure caused due to the suction process is exerted on the porous member 71. At this time, if the substrate 16 is placed on the first lower mold half body 23C, the substrate 16 is sucked towards the porous member 71. This state is illustrated on the left side with respect to the center line in FIG. 22, and will be referred to as a fixed state.

As described above, by providing the fixing/detaching mechanism 70 to the mold 20C, the substrate 16 is fixed to the first lower mold half body 23C in the fixed state. Hence, it is possible to prevent occurrence of a deformation of the substrate such as a wrap in the resin sealing step. It is also possible to calibrate a warp inherent in the substrate 16. In addition, the substrate 16 is urged so as to be detached from the first lower mold half body 23C in the detached state. Hence, the detaching of the substrate 16 from the mold 20C can be facilitated.

Figure 23:
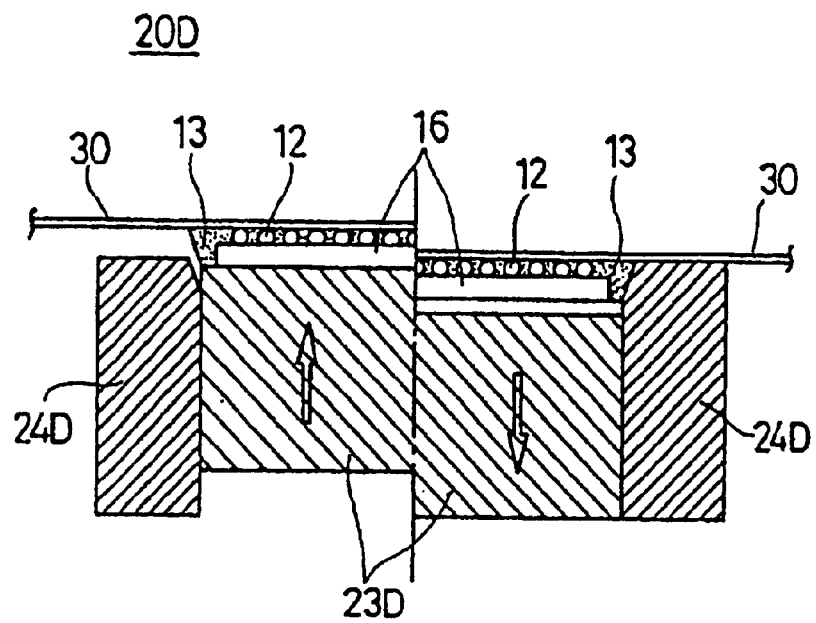
FIG. 23 is a diagram showing a mold for fabricating a semiconductor device according to a fourth embodiment of the present invention.

FIG. 23 shows a mold 20D for the semiconductor device fabrication device according to the fourth embodiment of the present invention (hereinafter simply referred to as mold 20D).

In the aforementioned first embodiment of the present invention, the mold 20 has the fixed first lower mold half body 23, while the second lower mold half body 24 is elevated with respect to the first lower mold half body 23. In contrast, the mold 20D has a fixed second lower mold half body 24D, and a first lower mold half body 23D is elevated with respect to the second lower mold half body 24D.

With the above arrangement in which the first lower mold half body 23D is elevated with respect to the second lower mold half body 23D, it is possible to definitely detach the substrate 16 to which the resin layer 13 is attached from the mold 20. In FIG. 23, the left side with respect to the center line of FIG. 23 shows a state in which the first lower mold half body 23D ascends, while the right side shows a state in which the first lower mold half body 23D descends.

Figure 24:
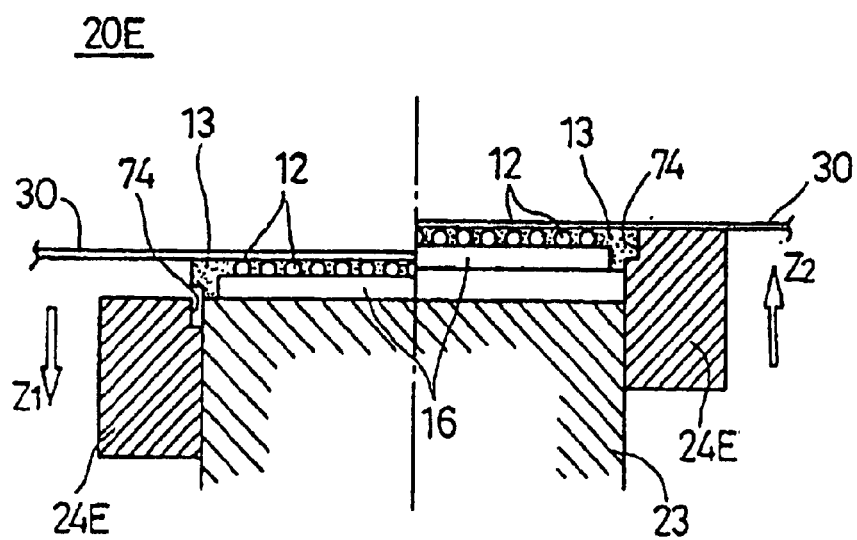
FIG. 24 is a diagram showing a mold for fabricating a semiconductor device according to a fifth embodiment of the present invention.

FIG. 24 shows a mold 20E for the semiconductor device fabrication method according to the fifth embodiment of the present invention (hereinafter simply referred to as mold 20E).

In the aforementioned first embodiment of the present invention, the slant portion 27 is formed on the peripheral inner wall of the second lower mold half body 24 in order to facilitate the detaching performance. The mold 20E used in the fifth embodiment of the present invention is designed so that an area circularly defined by a second lower mold half body 24E is wider than the area of the upper portion of the first lower mold half body 23, whereby a step portion 74 is formed in the second lower mold half body 24E and faces the first lower mold half body 23.

The step portion 74 formed in the second lower mold half body 24E facilitates the detaching performance. The step portion 74 has an approximately rectangular shape cross section, which can be formed easily.

The left side with respect to the center line of FIG. 24 shows a state in which the second lower mold half body 24E moves down from the resin sealing position in order to be detached from the resin layer 13. The right side with respect to the center line of FIG. 24 shows a state in which the second lower mold half body 24E moves up, and the substrate 16 to which the resin layer 13 is attached is detached from the mold 20E.

Figure 25:
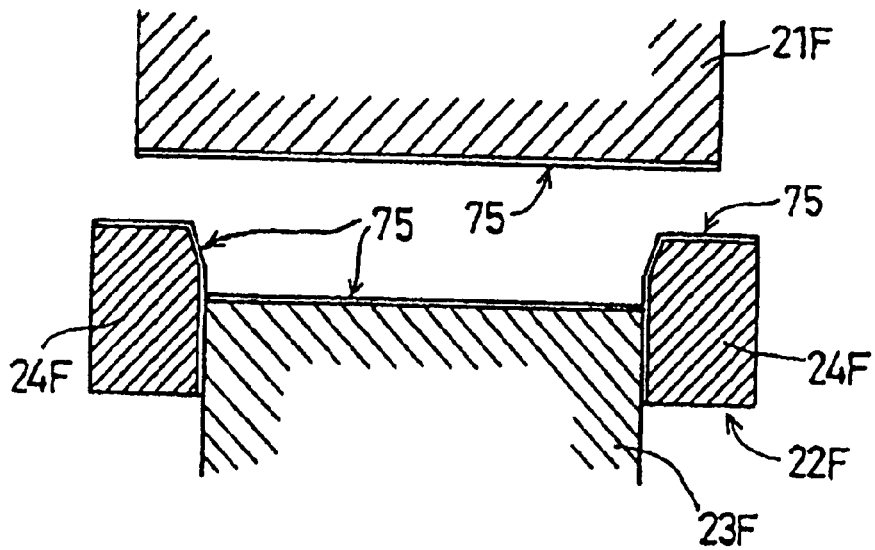
FIG. 25 is a diagram showing a mold for fabricating a semiconductor device according to a sixth embodiment of the present invention.

FIG. 25 shows a mold 20F for the semiconductor device fabrication method according to the sixth embodiment of the present invention (hereinafter simply referred to as mold 20F).

The mold 20F used in the present embodiment is characterized by providing non-adhesive process films 75 in an interface between contact surfaces of an upper mold 21F and a lower mold 22F (a first lower mold half body 23F and a second lower mold half body 24F), the resin layer 13 being placed on the above contact surfaces. The non-adhesive process films 75 are made of a substance which does not adhere to the resin layer 13. Hence, the substrate 16 to which the resin layer 13 is formed can be detached from the mold 20F with ease.

Figure 76:
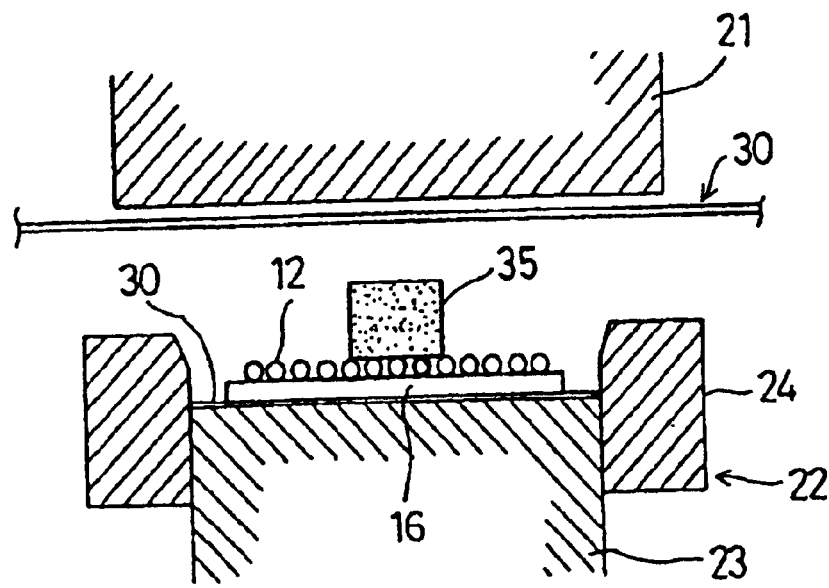
FIG. 76 is a diagram showing a variation of the mold for fabricating a semiconductor device according to the sixth embodiment of the present invention.
Figure 77:
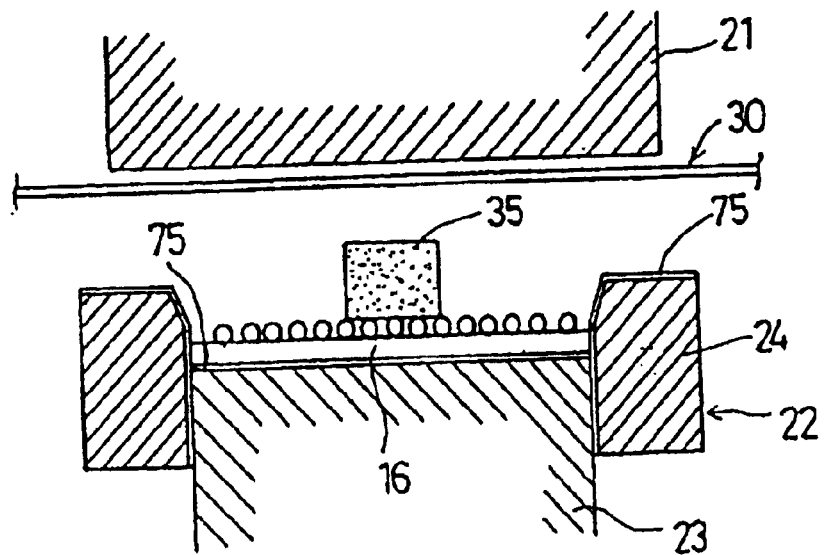
FIG. 77 is a diagram showing another variation of the mold for fabricating a semiconductor device according to the sixth embodiment of the present invention.

FIGS. 76 and 77 show a variation of the mold used in the sixth embodiment of the present invention. FIG. 76 shows an arrangement in which the area of the substrate 16 is narrower than the upper area of the first lower mold half body 23, and a film 30D is placed on the upper surface of the sealing resin 35. Hence, it is possible to reduce the contact interface between the sealing resin 35 and the first lower mold half body 23 and facilitate the detachability.

Figure 22:
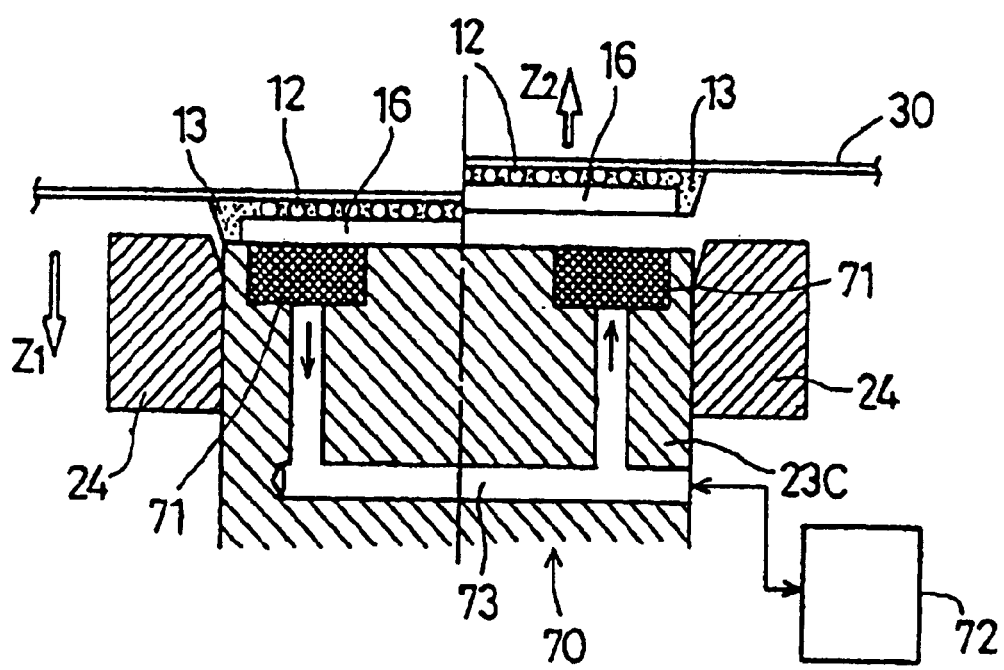
FIG. 22 is a diagram showing a mold for fabricating a semiconductor device according to a third embodiment of the present invention.

When a suction process as described with reference to FIG. 22 is employed in the present embodiment, fine holes (vacuum holes) may be provided in necessary positions of the film 30D.

FIG. 77 shows an arrangement in which the area of the upper surface of the first lower mold half body 23 is approximately equal to the area of the substrate 16. In each of the aforementioned embodiments, the area of the substrate 16 is narrower than the area of the upper surface of the first lower mold half body 23. Hence, the resin layer 13 is provided on sides of the substrate 16 (side surface portions) by the resin sealing process.

By making the area of the upper surface of the first lower mold half body 23 and the area of the substrate 16 equal to each other, it is possible to form the resin layer 13 on the upper surface of the substrate 16 only. It is possible to selectively provide the resin layer 13 on the upper surface of the substrate 16 only or not only on the upper surface but also the side surfaces by taking into consideration how the substrate 16 is used.

In the structure shown in FIG. 77, the film 30 is used for the upper mold 21 and the non-adhesive process film 75 (FIG. 25) is used for the lower mold 22 in order to facilitate the detachability.

A description will now be given of semiconductor devices according to second and third embodiments of the present invention.

Figure 26:
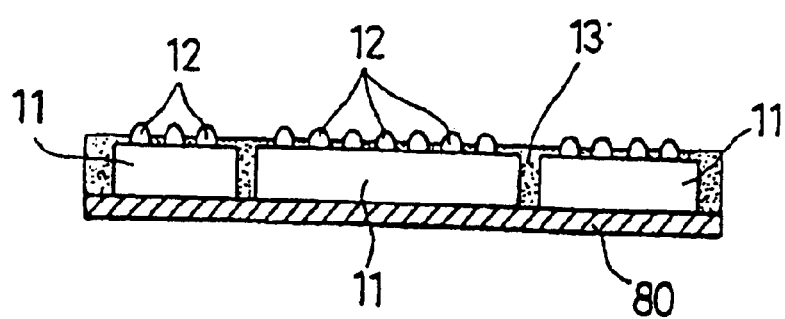
FIG. 26 is a diagram showing a semiconductor device according to a second embodiment of the present invention.
Figure 27:
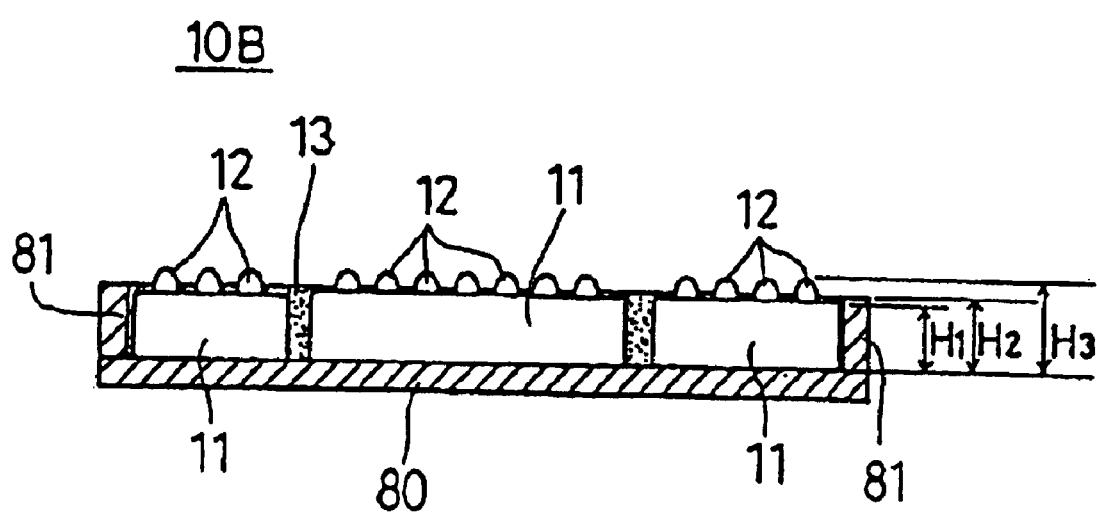
FIG. 27 is a diagram showing a semiconductor device according to a third embodiment of the present invention.

FIG. 26 shows a semiconductor device 10A according to the second embodiment of the present invention, and FIG. 27 shows a semiconductor device 10B according to the third embodiment of the present invention. In FIGS. 26 and 27, parts that have the same structures as those of the semiconductor device 10 shown in FIG. 9 according to the first embodiment of the present invention are given the same reference numbers.

The semiconductor device 10A according to the second embodiment of the present invention has a module structure in which a plurality of semiconductor elements 11 are mounted on a stage member 80. The resin layer 13 seals the bumps 12 except for the ends thereof, and seals the side portions of the semiconductor elements 11. Further, the stage member 80 is formed of a substance having good heat radiating performance (for example, copper or aluminum).

Since the stage member 80 of the semiconductor device 10A is formed of a substance having good heat radiating performance, heat generated by the plurality of semiconductor elements 11 can be efficiently radiated.

The semiconductor device 10B according to the third embodiment of the present invention is characterized by providing dam portions 81 in the outer peripheral portions of the stage member 80 of the semiconductor device 10A shown in FIG. 26. The height H2 of the dam portions 81 from the element mounting surface of the stage member 80 (indicated by an arrow in FIG. 27) is greater than the height H1 of the semiconductor elements 11 from the element mounting surface (indicated by another arrow in FIG. 27).

The height H2 of the dam portions 81 from the element mounting surface of the stage member 80 is less than the height H3 (indicated by yet another arrow in the figure) from the element mounting surface to the ends of the bumps 12 of the elements 11 by a predetermined length.

With the above arrangement, when resin for forming the resin layer 13 is provided in recess portions defined by the dam portions 81 and the stage member 80, the dam portions 81 are filled with the resin and the bumps 12 are sealed except for the ends thereof. Hence, it is possible to easily form the resin layer 13 which seals the bumps 12 so that the ends thereof are exposed from the resin layer 13.

In the semiconductor devices 10A and 10B according to the second and third embodiments of the present invention, additional wiring lines can be formed on the upper surface of the resin layer 13 so that the semiconductor elements 11 are connected together to provide given functions.

Figure 28:
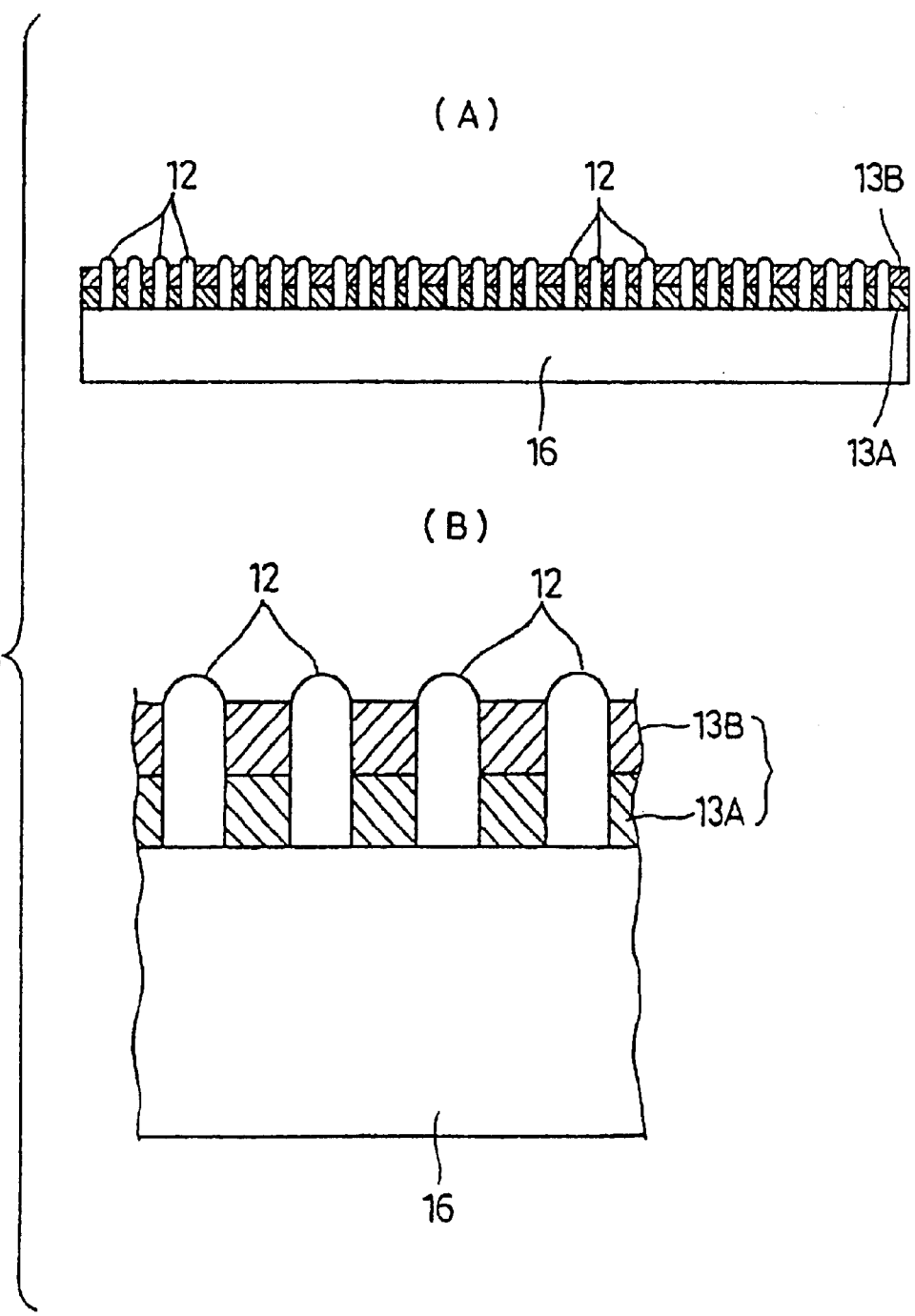
FIG. 28 is a diagram showing a method for fabricating a semiconductor device according to an eighth embodiment of the present invention.

A description will now be given of an eight embodiment of the present invention. FIG. 28 is a diagram which shows a method for fabricating a semiconductor device according to the eighth embodiment of the present invention and more particularly illustrates the substrate 16 after the resin sealing step is completed. FIG. 28(A) shows the whole substrate 16, and FIG. 28(B) is an enlarged view of a portion of the substrate 16. In FIG. 28, parts that have the same structures as those of the first embodiment of the present invention which has been described with reference to FIGS. 1 through 9 are given the same reference numbers, and a description thereof will be omitted.

The aforementioned method for fabricating the semiconductor device according to the first embodiment of the present invention employs the resin layer 13 formed by a single kind of resin layer 35. It will be noted that the resin layer 13 is required to have various functions. For example, it is desirable to form the resin layer 13 of hard resin in terms of protection of the substrate 16 and to form the resin layer 13 of soft resin in order to relax stress applied to the bumps 12 when mounting the device. In practice, it may be very difficult to meet both the requirements by means of a single kind of resin.

The eight embodiment of the present invention is characterized in that a plurality of kinds of resin having different natures are used as the sealing resin used in the resin sealing step. In the present embodiment, two kinds of resin are used to form resin layers 13A and 13B. In the example shown in FIG. 28, the resin layers 13A and 13B are stacked.

In order to form the resin layers 13A and 13B, the resin molding step commences filling the mold with sealing resin for forming the resin layer 13A. Then, the resin layer 13A is formed on the substrate 16. Next, the resin molding step fills the mold with sealing resin for forming the resin layer 13B. Hence, the resin layer 13B is formed on the resin layer 13A. Alternatively, a sealing resin is formed beforehand which has a stacked structure having the resin layers 13A and 13B. Then, the above sealing resin is formed on the substrate 16 so that the resin layers 13A and 13B are provided by performing the resin sealing step only one time.

For example, the resin layer 13B facing the outside of the device is made of hard resin, and the resin layer 13A located inside thereof is made of soft resin. In this arrangement, the substrate 16 can definitely be protected by the resin layer 13B formed of hard resin, while stress applied to the bumps 12 at the time of mounting the device can be absorbed by the resin layer 13A formed of soft resin. Hence, the semiconductor device fabricated by the present embodiment method has improved reliability.

A description will now be given of a ninth embodiment of the present invention.

Figure 29:
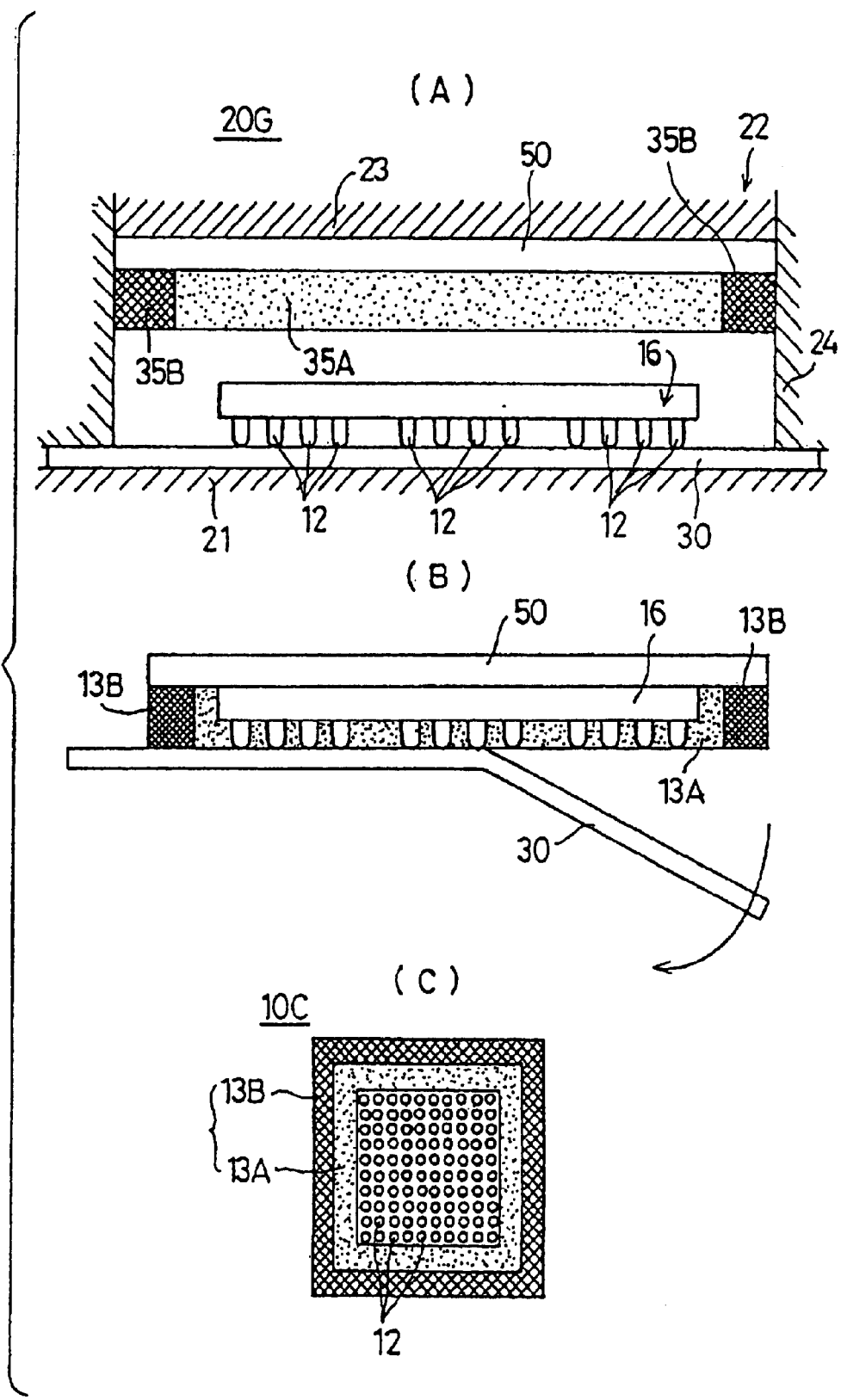
FIG. 29 is a diagram showing a method for fabricating a semiconductor device according to a ninth embodiment of the present invention.

FIG. 29 is a diagram showing a method for fabricating a semiconductor device according to the ninth embodiment of the present invention. In FIG. 29, parts that have the same structures as those of the first embodiment of the present invention are given the same reference numbers, and a description thereof will be omitted.

The ninth embodiment of the present invention is characterized, as in the case of the eighth embodiment thereof, by using a plurality kinds of resin having different performances are used (two kinds of resin are used in the ninth embodiment). The eighth embodiment of the present invention has the stacked structure made up of the resin layers 13A and 13B. In the ninth embodiment of the present invention, the resin layer 13B is arranged in the outer periphery of the substrate 16, and the resin layer 13A is arranged in a portion surrounded by the resin layer 13B (see FIG. 29(C)).

A description will be given of a method for forming the semiconductor device according to the ninth embodiment of the present invention.

FIG. 29(A) shows a resin sealing step of the semiconductor device fabrication method according to the present embodiment of the invention. A mold 20G used in the present resin sealing step has a structure having upper and lower portions, which correspond to the lower and upper portions of the mold 20 used in the first embodiment of the present invention described with reference to FIG. 1. For the sake of convenience, parts of the mold 20G are assigned the same names and reference numerals as those of the mold 20. Further, the present embodiment employs the reinforcement plate 50 as in the case of the aforementioned fifth embodiment of the present invention.

The reinforcement plate 50 is attached to the first lower mold half body 23. A sealing resin 35A for forming the resin layer 13A and a sealing resin 35B for forming the resin layer 13B are arranged to the lower surface (facing the substrate 16) of the reinforcement plate 50. The sealing resin 35B for forming the resin layer 13B is located in the outer periphery of the reinforcement plate 50. The sealing resin 35A for forming the resin layer 13A is located in the area surrounded by the sealing resin 35B. The substrate 16 to which the bumps 12 are formed is supported by the upper mold 21 through the film 30.

The substrate 16 and the reinforcement member 50 to which the sealing resins 35A and 35B are attached are loaded onto the mold 20G. Then, the first lower mold half body 23 moves up towards the upper mold 21. Hence, the sealing resins 35A and 35B are compression-molded so that the resin layers 13A and 13B are formed. As described before, since the sealing resin 35B is arranged in the outer periphery of the reinforcement plate 50 and the sealing resin 35A is arranged in the area surrounded by the sealing resin 35B, the resin layer 13B is located in the outer periphery of the substrate 16, and the resin layer 13A is located in the area surrounded by the resin layer 13A.

When the above resin sealing step is completed, as shown in FIG. 29(B), the film 30 is removed by the protruding electrode exposing step, so that the semiconductor device 10C shown in FIG. 29(C) is defined.

The resin layer 13B located in the outer periphery of the substrate 16 (semiconductor element) can be formed of hard resin, while the resin layer 13A surrounded by the resin layer 13B can be formed of soft resin. The outer periphery of the semiconductor device 10C fabricated by the above method is surrounded the resin layer 13B formed of hard resin, and the substrate 16 is definitely protected by the reinforcement plate 50 and the resin layer 13B. Hence, the semiconductor device 10C has improved reliability.

The resin layer 13A located further in than the resin layer 13B is formed of soft resin and is thus capable of absorbing stress applied to the bumps 12 at the time of mounting the device on a mounting board. Hence, the stress applied to the bumps 12 can be relaxed, and the reliability of the semiconductor device 10C can be improved.

A description will now be given of tenth and eleventh embodiments of the present invention.

Figure 30:
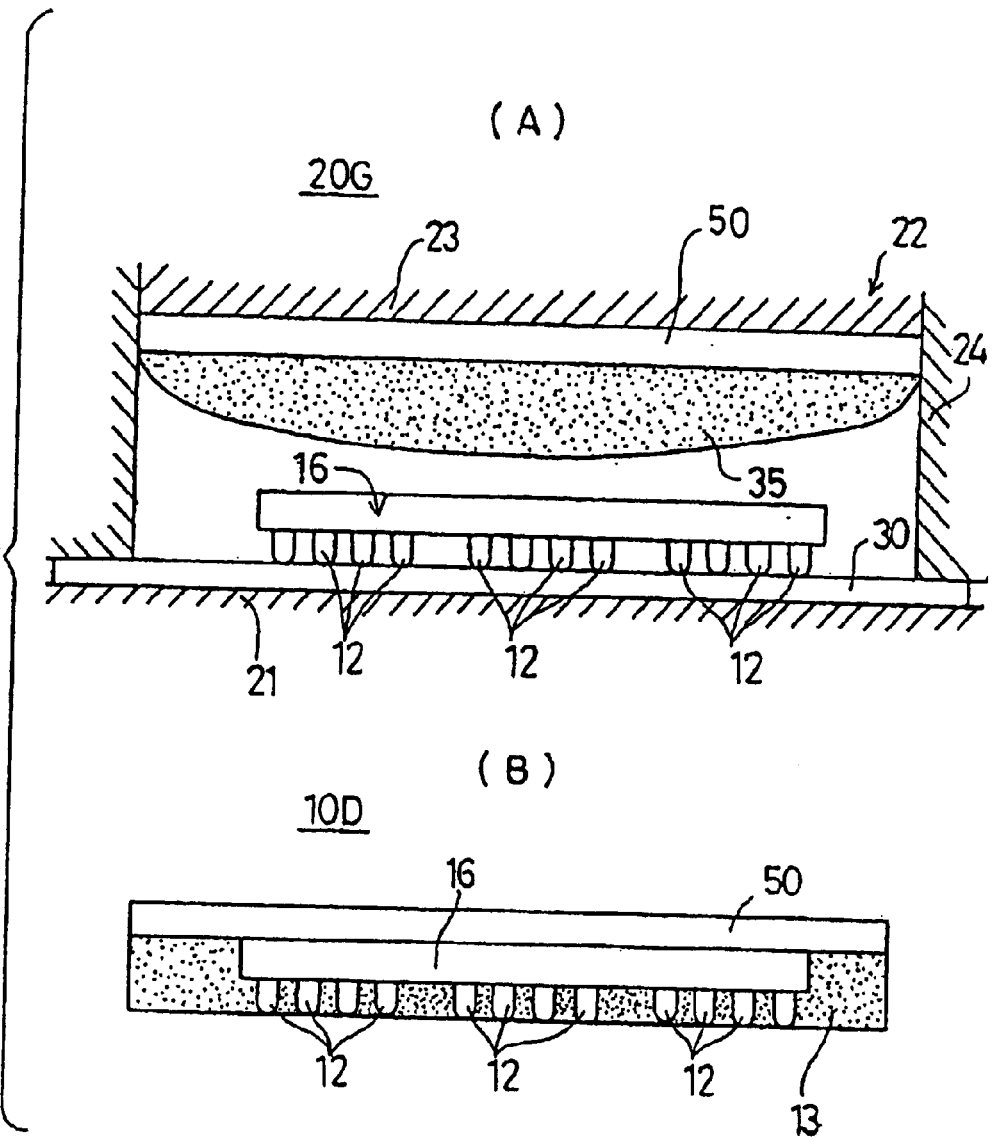
FIG. 30 is a diagram showing a method for fabricating a semiconductor device according to a tenth second embodiment of the present invention.
Figure 31:
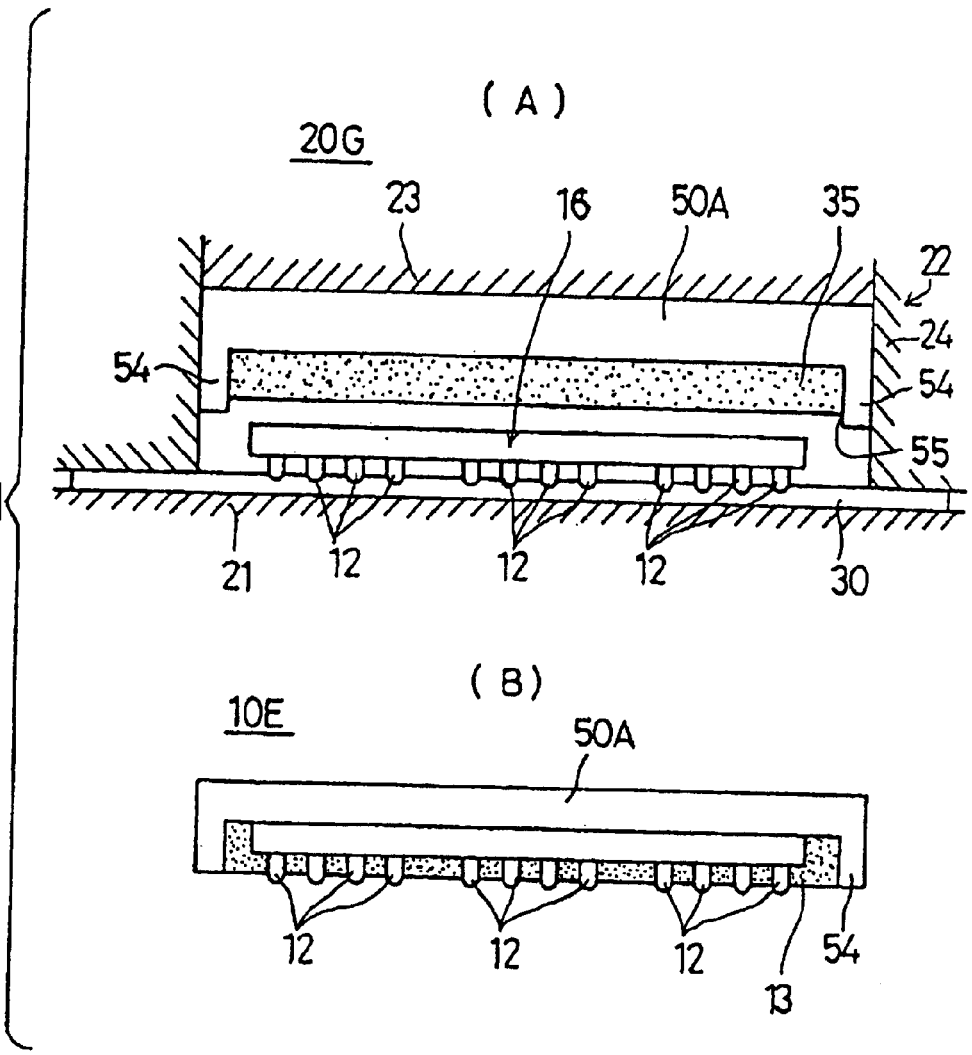
FIG. 31 is a diagram showing a method for fabricating a semiconductor device according to an eleventh embodiment of the present invention.

FIG. 30 is a diagram showing a method for fabricating a semiconductor device according to the tenth embodiment of the present invention, and FIG. 31 is a diagram showing a method for fabricating a semiconductor device according to the eleventh embodiment of the present invention. In FIGS. 30 and 31, parts that have the same structures as those of the first embodiment described with reference to FIGS. 1 through 9 and the ninth embodiment of the present invention described with reference to 29 are given the same reference numbers.

The fabrication method according to the tenth embodiment shown in FIG. 30 is characterized by arranging the sealing resin 35 to the reinforcement plate 50 in the resin sealing step as in the case of the aforementioned ninth embodiment of the present invention. The fabrication method according to the eleventh embodiment shown in FIG. 31 is characterized by providing a reinforcement plate 50A integrally with a frame part 54 and arranging the sealing resin 35 to the reinforcement plate 50A beforehand.

By arranging the sealing resin 35 to the reinforcement plates 50 and 50A beforehand in the resin sealing step, the reinforcement plates 50 and 50A can be used as a part of the mold 20G. More particularly, the reinforcement plates 50 and 50A can be used as a part of the first lower mold half body 23.

Hence, it is possible to reduce the area of the sealing resin 35 which directly contacts the first lower mold half body 23 (mold 20G) and to omit the step of removing unwanted resin attached to the mold employed in the prior art. Hence, the work of the resin sealing step can be simplified.

Parcicularly, the eleventh embodiment of the present invention provides the reinforcement plate 50A with the frame part 54. Hence, the portion of the reinforcement plate 50A which faces the substrate 16 defines a recess portion 55, which can be used as a cavity. In the arrangement shown in FIG. 30 in which the reinforcement plate 50 of a flat-plate shape is used, the sealing resin 35 touches the second lower mold half body 24. Hence, unwanted resin located in the above touching portion cannot be removed.

In contrast, the eleventh embodiment of the present invention shown in FIG. 31 can realize an arrangement in which the sealing resin 35 does not contact the mold 30G at all, so that unwanted resin attached to the mold 20G can easily be removed.

In the above-mentioned tenth and eleventh embodiments of the present invention, when the reinforcement plates 50 and 50A are formed of a material having a good heat radiating performance, the semiconductor devices 10D and 10E will have an improved heat radiating performance. FIG. 30(B) shows the semiconductor device 10D fabricated by the fabrication method according to the tenth embodiment, and FIG. 31(B) shows the semiconductor device 10E fabricated by the fabrication method according to the eleventh embodiment of the present invention.

A description will now be given of a twelfth embodiment of the present invention.

Figure 32:
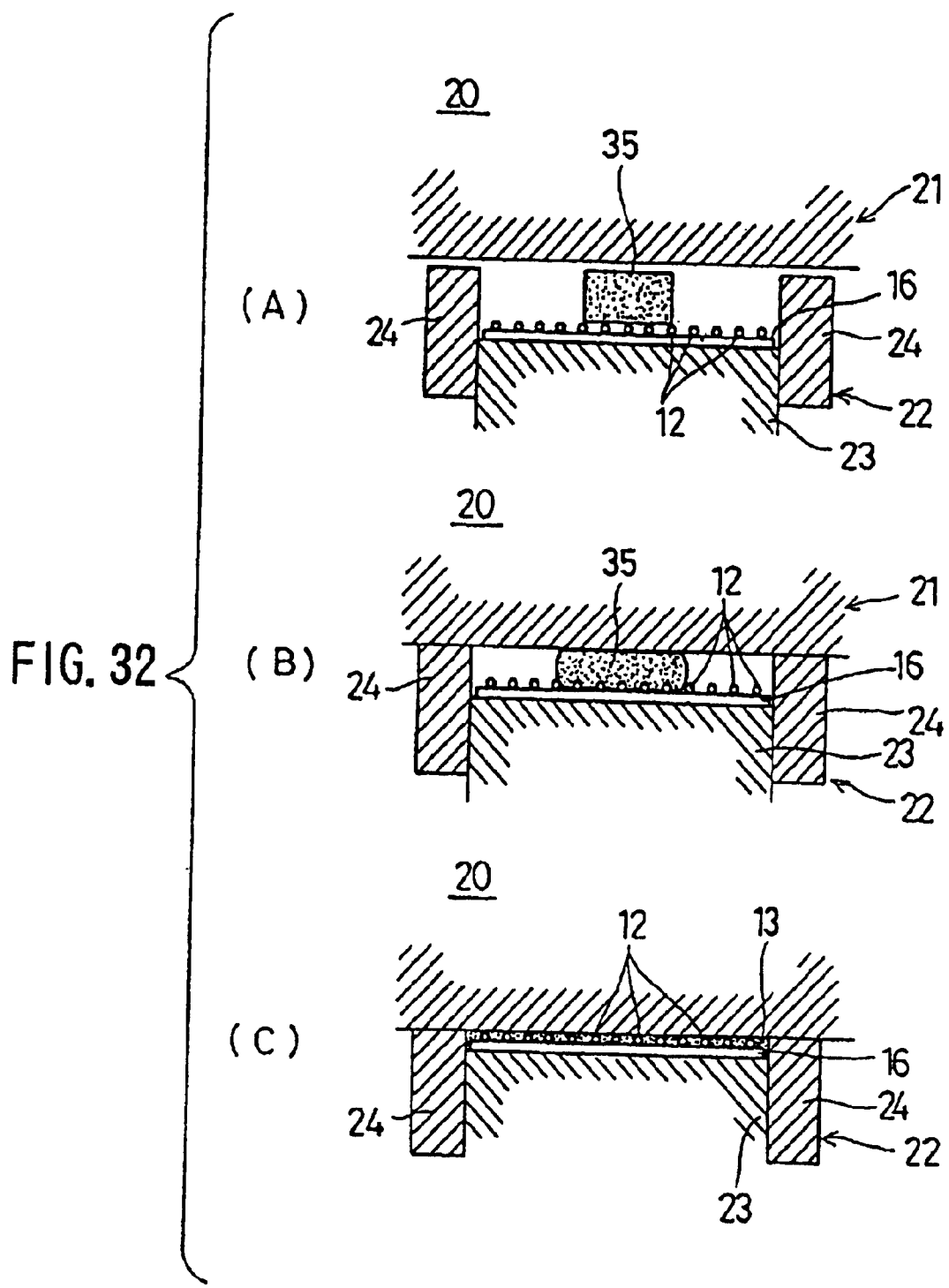
FIG. 32 is a diagram (part 1) showing a method for fabricating a semiconductor device according to a twelfth embodiment of the present invention.
Figure 33:
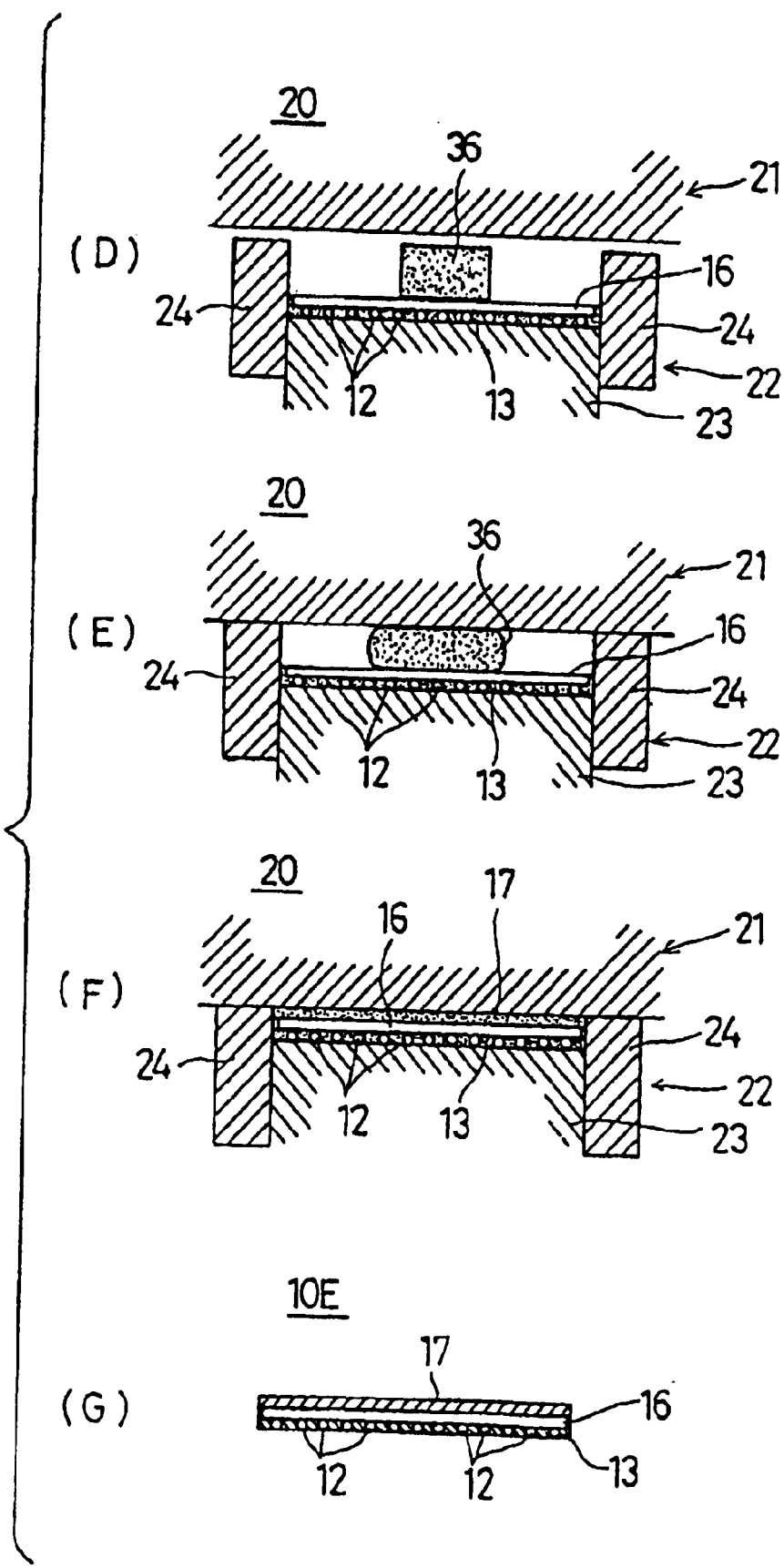
FIG. 33 is another diagram (part 2) showing the method for fabricating a semiconductor device according to the twelfth embodiment of the present invention.

FIGS. 32 and 33 are diagrams showing a method for fabricating a semiconductor device according to the twelfth embodiment of the present invention. In FIGS. 32 and 33, parts that have the same structures as those of the first embodiment described with reference to FIGS. 1 through 9 are given the same reference numbers, and a description thereof will be omitted.

The fabrication method of the present embodiment is characterized by forming the resin layer 13 (the first resin layer) on the front surface of the substrate 16 on which the bumps 12 are formed as in the case of each of the aforementioned embodiments, and then forming a second resin layer 17 on the back surface of the substrate 16. A detailed description will be given of a resin sealing step of the present invention by referring to FIGS. 32 and 33.

FIG. 32(A) and FIG. 32(B) show a step of compression-forming the first resin layer 13 on the front surface of the substrate 16 on which the bumps 12 are formed. The process shown in FIGS. 32(A) and 32(B) is the same as that which has been described previously with reference to FIGS. 1 through 4. Hence, a description of the step of forming the first resin layer 13 will be omitted here.

After the first resin layer 13 is formed on the front surface (bump formation surface) of the substrate 16 through the process shown in FIGS. 32(A) and 32(B), the substrate 16 is taken out of the mold 20, and is turned upside down. Then, the substrate 16 is loaded onto the mold 20 again. Hence, the substrate 16 is loaded onto the mold 20 so that surface of the substrate 16 on which the bumps 12 are formed faces the first lower mold half body 23. Then, as shown in FIG. 33(D), a second sealing resin 36 is placed on the upper surface of the substrate 16 loaded onto the first lower mold half body 23.

Subsequently, as shown in FIG. 33(E), the upper mold 21 and the second lower mold half body 24 are moved down and thus the second sealing resin 36 is compression-molded. Hence, as shown in FIG. 33(F), the second resin layer 17 is formed on the back surface of the substrate 16.

FIG. 33(G) shows a semiconductor device 10E fabricated by the method of the present embodiment. As shown in this figure, the semiconductor device 10E has a structure in which the first resin layer 13 is compression-molded on the front surface of the substrate 16 on which the bumps 12 are formed and the second resin layer 17 is compression-molded on the back surface of the substrate 16.

The semiconductor device 10 is well balanced because the first resin layer 13 is formed, by the resin sealing step, on the front surface of the substrate 16 on which the bumps 12 are formed, and thereafter the second resin layer 17 is formed so as to cover the back surface of the substrate 16.

That is, the arrangement in which only the first resin layer 13 is provided to the front surface of the substrate 16 has a possibility that a difference in thermal expansion may occur between the front and back sides of the substrate 16 because the substrate 16 (semiconductor element) and the sealing resin have different thermal expansion ratios and a warp may occur in the substrate 16.

In contrast, according to the twelfth embodiment of the present invention, the front and back surfaces of the substrate 16 are respectively covered by the resin layers 13 and 17 so that the states of the front and back surfaces of the substrate 16 can be equalized and the semiconductor device 10E can be well balanced. Hence, it is possible to prevent occurrence of a warp in the semiconductor device 10E during the thermal process.

It is also possible to select the first resin layer 13 formed on the front surface of the substrate 16 and the second resin layer 17 formed on the back surface thereof of resins having different natures. For example, the first resin layer 13 is formed of soft resin so that stress applied to the bumps 12 can be relaxed.

When the second resin layer 17 provided on the back surface of the substrate 16 is formed of hard resin, the substrate 16 can definitely be protected from external force. When the second resin layer 17 is formed of resin having a good heat radiating performance, the semiconductor device 10E has an improved heat radiating performance.

A description will be given of a thirteenth embodiment of the present invention.

Figure 34:
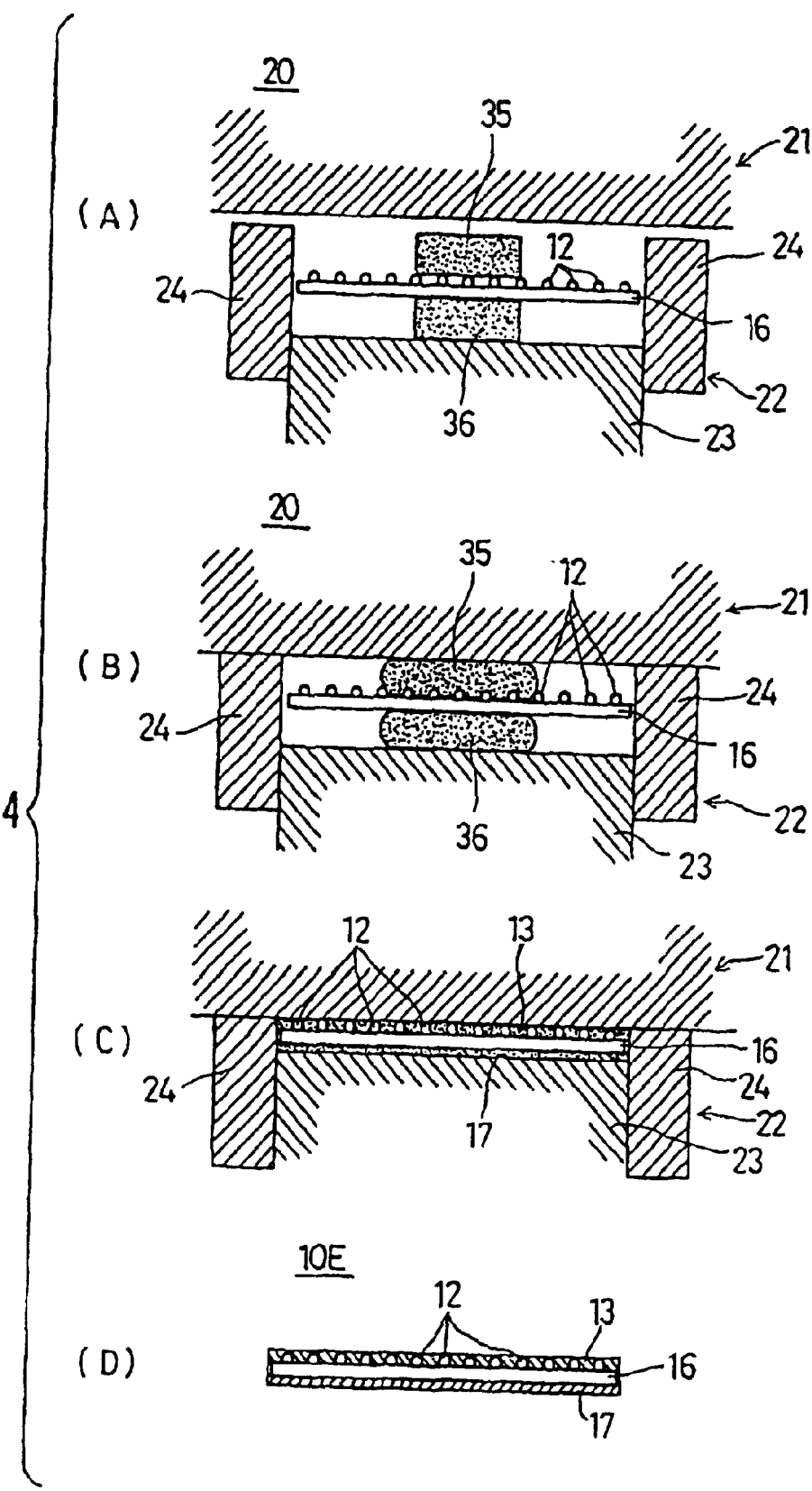
FIG. 34 is a diagram showing a method for fabricating a semiconductor device according to a thirteenth embodiment of the present invention.

FIG. 34 is a diagram showing a method for fabricating a semiconductor device according to a thirteenth embodiment of the present invention. In FIG. 34, parts that are the same as those of the first embodiment described with reference to FIGS. 1 through 9 and the twelfth embodiment described with reference to FIGS. 32 and 33 are given the same reference numbers, and a description thereof will be omitted.

Even in the present embodiment fabrication method, the first resin layer 13 is formed on the front surface of the substrate 16 and the second resin layer 17 is formed on the back surface thereof. In the fabrication method of the twelfth embodiment described with reference to FIGS. 32 and 33, the first resin layer 13 is formed by the process shown in FIG. 32(A) through 32(C). Thereafter, the substrate 16 to which the first resin layer 13 is formed is taken out of the mold 20 and is turned upside down. Then, the process shown in FIGS. 33(D) through 33(F) is carried out so that the second resin layer 17 is formed. Hence, the twelfth embodiment of the present invention is required to perform the compression molding step twice and does not have a good production efficiency.

With the above in mind, the fabrication method according to the thirteenth embodiment of the present invention is characterized by simultaneously forming the first and second resin layers 13 and 17 by carrying out the compress molding step only one time. When the substrate 16 is loaded onto the mold 20 in the resin sealing step, as shown in FIG. 34(A), the second sealing resin 36 is loaded onto the mold 20 first, and the substrate 16 is placed on the first sealing resin 36 second. Thereafter, the first sealing resin 35 is placed on the substrate 16. During the above process, the second sealing resin 35 contacts the back surface of the substrate 16, and the first sealing resin 35 is placed on the surface of the substrate 16 on which the bumps 12 are formed.

FIG. 34(B) shows a state in which the compression molding is being performed. As shown in this figure, the substrate 16 is sandwiched between the first sealing resin 35 and the second sealing resin 36. Hence, the sealing resins 35 and 36 can be simultaneously compression-molded on the front and back surfaces of the substrate 16. FIG. 34(C) shows a state in which the first resin layer 13 is formed on the front surface of the substrate 16, and the second resin layer 17 is formed on the back surface thereof.

FIG. 34(D) shows a semiconductor device fabricated by the production method according to the present embodiment, and has the same structure as that of the semiconductor device 10E fabricated by the twelfth embodiment (the semiconductor device fabricated by the method according to the thirteenth embodiment is also assigned the reference number 10E). As described above, it is not necessary to perform the work for turning the substrate 16 upside down as in the case of the fabrication method of the twelfth embodiment. The first resin layer 13 and the second resin layer 17 can totally be formed by performing the compression molding process only one time. Hence, the production efficiency of the semiconductor device 10E can be improved.

A description will now be given of a method for fabricating a semiconductor device according to a fourteenth embodiment of the present invention.

Figure 35:
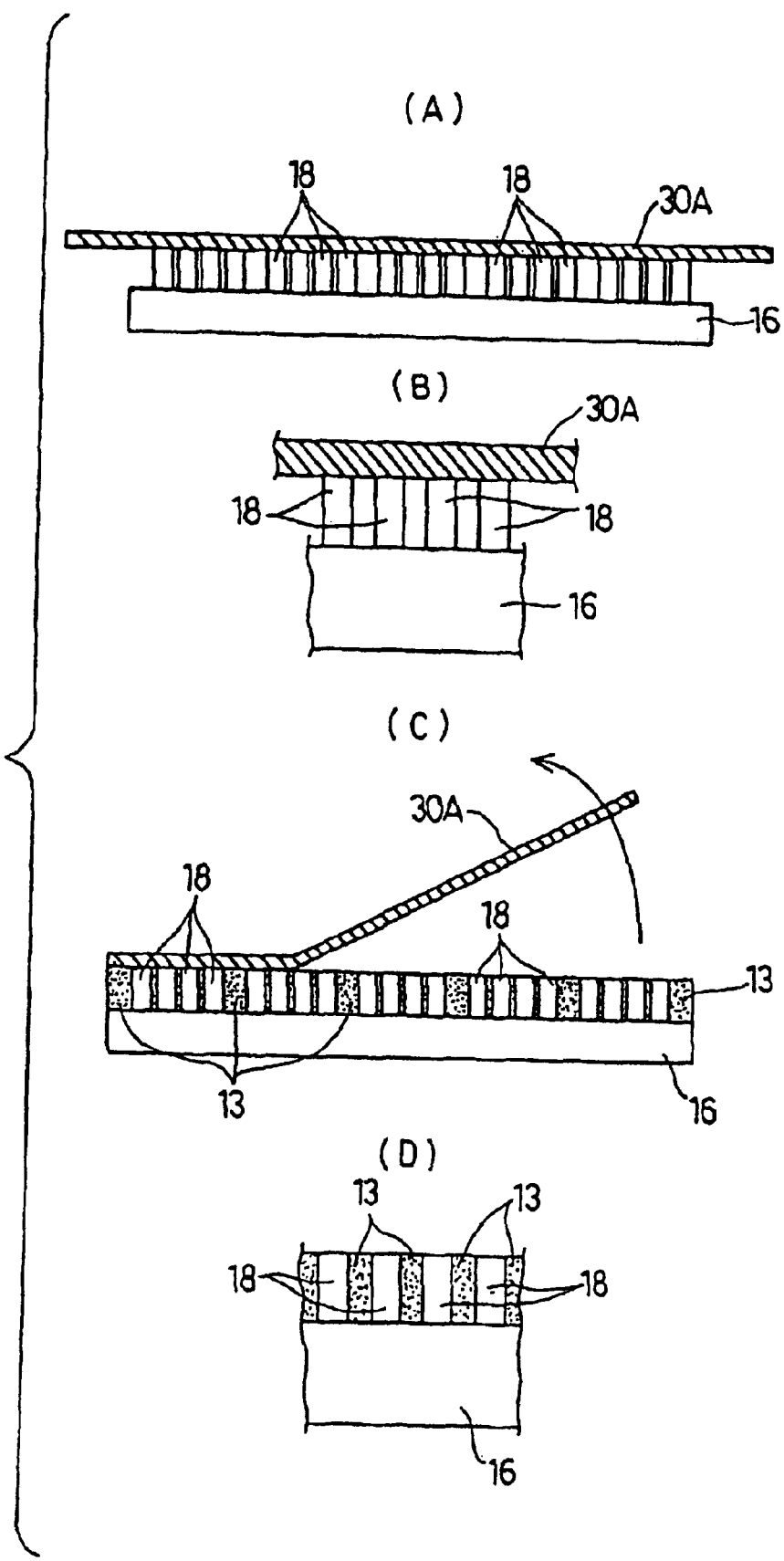
FIG. 35 is a diagram showing a method for fabricating a semiconductor device according to a fourteenth embodiment of the present invention.

FIG. 35 is a diagram showing the method for fabricating the semiconductor device according to the fourteenth embodiment. In FIG. 35, parts that have the same structures as those of the first embodiment described with reference to FIGS. 1 through 9 are given the same reference numbers, and a description thereof will be omitted.

In each of the aforementioned embodiments of the present invention, the protruding electrodes are spherical bumps. The fourteenth embodiment is characterized in that the protruding electrodes are straight bumps 18. The straight bumps are of a circular cylinder shape, and can be formed by a plating method. Since the straight bumps 18 have the circular cylinder shape, the area of tip ends thereof is wider than that of the spherical bumps 12.

the resin sealing step and the protruding electrode exposing step for the straight bumps 18 can be performed in the same manner as those employed in the aforementioned embodiments of the present invention. FIGS. 35(A) and 35(B) show a state in which the substrate 16 in which the straight bumps 18 are formed is loaded onto the mold 20 (not shown therein) in the resin sealing step. FIG. 35B is an enlarged cross-sectional view of a portion of the illustration of FIG. 35(A). In the loaded state, a film 30A is loaded onto the ends of the straight bumps 18.

The film 30A has the same structure as that shown in FIG. 19 and is not liable to be elastically deformed. When the resin sealing step is carried out for the substrate 16 in the above state, the resin layer 13 is compression-molded between the film 30A and the front surface of the substrate 16.

When the resin sealing step is completed, a process is carried out which removes the film 30A fixed to the resin layer 13 (indicated by a pear-skin illustration) therefrom, as shown in FIG. 35(C). As shown by an enlarged illustration of FIG. 35(D), the straight bumps 18 are embedded in the resin layer 13 except for the ends thereof.

In the seventh embodiment described with reference to FIGS. 19 through 21, the bumps 12 has a spherical shape, and thus only small areas of the bumps 12 are exposed from the resin layer 13 which totally seals the bumps 12. Hence, it is required to expose the ends of the bumps 12 from the resin layer 13, as shown in FIG. 21.

In contrast, the fourteenth embodiment of the present invention employs the straight bumps 18 of the circular cylinder shape, the ends of the bumps 18 exposed from the resin layer 13 has a comparatively wide area. Hence, as shown in FIG. 35(D), a sufficient electrical contact can be made by merely removing the film 30A from the resin layer 13. Hence, the use of the straight bumps 18 can omit the step of exposing the bumps 12 from the resin layer 13 which is required when the spherical bumps 12 are employed. Thus, the step of fabricating the semiconductor device can be simplified.

If it is aquired to provide further improved electrical contact performance, the step of exposing the ends of the straight bumps 18 from the resin layer 13. In the following description, the term "bumps 12" includes the bumps 12 having the spherical shape and the straight bumps 18. Further, if the bumps 12 having the spherical shape are specifically described, a term "spherical bumps 12" is used. Similarly, if the straight bumps 18 are specifically described, a term "straight bumps 18" is used.

A description will be given of a fifteenth embodiment of the present invention.

Figure 36:
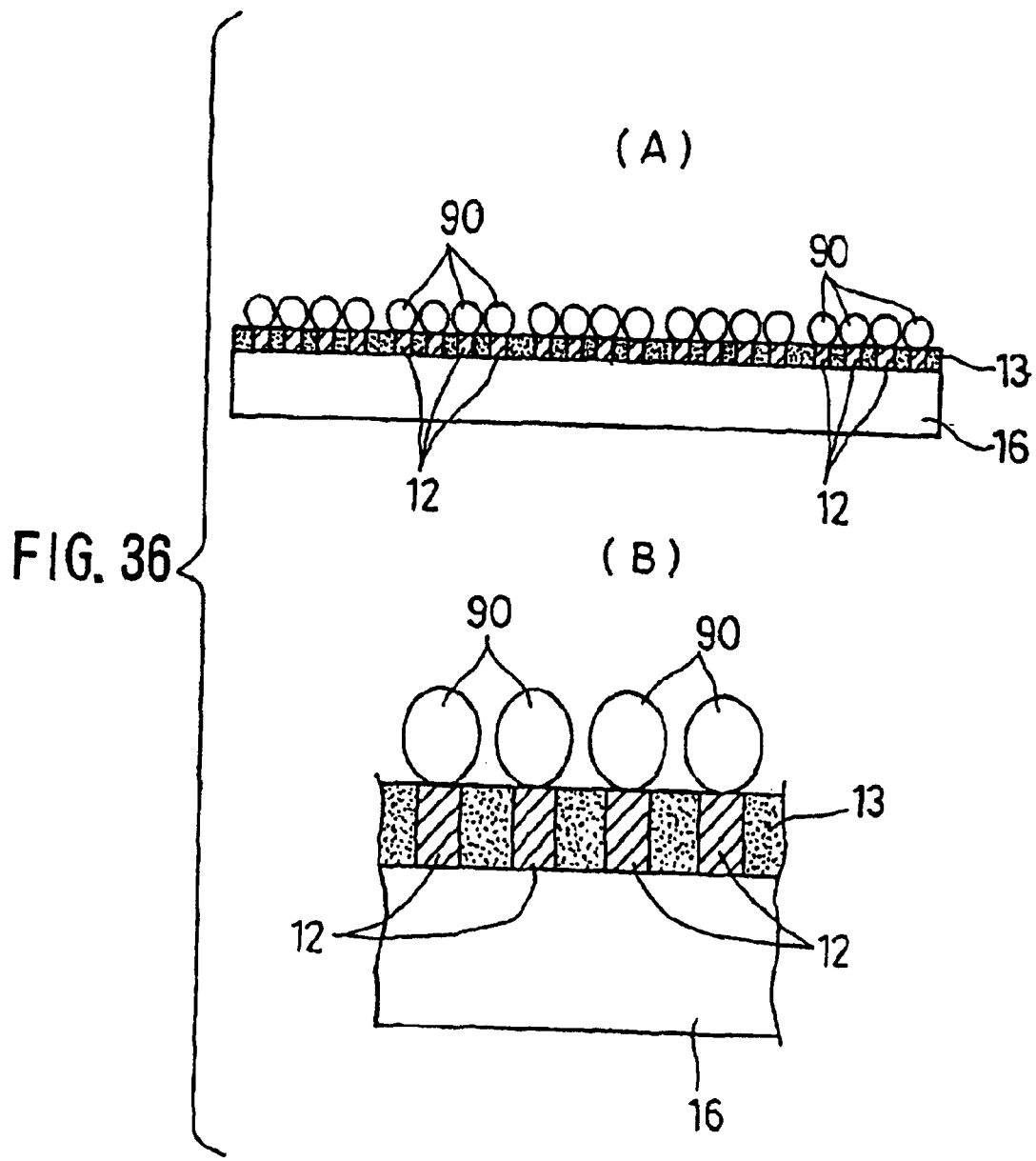
FIG. 36 is a diagram showing a method for fabricating a semiconductor device according to a fifteenth embodiment of the present invention.

FIG. 36 is a diagram showing a method of fabricating a semiconductor device according to the fifteenth embodiment of the present invention. In FIG. 36, parts that have the same structures as those of the first embodiment described with reference to FIGS. 1 through 9 and the fourteenth embodiment described with reference to FIG. 35 are given the same reference numbers, and a description thereof will be omitted.

The fabrication method according to the fifteenth embodiment is characterized by forming, after at least the ends of the bumps 12 (the straight bumps 18 are used in the present embodiment) are exposed from the resin layer 13 by the protruding electrode exposing step, other bumps 90 (hereinafter referred to as external connection bumps) on the ends of the bumps 12.

The external connection bumps 90 are formed by an external connection protruding electrode forming step, which may be a bump formation technique which is generally used in practice. Examples of such a technique are a transferring method, a plating method and a dimple plate method. After the protruding electrode exposing step is executed, the external connection protruding electrode forming step is carried out so that the external connection bumps 90 are formed on the ends of the straight bumps 18.

According to the present embodiment, the protruding electrode exposing step is carried out and then the external connection protruding electrode forming step is carried out so that the external connection bumps 90 are formed on the ends of the straight bumps 18 and the electrical connections between the semiconductor device and a mounting board can be made more definitely.

More particularly, the bumps 12 are formed on the electrodes formed on the substrate 16 (semiconductor element), and are required to have a small size. Hence, when the small-size bumps 12 are used as external connection terminals for making electrical connections with the mounting board, there is a possibility that the electrical connections between the mounting board and the bumps 12 may not be made definitely.

The external connection bumps 90 provided in the present embodiment are separated from the bumps 12 formed on the substrate 16. Hence, it is possible to design the external connection bumps 90 separately from the substrate 16 and the bumps 12 (of course, the bumps 90 must be electrically connected to the bumps 12) and is thus flexible to the structure of the mounting board. Hence, the external connection bumps 90 provided to the ends of the bumps 12 makes it possible to improve the performance of mounting the semiconductor device on the mounting board.

A description will be given of a sixteenth embodiment of the present invention.

Figure 37:
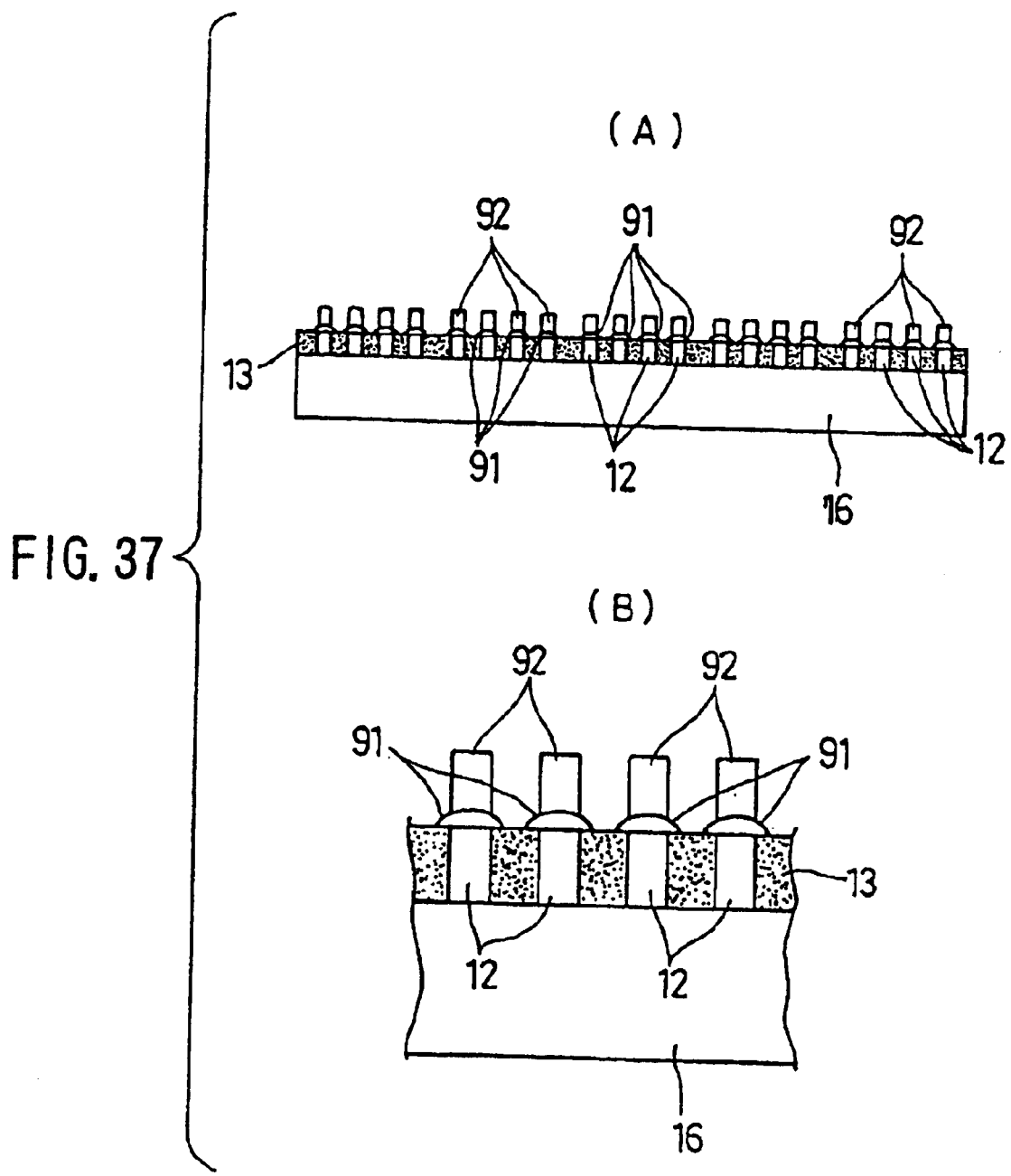
FIG. 37 is a diagram showing a method for fabricating a semiconductor device according to a sixteenth embodiment of the present invention.

FIG. 37 is a diagram showing a method of fabricating a semiconductor device according to a sixteenth embodiment of the present invention. In FIG. 37, parts that have the same structures as those of the first embodiment described with reference to FIGS. 1 through 9 and the fifteenth embodiment described with respect to FIG. 36 are given the same reference numbers, and a description thereof will be omitted.

The present embodiment is characterized by bonding the bumps 12 and the external connection protruding electrodes by means of adhesive members 91 (hereinafter, stress relaxation bonding members) in the external connection protruding electrode forming step. The present embodiment is also characterized by using pole electrodes 92 that serve as the external connection protruding electrodes.

The stress relaxation bonding members 91 are solder which has a fusing point higher than the temperature applied when the semiconductor device is mounted. The pole electrodes 92 may be wires of palladium. The bumps 12 and the pole electrodes 92 are bonded together by the stress relaxation bonding members 91. The solder is a comparatively soft metal, and thus the stress relaxation bonding members 91 of solder are deformed in the bonded positions of the bumps 12 and the pole electrodes 92. Hence, stress exerted on the pole electrodes 92 can be absorbed.

According to the sixth embodiment, the bumps 12 and the pole electrodes 92 are bonded together by the stress relaxation bonding members 91 having the stress relaxing function. Hence, even if external force is exerted on the pole electrodes 92 and stress is caused, the stress is relaxed by the stress relaxation bonding members 91 and is prevented from being transferred to the bumps 12. Hence, it is possible to the substrate 16 (semiconductor element) from being damaged due to external stress and thus improve the reliability of the semiconductor device.

Since the external connection protruding electrodes are formed by the pole electrodes 92, it is possible to make good electrical connections with external connection terminals (those provided on the mounting board or those of a test device), as compared with the spherical electrodes. The spherical electrodes have a comparatively narrow connection area, whereas the pole electrodes 92 have a comparatively wide connection area.

It may be somewhat difficult to form the spherical electrodes and obtain an even height (diameter). In contrast, it is possible to easily form the wire-shaped pole electrodes 92 having an equal length, whereby there is no substantial difference in length among the pole electrodes 92. Further, the pole electrodes 92 can be elastically buckling-deformed, and inherently have the stress relaxing function. Hence, it is possible to more effectively relax stress caused by external force.

A description will be given of a seventeenth embodiment of the present invention.

Figure 38:
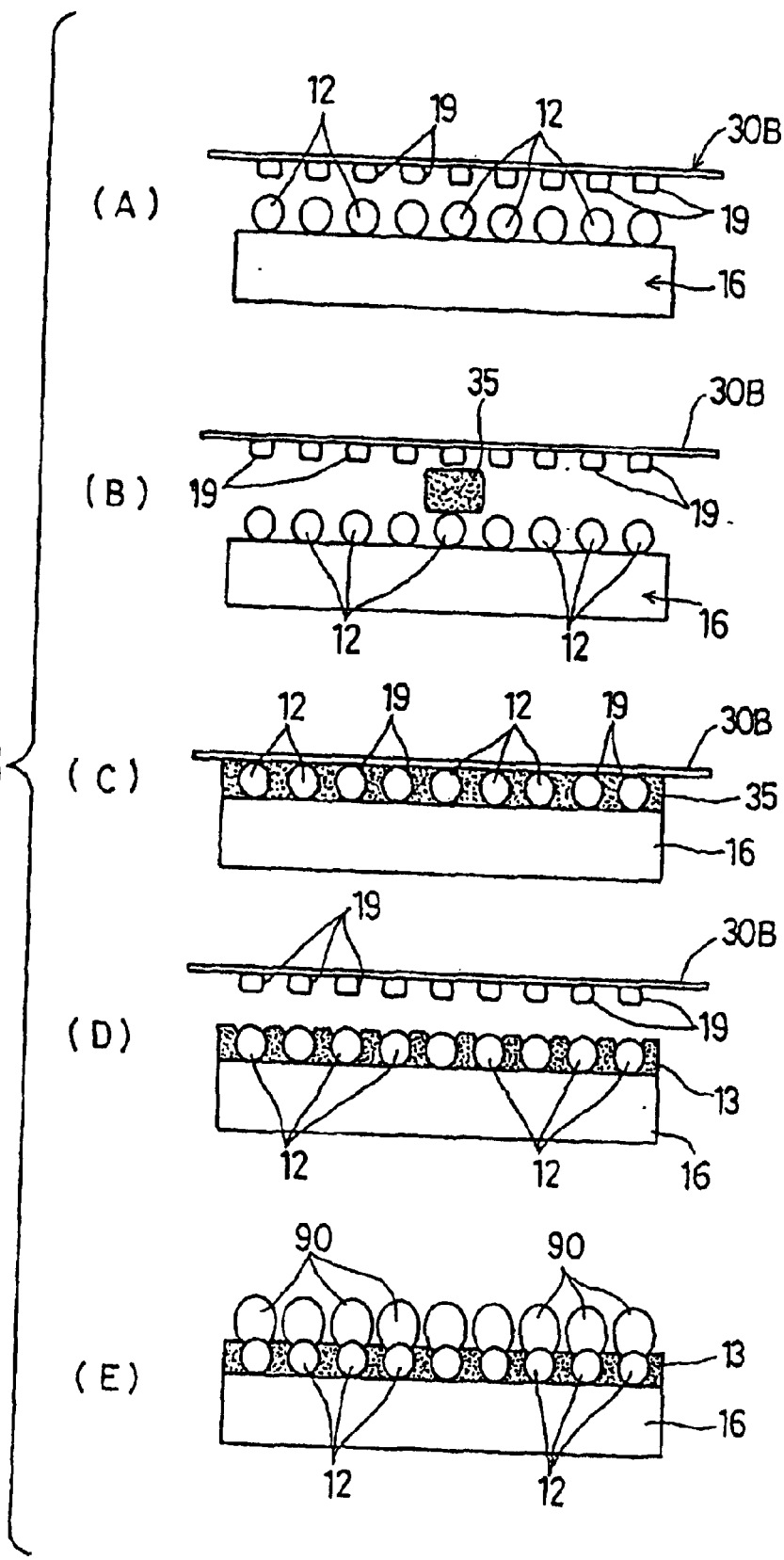
FIG. 38 is a diagram showing a method for fabricating a semiconductor device according to a seventeenth embodiment of the present invention.

FIG. 38 is a diagram showing a method of fabricating a semiconductor device according to the seventeenth embodiment of the present invention. In FIG. 38, parts that have the same structures as those of the first embodiment described with reference to FIGS. 1 through 9 are given the same reference numbers and a description thereof will be omitted.

The film 30 is formed of an elastic substance in order to expose the bumps 12 from the resin layer 13 in the aforementioned first embodiment of the present invention. Further, the film 30 is provided to the bumps 12 so that the ends of the bumps 12 fall in the film 30. Thus, when the film 30 is removed, the ends of the bumps 12 are exposed from the resin layer 13. However, the ends of the bumps 12 protruding from the resin layer 13 thus formed may have a comparatively narrow area and may not make good electrical contacts to the mounting board.

In the aforementioned seventh embodiment, the film 30A is formed of hard resin, and the ends of the bumps 12 are not naked from the resin layer 13 when the film 30A is removed. The ends of the bumps 12 are exposed by the laser projecting device or the like as shown in FIG. 21. However, the seventh embodiment requires a large-scale facility to expose the ends of the bumps 12.

With the above in mind, as shown in FIG. 38(A), the seventeenth embodiment is characterized by forming the film 30B of a hard substance in the resin sealing step and forming projections 19 on the film 30B so that the projections 19 face the bumps 12. A description will be given of the resin sealing step using the film 30B provided with the projections 19. In FIG. 38, an illustration of the mold is omitted.

FIG. 38(B) shows a state in which the substrate 16, the sealing resin 35 and the film 30B are loaded onto the mold.

In this state, the projections 19 formed on the film 30B are positioned so as to face the bumps 12 formed on the substrate 16. The film 30B is formed of a hard resin substance, and the projections 19 are formed of a comparatively soft resin substance. That is, the present embodiment, the film 30B and the projections 19 are made of different substances (however, the films 30B and the projections 19 may be integrally formed of an identical substance).

FIG. 38(C) shows a state in which the sealing resin 35 is subjected to a compression molding process. In the compression molding process, the projections 19 formed on the film 30B are pressed by the bumps 12. Hence, the sealing resin 35 do not adhere to the bumps 12, in areas in which the projections 19 are pressed by the bumps 12. IN addition, the projections 19 are formed of soft resin, and the contact areas between the bumps 12 and the projections 19 can be increased because the projections 19 are elastically deformable.

FIG. 38(D) shows a protruding electrode exposing step in which the film 30B is removed from the substrate 16. As has been described previously, the sealing resin 35 do not adhere to the bumps 12 in the areas in which the bumps 12 are pressed by the projections 19. In the state in which the film 30B has been removed, the above areas are exposed from the resin layer 13. In addition, the areas in which the bumps 12 are exposed from the resin layer 13 are wider than corresponding those obtained by the method of the first embodiment of the present invention.

Hence, according to the seventeenth embodiment of the present invention, it is possible to definitely expose the bumps 12 from the resin layer 13 without a large scale facility. Further, the areas of the bumps 12 exposed from the resin layer 13 are comparatively wide. Hence, as shown in FIG. 38(E), even when the external connection bumps 90 are provided to the ends of the bumps 12, the bumps 12 and the external connection bumps 90 can definitely be bonded together.

A description will be given of an eighteenth embodiment of the present invention.

Figure 39:
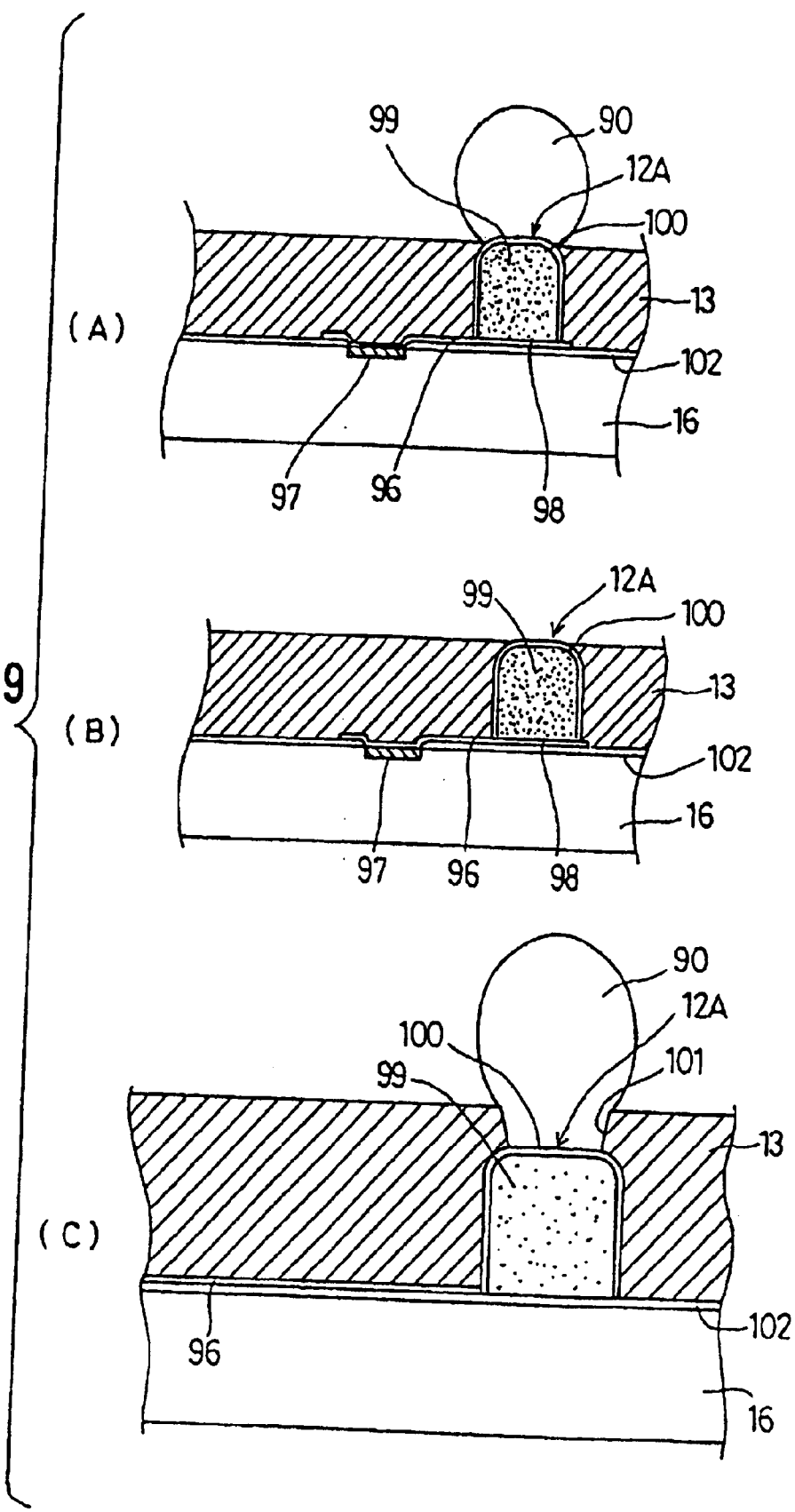
FIG. 39 is a diagram showing a method for fabricating a semiconductor device according to an eighteenth embodiment of the present invention.
Figure 40:
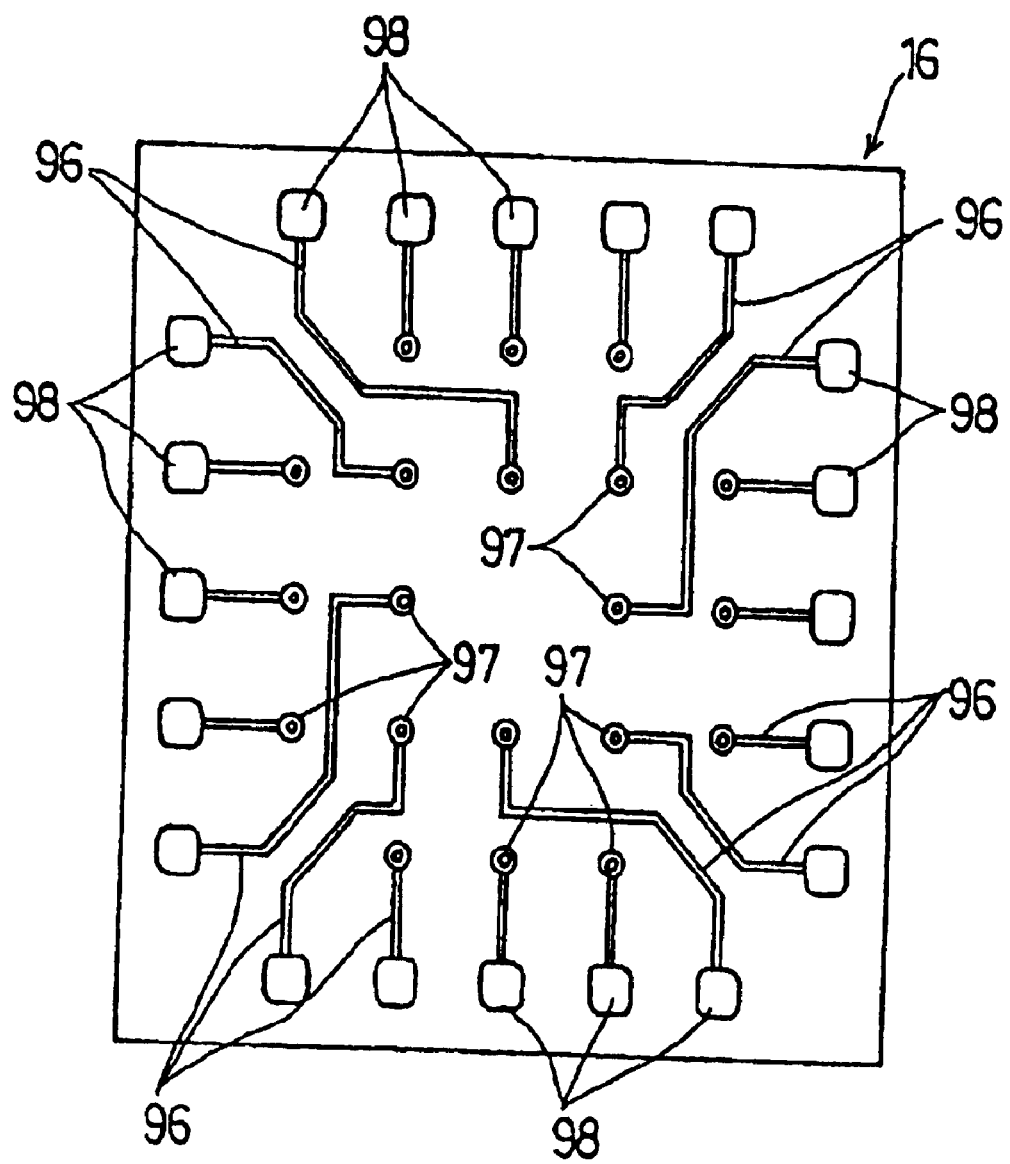
FIG. 40 is a diagram of an enlarged view of a substrate used in FIG. 39.

FIGS. 39 and 40 are diagrams showing a method for fabricating a semiconductor device according to the eighteenth embodiment of the present invention. In FIGS. 39 and 40, parts that have the same structures as those of the first embodiment described with reference to FIGS. 1 through 9 are given the same reference numbers and a description thereof will be omitted.

The present embodiment is characterized by a method for forming a bump 12A on the substrate 16 and a structure thereof. The bump 12A is formed on a connection electrode 98 provided on the surface of the substrate 16. The step of forming the bump 12A commences forming a core portion 99 (indicated by a pear-skin illustration) on the upper portion of the connection electrode 98. The core portion 99 is formed of resin having elasticity (for example, polyimide).

The core portion 99 can be formed on the connection electrode 98 by the following method. First, resin (photosensitive polyimide) for forming the core portion 99 is spin-coated on the entire surface of the substrate 16 to have a given thickness. Subsequently, the portion of the resin 98 other than the connection electrode 98 is removed by photolithography.

Then, an electrically conductive film 100 is formed so as to cover the entire surface of the core portion 99. The electrically conductive film 100 is formed by a thin-film forming technique such as a plating method or sputtering method. The side portions of the film 100 are connected to the connection electrode 98. The electrically conductive film 100 is formed of a metal which has an elasticity and a low electrical resistance. By the above method, the bump 12A is formed. In FIG. 39, a reference number 102 indicates an insulating film.

It can be seen from the above description that the bump 12A includes the core portion 99 and the electrically conductive film 100 formed on the surface of the core portion 99. As described above, the core portion 99 has an elasticity and the electrically conductive film 100 is also formed by a substance having en elasticity. Hence, even if external force is exerted on the bump 12A at the time of mounting, resultant stress can be absorbed due to elastic deformations of the core portion 99 and the electrically conductive film 100. Hence, it is possible to prevent stress from being applied to the substrate 16, which can thus be suppressed from being damaged.

Now, a description will be given of the height of the bump 12A with respect to the resin layer 13. FIG. 39(A) shows an arrangement in which the ends of the bump 12A protrudes from the resin layer 13. The bump 12A has a comparatively wide exposed area. Hence, when the external connection bump 90 is provided, the bump 21A and the bump 90 can definitely be bonded together through a wide interface area.

FIG. 39(B) shows an arrangement in which the end of the bump 12A is flush with the surface of the resin layer 13. This arrangement provides a semiconductor device of an LCC (Leadless Chip Carrier) structure, and contributes to increasing the mounting density.

FIG. 39(C) shows an arrangement in which the end of the bump 12A is located at a lower level than that of the surface of the resin layer 13. Hence, a recess portion 101 is formed in the resin layer 13 through which the bump 12A is exposed. If the external connection bump 90 is applied to the present arrangement, the recess portion 101 functions to position the external connection bump 90. Hence, as compared with the arrangement shown in FIG. 39(A), the bump 12A and the external connection bump 90 can be positioned easily.

In the present eighteenth embodiment, as shown in FIG. 40, electrode pads 97 provided on the substrate 16 (semiconductor element) are spaced apart from connection electrodes 98 in which the bumps 12A are formed. The electrode pads 97 and the connection electrodes 98 are connected together through lead lines 96.

In the arrangement shown in FIG. 39 in which the external connection bump 90 is provided to the end of the bump 12A, the bump 90 is made greater than the bump 12A in order to improve the mounting performance. Hence, if the adjacent bumps 12 are arranged at a small pitch, the adjacent external connection bumps 90 may contact each other.

Figure 90:
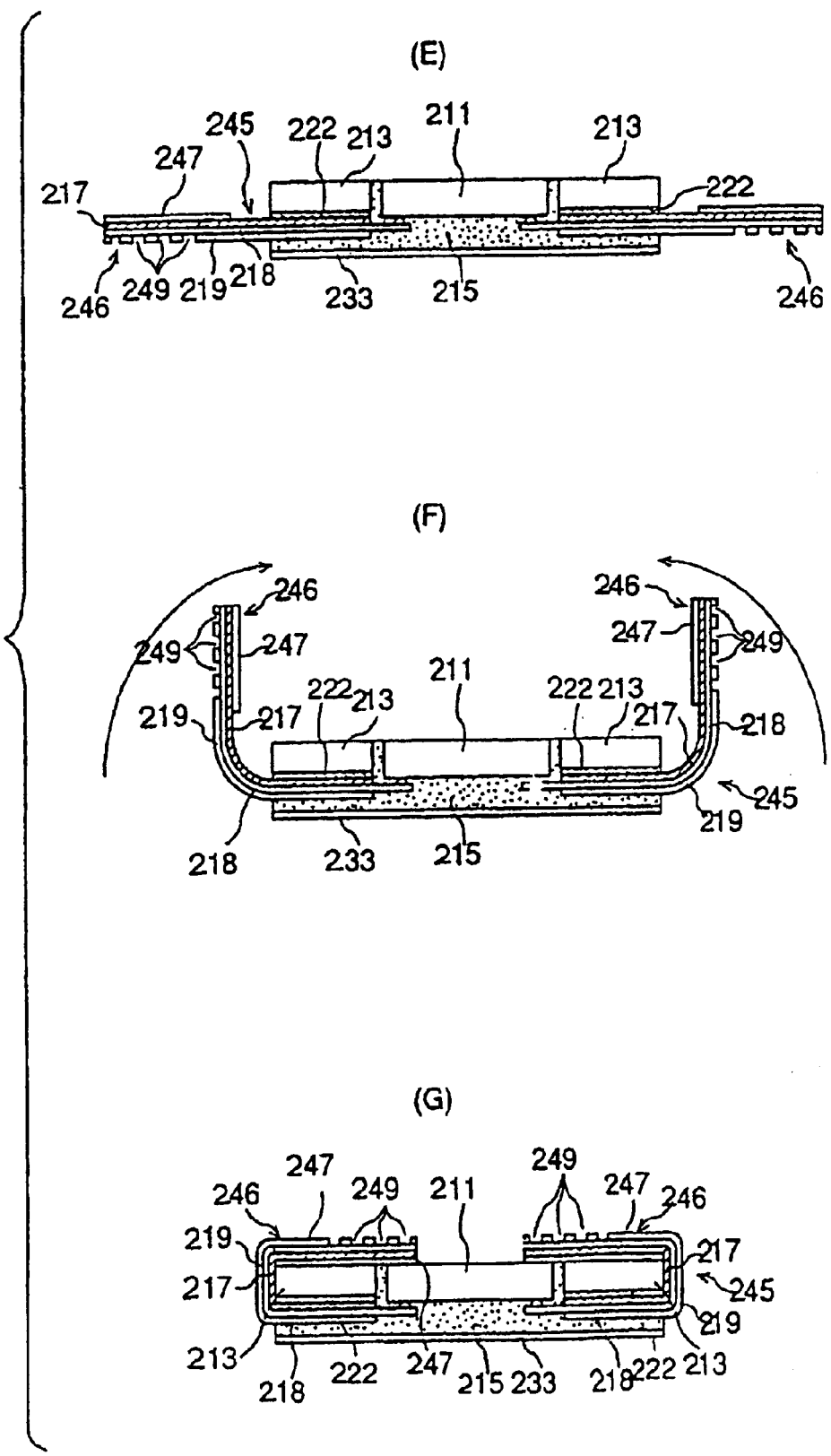
FIG. 90 is a diagram (part 2) showing a method for fabricating the semiconductor device according to the thirty fifth embodiment of the present invention.

With the above in mind, in the arrangement shown in FIG. 90, the electrode pads 97 and the connection electrodes 98 are connected together by means of the lead lines 96, so that the connection electrodes 98 in which the bumps 12A are formed are arranged at an increased pitch. Hence, it is possible to avoid occurrence of an interference between the adjacent external connection bumps 90.

A description will be given of a nineteenth embodiment of the present invention.

Figure 41:
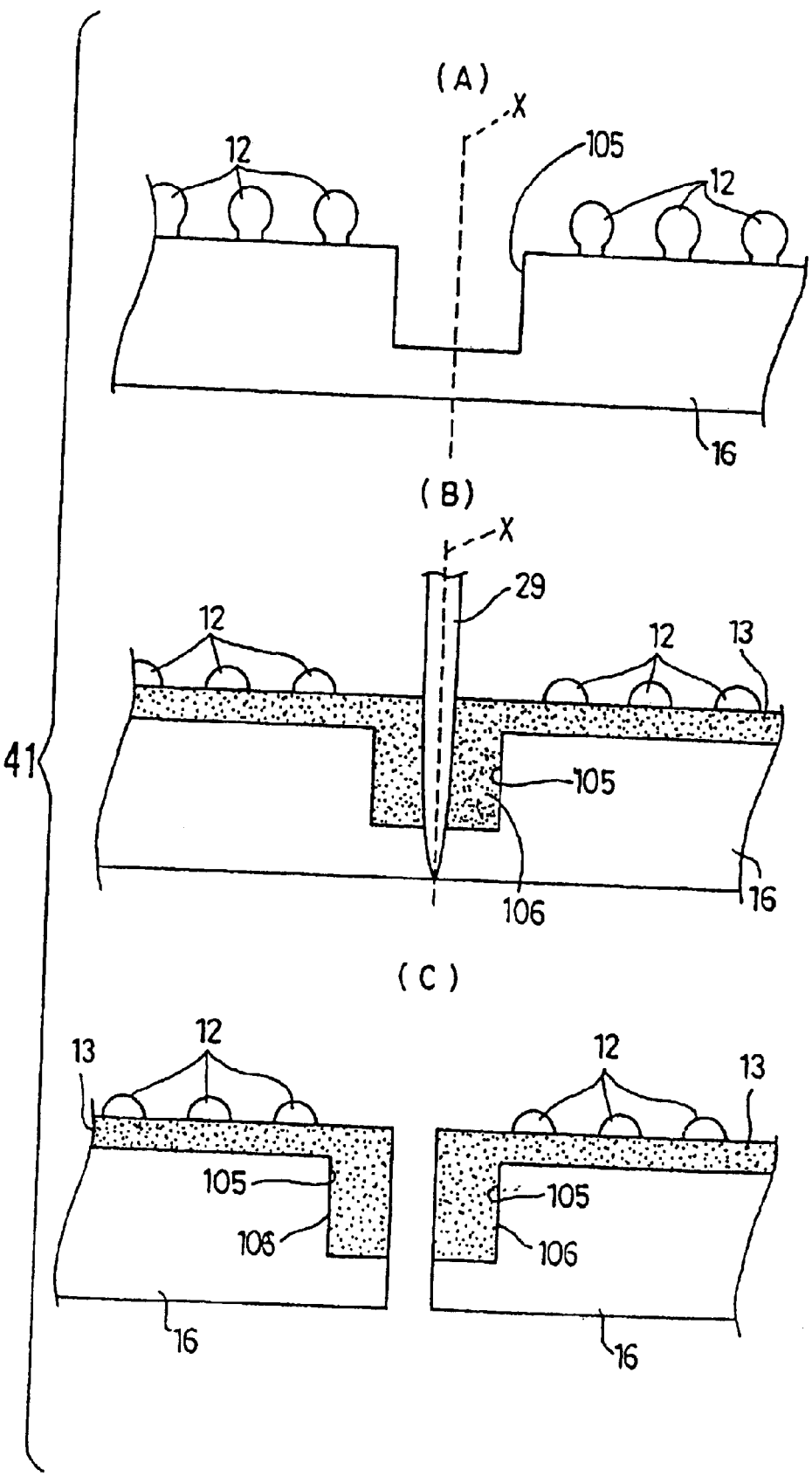
FIG. 41 is a diagram showing a method for fabricating a semiconductor device according to a nineteenth embodiment of the present invention.

FIG. 41 is a diagram showing a method for producing a semiconductor device according to the nineteenth embodiment of the present invention. In FIG. 41, parts that have the same structures as those of the first embodiment described with reference to FIGS. 1 through 9 are given the same reference numbers, and a description thereof will be omitted.

In the present fabrication method, as shown in FIG. 41(A), a cut position groove 105 having a relatively wide width is formed, before the resin sealing step, in a position (indicated by a broken line X; the position is hereinafter referred to as cut position) in which the substrate 16 is cut by a separating step carried out. The width of the cut position groove 105 is at least greater than the width of a dicer 29, which will be described later.

In the resin sealing step of forming the resin layer 13 subsequent to the step of forming the groove 105, the cut position groove 105 is filled with the sealing resin 35, so that a cut position resin layer 106 is formed. In the separating step carried out after the resin sealing step, as shown in FIG. 41(B), the substrate 16 is cut, by the dicer 29, in the cut position X within the cut position groove 105 full of the cut position resin layer 106. Hence, the substrate 16 is cut as shown in FIG. 41(C).

According to the above mentioned fabrication method, it is possible to prevent occurrence of a crack in the substrate 16 and the resin layer 13 in the separating step. The reason for the above will be described below.

An arrangement will now be assumed in which the cut position groove 105 is not formed. The separating step cuts the substrate 16 having the surface on which the resin layer 13 that is a relatively thin film is provided. The cutting process using the dicer 29, a large magnitude of stress is applied to the substrate 16. Hence, the thin resin layer 13 may be flaked off from the substrate 16 or crack may occur in the resin layer 13 and the substrate 16.

In contrast, according to the nineteenth embodiment of the present invention, the cut position groove 105 which is relatively wide is formed in the cut position X. Hence, the separating step is carried out within the cut position groove 105 in which the cut position resin layer 106 is formed. The cut position resin layer 106 is thicker than the resin layer 13 formed on the other portion, and a greater mechanical strength. Further, the cut position resin layer 106 is more flexible than the substrate 16, and functions to absorb the stress.

Hence, the stress caused in the cutting process is absorbed and weakened by the cut position resin layer 106, and is then applied to the substrate 16. Hence, it is possible to prevent occurrence of a crack in the resin layer 13 and the substrate 16 and improve the yield.

As shown in FIG. 41(C), exposed portions of the cut position resin layer 106 are provided on the side surfaces of the substrate 16 after the separating step is completed. Hence, the side portions of the substrate 16 are protected by the cut position resin layer 106, so that the substrate 16 can be suppressed from being affected by the external environments.

Further, a handling apparatus used to transport the semiconductor device can be designed to grip the exposed portions of the cut position resin layer 106. Hence, it is possible to prevent the substrate 16 from being damaged by the handling apparatus.

A description will now be given of a twentieth embodiment of the present invention.

Figure 42:
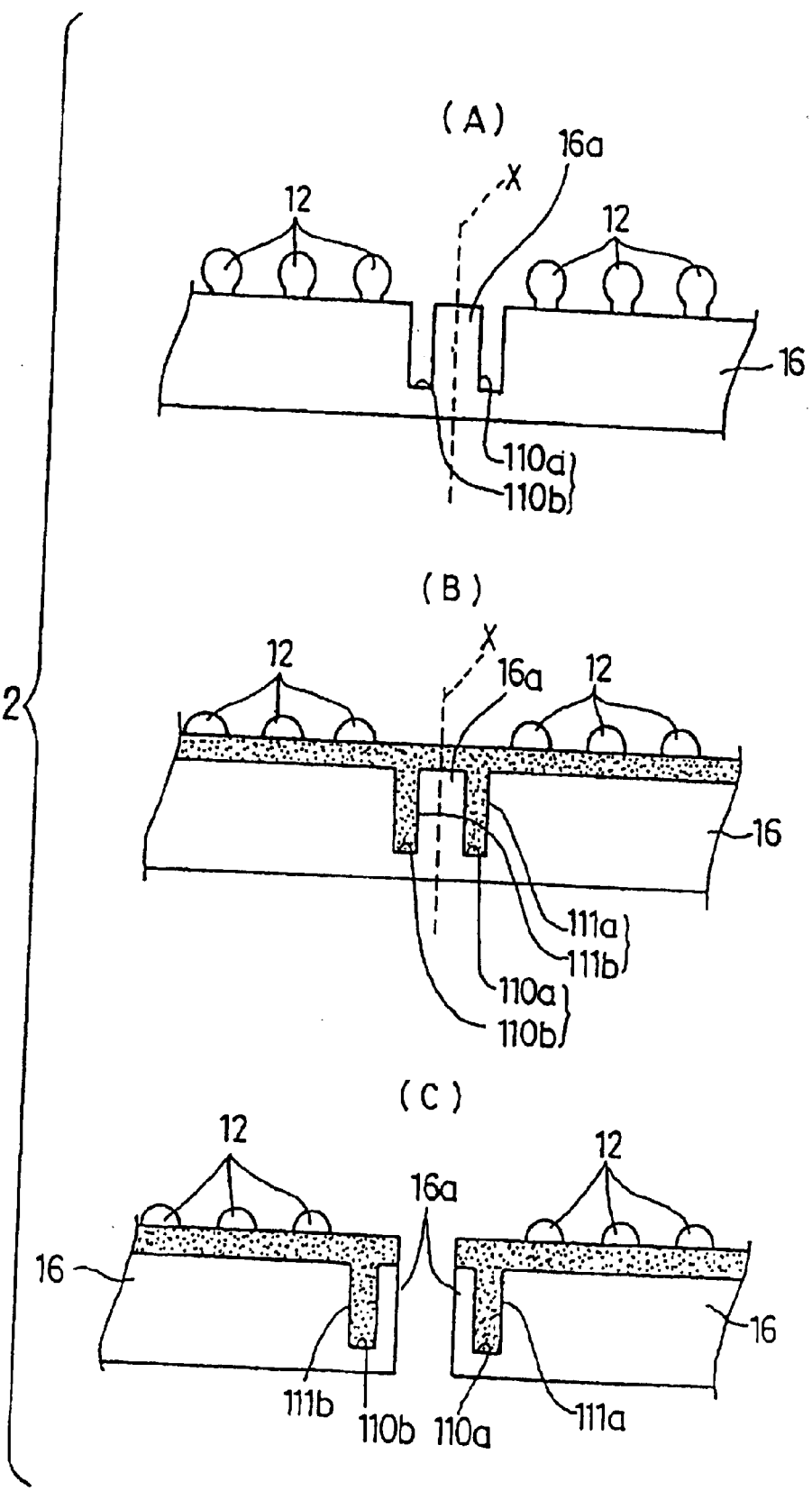
FIG. 42 is a diagram showing a method for fabricating a semiconductor device according to a twentieth embodiment of the present invention.

FIG. 42 is a diagram showing a method for fabricating a semiconductor device according to the twentieth embodiment of the present invention. In FIG. 42, parts that have the same structures as those of the first embodiment described with reference to FIGS. 1 through 9 and the nineteenth embodiment described with reference to FIG. 41 are given the same reference numbers, and a description thereof will be omitted.

In the aforementioned nineteenth embodiment, the cut position groove 105 is formed in the cut position X. In contrast, the twentieth embodiment is characterized, as shown in FIG. 42(A), that a pair of stress relaxing grooves 110a and 110b are provided so that sandwich the cut position X. Hence, the separating step, the substrate 16 is cut in the position between the pair of stress relaxing grooves 110a and 110b.

Further, as shown in FIG. 42(B), 111a and 11b are formed in the stress relaxing grooves 110a and 110b in the resin sealing step. The stress relaxing resin layers 111a and 111b are thicker than the resin layer 13 formed on the other portions and have an enhanced mechanical strength. Further, the stress relaxing resin layers 111a and 111b are more flexible than the substrate 16 and thus function to absorb stress generated.

When the substrate 16 is cut in the position between the stress relaxing grooves 110a and 110b, a large magnitude of stress is applied to the above position (hereinafter, the portion is referred to as a substrate cutting portion 16a). Hence, a crack may be generated in the substrate cutting portion 16a and the resin layer 13 provided thereon. However, no important structural elements such as the bump 12 and an electronic circuit are provided in the substrate cutting portion 16a. Hence, there is no problem even if a crack occurs.

The stress generated when the substrate cutting portion 16a is cut is transferred towards the sides of the substrate 16. However, the stress relaxing grooves 110a and 11b full of the stress relaxing layers 111a and 111b are formed on the sides of the substrate cutting portions 16a. Hence, the above stress can be absorbed by the stress relaxing grooves 110a and 110b.

Hence, the stress generated in the substrate cutting portions 16a do not affect portions (in which electronic circuits are formed) located beyond the stress relaxing grooves 110a and 110b. Thus, it is possible to prevent a crack from being generated in the areas in which the bumps 12 and electronic circuits are formed. FIG. 42(C) shows a state in which the separating step is completed.

A description will be given of a twenty first embodiment of the present invention.

Figure 43:
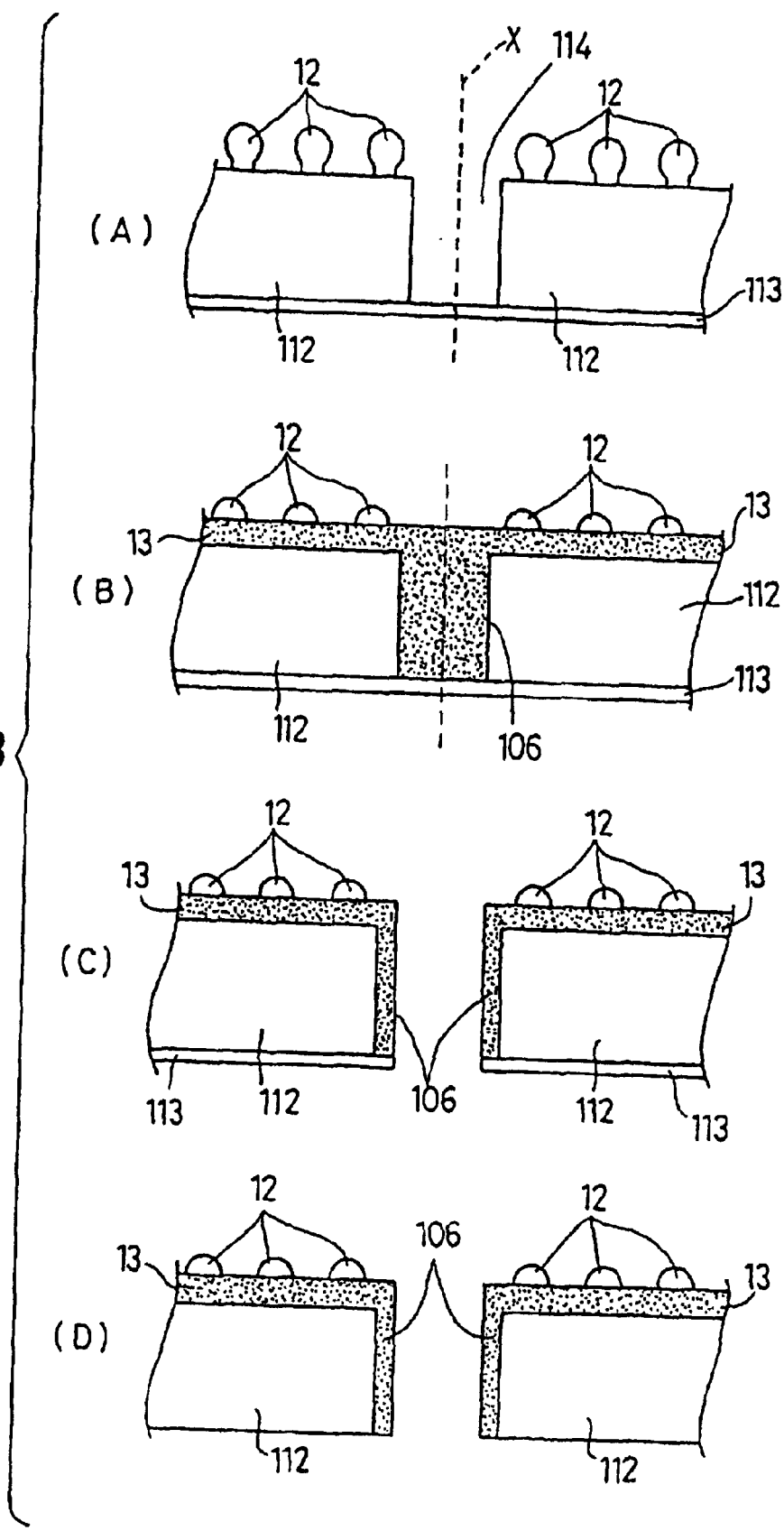
FIG. 43 is a diagram showing a method for fabricating a semiconductor device according to a twenty first embodiment of the present invention.

FIG. 43 is a diagram of a method for fabricating a semiconductor device according to the twenty first embodiment. In FIG. 43, parts that have the same structures as those of the first embodiment described with reference to FIGS. 1 through 9 and the nineteenth embodiment described with reference to FIG. 41 are given the same reference numbers, and a description thereof will be omitted.

In the fabrication method of the present embodiment, a first separating step is executed before the resin sealing step is executed. Thus, the substrate 16 is separated into semiconductor elements 112. Each of the semiconductor elements 112 is equipped with bumps 12 and an electronic circuit (not shown).

After the first separating step is completed, the resin sealing step is carried out. In this step, as shown in FIG. 43(A), the semiconductor elements 112 are arranged on a film member 113 serving as a base member. At this time, an adhesive is used to mount the semiconductor elements 112 on the film member 113. As shown in FIG. 43(A), the semiconductor elements 112 are arranged so that a gap portion 114 is formed between the adjacent semiconductor elements 112.

Then, a resin compression-molding process is carried out so that the resin layer 13 is formed on the surface of each of the semiconductor elements 112, and a cut position resin layer 106 is formed in the gap portion 114. Subsequently, a protruding electrode exposing step is carried out which exposes at least the ends of the bumps 12 from the resin layer 13. FIG. 43(B) shows a state observed when the above process is completed.

Then, a second separating step is carried out. In this step, a cutting operation is performed in the position between the adjacent semiconductor elements 112, that is, the position in which the cut position resin layer 106 is formed. Hence, the cut position resin layer 106 is cut along with the film member 113. hence, as shown in FIG. 43(C), the semiconductor elements 112 having the resin layer 13 are separated from each other. Then, as shown in FIG. 43(D), the separated film members 113 are removed.

In the above-mentioned fabrication method, the semiconductor elements 112 are separated from each other by cutting the substrate 16 by the first separating step. Hence, it is possible to mount different types of semiconductor elements 112 on the film member 113 in the resin sealing step.

Hence, it is possible to realize a combination of semiconductor elements 112 of different types and different performances on the single resin sealing layer 13. Hence, the degree of freedom in design of semiconductor devices can be improved. Further, the twenty first embodiment has the same effects as those of the nineteenth embodiment described with reference to FIG. 41.

A description will be given of a twenty second embodiment of the present invention.

Figure 44:
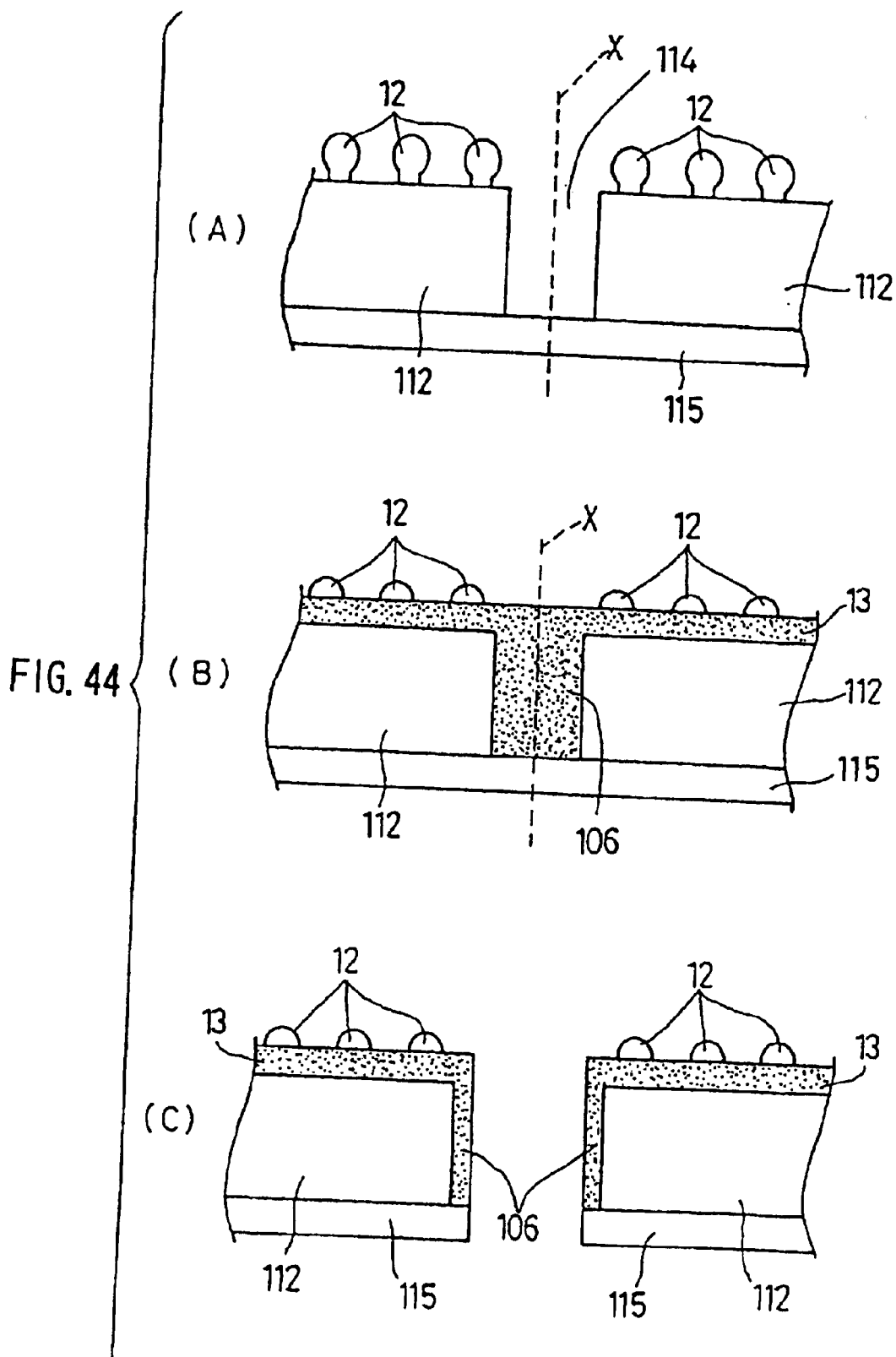
FIG. 44 is a diagram showing a method for fabricating a semiconductor device according to a twenty second embodiment of the present invention.

FIG. 44 is a diagram showing a method of fabricating a semiconductor device according to the twenty second embodiment. In FIG. 44, parts that have the same structures as those of the twenty first embodiment described with reference to FIG. 43 are given the same reference numbers, and a description thereof will be omitted.

The fabrication method of the present embodiment is generally the same as that of the twenty first embodiment described with reference to FIG. 43. In the twenty first embodiment, the film member 113 is used as the base member in the resin sealing step. In contrast, the twenty second embodiment uses a heat radiating plate 115 as the base member.

Thus, the semiconductor elements 112 are mounted on the heat radiating plate 115 in the resin sealing step, and the heat radiating plate 115 is cut together with the cutting position resin layer 106 in the second separating step. In the twenty first embodiment, the film member 113 is removed after the second separating step is completed. In contrast, the present embodiment does not remove the heat radiating members 115 after the second separating step is completed. Hence, the heat radiating plates 115 remain in the respective semiconductor devices, which have improved heat radiating performance.

A description will be given of a twenty third embodiment of the present invention.

Figure 45:
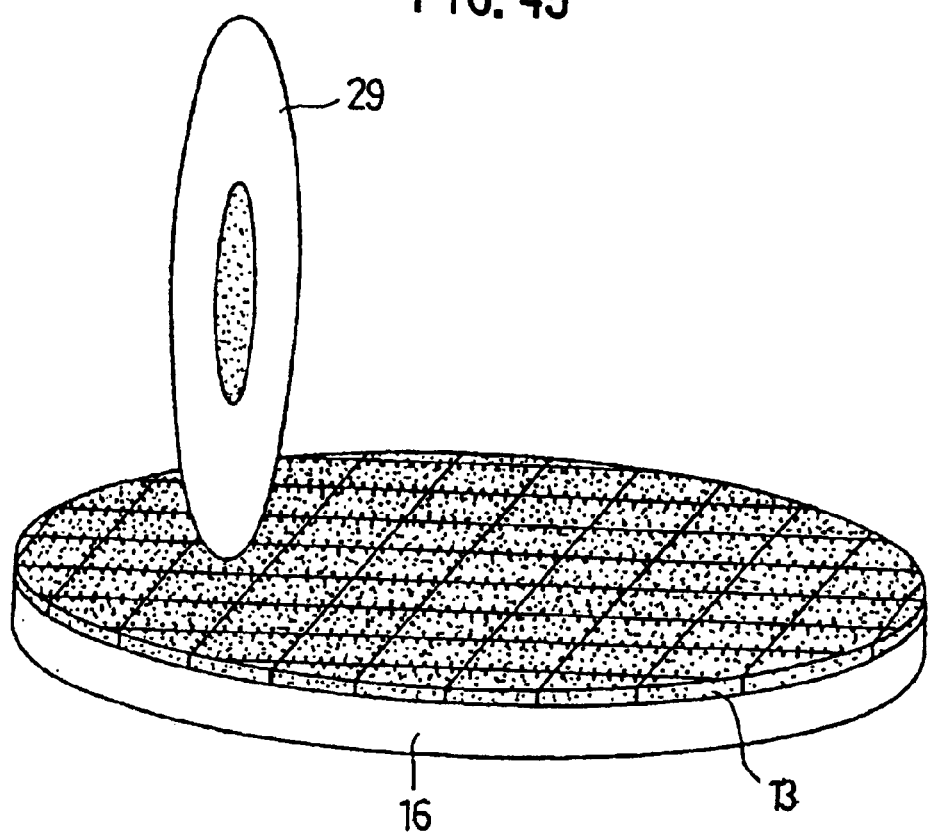
FIG. 45 is a diagram showing a method for fabricating a semiconductor device according to a twenty third embodiment of the present invention.
Figure 46:
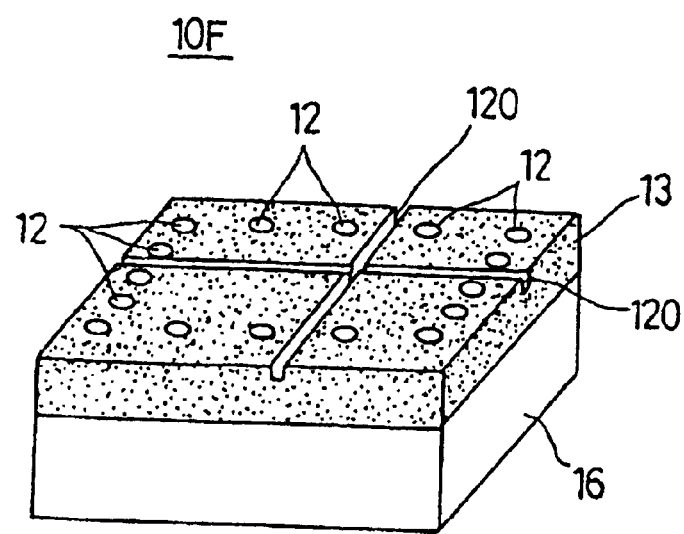
FIG. 46 is a diagram showing a semiconductor device in which positioning grooves are formed.

FIGS. 45 and 46 are diagrams showing a method for fabricating a semiconductor device according to a twenty third embodiment of the present invention. In FIGS. 45 and 46, parts that have the same structures as those of the first embodiment described with reference to FIGS. 1 through 9 are given the same reference numbers and a description thereof will be omitted.

The fabrication method of the present embodiment is characterized by forming, as shown in FIG. 46, positioning grooves 120 on the resin layer after the resin sealing step is executed but before the separating step is executed.

The positioning grooves 120 formed on the resin layer 13 can be used as a reference for positioning a semiconductor device 10F to a tester. By forming the positioning grooves 120 before the separating step is executed, the positioning grooves 120 can be totally and efficiently formed with respect to a plurality of semiconductor devices 10F.

The positioning grooves 120 can be formed by, for example, performing half scribing to the resin layer 13 by using the dicer 29, as shown in FIG. 45. Hence, the positioning grooves 120 can be efficiently and precisely formed by the generally used scribing technique.

A description will be given of a twenty fourth embodiment of the present invention.

Figure 47:
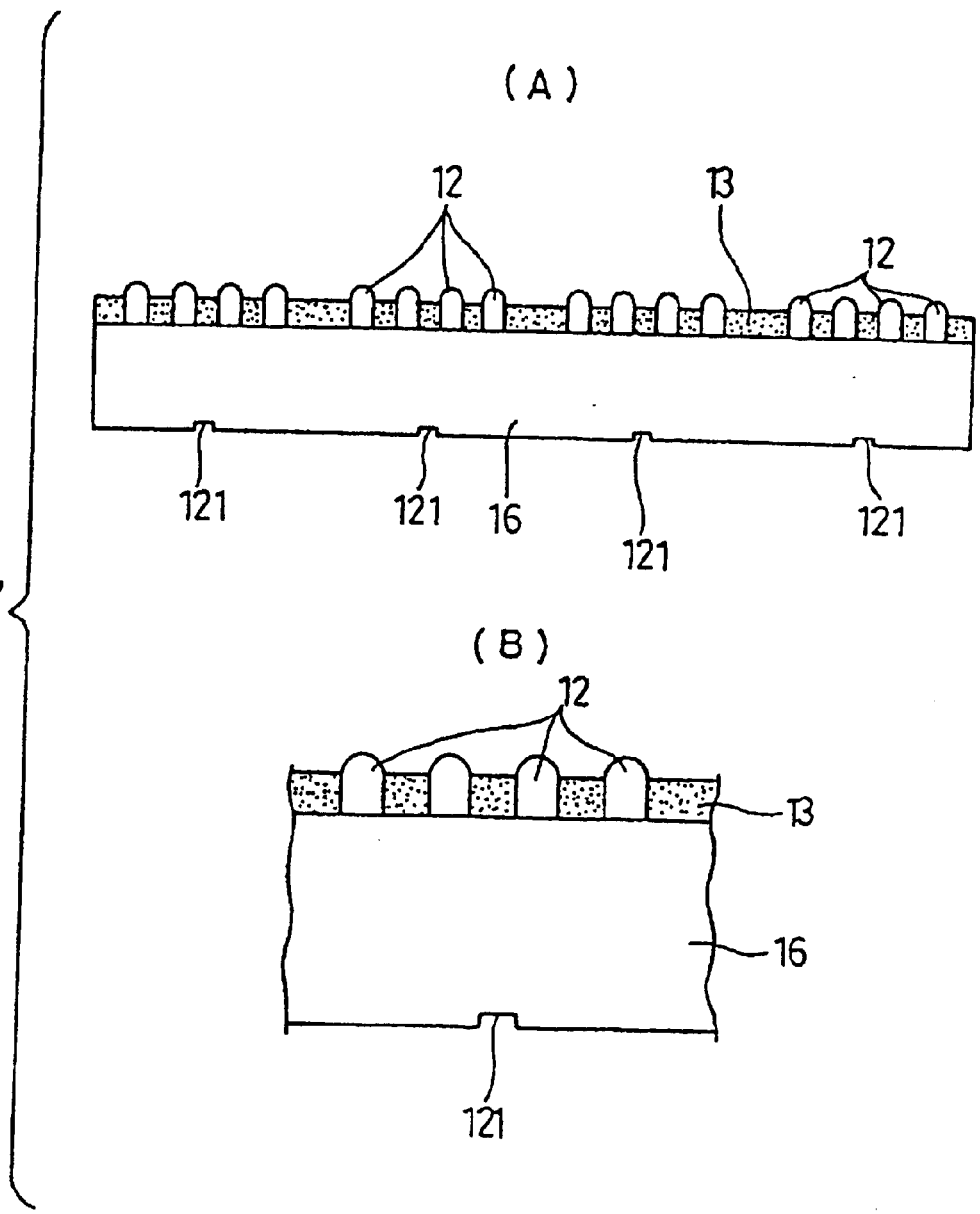
FIG. 47 is a diagram showing a method for fabricating a semiconductor device according to a twenty fourth embodiment of the present invention.

FIG. 47 is a diagram showing a method for fabricating a semiconductor device according to the twenty fourth embodiment. In FIG. 47, parts that have the same structures as those of the first embodiment are given the same reference numbers and a description thereof will be omitted.

The present embodiment is characterized by forming, as shown in FIG. 47, positioning grooves 121 on the back surface of the substrate 16 before the resin sealing step is completed but before the separating step is performed. FIG. 47(B) is an enlarged view of a part of the illustration of FIG. 47(A).

The positioning grooves 121 can be used as a reference for positioning the semiconductor device as in the case of the twenty third embodiment. Particularly, the positioning of the semiconductor device at the time of mounting is carried out so that the bumps 12 face the mounting board. Hence, the positioning grooves 120 formed on the resin layer 13 cannot be visually recognized from the upper side.

In contrast, the positioning grooves 121 formed on the back surface of the substrate 16 can be visually recognized even at the time of mounting. Hence, the mounting process can be carried out precisely. The positioning grooves 121 can be formed by performing half scribing on the back surface of the substrate 16 by the dicer 29 as in the case of the twenty third embodiment.

A description will be given of twenty fifth and twenty sixth embodiments of the present invention.

Figure 48:
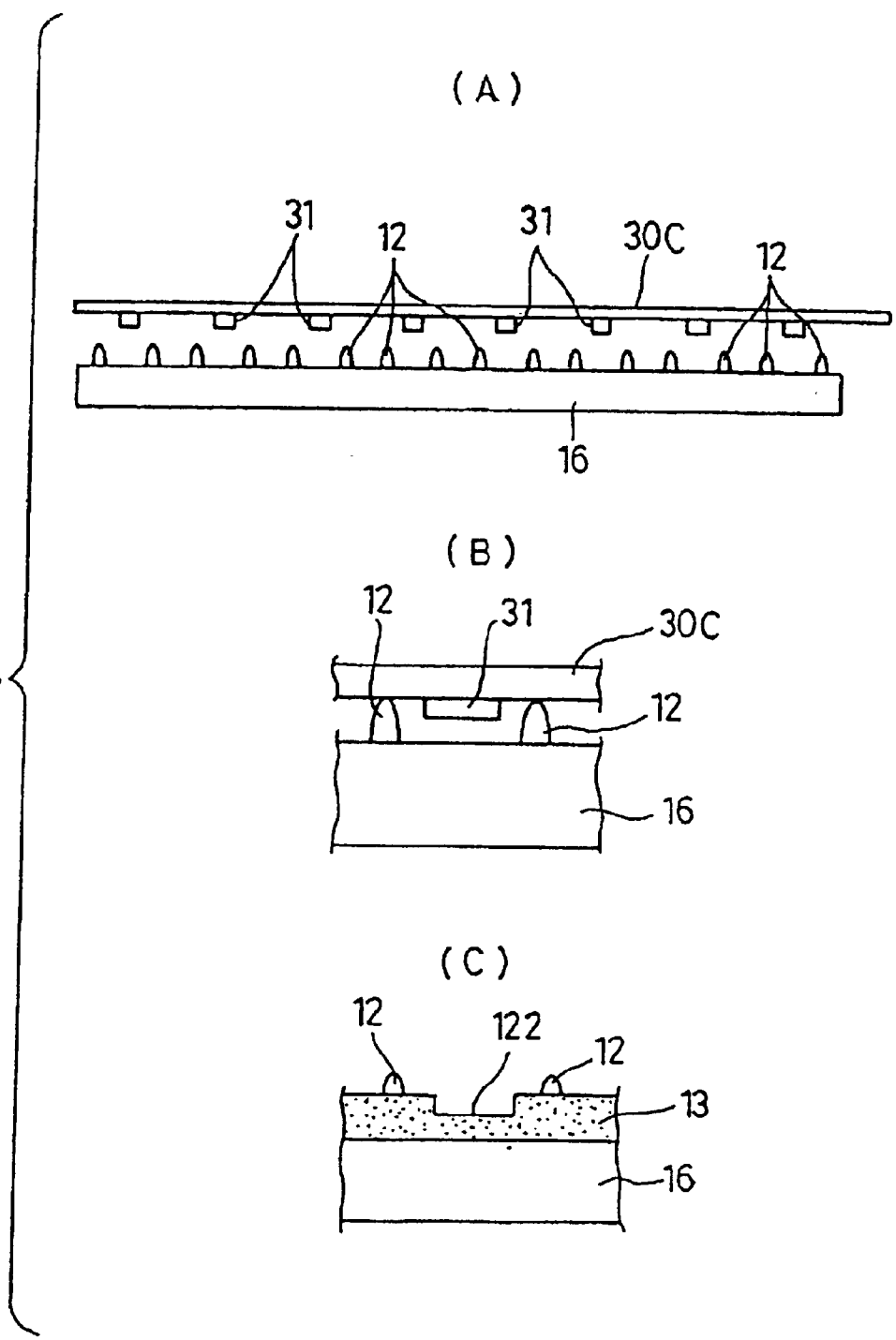
FIG. 48 is a diagram showing a method for fabricating a semiconductor device according to a twenty fifth embodiment of the present invention.
Figure 49:
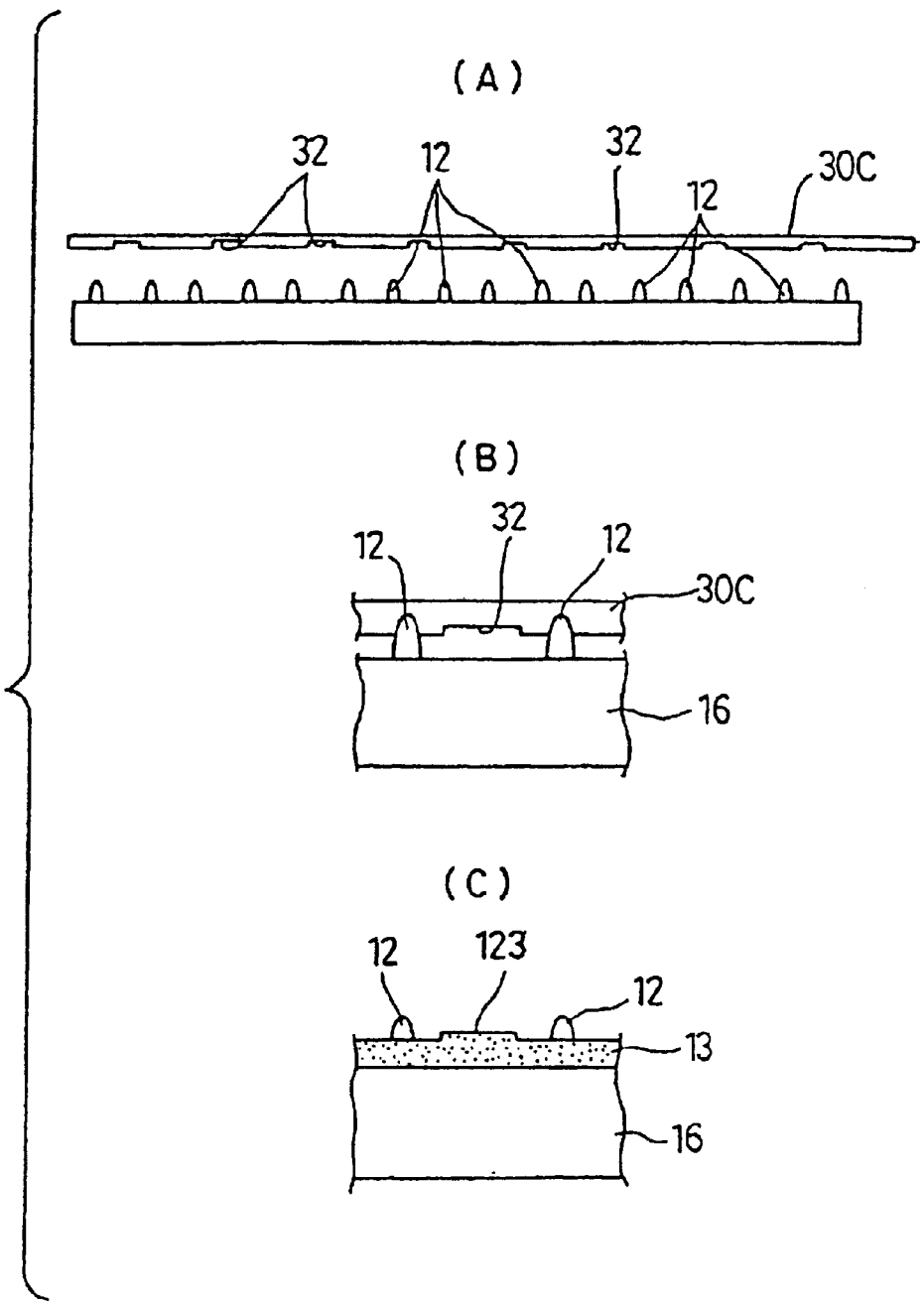
FIG. 49 is a diagram showing a method for fabricating a semiconductor device according to a twenty sixth embodiment of the present invention.

FIG. 48 is a diagram showing a method for fabricating a semiconductor device according to the twenty fifth embodiment of the present invention, and FIG. 49 is a diagram showing a method for fabricating a semiconductor device according to the twenty sixth embodiment of the present invention. In FIGS. 48 and 49, parts that have the same structures as those of the first embodiment described with reference to FIGS. 1 through 9 are given the same reference numbers, and a description thereof will be omitted.

The fabrication method of the twenty fifth embodiment is characterized by forming positioning grooves 121 as in the case of the twenty third and twenty fourth embodiments. FIG. 48(C) shows one positioning groove 1 22 formed on the resin layer 13.

As shown in FIG. 48(A), the positioning grooves 122 are formed by using a film 30C having projections 31 located in positions in which the projections 31 do not interfere with the bumps 12. FIG. 48(B) shows a state in which the film 30C having the projections 31 faces the substrate 16 in the resin sealing step. As shown, the projections 31 is located so as not to face the bumps 12. Hence, the positioning groove 122 is formed on the resin layer 13 due to the projections 31 when the resin sealing step is completed.

The fabrication method of the twenty sixth embodiment is characterized by forming a positioning protruding 123 in the resin layer 13. FIG. 49(C) shows the positioning protruding 123 formed in the resin layer 13.

The positioning protruding 123 are formed by using the film 30C having recesses 32 located in the positions in which the recess positions 32 do not interfere with the bumps 12. FIG. 49(B) shows a state in which the film 30C having the recess 32 faces the substrate 16. As shown, the recess 32 is located so as not to face the bumps 12. Hence, the positioning protruding 123 is formed on the resin layer 13 due to the recess 32 when the resin sealing step is completed.

The above-mentioned twenty fifth and twenty sixth embodiments respectively use the films 30C having the projections 31 and the recesses 32 located in the positions having no positional interferences with the bumps 12, so that the positioning grooves 122 and the positioning protruding 123 serving as the references for positioning can be formed on the resin layer 13. Hence, when the semiconductor device is subjected to a test process or a mounting process, the semiconductor device can be positioned by referring to the positioning grooves 122 or the positioning protruding 123. Hence, the positioning work of the semiconductor device can be simplified.

A description will be given of a twenty seventh embodiment of the present invention.

Figure 50:
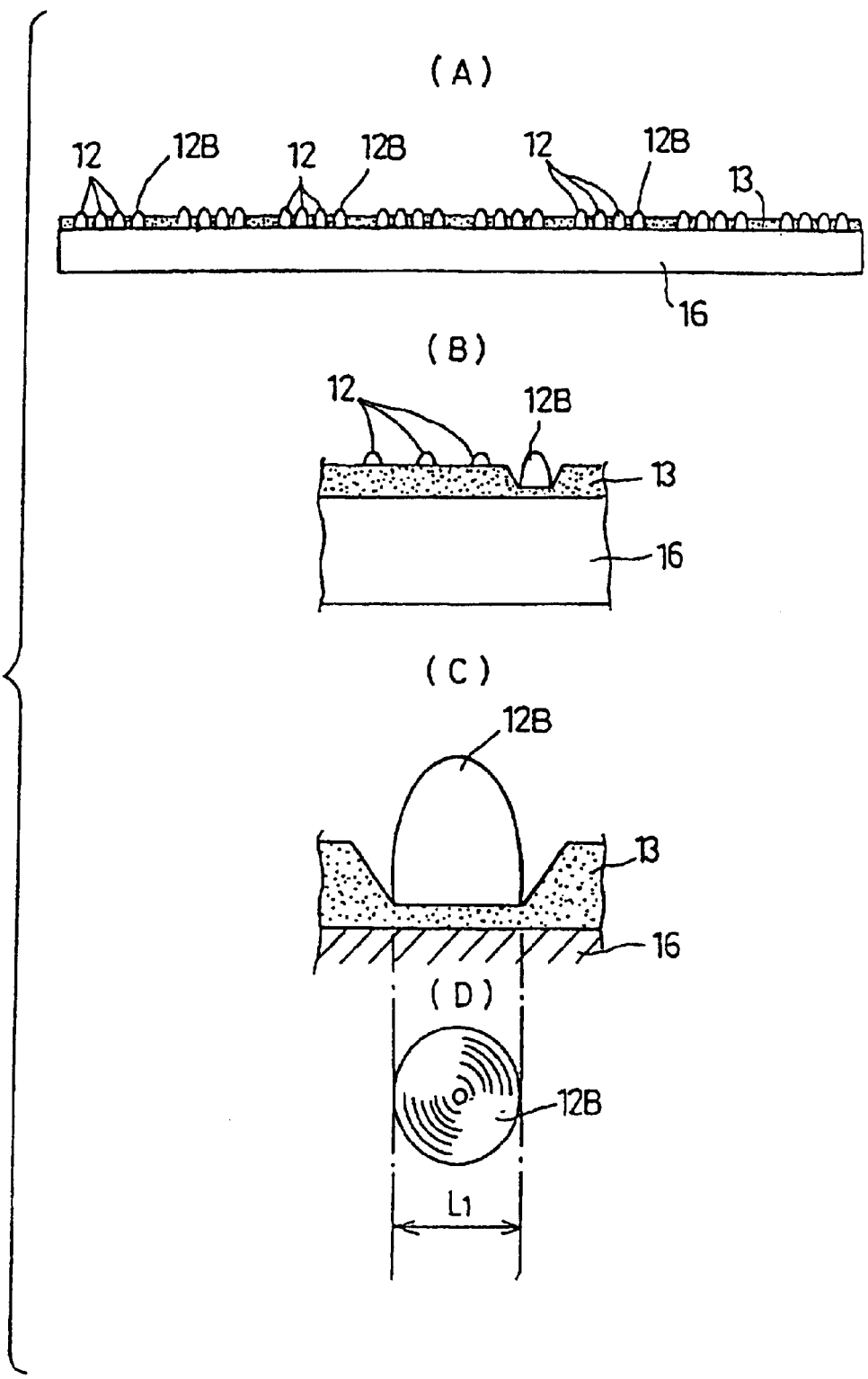
FIG. 50 is a diagram showing a method for fabricating a semiconductor device according to a twenty seventh embodiment of the present invention.

FIG. 50 is a diagram showing a method for fabricating a semiconductor device according to the twenty seventh embodiment. In FIG. 50, parts that have the same structures as those of the first embodiment described with reference to FIGS. 1 through 9 are given the same reference numbers, and a description thereof will be omitted.

The fabrication method of the present embodiment is characterized by selecting some bumps 12 among the bumps 12 as references for positioning (hereinafter such bumps are referred to as positioning bumps 12B) and by processing, after the resin sealing step is completed, the resin layer 13 in the positions in which the positioning bumps 12B are formed. Hence, the general bumps 12 can be discriminated over the positioning bumps 12B. The structure itself of the positioning bumps 12B is the same as that of the general bumps 12.

FIG. 50(A) shows the substrate 16 observed after the resin sealing step and the protruding electrode exposing step are completed. In this state, the resin layer 13 has a uniform film thickness on the substrate 16. Hence, the positioning bumps 12B cannot be discriminated from the general bumps 12.

With the above in mind, as shown in FIG. 50(B), a step is performed which reduces the thickness of the resin layer 13 in the vicinity of the positioning bumps 12B. Hence, the positioning bumps 12B can be discriminated from the general bumps 12. The resin layer 13 can be processed to define the positioning bumps 12B by, for example, laser beam projection, eximer laser, etching, mechanical polishing or blasting, these means being also used in the aforementioned protruding electrode exposing step. Hence, there is no need to greatly modify the fabrication facility for resin processing.

Figure 51:
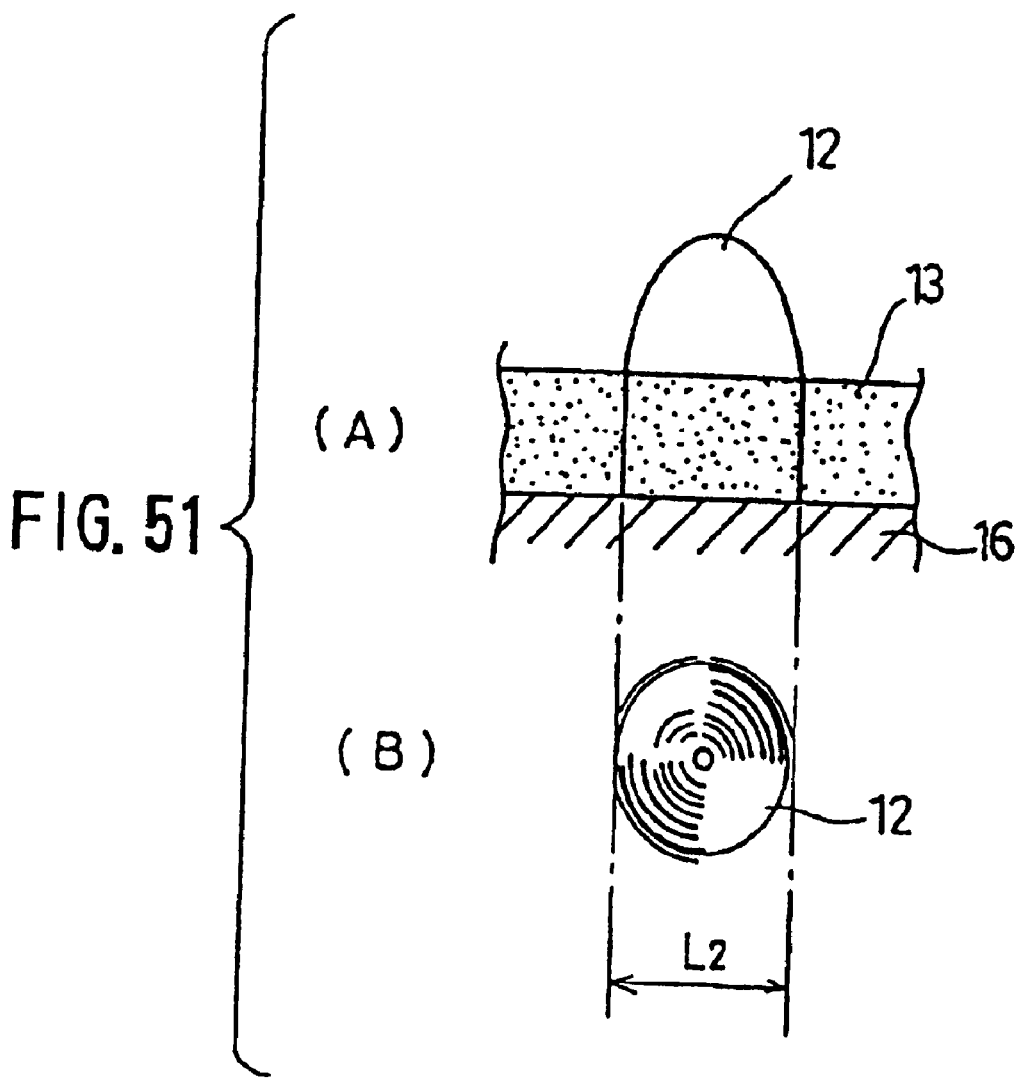
FIG. 51 is a diagram showing a conventional bump structure.

A description will be given of a method of discriminating the positioning bumps 12B from the general bumps 12. FIG. 50(C) is an enlarged view of a part of the positioning bump 12B, and FIG. 50(D) is a top view of the positioning bump 129. FIG. 51(A) is an enlarged view of the general bump 12, and FIG. 51(B) is a top view of the general bump 12.

As described previously, the positioning bump 12B has the same structure as that of the general bump 12. Hence, it is impossible to discriminate the general bump 12 and the positioning bump 12B only by referring to their structures themselves. The bumps 12 and 12B have a spherical shape or a rugby ball shape, and thus the diameters thereof viewed from the top are different from each other due to the depths in which the bumps 12 and 12B are embedded in the resin layer 13.

More particularly, the general bump 12 is deeply embedded in the resin layer 13, and thus a comparatively small diameter L2 of the exposed portion can be observed when viewing the general bump 12 from the top, as shown in FIG. 51(B). In contrast, the positioning bump 12B is greatly exposed from the resin layer 13 by the aforementioned resin process, and thus a comparatively large diameter L1 of the exposed portion can be observed when viewing the positioning bump 12 from the top, as shown in FIG. 50(D) (L1>L2).

Hence, it is possible to discriminate the general bump 12 and the positioning bump 12B from each other by measuring the diameters of the bumps 12 and 12B observed when viewing these bumps from the top. Hence, it is possible to position the semiconductor device by referring to the positioning bumps 12B.

A description will be given of a method for mounting the semiconductor device fabricated by any of the foregoing embodiments of the present invention.

Figure 52:
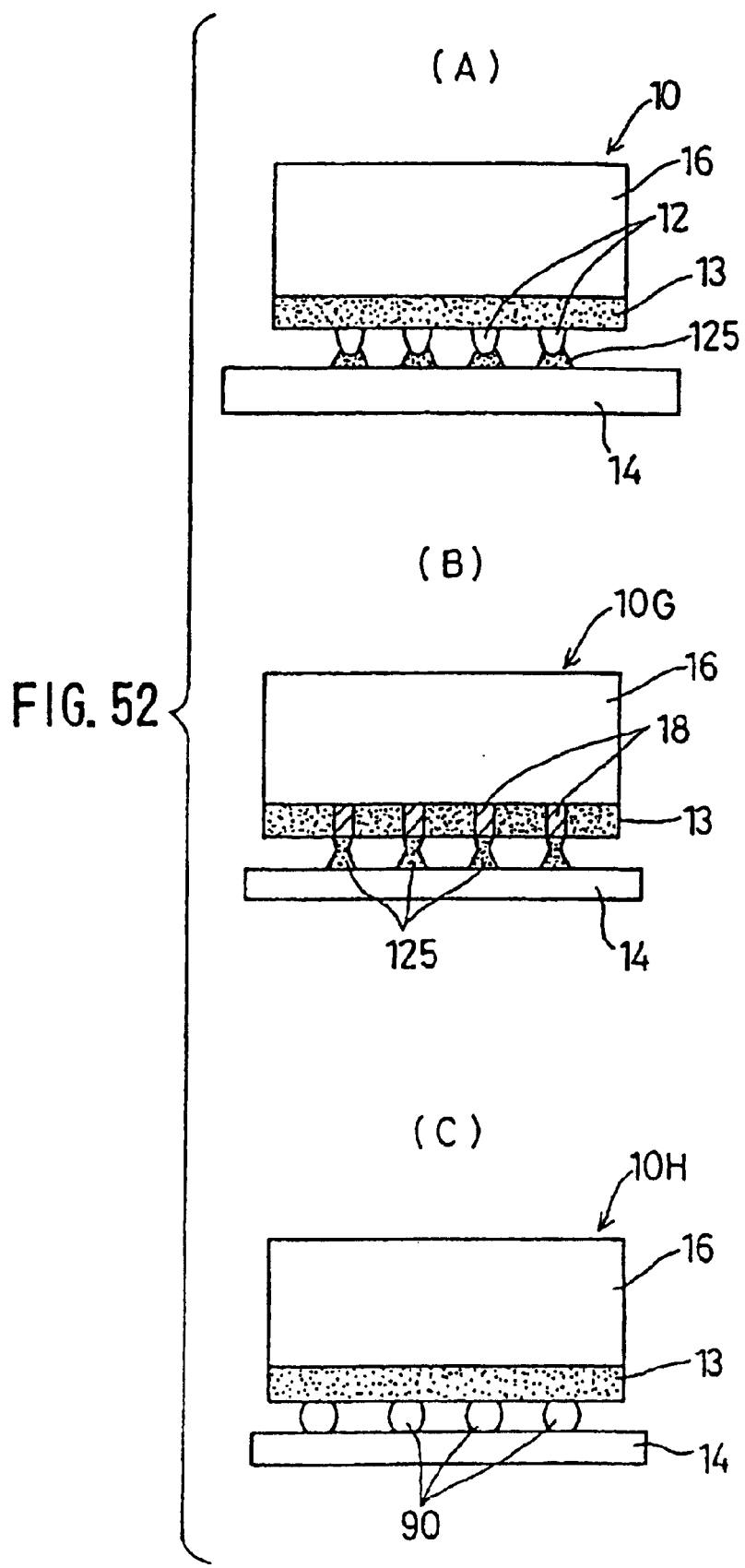
FIG. 52 is a diagram showing a method for mounting a semiconductor device according to a first embodiment of the present invention.

FIG. 52 shows a first embodiment of the mounting method. FIG. 52(A) shows a method for mounting the semiconductor device 10 fabricated by the method according to the aforementioned first embodiment of the present invention, wherein the bumps 12 are bonded to the mounting board 14 by using bonding members 125 such as solder paste. FIG. 52(B) shows a method for mounting a semiconductor device 10G fabricated by the method according to the aforementioned fourteenth embodiment, wherein the straight bumps 18 are bonded to the mounting board 14 by using the bonding members 125 such as solder paste. FIG. 52(C) shows a method for mounting a semiconductor device 10H fabricated by the method according to the aforementioned fifteenth embodiment, in which the external connection terminals 90 provided to the ends of the bumps 12 are bonded to the mounting board 14.

Figure 53:
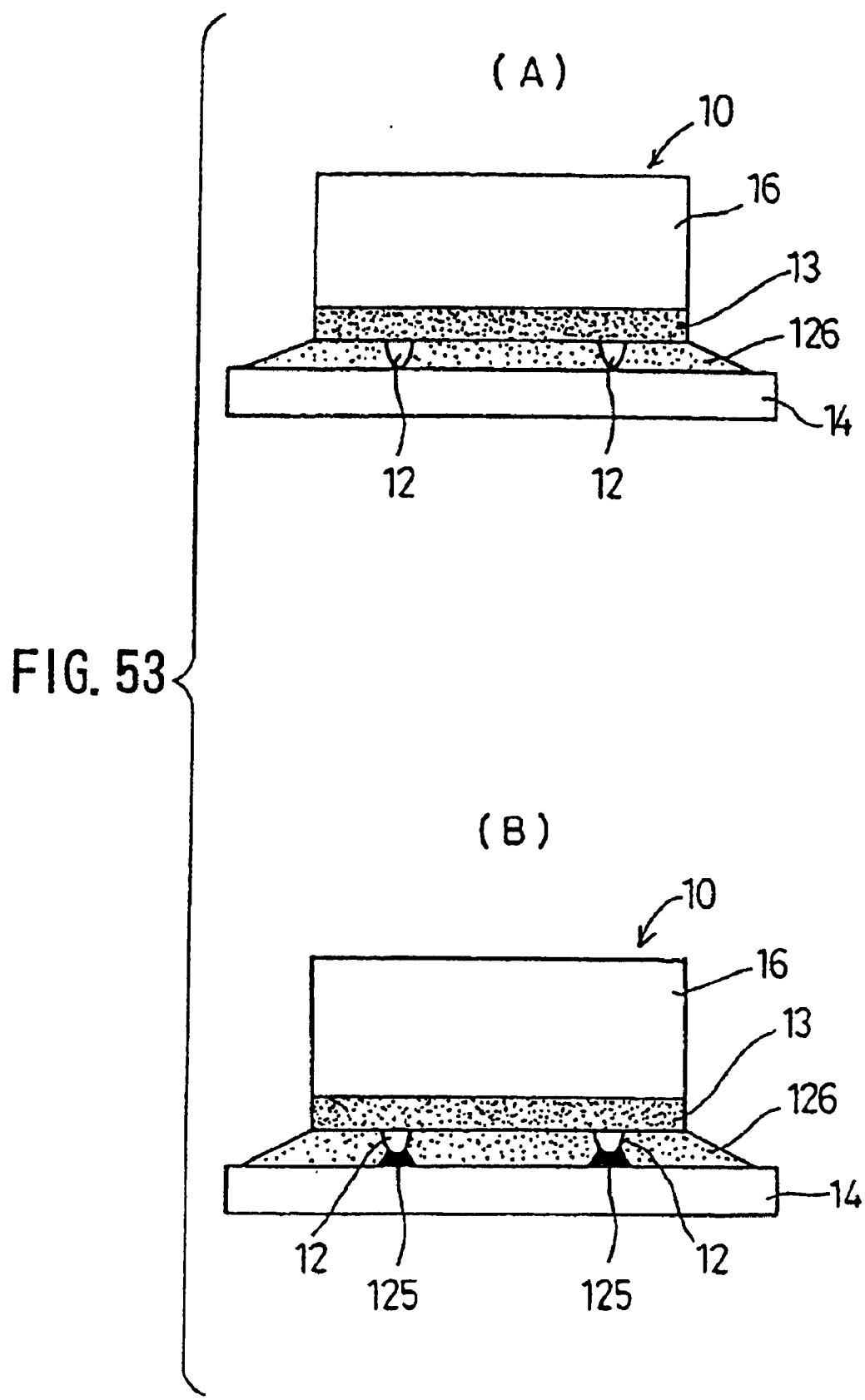
FIG. 53 is a diagram showing a method for mounting a semiconductor device according to a second embodiment of the present invention.

FIG. 53 shows a second embodiment of the mounting method. The mounting method shown in FIG. 53 mounts the semiconductor device 10 on the mounting board 14 and arranges an under fill resin126.

FIG. 53(A) shows an arrangement in which the bumps 12 of the semiconductor device 10 are directly bonded to the mounting board 14 and then the under fill resin 126 is provided. FIG. 53(B) shows an arrangement in which the bumps 12 are bonded to the mounting board 14 through the bonding members 125, and then the under fill resins 126 are provided.

As described above, the semiconductor devices 10, 10A–10H have the arrangements in which the resin layers 13, 13A and 13B are formed on the substrates 16, which are definitely protected thereby.

On the other hand, the portions of the bumps 12, 18 and 90 bonded to the mounting board 14 are exposed and may be oxidized. Also, if there is a large difference in thermal expansion ration between the mounting board 14 and the substrate 16, a large magnitude of stress may be applied to the bonded portions of the bumps 12, 18 and 90 and the mounting board 14. With the above in mind, the under fill resin 126 may be provided in order to prevent the bonded portions from being oxidized and relax the stress applied to the bonded portions.

Figure 54:
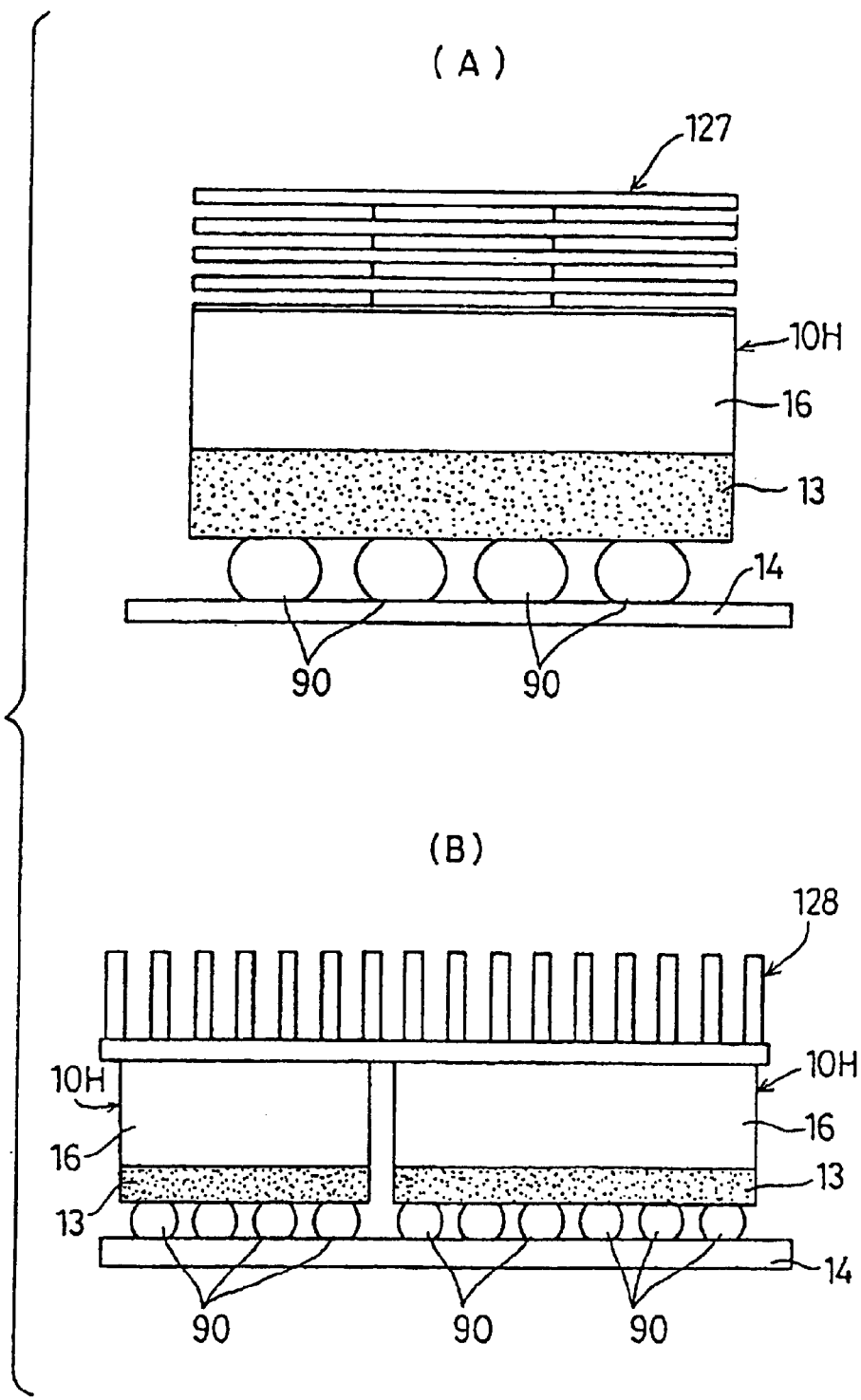
FIG. 54 is a diagram showing a method for mounting a semiconductor device according to a third embodiment of the present invention.

FIG. 54 shows a third embodiment of the mounting method (the semiconductor device 10H having the external connection bumps 90 is exemplarily illustrated). The present mounting method is characterized by arranging heat radiating fins 127 and 128 to the semiconductor device 10H at the time of mounting.

FIG. 54A shows an arrangement in which the heat radiating fin 12 is provided to a single semiconductor device 10H. FIG. 54B shows an arrangement in which the heat radiating fin 128 is arranged to a plurality of (two in the figure) semiconductor devices 10H. The semiconductor devices 10H are fixed to the heat radiating fins 127 and 128 and are then mounted on the mounting board 14. Alternatively, thee semiconductor devices 10H are mounted on the mounting board 14, and then the heat radiating fins 127 and 128 are fixed to the semiconductor devices 10H.

Figure 55:
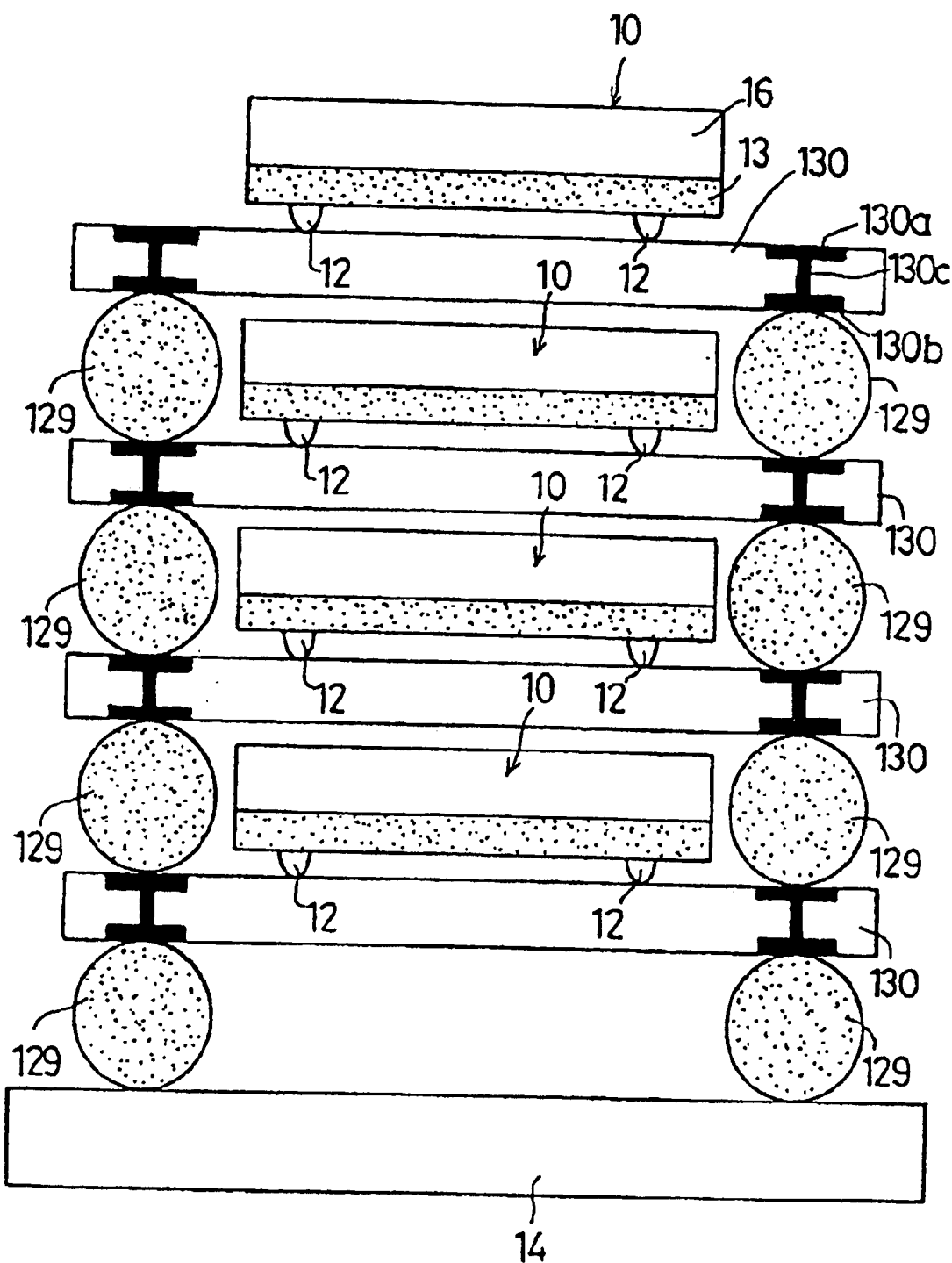
FIG. 55 is a diagram showing a method for mounting a semiconductor device according to a fourth embodiment of the present invention.

FIG. 55 shows a fourth embodiment of the mounting method. The present mounting method mounts a plurality of semiconductor devices 10 on the mounting board 14 by using interposer boards 130. The semiconductor devices 10 are bonded to the interposer boards 130 by the bumps 12, and the interposer boards 130 are electrically connected together through substrate bonding bumps 129. Hence, connection electrodes 130a and 130b are formed on the upper and lower surfaces of each of the interposer boards 130, and are connected together by internal wiring lines 130c.

The present mounting method makes it possible to arrange a plurality of semiconductor devices 10 in a stacked formation and thus increase the mounting density of semiconductor devices 10 per unit area on the mounting board 14. The arrangement of the present method is effective and efficient when the semiconductor devices 10 are memory devices.

Figure 56:
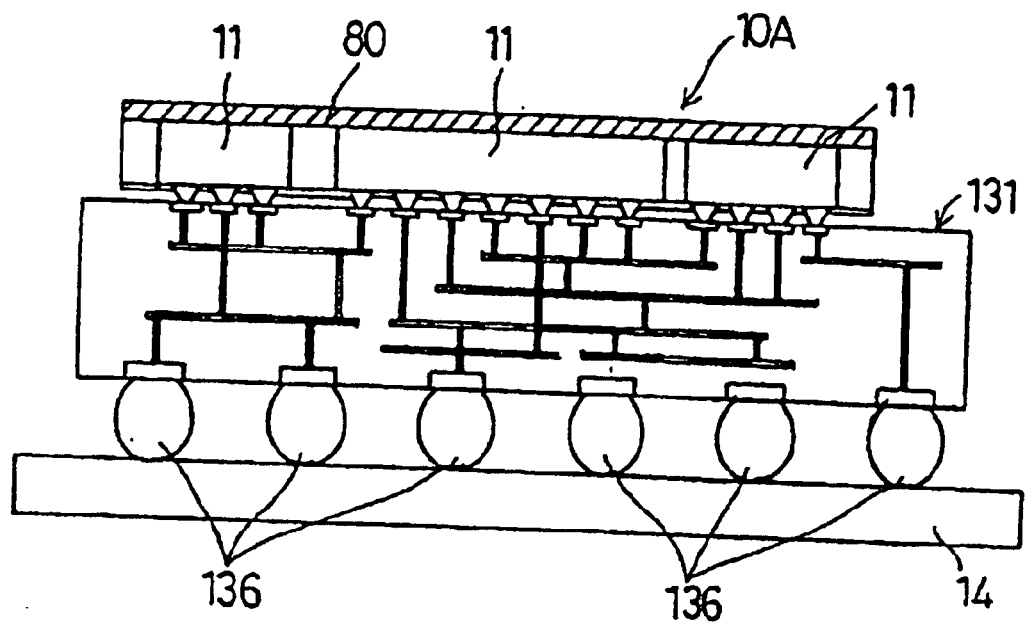
FIG. 56 is a diagram showing a method for mounting a semiconductor device according to a fifth embodiment of the present invention.

FIG. 56 shows a fifth embodiment of the mounting method, in which the semiconductor device 10A of the second embodiment described with reference to FIG. 26 is mounted on the interposer board 131, which is then mounted on the mounting board 14. The interposer board 131 used in the present embodiment is a multi layer wiring board. A plurality of upper electrodes which are to be connected to the semiconductor device 10A are provided on the upper surface of the interposer board 131. A plurality of mounting bumps 136 which are to be bonded to the mounting board 14 are provided on the lower surface of the interposer board 131.

Figure 57:
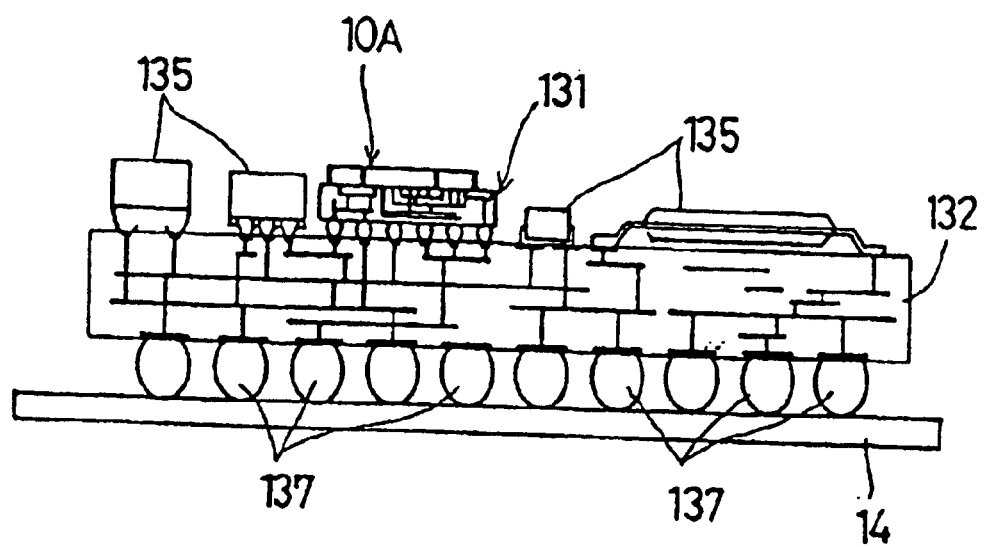
FIG. 57 is a diagram showing a method for mounting a semiconductor device according to a sixth embodiment of the present invention.

FIG. 57 shows a sixth embodiment of the mounting method, in which the semiconductor device 10A of the second embodiment is mounted on a first interposer board 131, which is mounted on a second interposer board 132 together with other electronic components 135. Then, the second interposer board 132 is mounted on the mounting board 14. The second interposer board 132 is a multilayer wiring board. A plurality of upper electrodes which are to be connected to the first interposer board 131 and the electronic components 135 are provided on the upper surface of the second interposer board 132. A plurality of mounting bumps 137 which are to be bonded to the mounting board 14 are provided on the lower surface of the second interposer board 132.

Figure 58:
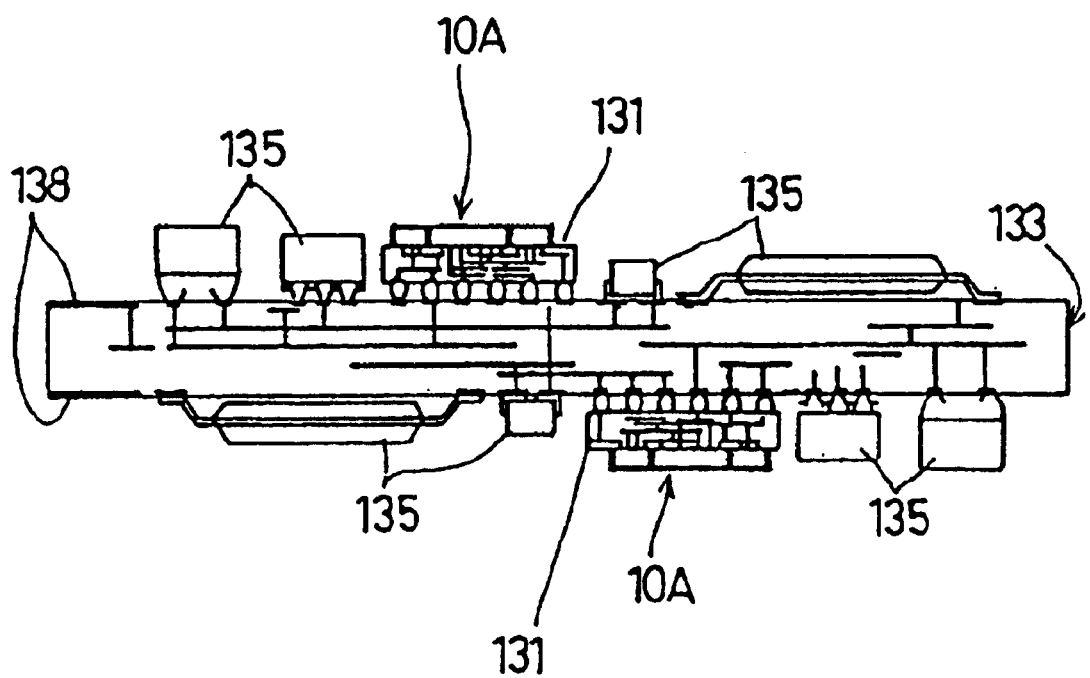
FIG. 58 is a diagram showing a method for mounting a semiconductor device according to a seventh embodiment of the present invention.

FIG. 58 shows a seventh embodiment of the mounting method. In the sixth embodiment of the mounting method shown in FIG. 57, the first interposer board 131 on which the semiconductor device 10A is mounted and the electronic components 135 are provided on only the upper surface of the second interposer 132, while the mounting bumps 137 are provided on the lower surface thereof.

In contrast, in the seventh embodiment of the mounting method, a second interposer board 133 has upper and lower surfaces on both of which surfaces are provided the electronic components 135 and the first interposer boards 131 on which the semiconductor devices 10A are mounted. Electrical connections with the outside of the device are made by card edge connectors 138 provided on a side end of the second interposer board 133 (the left side end in FIG. 58).

In the mounting methods described with reference to FIGS. 55 through 58, the interposer boards 131–133 are interposed between the semiconductor device 10, 10A and the mounting board 14 (or a connector to which the card edge connectors 138). The interposer boards 131–133 are multilayer wiring boards, so that the wiring lines within the boards can be routed with ease and a high degree of freedom, and the matching between the bumps 12 of the semiconductor devices 10, 10A (the external connection bumps 90) and the mounting board 14 (or connector).

A description will be given of a method for fabricating a semiconductor device according to a twenty eighth embodiment of the present invention, and a fourth embodiment of the semiconductor device.

Figure 63:
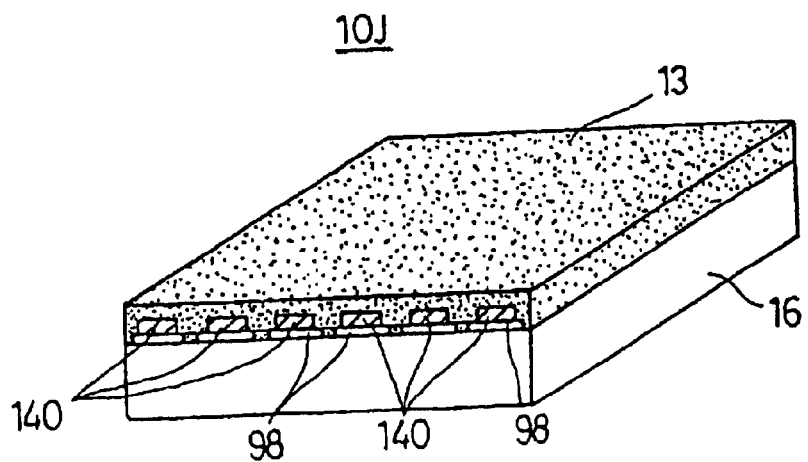
FIG. 63 is a diagram showing a semiconductor device according to a fourth embodiment of the present invention.

First, a description will be given, with reference to FIG. 63, of a semiconductor device 10J according to the fourth embodiment of the present invention. In FIG. 63, parts that have the same structures as those of the semiconductor device 10 according to the first embodiment described with reference to FIG. 9 are given the same reference numbers and a description thereof will be omitted. The semiconductor device 10J of the present embodiment is generally made up of the substrate 16 (semiconductor element), the resin layer 13 and external connection electrodes 140. The substrate 16 functions as a semiconductor element and has a surface on which are provided electronic circuits and the external connection electrodes 140 which can be connected to external terminals. The resin layer 13 is formed so as to cover the surface of the substrate 16 so that the external connection electrodes 140 are sealed by the resin layer 13.

The semiconductor device 10J of the present embodiment is characterized in that the external connection electrodes 140 are laterally exposed at the interface between the substrate 16 and the resin layer 13. More particularly, the semiconductor device 10J does not have any bumps, and electrical connections to a mounting board or the like can be made by the external connection electrodes 140 laterally exposed at the interface and used instead of the bumps.

The semiconductor device 10J can be mounted on the mounting board by the external connection electrodes 140 rather than the bumps. Hence, it is possible to simplify the structure and fabrication process of the semiconductor device 10J and to thus reduce the cost and fabrication efficiency. Further, since the external connection electrodes 140 are laterally exposed at the interface between the resin layer 13 and the substrate 16, the semiconductor device 10J can vertically be mounted on the mounting board 14, as will be described in detail later.

A description will now be given of a method for fabricating a semiconductor device according to a twenty eighth embodiment of the present invention. The fabrication method of the twenty eighth embodiment fabricates the semiconductor device 10J shown in FIG. 63.

The method for fabricating the semiconductor device 10J does not have the step of forming the bumps, but executes the resin sealing step immediately after a semiconductor element forming step is performed. In the semiconductor element forming step, given electronic circuits are formed on the surface of the substrate 16, and the lead lines 96 and the connection electrodes 98 are formed thereon, as has been described with reference to FIG. 40. Further, in the present step, the external connection electrodes 140 are formed on the connection electrodes 98.

Figure 59:
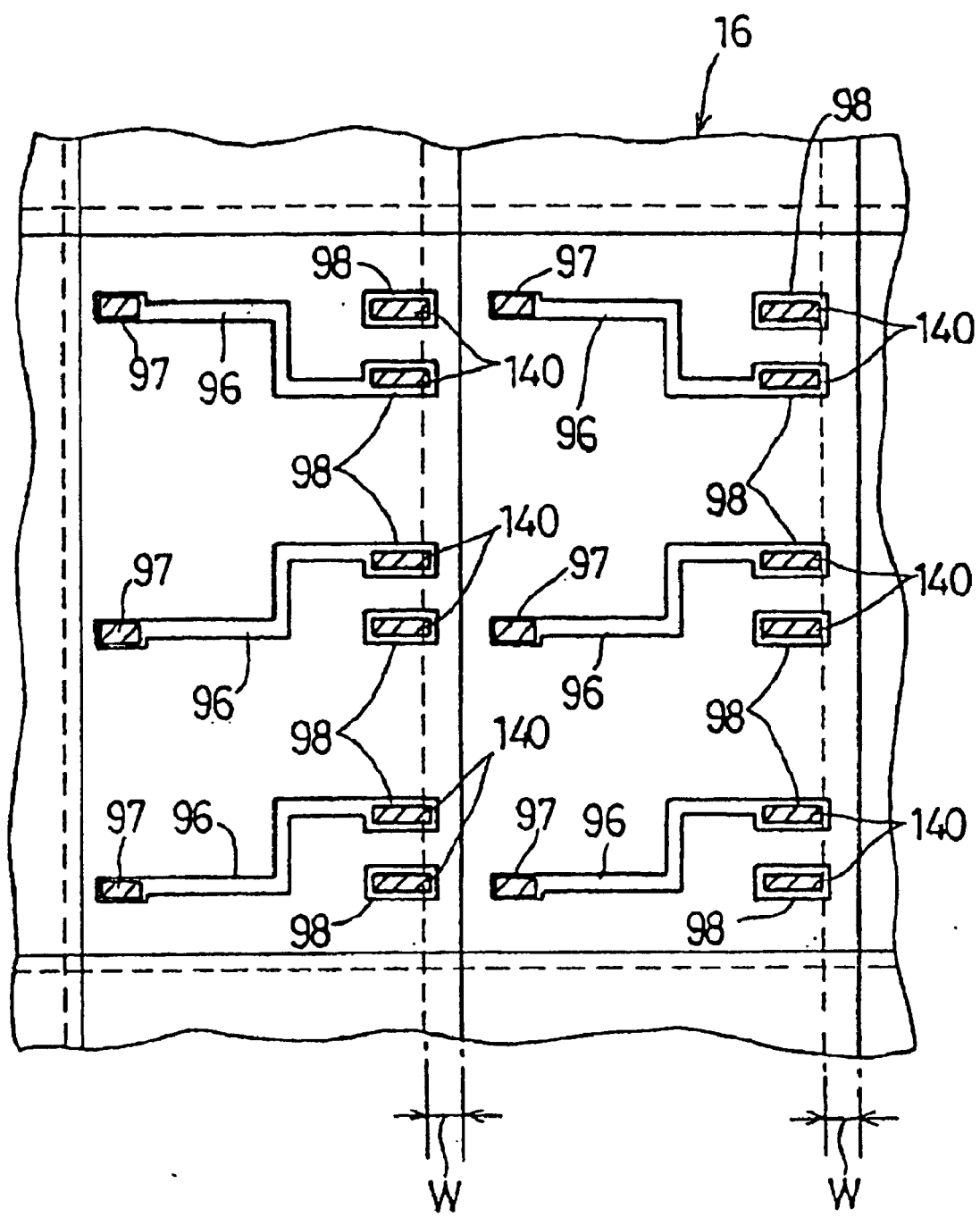
FIG. 59 is a diagram showing a method for fabricating a semiconductor device according to a twenty eighth embodiment of the present invention.

FIG. 59 shows the substrate in a state in which the semiconductor element forming step is completed. As shown in this figure, the external connection electrodes 140 are arranged along an edge of each of the rectangular areas (depicted by the solid lines), which correspond to respective semiconductor elements.

After the substrate forming step is carried out, a resin sealing step is carried out, in which the substrate 16 is loaded onto the mold and the resin 13 is compression-molded. The present resin sealing step is the same as that of the aforementioned first embodiment, and a description thereof will be omitted.

When the resin sealing step is completed, the resin layer 13 is formed on the entire surface of the substrate 16. Hence, the lead lines 96 and the connection electrodes 98 are covered by the resin layer 13. After the resin sealing step, a separating step is immediately carried out rather than the protruding electrode exposing step because the bumps are not formed.

The present embodiment is characterized by cutting, in the separating step, the substrate 16 in the position where the external connection electrodes 140 are formed. In FIG. 59, the broken lines denote the cutting positions. The substrate 16 is cut in the cutting position together with the resin layer 13, parts of the external connection electrodes 140 are cut, so that the semiconductor devices 10J can be obtained in which the external connection electrodes 140 are laterally exposed at the interface between the substrate 16 and the resin layer 13.

As described above, the fabrication method of the present embodiment does not need the bump forming step and the protruding electrode exposing step, which are required in the aforementioned embodiments. Further, the external connection electrodes 140 can be exposed from the resin layer 13 by merely cutting the substrate 16 in the cutting positions together with the resin layer 13. Hence, the semiconductor devices 10J can easily be fabricated.

Figure 60:
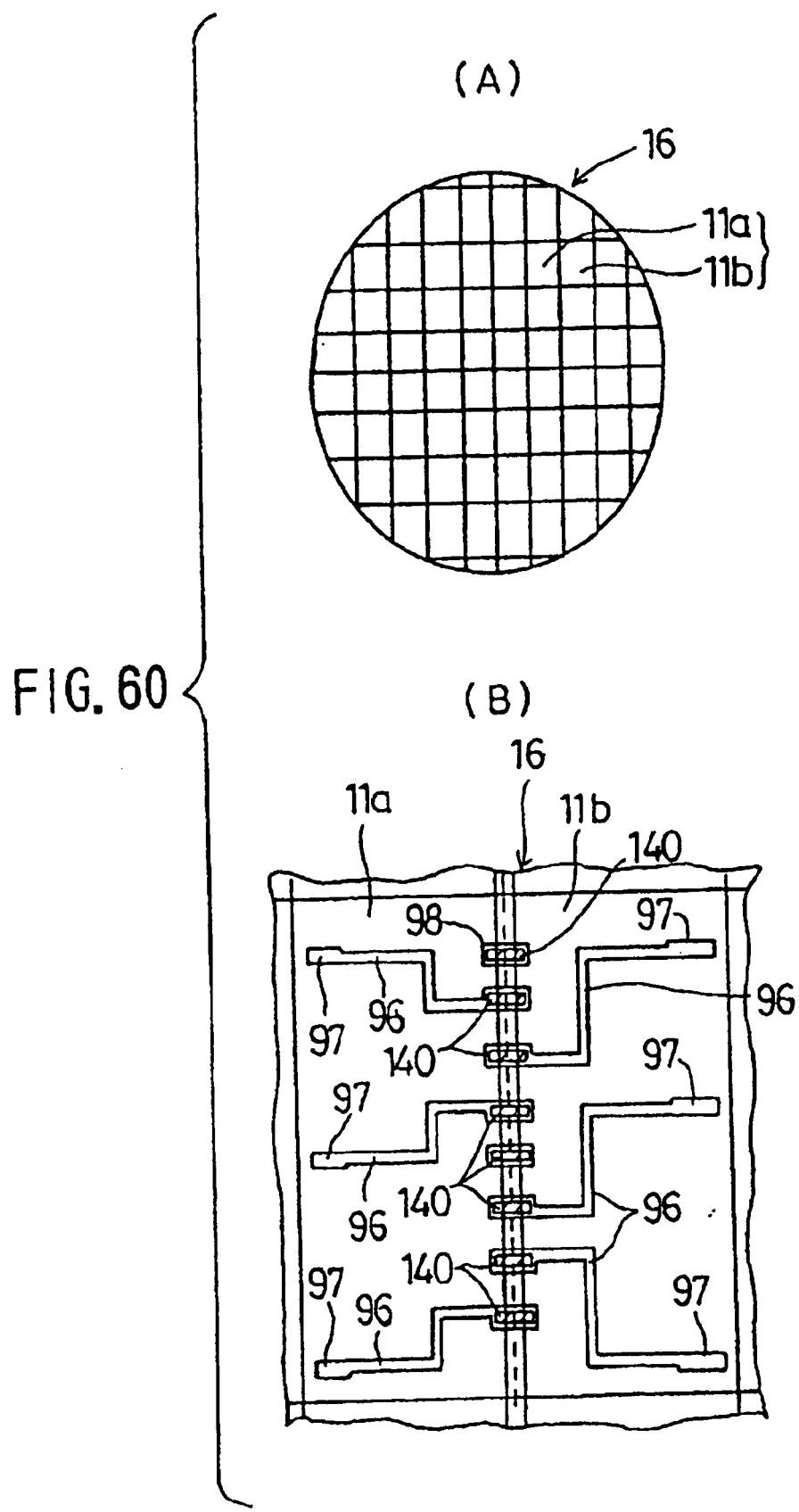
FIG. 60 is a diagram (part 1) showing a method for fabricating a semiconductor device according to a twenty ninth embodiment of the present invention.
Figure 61:
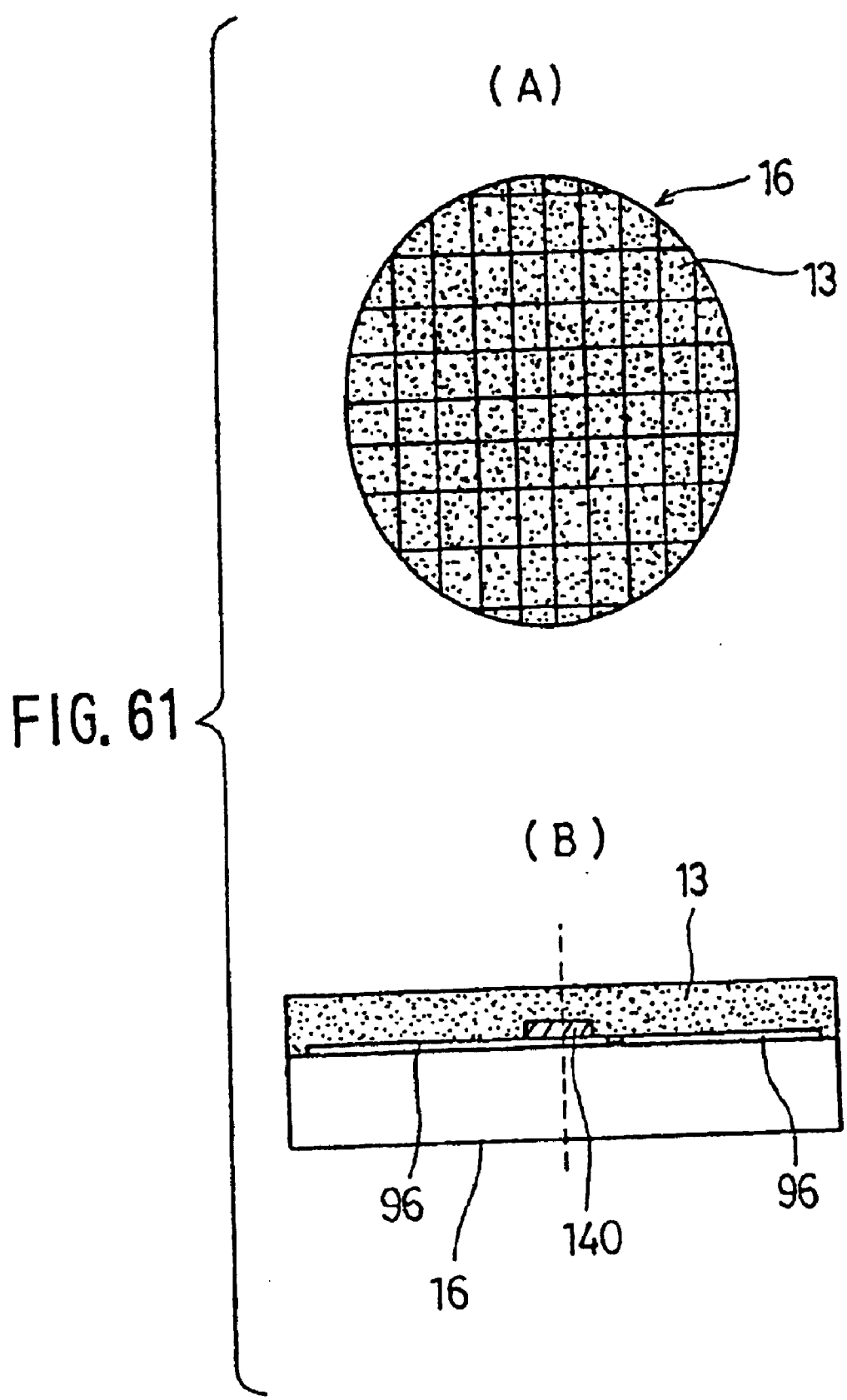
FIG. 61 is another diagram (part 2) showing the method for fabricating a semiconductor device according to the twenty ninth embodiment of the present invention.
Figure 62:
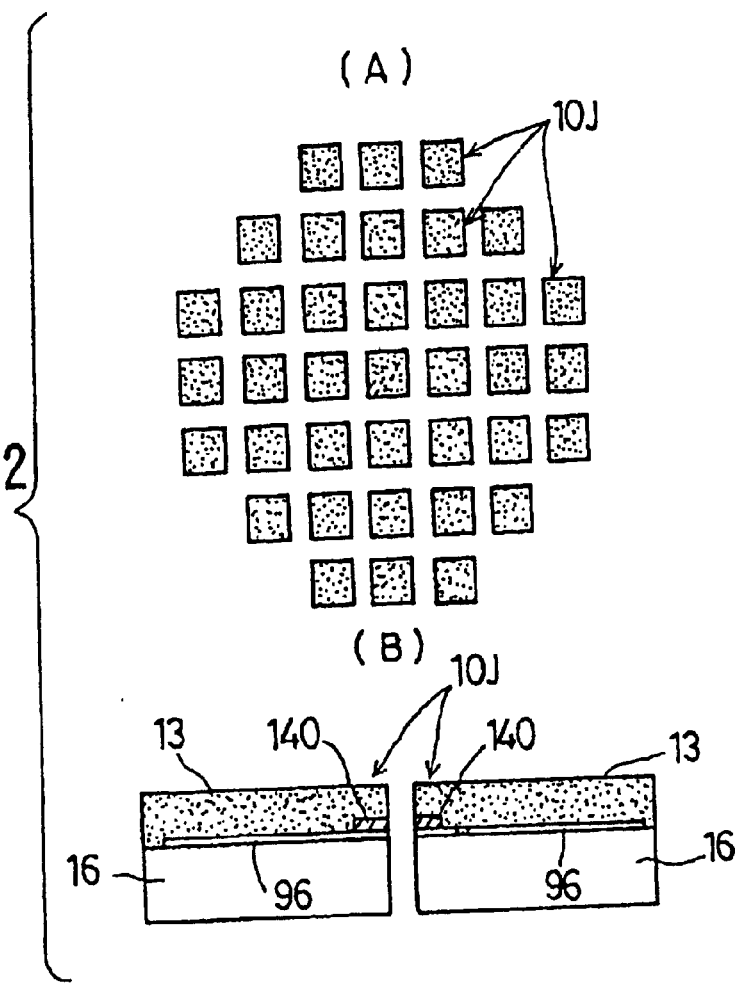
FIG. 62 is yet another diagram (part 3) showing the method for fabricating a semiconductor device according to the twenty ninth embodiment of the present invention.

A description will now be given, with reference to FIGS. 60 through 62, of a method for fabricating a semiconductor device according to a twenty ninth embodiment of the present invention. The present fabrication method is directed to fabricating the semiconductor device 10J shown in FIG. 63. In FIGS. 60 through 62, parts that have the same structures as those shown in FIG. 59 are given the same reference numbers and a description thereof will be omitted.

As described previously, the twenty eight embodiment fabrication method described with reference to FIG. 59 can fabricate the semiconductor device 10J with ease. However, the separating step is required to cut the substrate 16 not only at the positions indicated by the broken lines shown in FIG. 59 but also at the positions indicated by the solid lines shown therein. Further, parts indicated by arrows W are unnecessary (and discarded). Hence, the twenty eighth embodiment method does not execute the cutting process efficiently in the separating step and does not substrate 16 efficiently.

FIG. 60 shows the substrate 16 in a state in which the semiconductor element forming step is completed. FIG. 60(A) shows the whole substrate 16, and FIG. 60(B) is an enlarged view of semiconductor elements 11a and 11b among a plurality of semiconductor elements shown in FIG. 60(A).

As shown in FIG. 60(B), even in the present embodiment, the external connection electrodes 140 are arranged along an edge of each of the semiconductor elements 11a and 11b. However, the present embodiment is characterized in that the external connection electrodes 140 are commonly owned by the adjacent semiconductor elements 11a and 11b.

After the above substrate forming step, a resin sealing step is carried out so that the resin layer 13 is formed on the surface of the substrate 16. Hence, the lead lines 96 and the connection electrodes 98 formed in the substrate forming step are sealed.

After the resin sealing step is completed, a separating step is performed so that the substrate 16 is cut in the positions where the external connection electrodes 140 are formed. In FIG. 61(B), the position indicated by the broken line is a cutting position.

The substrate 16 is cut in the cutting position so that the external connection electrodes are cut in the central positions thereof. Thus, as shown in FIG. 62, the semiconductor devices 10J are formed in each of which devices the external connection electrodes 140 are laterally exposed at the interface between the substrate 16 and the resin layer 13.

As described above, the external connection electrodes 140 are commonly owned by the adjacent semiconductor elements 11a and 11b. Hence, by forming the cutting process only one time, it is possible to expose the external connection electrodes 140 in each of the semiconductor elements 11a and 11b.

Hence the efficiency in fabrication of the semiconductor devices 10J can be improved. Further, the present fabrication method does not produce the unnecessary parts indicated by the arrows W shown in FIG. 59. Hence, the substrate 16 can efficiently be utilized. e A description will now be given of eighth through eleventh embodiments of the semiconductor device mounting method, which are directed to mounting the semiconductor device shown in FIG. 63 on the mounting board 14.

Figure 64:
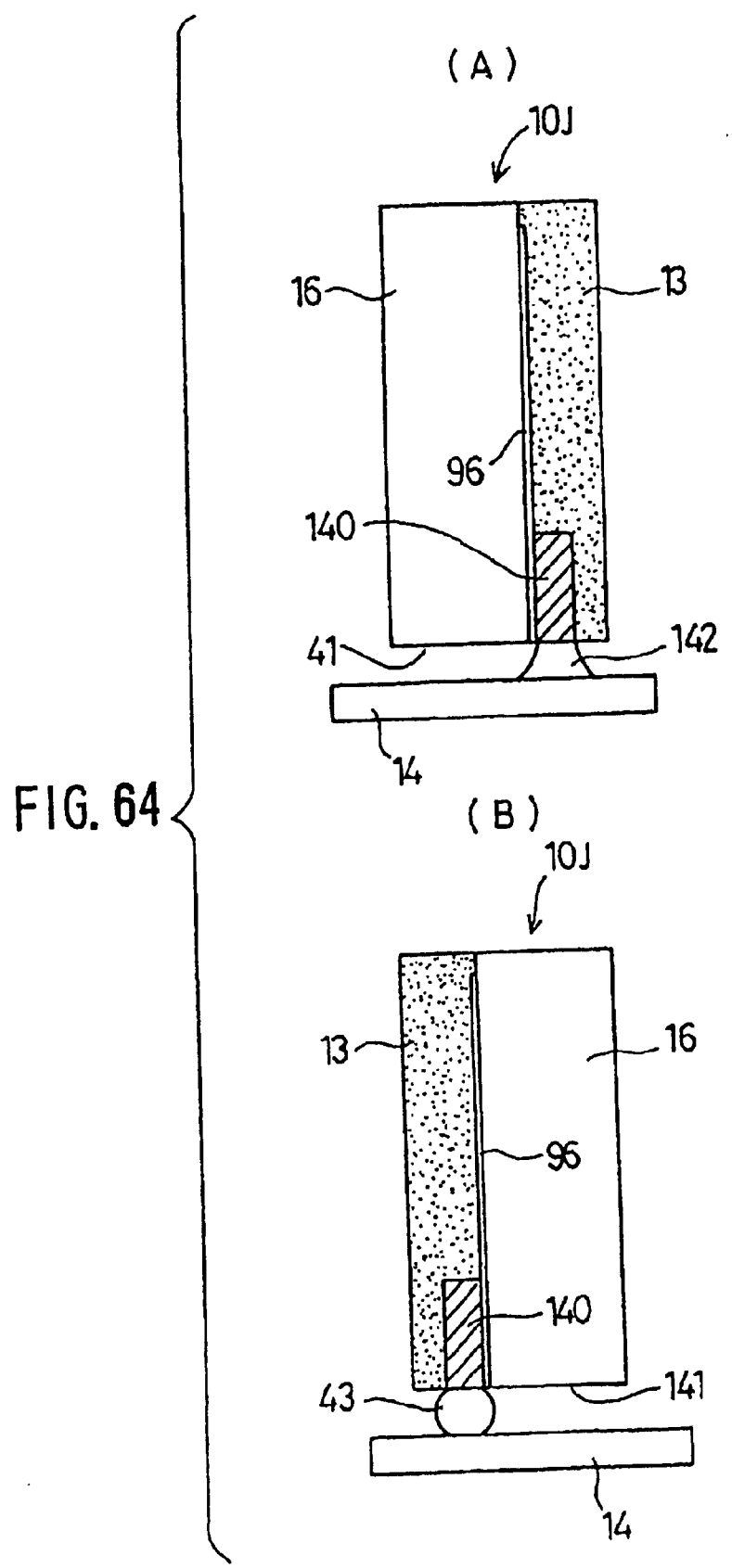
FIG. 64 is a diagram showing a method for mounting a semiconductor device according to an eighth embodiment of the present invention.

FIG. 64 shows the eighth embodiment of the mounting method which mounts the semiconductor device 10J. The present mounting method is directed to mounting a single semiconductor device 10J on the mounting board 14.

As has been described previously, the semiconductor device 10J has the external connection electrodes 140, which are laterally exposed from the side portion thereof. Hence, the semiconductor device 10J can be mounted so that a side surface 141 thereof from which the external connection electrodes 140 are exposed faces the mounting board 14. Thus, the semiconductor 10J can be mounted on the mounting board 14 in an upright state.

In the arrangement shown in FIG. 64(A), a paste member 142 is used to bond the external connection electrodes 140 and the mounting board 14, whereby the semiconductor device 10J vertically stands on the mounting board 14. In the arrangement shown in FIG. 64(B), external connection bumps 143 are provided to the external connection electrodes 140 beforehand, and are then bonded to the mounting board 14, so that the semiconductor device 10J vertically stands on the mounting board 14.

The above vertical mounting of the semiconductor device 10J on the mounting board 14 requires a reduced area on the mounting board 14, as compared with a mounting arrangement in which the semiconductor 10J is laid on the mounting board 14, and thus improves the density of mounting the semiconductor devices 10J.

Figure 65:
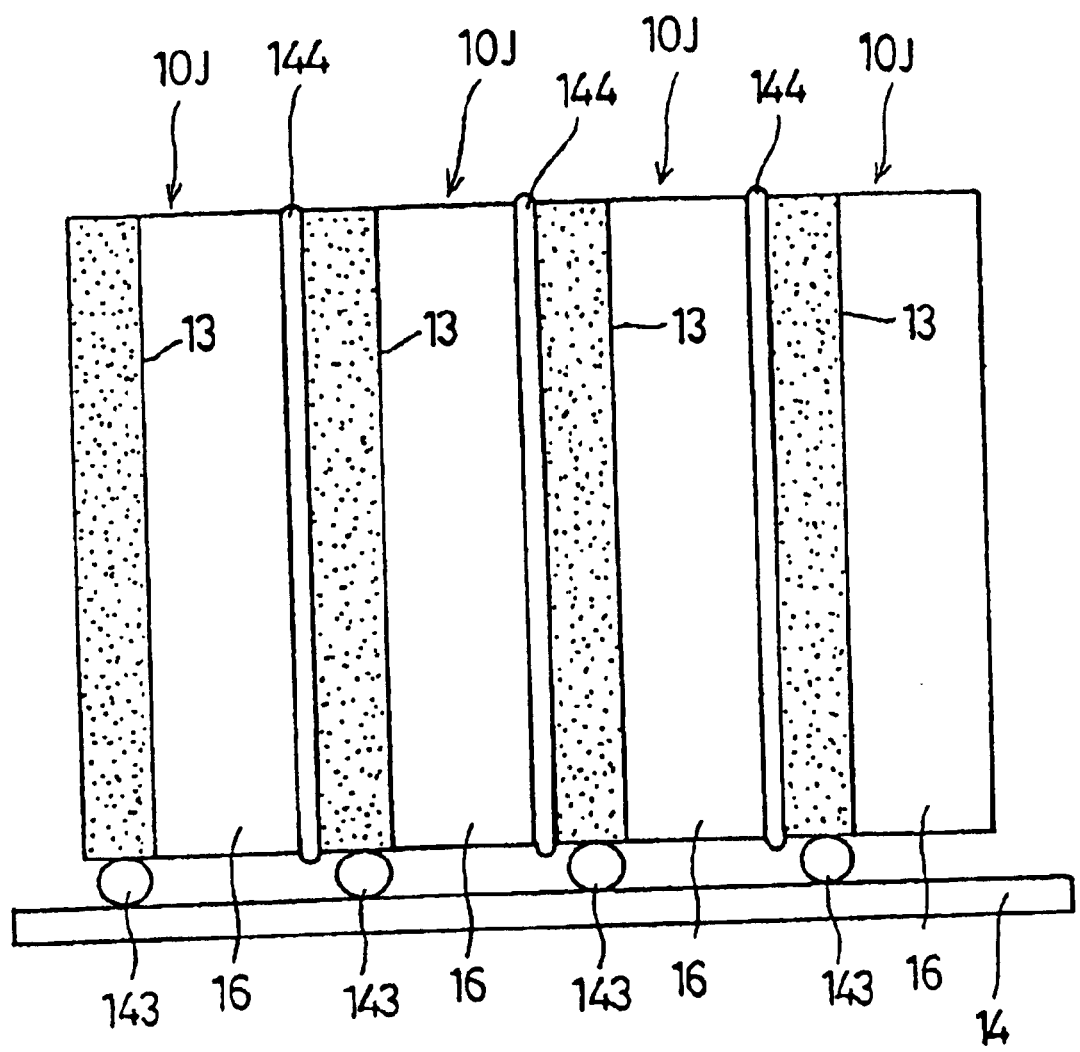
FIG. 65 is a diagram showing a method for mounting a semiconductor device according to a ninth embodiment of the present invention.
Figure 66:
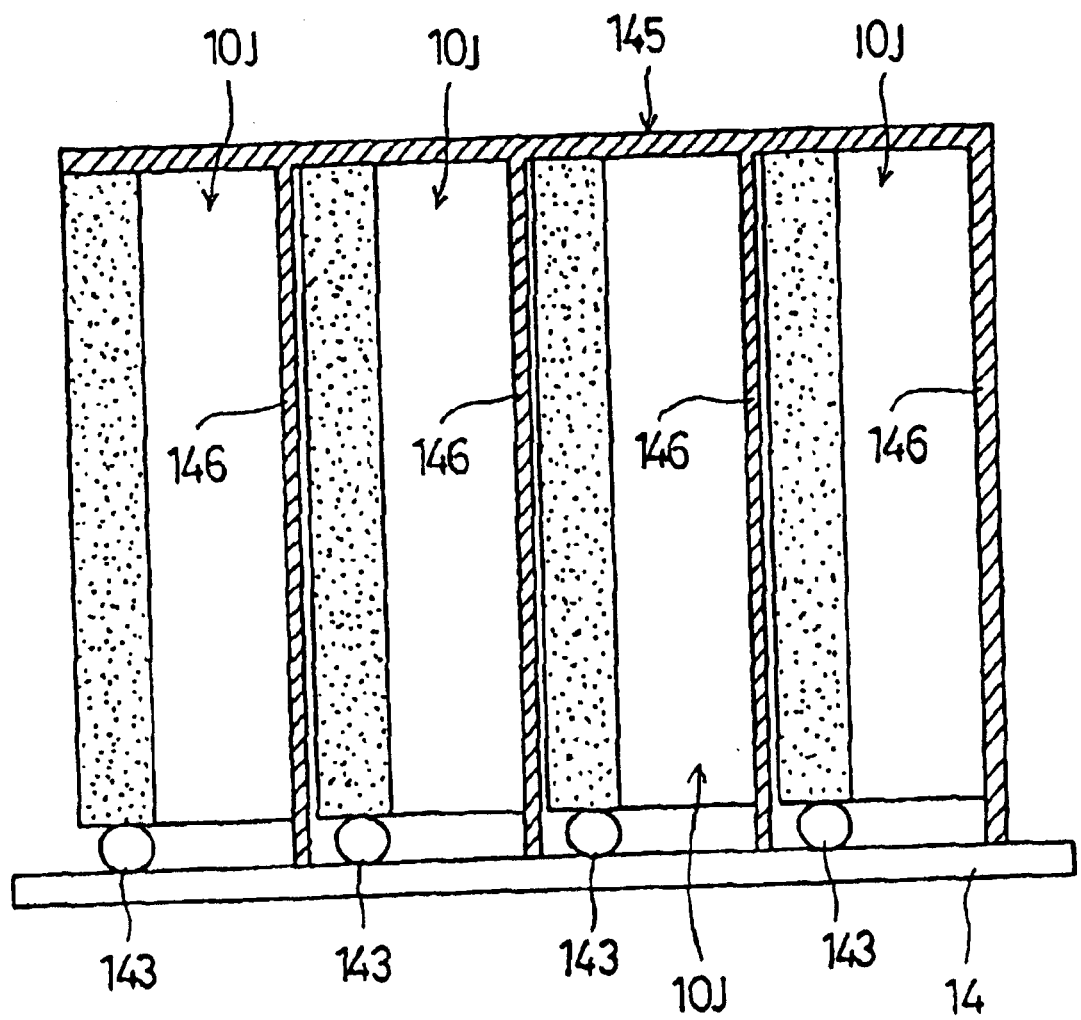
FIG. 66 is a diagram showing a method for mounting a semiconductor device according to a tenth embodiment of the present invention.

FIGS. 65 and 66 show the ninth and tenth embodiments of the mounting method wherein a plurality of semiconductor devices 10J are mounted on the mounting board 14.

The ninth embodiment shown in FIG. 65 is characterized in that a plurality of semiconductor devices 10J are vertically arranged side by side, and adhesives 144 are used to bond the adjacent semiconductor devices 10J together. The step of bonding the adjacent semiconductor devices 10J by the adhesives 144 is carried out before the semiconductor devices 10J are mounted on the mounting board 14. Alternatively, the bonding step may be carried out when the semiconductor devices 10J are bonded to the mounting board 14.

The semiconductor devices 10J are bonded to the mounting board 14 by arranging the external connection bumps 143 to the external connection electrodes 140 beforehand and bonding the external connection bumps 143 to the mounting board 14, as in the case of FIG. 64(B). Alternatively, the adhesives 142 shown in FIG. 64(A) can be used to bond the semiconductor devices 10J and the mounting board 14.

The tenth embodiment shown in FIG. 66 is characterized in that a plurality of semiconductor devices 10J are vertically arranged side by side and a supporting member 145 is used to support the semiconductor devices 10J in the vertically standing state. The semiconductor devices 10J are bonded to the mounting board 14 by using the external connection bumps 143 as in the case of the ninth embodiment mounting method.

The supporting member 145 is formed of a metal having a good heat radiating performance, and has partition walls 146 by which the adjacent semiconductor devices 10J are separated from each other. Each of the semiconductor devices 10J is bonded to a pair of partition walls 146 by an adhesive, whereby the semiconductor devices 10J are fixed to the supporting member 145.

The means for fixing the semiconductor devices 10J to the supporting member 145 is not limited to an adhesive but includes means for holding each of the semiconductor devices 10J by a respective pair of partition walls 146.

According to the ninth and tenth embodiments of the method for fabricating the semiconductor device 10J, it is possible to handle a plurality of semiconductor devices 10J as a unit. Hence, it is possible to mount a number of semiconductor devices 10J on the mounting board 14 on the unit basis and to thus improve the efficiency in mounting the semiconductor devices 10J.

Figure 67:
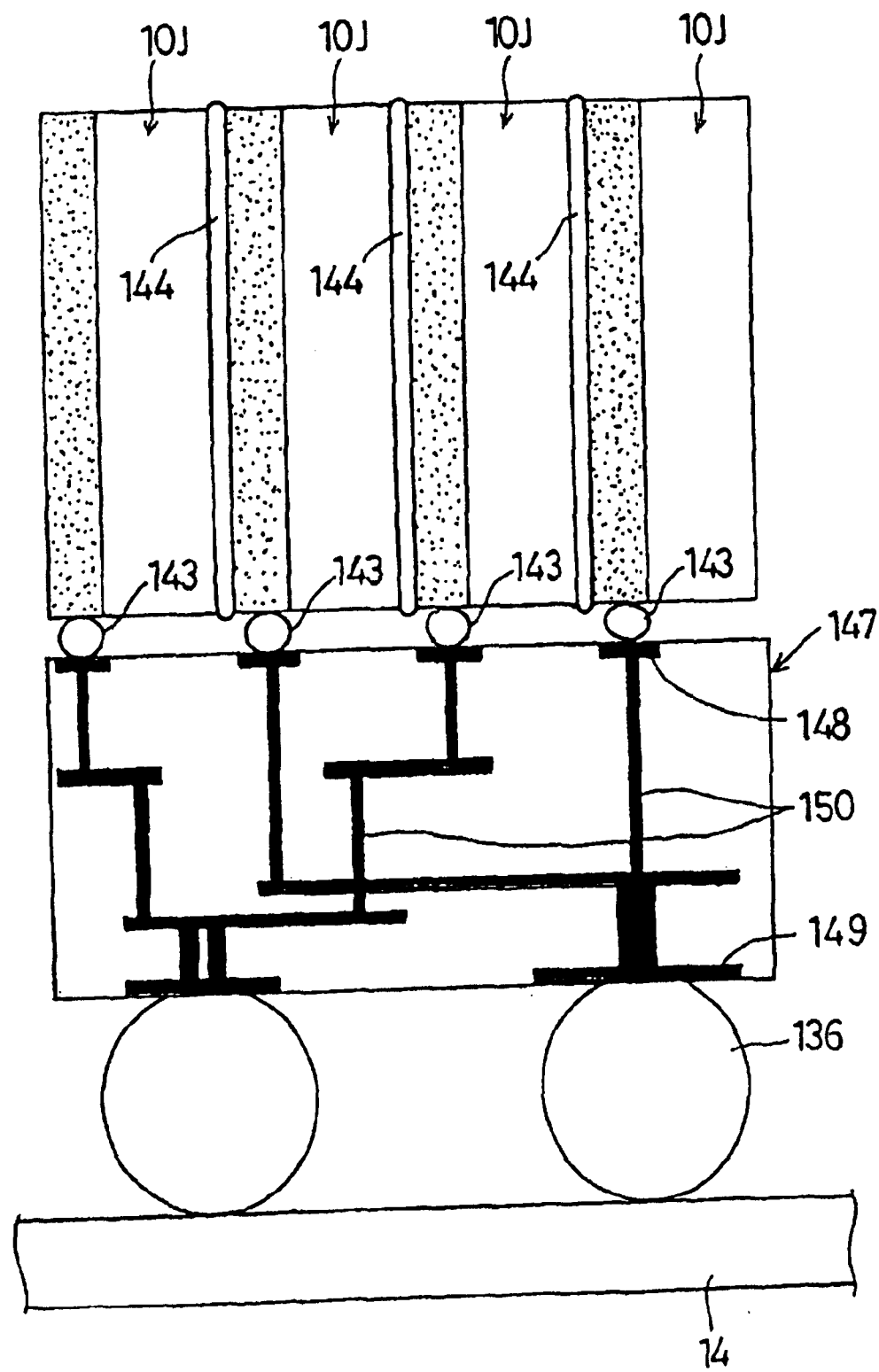
FIG. 67 is a diagram showing a method for mounting a semiconductor device according to an eleventh embodiment of the present invention.

FIG. 67 shows the eleventh embodiment of the method for mounting semiconductor devices 10J. The present method is characterized by mounting a plurality of (four in the illustrated structure) semiconductor devices 10J on the mounting board 14 through an interposer board 147.

In the present embodiment, a plurality of semiconductor devices 10J to which the ninth embodiment mounting method described with reference to FIG. 65 is applied are mounted on the interposer board 147. Then, the interposer board 147 is mounted on the mounting board 14. The interposer board 147 used in the present embodiment is a multilayer wiring board, which has an upper surface on which upper electrodes 148 are formed to which the semiconductor devices 10J are connected. Also, the interposer board 147 has a lower surface on which lower electrodes 149 are arranged. The mounting bumps 136 for bonding the interposer board 147 to the mounting board 14 are provided to the lower electrodes 149. The upper electrodes 148 and the lower electrodes 149 are connected by internal wiring lines 150.

According to the present embodiment mounting method, the interposer board 147 is provided between the semiconductor devices 10J and the mounting board 14, so that the semiconductor devices 10J can be mounted on the mounting board 14 with an increased degree of freedom.

Figure 68:
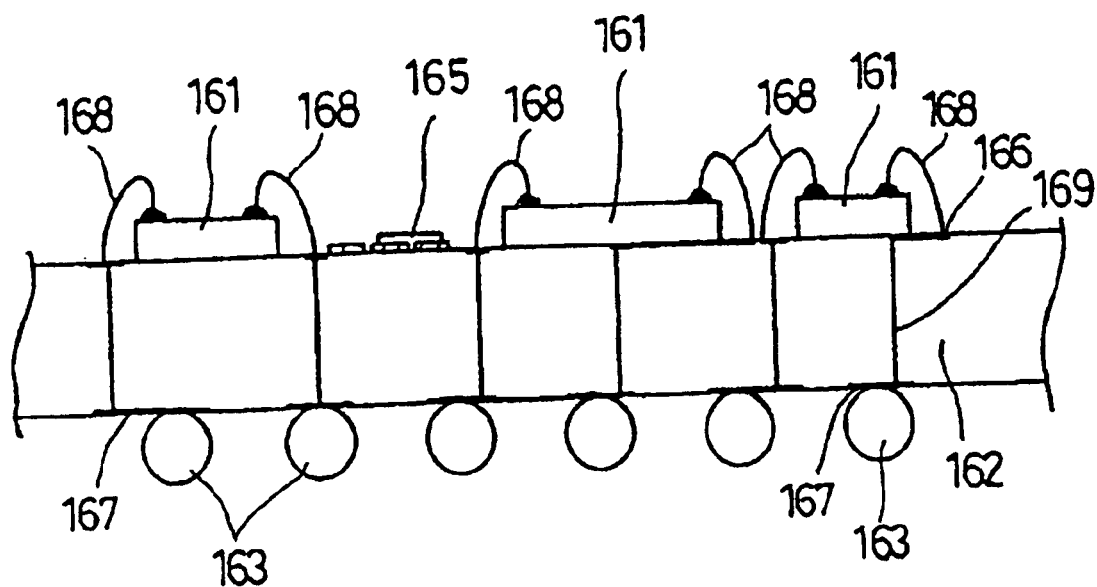
FIG. 68 is a diagram (part 1) showing another method for mounting a semiconductor device.
Figure 69:
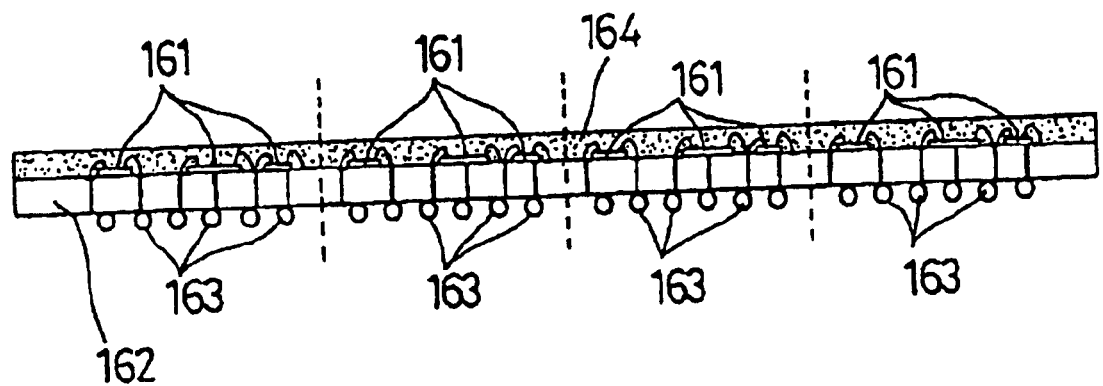
FIG. 69 is a diagram (part 2) showing another method for mounting a semiconductor device.

A description will be given of a semiconductor device 160 having a structure different from those of the foregoing semiconductor devices 10, 10A–10J and a method for fabricating the device 160. FIGS. 68 and 69 are diagrams showing the method for fabricating the semiconductor device 160, and FIG. 70 is a diagram of the structure of the semiconductor device 160.

Figure 70:
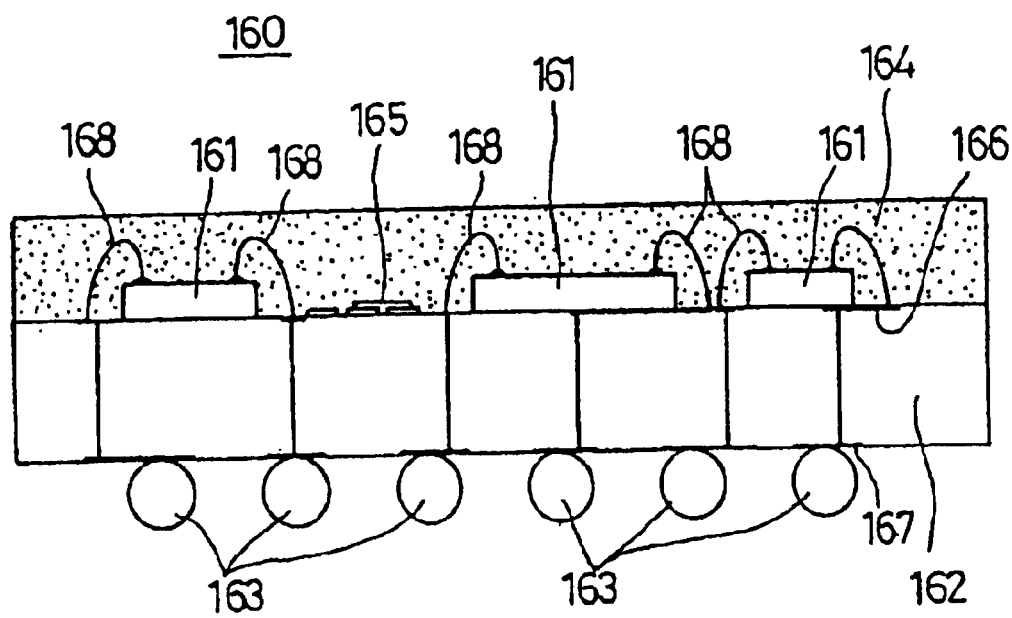
FIG. 70 is a diagram (part 3) showing another method for mounting a semiconductor device.

As shown in FIG. 70, the semiconductor device 160 is generally made up of a plurality of semiconductor elements 161, an interposer board 162, external connection bumps 163 and a resin layer 164.

The semiconductor elements 161 are mounted on the upper surface of the interposer board 162 together with electronic components 165. A plurality of upper electrodes 166 are formed on the upper surface of the interposer board 162, and are electrically connected to the semiconductor elements 161 by wires 168.

A plurality of lower electrodes 167 are formed on the lower surface of the interposer board 162, and external connection bumps 163 are connected to the lower electrodes 167. A plurality of through holes 169 are formed in the interposer board 162, and are used to make electrical connections between the upper electrodes 166 and the lower electrodes 167. Hence, the semiconductor elements 161 and the external connection bumps 163 are electrically connected together. A resin layer 164 is formed by the compression molding technique so as to cover the upper surface of the interposer board 612.

It is possible to form the resin layer 164 by the compression molding technique even on the semiconductor device 160 which employs the wires 168 for making the electrical connections between the semiconductor elements 161 and an external part (interposer board 162).

The method for fabricating the above semiconductor device 160 commences mounting the semiconductor elements 161 on the upper surface of the interposer board 162 by an adhesive. The electronic components 165 may be simultaneously mounted, if necessary. Then, a wire bonding step is carried out so that the wires 168 are provided between the upper electrodes 166 formed on the upper surface of the interposer board 162 and pads provided on the upper portions of the semiconductor elements 161. Thereafter, the external connection bumps 163 are provided to the lower electrodes 167 formed on the lower surface of the interposer board 162 by, for example, a transfer method.

After the semiconductor elements 161, the external connection bumps 163 and the wires 168 are provided to the interposer board 162, the board 162 is loaded onto a mold for resin sealing, and the resin layer 164 is formed on the surface of the interposer board 162 by the compression molding method. FIG. 69 shows the interposer board 162 on which the resin layer 164 is formed. Subsequently, the interposer board 162 is cut at given cutting positions indicated by the broker lines in FIG. 69, so that the semiconductor device 160 shown in FIG. 70 can be obtained.

Figure 71:
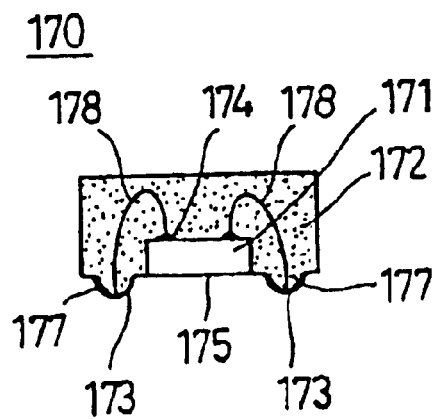
FIG. 71 is a diagram showing another semiconductor device.
Figure 72:
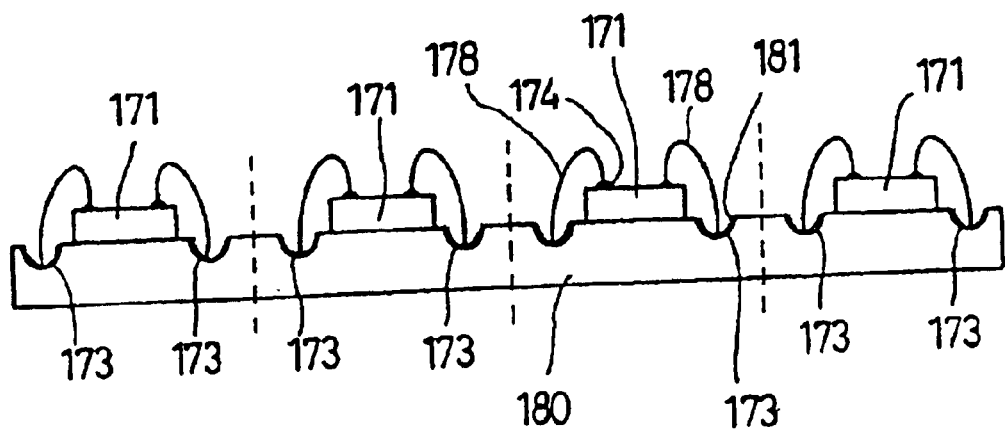
FIG. 72 is a diagram (part 1) showing yet another method for mounting a semiconductor device.
Figure 73:
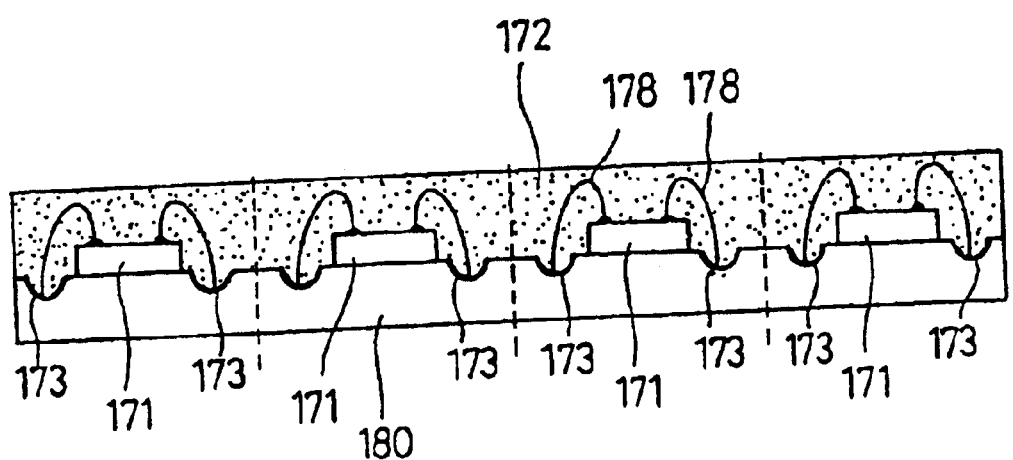
FIG. 73 is a diagram (part 2) showing yet another method for mounting a semiconductor device.
Figure 74:
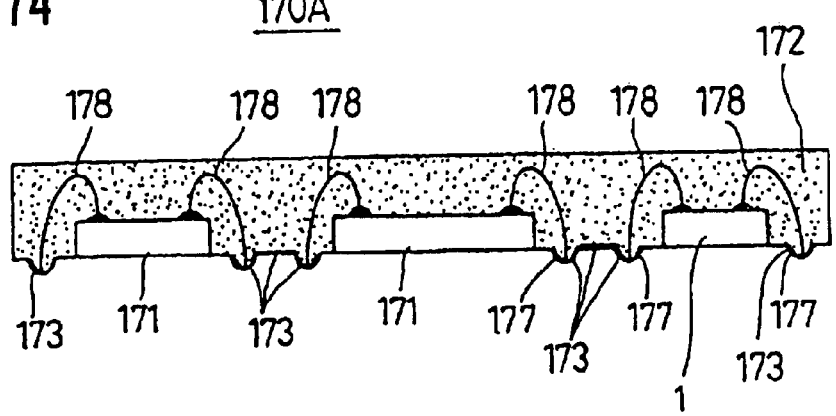
FIG. 74 is a diagram (part 3) showing yet another method for mounting a semiconductor device.
Figure 75:
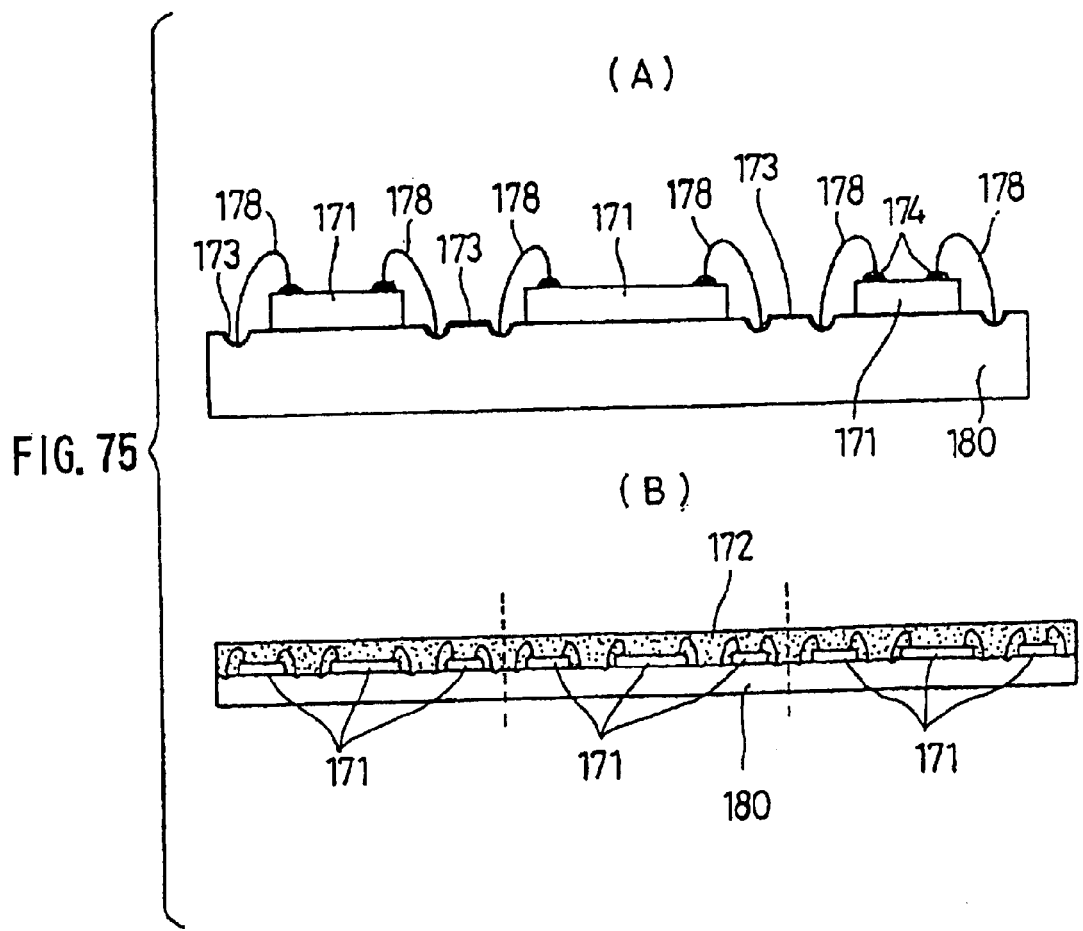
FIG. 75 is a diagram (part 4) showing yet another method for mounting a semiconductor device.

FIGS. 71 through 75 are diagrams showing semiconductor devices 170 and 170A having structures different from those of the aforementioned semiconductor devices 10, 10A–10J, and their fabrication methods. FIG. 71 is a diagram showing a structure of the semiconductor device 170, and FIGS. 72 and 73 are diagrams showing a method for fabricating the semiconductor device 170. FIG. 74 is a diagram showing q structure of the semiconductor device 170A, and FIG. 75 is a diagram showing a method for fabricating the semiconductor device 170A.

The semiconductor device 170 has an extremely simple structure, which is generally made up of semiconductor elements 171, a resin package 172, and metallic films 173. A plurality of electrode pads 174 are formed on the upper surfaces of the semiconductor elements 171. The resin package 172 is formed by compression-molding epoxy resin. The resin package 172 has a mounting surface 175 on which resin projections 177 are integrally formed.

The metallic films 173 are formed so as to cover the resin projections 177 formed in the resin package 172. Wires 178 are provided between the metallic films 173 and the electrode pads 174, whereby the metallic films 173 and the semiconductor elements 171 are electrically connected together.

The semiconductor device 170 thus configured does not need inner leads and outer leads such as conventional SSOP, and does not need areas for leading from the inner leads to the outer leads and areas for the outer leads themselves. Thus, the semiconductor device 170 can be down sized.

Further, there is no need to provide a mount board necessary to form solder balls such as BGA, so that the cost of fabricating the semiconductor device 170 can be reduced. The resin projections 177 and the metallic films 173 cooperate with each other and function as the solder bumps of the BGA type semiconductor device. Hence, the mounting performance can be improved.

The method for fabricating the semiconductor device 170 will be described with reference to FIGS. 72 and 73. Lead frame 180 shown in FIG. 72 is prepared. The lead frame 180 is made of, for example, copper (Cu). A plurality of recess portions 181 having a counterpart shape of the resin projections 177 are formed in the positions corresponding to those of the resin projections 177. The metallic films 173 are formed on the surfaces of the recess portions 181.

First, the semiconductor elements 171 are mounted on the lead frame 180. Next, the lead frame 180 are loaded to a wire bonding apparatus, which arranges the wires 178 between the electrode pads 174 of the semiconductor elements 171 and the metallic films 173 formed on the lead frame 180. Hence, the semiconductor elements 171 and the metallic films 173 are electrically connected. FIG. 72 shows the arrangement observed after the above steps are completed.

After the wires 178 are arranged, the resin package 172 is formed on the lead frame 180 so as to seal the semiconductor elements 171. In the present embodiment, the resin package 172 is formed by the compression-molding. FIG. 73 shows the lead frame 180 on which the resin package 172 is formed.

After the resin package 172 is formed, the arrangement is cut at the position indicated by the broken lines shown in FIG. 73, and then a removing step is carried out in which the resin package 172 is removed from the lead frame 180. Thus, the semiconductor device 170 can be obtained. In the removing step, the lead frame 180 is placed in an etchant and is thus dissolved. The etchant used in the removing step is required to dissolve the lead frame 180 only and not to dissolve the metallic films 173.

Since the lead frame 180 is totally dissolved, the resin package 172 is separated from the lead frame 180. The metallic films 173 are disposed to the resin projections 177, and thus the semiconductor device 170 shown in FIG. 71 can be obtained. Hence, the above method makes it possible to definitely remove the lead frame 180 from the resin package 172 with ease and to improve the yield.

The semiconductor device 170A shown in FIG. 74 has an arrangement in which the semiconductor elements 171 are arranged in the single resin package 172. Hence, the semiconductor device 170A can be made to have multiple functions. The method for fabricating the semiconductor device 170A is almost the same as that which has been described with reference to FIGS. 72 and 73, while there is an only minor difference such that the cutting positions indicated in FIG. 75(B) are different from those in the previously described method. Hence, a detailed description of the method for fabricating the semiconductor device 170A will be omitted.

Figure 78:
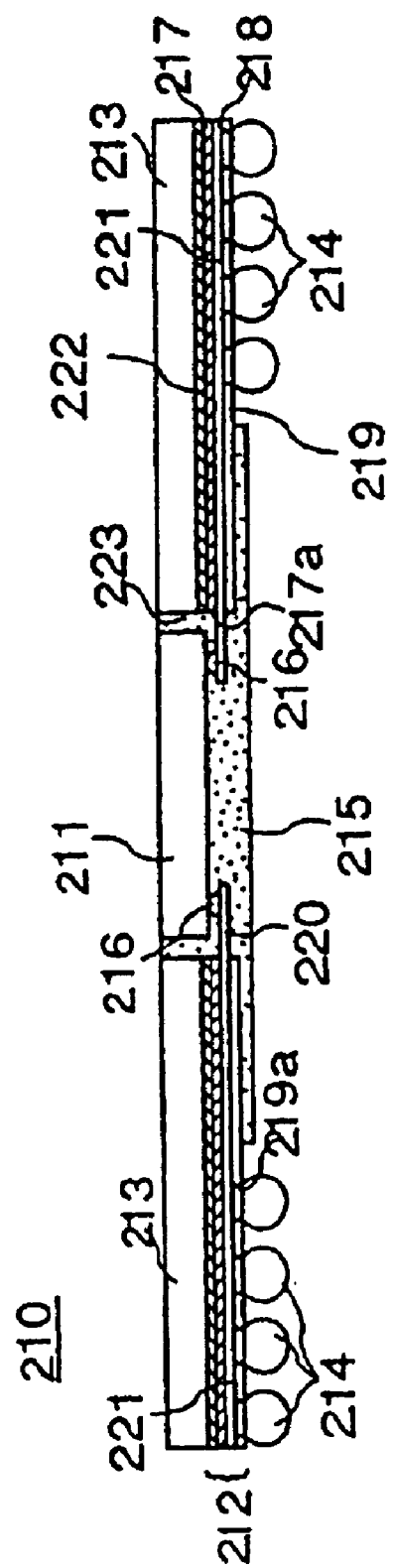
FIG. 78 is a diagram showing a semiconductor device according to a thirtieth embodiment of the present invention.
Figure 79:
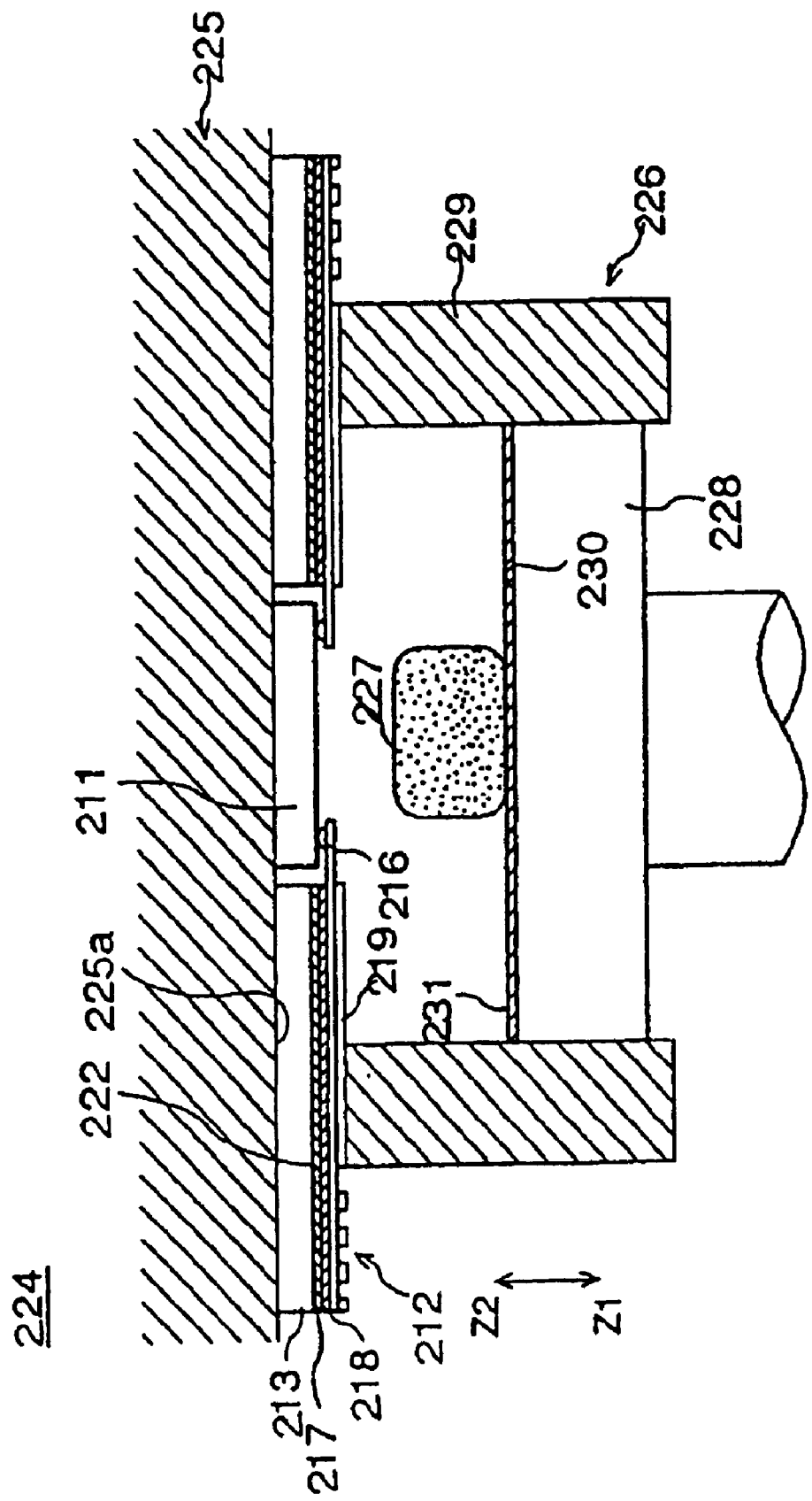
FIG. 79 is a diagram (part 1) showing a method for fabricating the semiconductor device according to the thirtieth embodiment of the present invention.
Figure 80:
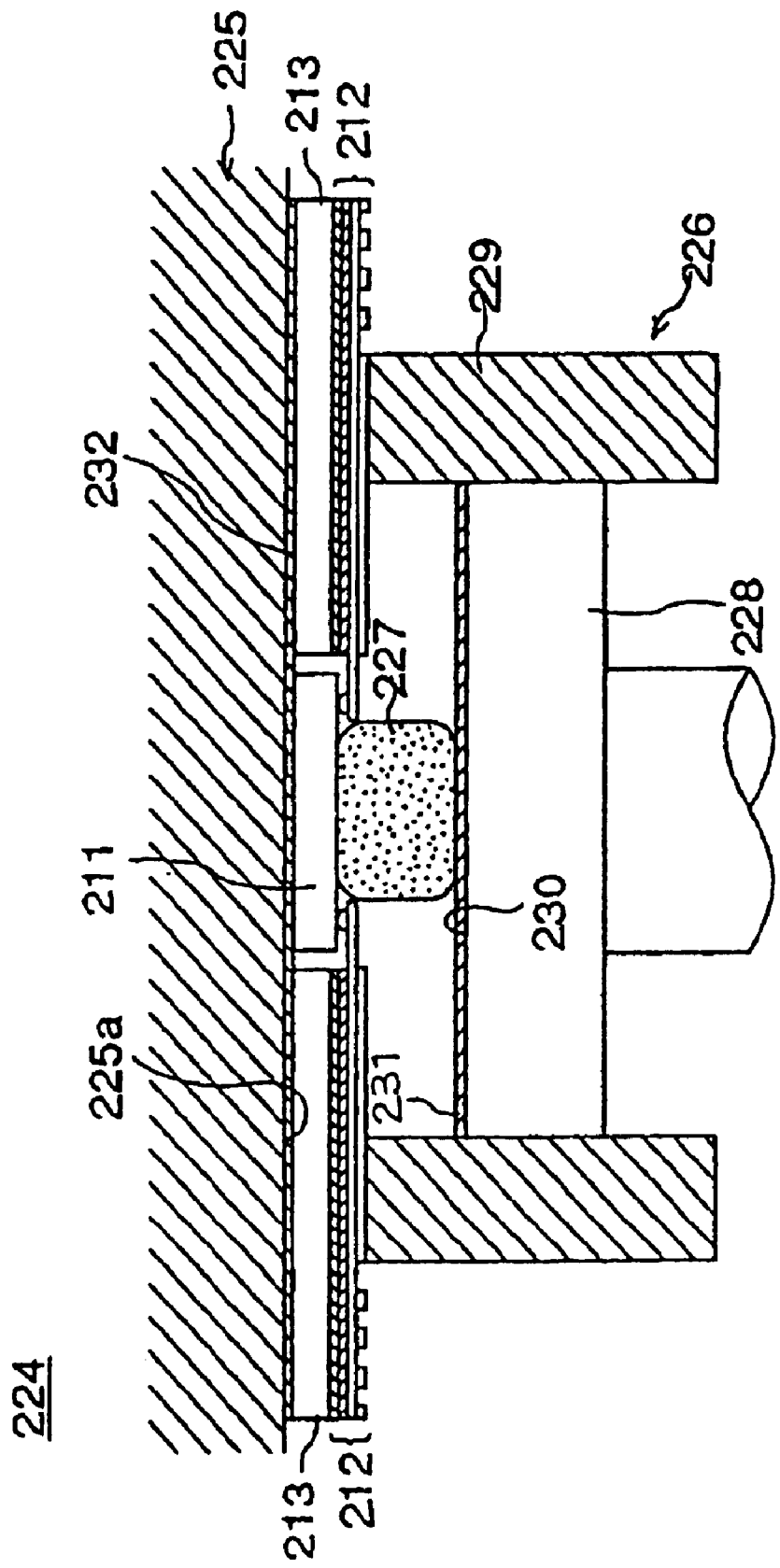
FIG. 80 is a diagram (part 2) showing a method for fabricating the semiconductor device according to the thirtieth embodiment of the present invention.

FIGS. 78 through 80 show a method for fabricating a semiconductor device according to a thirtieth embodiment of the present invention. First, a semiconductor device 210 fabricated by the thirtieth embodiment will be described by referring to FIG. 78. In the following description, semiconductor devices having a T-BGA (Tape-Ball Grid Array) structure will exemplarily be described. However, the present invention can be applied to semiconductor devices of other BGA structures.

The semiconductor device 210 is generally made up of a semiconductor element 211, a wiring board 212, a frame 213, protruding electrodes 214 and a sealing resin 215.

The semiconductor element 211 is a so-called bare chip, and a plurality of bumps 216 are provided on the lower surface thereof. The semiconductor element 211 is electrically or mechanically connected to the wiring board 212 by flip-chip bonding.

The wiring board 212 is made up of a base film 217 (a flexible base member), leads 218 and an insulating film 219 (solder resist). The base film 217 is a The base film 217 is thicker than the leads 218 and the insulating film 219, and has a comparativeln insulating film having a flexibility such as polyimide. The leads 218 have a given pattern which is formed on the base film 217 and is made of an electrically conductive film such as a copper foil.

The base film 217 is thicker than the leads 218 and the insulating film 219, and has a comparatively strong mechanical strength. Hence, the leads 218 and the insulating film 219 are supported by the base film 217. As described above, the base film 217 has flexibility, and the leads 218 and the insulating member 219 are comparatively thin. Hence, the wiring board 212 can be bent. Further, an attachment hole 217a for attaching the semiconductor element 211 is formed in the approximately central position of the base film 217.

A plurality of leads 218 are provided in correspondence with the number of bump electrodes 216 of the semiconductor element 211. Inner lead portions 220 and outer lead portions 221 are integrally formed. The inner lead portions 220 are inner portions of the leads 218, and are bonded to the bump electrodes 216 of the semiconductor element 211. The outer lead portions 221 are located further out than the inner lead portions 220, and the protruding electrodes 214 are connected thereto.

The insulating film 219 is an insulating resin film such as polyimide, and connection holes 219a are formed therein in positions corresponding to the positions of the protruding electrodes 214. The leads 218 and the protruding electrodes 214 are electrically connected through the connection holes 219a. The insulating film 219 protrudes from the leads 218.

The frame 213 is formed of a metallic substance such as copper or aluminum. In the central portion of the frame 213, a cavity 223 is formed so as to face the attachment hole 217a formed in the base film 217. In the present embodiment, the cavity 223 penetrates the frame 213 and connects the upper and lower surfaces thereof. The frame 213 has a rectangular shape when viewing it from the top. Hence, the cavity 223 forms the frame 213 into a rectangular frame shape.

The aforementioned wiring board 212 having flexibility is bonded to and fixed to the lower surface of the frame 213 by an adhesive 222. In the state in which the wiring board 212 is arranged to the frame 213, the inner lead portions 220 of the leads 218 extend into the cavity 223. The semiconductor element 211 is bonded, in flip-chip bonding formation, to the inner lead portions 220 extending into the cavity 223. Hence, the semiconductor element 211 is located within the cavity 223.

The outer lead portions 221 of the leads 218 are disposed so as to be located at the lower surface side of the frame 213. The protruding electrodes 214 are arranged to the outer lead portions 221. In the present embodiment, the protruding electrodes 214 are formed of solder bumps, and are bonded to the outer lead portions 221 via the connection holes 219a formed in the insulating film 219 by using solder balls.

The outer lead portions 221 to which the protruding electrodes 214 are arranged are located at the lower surface side of the frame 213. Although the wiring board 212 is flexible, the outer lead portions 221 are suppressed from being flexibly deformed by the frame 213. Hence, even if the flexible wiring board 212 is used, the protruding electrodes 214 can precisely be located in positions, and the mounting performance can be improved.

The sealing resin 215 is disposed within the cavity 223 onto which the semiconductor element 211 is loaded. The sealing resin 215 is formed by the compression-molding method. By arranging the sealing resin 215 in the cavity 223, the semiconductor element 211, the bump electrodes 216 and the inner lead portions 220 of the leads 218 are sealed by resin, so that the semiconductor element 211 and the inner lead portions 220 of the leads 218 can definitely be protected.

A description will be given, with reference to FIG. 79, of a method (fabrication method according to the thirtieth embodiment) of fabricating the semiconductor device 210 having the above-mentioned structure.

The semiconductor device 210 is generally made up of a semiconductor element forming step of forming the semiconductor element 211, a wiring board forming step of forming the wiring board 212, a protruding electrode forming step of forming the protruding electrodes 214, an element mounting step of mounting the semiconductor element 211 on the wiring board 212, a resin sealing step of sealing the semiconductor element 211 and other components by the sealing resin 215, and a test step of testing the semiconductor device 210 from various viewpoints.

Among the above steps, the semiconductor element forming step, the wiring board forming step, the protruding electrode forming step, the element mounting step and the testing step can be executed by using the known techniques. The present method has a unique feature in the resin sealing step, which will mainly be described below.

FIG. 79 shows the resin sealing step used in the thirtieth embodiment.

As shown in FIG. 79, the resin sealing step commences loading, onto a mold 224 for fabricating semiconductor devices (hereinafter simply referred to as mold), the wiring board 212 on which the semiconductor element 211 is mounted through the semiconductor element forming step, the wiring board forming step and the element mounting step.

The structure of the mold 224 will be described. The mold 224 is generally made up of an upper mold 225 and a lower mold 226, which are respectively equipped with heaters that are not shown. The heaters heat and melt sealing resin before molding (the sealing resin before molding is specifically indicated by a reference number 227).

The upper mold 225 is elevated in directions Z1 and Z2 indicated by an arrow by means of an elevating apparatus, which is not shown. The lower surface of the upper mold 225 is a cavity surface 225a, which is flat. The upper mold 225 has a very simple shape, which can be produced at a less-expensive cost.

The lower mold 226 is made up of a first lower mold half body 228 and a second lower mold half body 229. The first lower mold half body 228 is arranged within the second lower mold half body 229. The upper and lower mold half bodies 228 and 229 can independently be elevated in the directions Z1 and Z2 indicated by the arrow by means of the elevating apparatus which is not shown.

In the present embodiment, a resin film 231 is provided to the cavity surface 230 formed on the upper surface of the first lower mold half body 228. A sealing resin 227 is placed on an upper portion of the resin film 231. Then, the resin sealing step is carried out. The resin film 231 is formed of, for example, polyimide, chloroethylene, PC, Pet, or statical resin, and is required not to be degraded by heat applied at the time of molding the resin.

In the resin sealing step, the wiring board 212 on which the semiconductor device 211 is mounted is loaded onto the mold 224. More particularly, the upper mold 225 and the second lower mold half body 229 are spaced apart from each other, and the wiring board 212 is placed therebetween. Then, the upper mold 225 and the second lower mold half body 229 are moved to become close to each other, so that the wiring board 212 is held by the upper mold 225 and the second lower mold half body 229. FIG. 79 shows a state in which the wiring board 212 is held by the upper mold 224 and the lower mold half body 229 so that the wiring board 212 is loaded onto the mold 224.

The sealing resin 227 arranged on the first lower mold half body 228 is, for example, polyimide or epoxy resin (PPS, PEEK, PES and thermoplastic resin such as heat-resistant liquid crystal resin), and is formed into a circular cylinder shape. the sealing resin 227 is located in the substantially central position of the first lower mold half body 228 so as to face the semiconductor element 211 placed on the wiring board 212.

After the wiring board 212 is loaded onto the mold 224, the step of compression-molding the sealing resin 227 is executed. After the above step is initiated, it is confirmed that the temperature of the sealing resin 227 is raised, by heating through the mold 224, to a level at which the sealing resin 227 may be melted. Then, the first lower mold half body 228 is moved up in the direction Z2.

The sealing resin 227 which has been heated and melted is also moved up since the first lower mold half body 228 is moved up in the direction Z2, and reaches the wiring board 212. Further, the first lower mold half body 227 is moved up and the sealing resin is thus compressed. Hence, the sealing resin 227 enters into the cavity 223 via gaps between the inner lead portions 220 and the semiconductor element 211.

As described above, the sealing resin 227 is pressed by the first lower mold half body 228 and is thus compressed. Thus, the sealing resin 227 enters the cavity 223 in a compressed state. By the above resin sealing process, as shown in FIG. 78, the sealing resin 215 is formed in the cavity 223 and the upper portion of the semiconductor element 211. Hence, the semiconductor element 211, the bump electrodes 216 and the inner lead portions 220 are protected by the sealing resin 215.

As described above, the sealing resin 227 is compressed in the mold 224 and is molded (this process is called compression molding method). By molding the sealing resin 227 by the compression molding method, narrow gap portions formed between the semiconductor element 211 and the wiring board 212 can definitely be filled with resin.

Since the compression molding method requires a comparatively low molding pressure, it is possible to prevent the wiring board 224 from being deformed at the time of molding the resin and to prevent a load from being applied to electrically connecting portions between the semiconductor element 211 and the wiring board 212 (more particularly, the connecting portions between the bump electrodes 216 and the inner lead portions 220). Hence, it is possible to prevent the semiconductor element 211 and the wiring board 212 from being broken and to realize the highly reliable resin sealing process.

In the resin sealing step, if the first lower mold half body 228 is moved too fast, the molding pressure is abruptly increased, so that the connecting portions between the bump electrodes 216 and the inner lead portions 220 may be damaged. If the first lower mold half body 228 is moved too slowly, the molding pressure becomes too low, so that some portions may not be filled with resin and the time necessary to execute the resin sealing step may become long. The fabrication efficiency is degraded. With the above in mind, the moving speed of the first lower mold half body 228 is selected to an appropriate level at which the above contradictory problems do not occur.

After the sealing resin 215 is formed, the step of removing the wiring board 212 from the molding resin 224 is carried out. In order to remove the wiring board 212 from the mold 224, the first lower mold half body 228 is moved down in the direction Z1. Since the resin film 231 having a good detachment performance is provided to the cavity surface of the first lower mold half body 228, the first lower mold half body 228 can easily be removed from the sealing resin 215.

After the first lower mold half body 228 is removed from the sealing resin 215, the upper mold 225 and the second lower mold half body 229 are moved so as to become away from each other. Hence, the wiring board 212 can be taken out of the mold 224. There is no problem even when the first lower mold half body 228 is moved at the same time as the second lower mold half body 229 and the upper mold 225 are moved.

After the wiring board 212 is removed from the mold 224, the protruding electrodes 214 are formed on the wiring board 212. The protruding electrodes 214 can be formed by various methods. In the present embodiment, a transfer method is employed in which solder balls are transferred to connection holes 219a formed in the wiring board 212, and are heated, so that the solder balls are bonded to the leads 218. By the above-mentioned series of steps, the semiconductor device shown in FIG. 78 can be fabricated.

FIG. 80 shows a resin sealing step executed in the method for fabricating the semiconductor device 210 shown in FIG. 78 according to a thirty first embodiment of the present invention. In FIG. 80, parts that have the same structures as those shown in FIG. 79 are given the same reference numbers, and a description thereof will be omitted.

In the resin sealing step shown in FIG. 78, the resin film 31 for improving the detachability is arranged to only the cavity surface 230 of the first lower mold half body 28. As shown in FIG. 79, there is a portion in which the cavity surface 225a of the upper mold 224 contacts the sealing resin 215.

With the above in mind, the present embodiment resin sealing step is characterized in that a resin film 232 having a good detachability is provided to the cavity surface 225a of the upper mold 225. The resin film 232 may be formed of the same substance as that of the aforementioned resin film 231. The resin film 232 is arranged to the cavity surface 225a of the upper mold 225 before the wiring board 212 is loaded onto the mold 224. Then, the wiring board 212 is held by the upper mold 225 and the second lower mold half body 229.

The resin film 232 can be arranged without any particular additional step, and the sealing resin 215 can easily be detached from the cavity surface 225a of the upper mold 225 when the wiring board 212 is taken out of the mold 224.

A description will be given of a semiconductor device according to the thirty first embodiment of the present invention.

Figure 81:
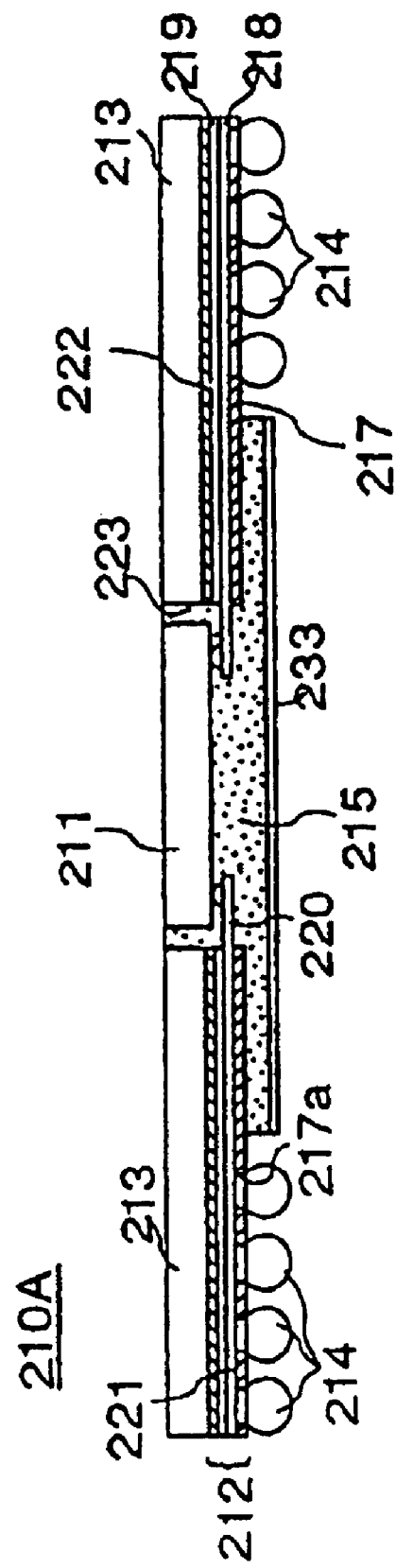
FIG. 81 is a diagram showing a semiconductor device according to a thirty first embodiment of the present invention.

FIG. 81 shows a semiconductor device 210A according to the thirty first embodiment of the present invention. In FIG. 81, parts that have the same structures as those of the semiconductor device 10 according to the thirtieth embodiment of the present invention are given the same reference numbers, and a description thereof will be omitted.

The semiconductor device 210A according to the present embodiment is characterized by providing a heat radiating plate 233 to the mounting-side surface (the lower surface in the figure) of the sealing resin 215. The heat radiating plate 233 is formed of a metal having a good heat radiating performance such as aluminum. By providing the heat radiating plate 233 to the sealing resin 215 sealing the semiconductor element 211, it is possible to efficiently radiate heat generated in the semiconductor element 211. Hence, it is possible to suppress the temperature of the semiconductor element 211 from raising and to thus improve the reliability in the operation of the semiconductor device 210A.

The semiconductor device 210A according to the present embodiment has the wiring board 212 arranged in a direction different from that of the semiconductor device 210 according to the aforementioned thirtieth embodiment. That is, the base film 217 forms the lowermost layer, and the leads 218 and the insulating film 219 are arranged in a stacked formation on the base film 217.

Hence, the insulating film 219 is bonded to the frame 213 by the adhesive 222, and the connection holes 217b accommodating the protruding electrodes 214 are formed on the base film 217. As described above, the wiring board 212 can be arranged in any of the two different directions by selecting the positions in which the connection holes 217b and 219a aforementioned].

Figure 82:
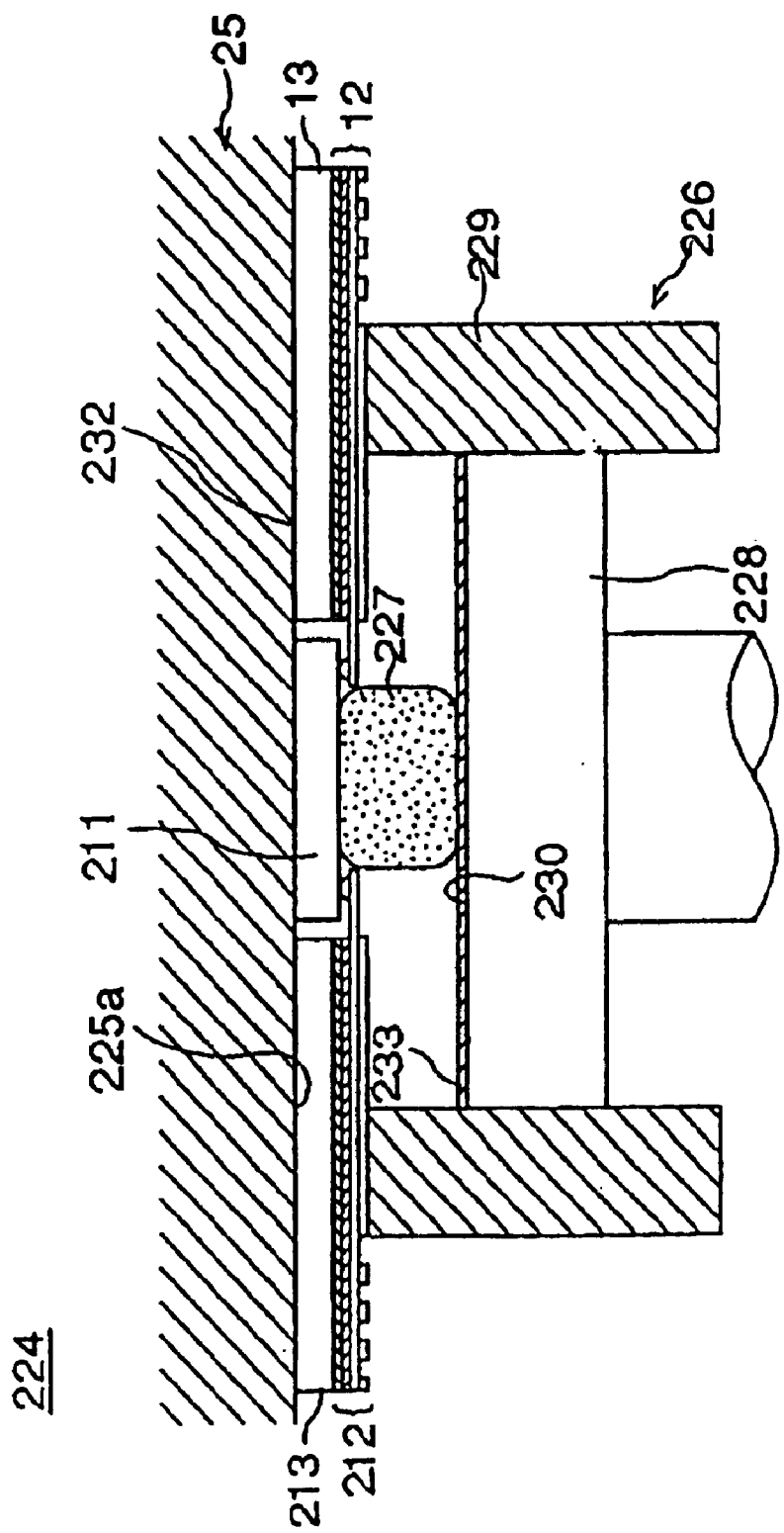
FIG. 82 is a diagram (part 1) showing a method for fabricating the semiconductor device according to the thirty first embodiment of the present invention.
Figure 83:
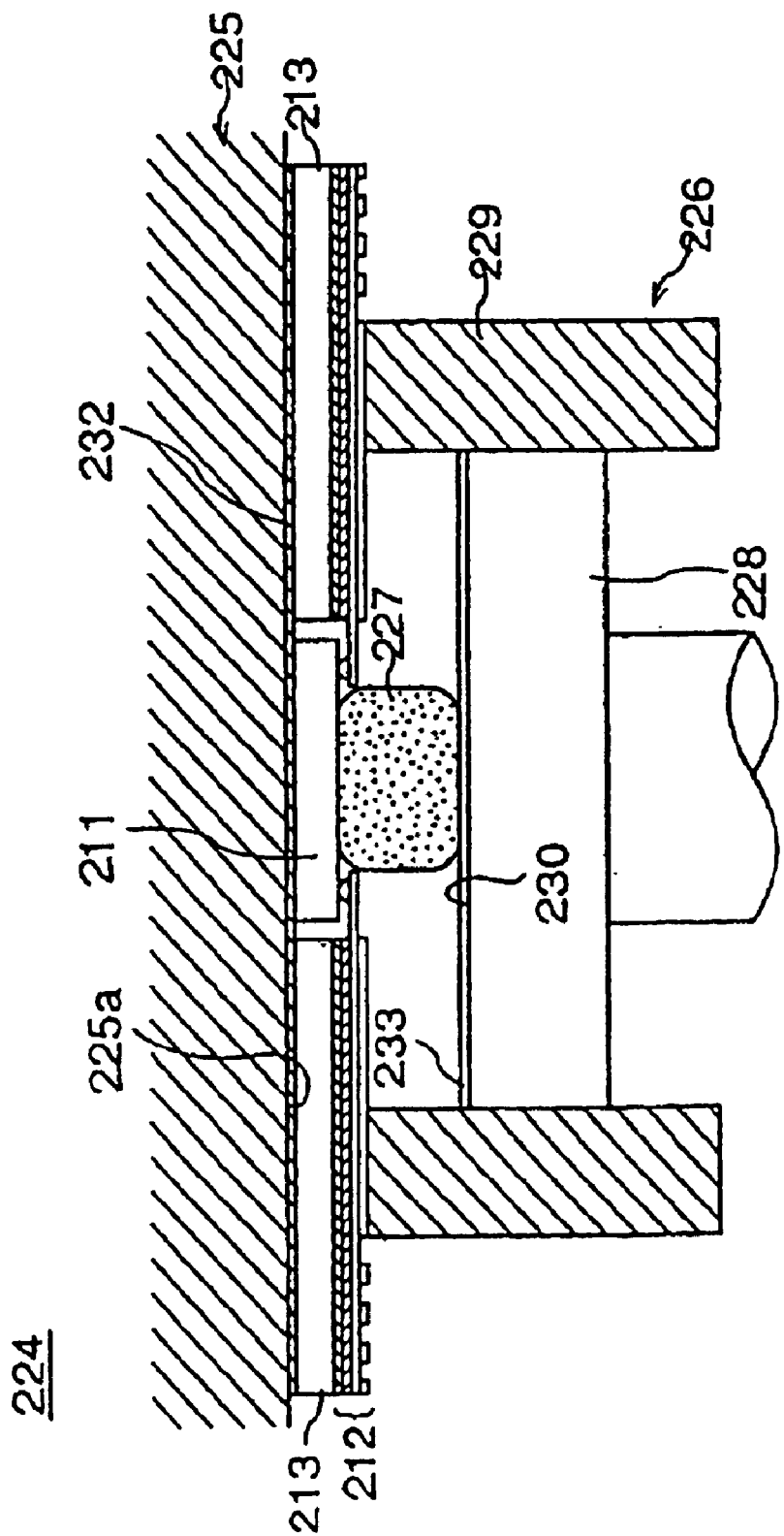
FIG. 83 is a diagram (part 2) showing a method for fabricating the semiconductor device according to the thirty first embodiment of the present invention.

FIGS. 82 and 83 are diagrams showing a resin sealing step in the method of fabricating the semiconductor device 210A shown in FIG. 61. In FIGS. 82 and 83, parts that have the same structures as those shown in FIGS. 79 and 80 are given the same reference numbers and a description thereof will be omitted.

The resin sealing step shown in FIG. 82 is characterized by arranging the heat radiating plate 233 to the cavity surface 230 of the first lower mold half body 228. Hence, the sealing resin 227 is provided on the heat radiating plate 233. Further, the heat radiating plate 233 has a size slightly smaller than the cavity surface 230. Thus, the movement of the first lower mold half body 228 is not interfered with the arrangement of the heat radiating plate 233.

The compression molding step for the sealing resin 227 using the mold 224 to which the heat radiating plate 233 is provided is basically the same as that described with reference to FIG. 79. However, the sealing resin 227 is pressed by the heat radiating plate 233 which is moved up by moving up the first lower mold half body 228 and is thus compression-molded.

The heat radiating plate 233 and the sealing resin 227 does not have a good detachability, and the heat radiating plate 233 is merely placed on the first lower mold half body 228 made of a metal. Hence, when the first lower mold half body 228 is moved down after the sealing resin 215 is formed, the heat radiating plate adheres to the sealing resin 215. That is, by executing the resin sealing step, it is possible to simultaneously arrange the heat radiating plate 233 to the sealing resin 215 and to easily fabricate the semiconductor device 210A equipped with the heat radiating plate 233.

The resin sealing step shown in FIG. 83 is characterized by arranging the heat radiating plate 233 to the cavity surface 230 of the first lower mold half body 228 and arranging a resin film 232 having a good detachability to the cavity surface 225a of the upper mold 225.

Hence, the present embodiment resin sealing step easily fabricates the semiconductor device 210A equipped with the heat radiating plate 233 and easily detaches the sealing resin 215 from the cavity surface 225a of the upper mold 225.

A description will now be given of a semiconductor device according to a thirty second embodiment of the present invention.

Figure 84:
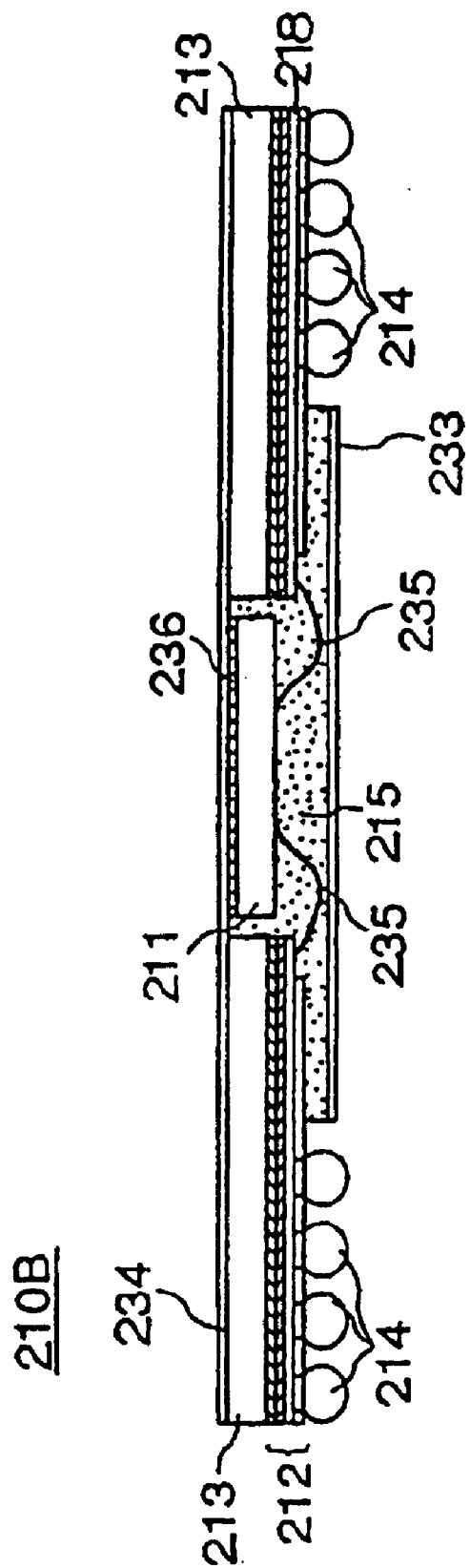
FIG. 84 is a diagram showing a semiconductor device according to a thirty second embodiment of the present invention.

FIG. 84 shows a semiconductor device 210B according to the thirty second embodiment of the present invention. In FIG. 84, parts that have the same structures as those of the semiconductor device 210 according to the thirtieth embodiment are given the same reference numbers, and a description thereof will be omitted.

The semiconductor device 210B according to the present embodiment is characterized by providing the first heat radiating plate 233 to the mounting-side surface (the lower surface in the figure) of the sealing resin 215 as in the case of the semiconductor device 210A according to the thirty first embodiment and by providing a second heat radiating plate 234 to the upper surface of the frame 213. The second heat radiating plate 234 is made of a metal having a good heat radiating performance such as aluminum as in the case of the first heat radiating plate 233.

The heat radiating plates 233 and 234 are arranged so as to sandwich the semiconductor element 211, and more efficiently radiate heat generated in the semiconductor element 211. Thus, the reliability of the semiconductor device 210B can be improved. When the frame 213 to which the second heat radiating plate 234 is arranged is made of a substance having a good heat radiating performance, the heat radiating performance of the semiconductor device 210B can further be improved.

The semiconductor device 210B uses wires 235 as means for electrically connecting the semiconductor element 211 and the wiring board 212. Hence, the semiconductor element 211 is connected to the wiring board 212 by bonding the second heat radiating plate 234 to the upper surface of the frame 213 by, for example, an adhesive (not shown), so that the bottom portion of the second heat radiating plate 234 is present in the cavity of the frame 213.

Then, the semiconductor device 211 is bonded to the second heat radiating plate 234 in the cavity 223 by an adhesive 236, and the wiring board 212 is bonded to the lower surface of the frame 213. Thereafter, the wires 235 are provided between the leads 218 of the wiring boards 212 and the semiconductor element 211 by wire bonding.

Then, the sealing resin 215 is formed by the compression-molding process as in the case of the aforementioned embodiments. In this process, the sealing resin 215 does not directly contact the upper mold 225 because the heat radiating plate 234 is provided above the semiconductor element 211 and the frame 213. Hence, the detachability can be improved.

The heat radiating plate 234 may be formed of a substance which does not have a good heat radiating performance but a relatively low heat radiating performance when the semiconductor element 211 does not generate much heat.

A description will now be given of a semiconductor device according to a thirty third embodiment of the present invention.

Figure 85:
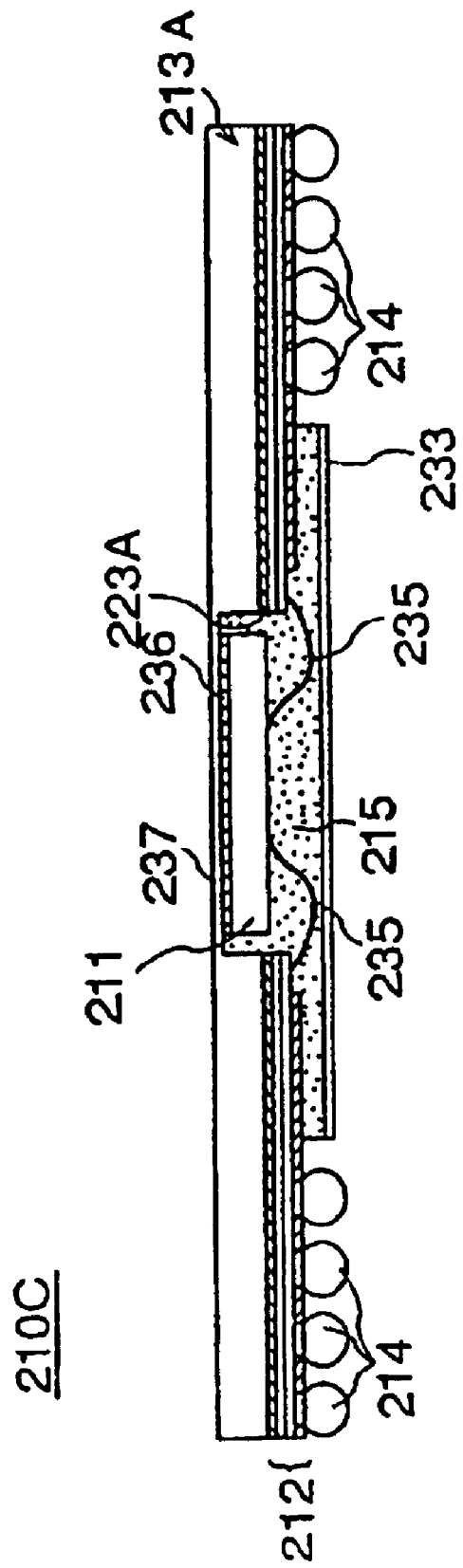
FIG. 85 is a diagram showing a semiconductor device according to a thirty third embodiment of the present invention.

FIG. 85 shows a semiconductor device 210C according to the thirty third embodiment of the present invention. In FIG. 85, parts that have the same structures as those of the semiconductor device 210B according to the thirty second embodiment of the present invention described with reference to FIG. 84 are given the same reference numbers, and a description thereof will be omitted.

The semiconductor device 210C according to the present embodiment has a frame 213A, which integrates the second heat radiating plate 234 of the semiconductor device 210B described with reference to FIG. 84 and the frame 213 thereof. Hence, a cavity 223A is defined by a bottom portion 237 of the frame 213A.

The semiconductor element 211 is fixed to the bottom portion 237 by an adhesive 236, and the wiring board 212 is arranged to the lower surface of the frame 213A in this figure. Hence, wire bonding between the semiconductor device 211 and the wiring board 212 can be employed.

The semiconductor device 210C can be obtained by a reduced number of components and a reduced number of production steps, as compared to the semiconductor device 210B according to the thirty second embodiment. The cost of fabricating the semiconductor device 210C can be reduced. The sealing resin 215 of the semiconductor device 210C can be provided by the compression-molding method.

A description will now be given of a semiconductor device according to a thirty fourth embodiment of the present invention.

Figure 86:
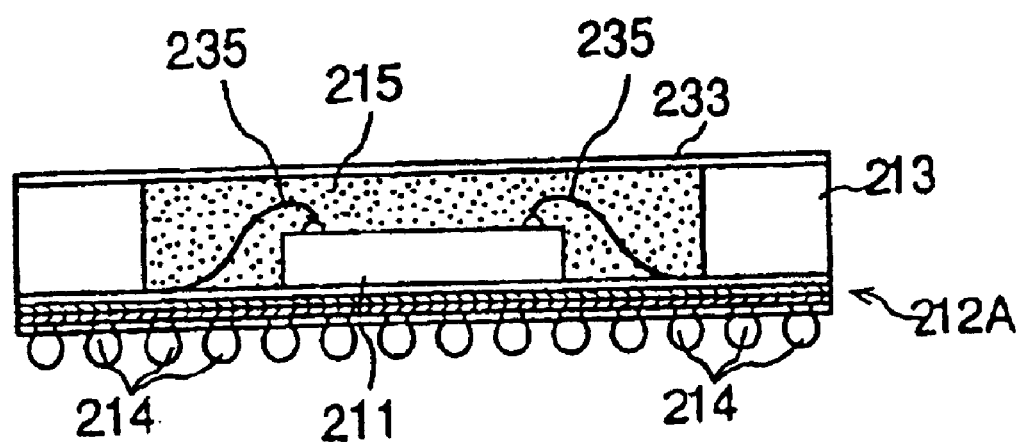
FIG. 86 is a diagram showing a semiconductor device according to a thirty fourth embodiment of the present invention.

FIG. 86 shows a semiconductor device 210D according to the thirty third embodiment of the present invention. In FIG. 86, parts that have the same structures as those of the semiconductor device 210B according to the thirty second embodiment are given the same reference numbers and a description thereof will be omitted.

The semiconductor device 210D is characterized by placing the semiconductor element 211 on a wiring board 212A so that protruding electrodes 214 can be arranged below the semiconductor element 211. The wiring board 212 is different from those of the semiconductor devices 210–210C in that there are no attachment holes 217a.

The above arrangement increases the degree of freedom in arrangement of the protruding electrodes 214 and realizes down-sized semiconductor device 210D. The sealing resin 215 of the semiconductor device 210D can be formed by the compression-molding process.

Figure 87:
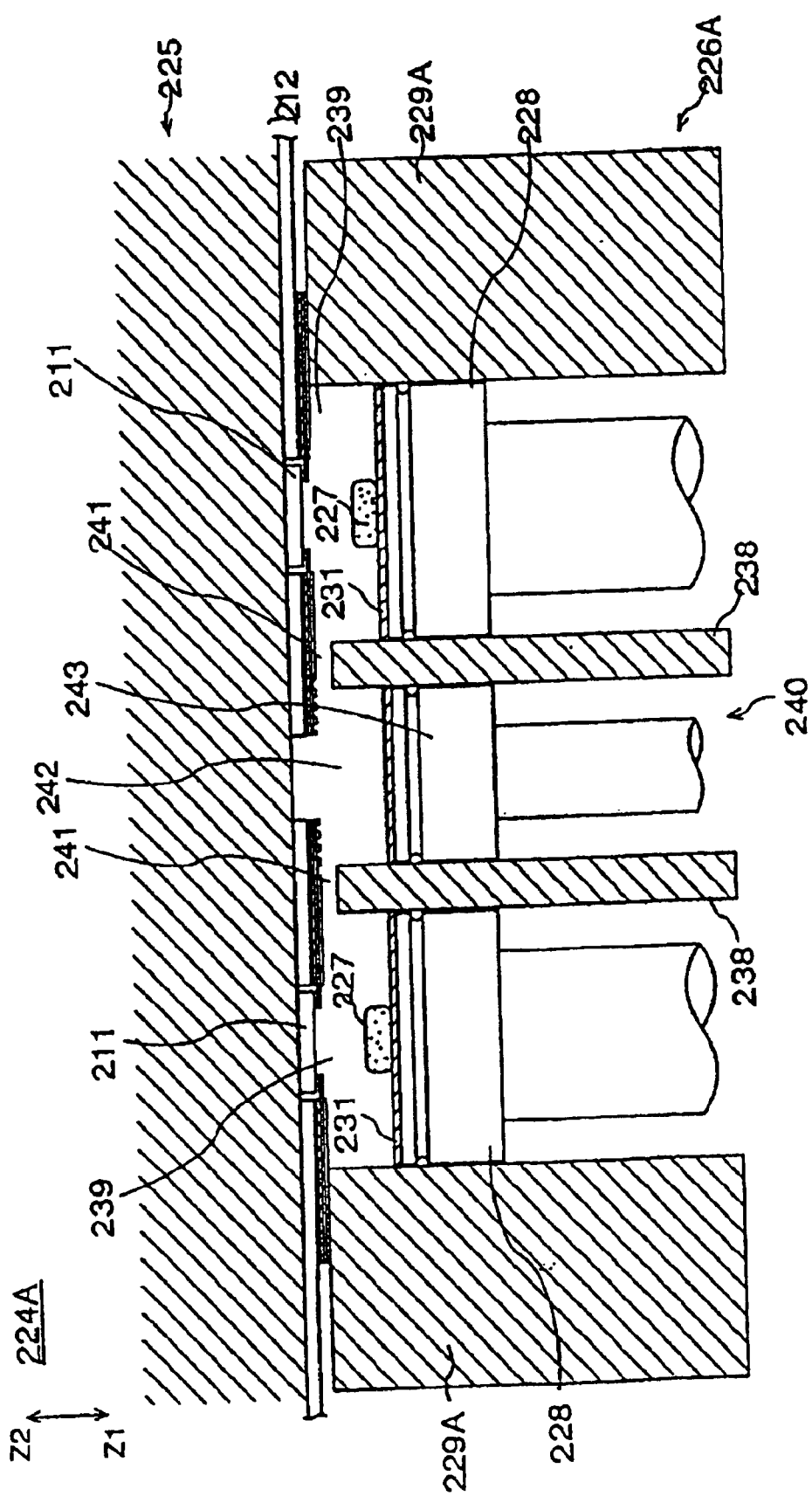
FIG. 87 is a diagram showing an excess resin removing mechanism.

A description will now be given, with reference to FIG. 87, of a resin sealing step. In FIG. 87, parts that have the same structures as those of the mold 224 described with reference to FIG. 79 are given the same reference numbers, and a description thereof will be omitted.

A mold 224A used in the present embodiment is generally made up of the upper mold 225 and a lower mold 226A. The mold 224A has a multi-process arrangement which is capable of totally processing a plurality of (two in the present embodiment) sealing resins 215.

The upper mold 225 is almost the same as that of the mold 224 shown in FIG. 79. However, the mold 224A has a comparatively large size because it has the multi-process arrangement. The lower mold 226A is made up of first and second lower mold half bodies 228 and 229A. Two first lower mold half bodies 228 are arranged in the second lower mold half body 229.

An excess resin removing mechanism 240 for removing excess resin is provided in the central position of the second lower mold half body 229A. The excess resin removing mechanism 240 is generally made up of a pot portion 242 and a pressure control rod 243. Openings 241 are formed above wall portions 238 of the second lower mold half body 229A. The openings 241 are coupled to the pot portion 242.

The pot portion 242 has a cylindrical structure in which the pressure control rod 243 is slidably provided. The pressure control rod 243 is connected to a driving mechanism which is not shown, and can be elevated in the directions Z1 and Z2 indicated by the arrow with respect to the second lower mold half body 229A.

A description will be given of a resin sealing step using the mold 224A equipped with the excess resin removing mechanism 240.

The resin sealing step commences executing the substrate loading step, in which the wiring board 212 is loaded onto the mold 224A. The lower mold 226A is moved down in the direction Z1 with respect to the upper mold 225 and the pressure control rod 243 is located to the upper limit immediately after the resin sealing step is started.

The resin films 231 are respectively placed on the first lower mold half bodies 228, and resins 227 are placed thereon. Subsequently, the wiring board 212 is loaded onto the upper portion of the second lower mold half body 229A, and the upper mold 225 and the lower mold 226A are moved so as to be close to each other. Hence, the wiring board 212 is clamped between the upper mold 225 and the lower mold 226A. FIG. 87 shows the clamped state. At this time, cavity portions 239 (space portions) are defined above the first lower mold half bodies 228 of the mold 224A. The pot portion 242 of the excess resin removing mechanism 240 is coupled to the cavity portions 239 via the openings 241.

After the wiring board 212 is clamped between the upper body 225 and the lower mold 226A, the first lower mold half bodies 228 are driven to move up in the direction Z2. Hence, the resins 227 are compressed and molded in the cavity portions 239. In order to definitely seal the semiconductor elements 211, it is required to set the movement speed of the first lower mold half bodies 228 to an appropriate level. In other words, the appropriate level setting of the movement speed of the first lower mold half bodies 228 leads to the appropriate level setting of the compression pressure applied to the sealing resins 227 in the cavity portions 239.

According to the present embodiment, the compression pressure applied to the sealing resins 227 can be controlled not only by controlling the movement speed of the first lower mold half bodies 228 but also controlling the movement speed of the pressure control rod 243 of the excess resin removing mechanism 240. More particularly, when the pressure control rod 243 is moved down, the pressure applied to the sealing resins 227 is reduced. When the pressure control rod 243 is moved up, the pressure applied to the sealing resins 227 is increased.

For example, if the amounts of the resins 227 are greater than the volumes of the sealing resins 215, and excess resins increase the pressures of the cavity portions 239, the resin layers may not be formed appropriately. In this case, the pressure control rod 243 is moved down in the direction Z1, and excess resins are transferred to the pot portions 242 through the openings 241. Hence, even if there is an excess amount of resin, the pressures in the cavities 239 can be maintained at the appropriate level.

As described above, the excess resin removing mechanism 240 functions to remove excess resin generated in the step of forming the sealing resins 227, so that the resin molding can always be performed at the appropriate pressure level. Hence, the sealing resin 215 can be formed definitely. It is also possible to prevent excess resin from leaking from the mold 224A. It is not required to precisely measure the amounts of resins 227, so that the measurement operation can be performed easily.

After the sealing resins 215 are formed, a separating step is executed in which the wiring board 212 on which the sealing resins 215 is separated from the mold 224A.

As described above, the resin sealing step has the function of regulating the pressures in the cavity portions 239 at the appropriate level. Hence it is possible to prevent air from remaining in the sealing resins 215 and prevent babbles (voids) from being formed therein.

Let us assume a case where babbles occur in the sealing resins 215, if a thermal process is carried out after the resin sealing step, the babbles will expand and a crack may occur in the sealing resins 215. However, the excess resin removing mechanism 240 can prevent babbles from occurring in the sealing resins 215. Hence, there is no possibility that the sealing resins 215 may be damaged during the thermal process. As a result, the reliability of the semiconductor device can be improved.

A description will be given of semiconductor devices and methods for fabricating these devices according to thirty fifth through forty seventh embodiments of the present invention. FIGS. 88 through 102, parts that are the same as those of the semiconductor device 210 according to the thirtieth embodiment described with reference to FIGS. 78 and 79 are given the same reference numbers and a description thereof will be omitted.

Figure 88:
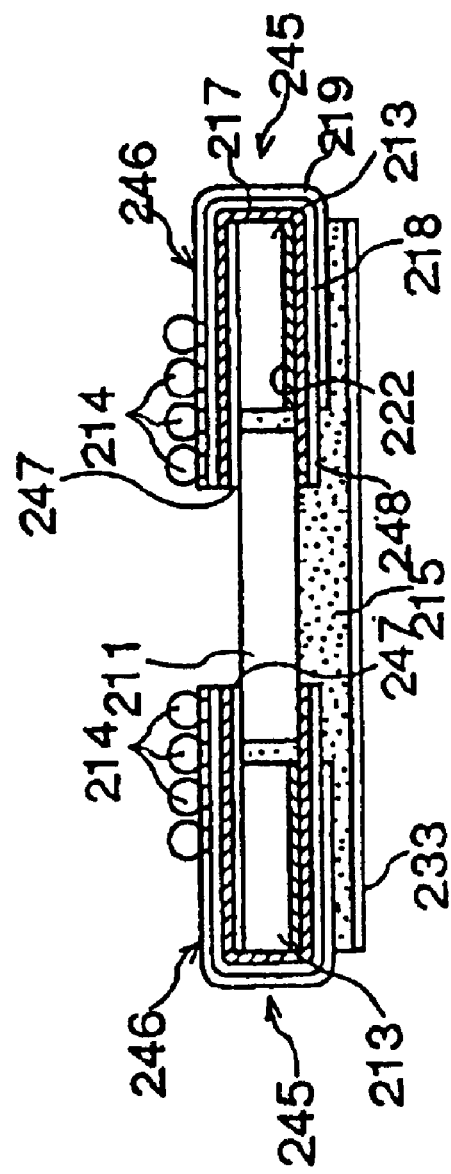
FIG. 88 is a diagram showing a semiconductor device according to a thirty fifth embodiment of the present invention.
Figure 89:
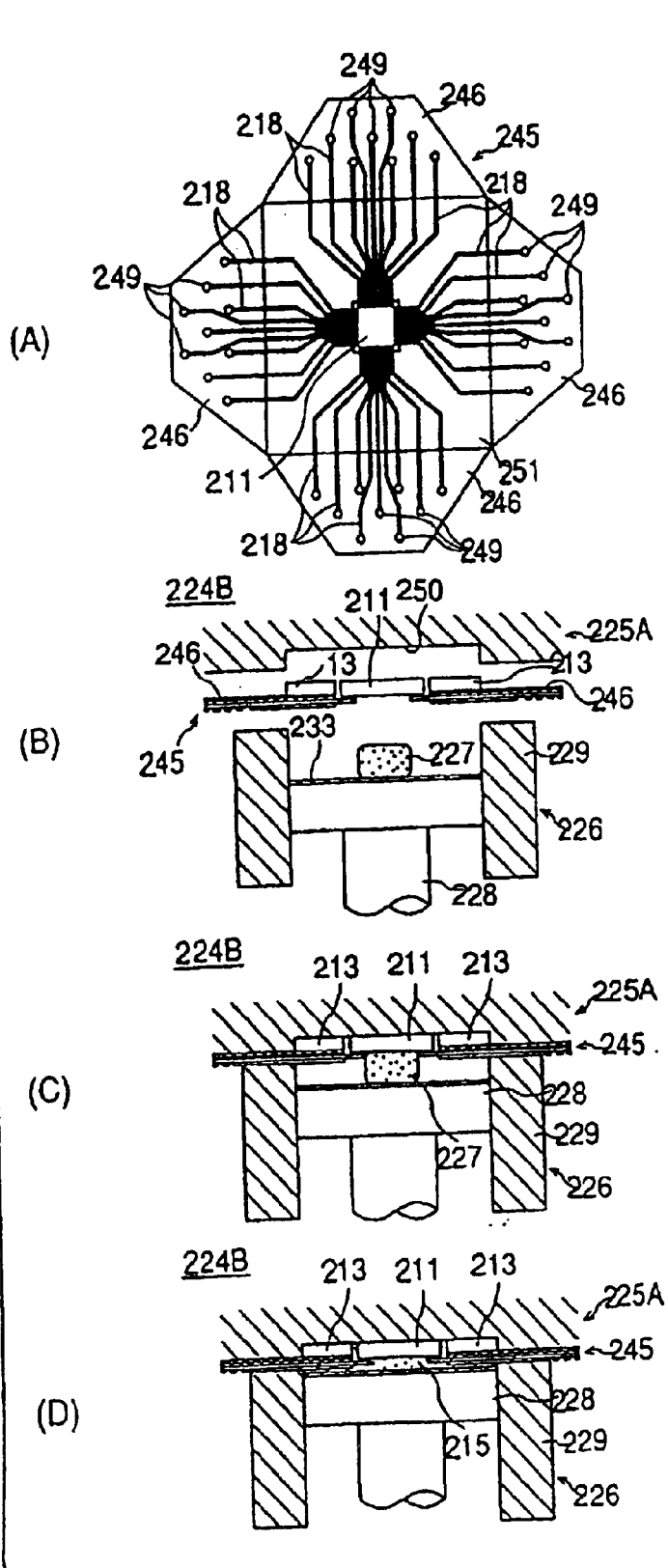
FIG. 89 is a diagram (part 1) showing a method for fabricating the semiconductor device according to the thirty fifth embodiment of the present invention.

FIG. 88 shows a semiconductor device 210E according to the thirty fifth embodiment of the present invention. FIGS. 89 and 90 show a method for fabricating the semiconductor device 210. The semiconductor device 210E according to the thirty fifth embodiment of the present invention is characterized as follows. Extending portions 246 are formed at the sides of the semiconductor element 211 (see FIG. 89(A)). The extending portions 246 are bent along the frame 213 so that the extending portions 246 extend on the upper surface of the frame 213. Projection electrodes 214 are formed on the extending portions 246 located on the upper surface of the frame 213.

A wiring board 245 used in the present embodiment is made up of a base film 217, leads 218 and an insulating film 219 as in the case of the wiring board 212 used in the semiconductor device 210 according to the thirtieth embodiment. The base film 217 of the wiring board 245 is formed of a substance that is more flexibly deformable than the substance of the base film used in the thirtieth embodiment.

The wiring board 245 has a portion that faces the lower surface of the frame 213 is fixed to the frame 213 by an adhesive 222 as in the case of the thirtieth embodiment, and the extending portions 246 are fixed to the upper surface of the frame 213 by a second adhesive 247. Hence, the extending portions 246 are prevented from being flaked off from the frame 213.

According to the semiconductor device 210E thus structured, the protruding electrodes 214 are arranged on the upper side of the frame 213. Further, no other components are arranged on the upper surface of the frame 213. Hence, the protruding electrodes 214 can be arranged with a high degree of freedom. Further, the semiconductor device 210E can be down sized, as compared to the semiconductor device 210 of the thirtieth embodiment in which the protruding electrodes 214 are arranged on the lower surface of the frame 213.

Figure 103:
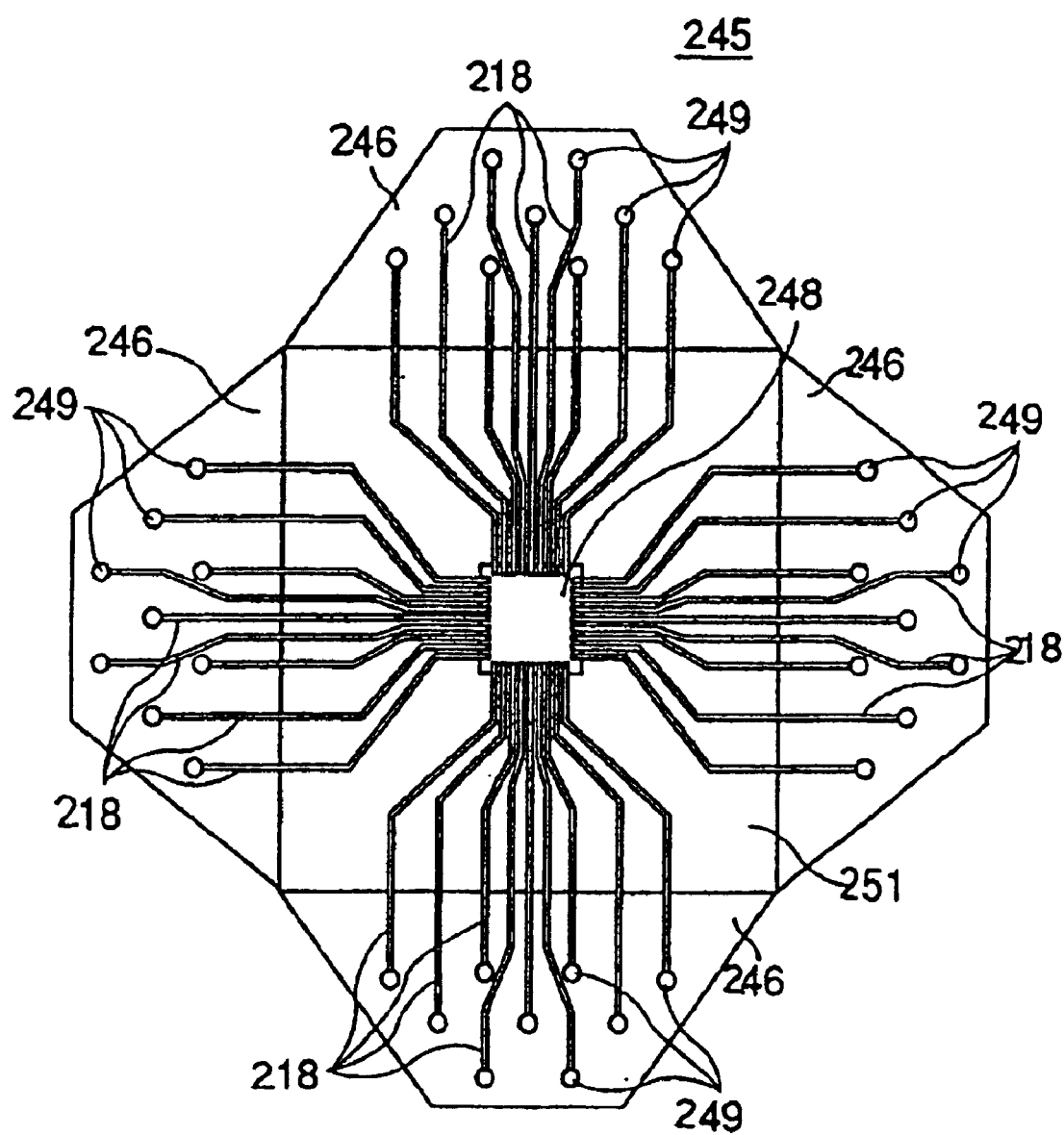
FIG. 103 is a diagram showing another embodiment of a wiring board (part 1).

A description will be given of a method for fabricating the above semiconductor device 210E. First, the wiring board 245 as shown in FIGS. 89(A) and 103 is prepared. The wiring board 245 has a rectangular base portion 251 on which the semiconductor element 211 to be mounted, and the extending portions 246 arranged on the four sides of the base portion 251.

An attachment hole 248 (shown in FIG. 103) for mounting the semiconductor element 211 is formed in the central position of the base portion 251. Leads 218 are provided between edge portions of the attachment hole 248 and lands 249 formed in the extending portions 246 and located in the positions in which the protruding electrodes 214 are to be provided. The extending portions 246 have a trapezoidal shape in order to prevent the adjacent extending portions 246 from contacting each other when the wiring board 245 is bent.

The leads 219 are protected by the insulating film 219 (see FIG. 90(E)). The portions of the insulating film 219, which are located in the positions in which the lands 249, that is, the protruding electrodes 214 are to be provided, are removed so that the leads 218 are exposed. FIG. 103 shows an enlarged view of the wiring board 245 shown in FIG. 89(A).

The semiconductor element 211 is bonded to the upper surface of the wiring board 245 in the flip-chip bonding formation, and the frame 213 is bonded thereto by the adhesive 222. The frame 213 used in the present embodiment has a size smaller than that of the frame used in the thirtieth embodiment because the extending portions 246 are provided in the outer periphery of the frame 213. FIG. 89(A) shows the wiring board 245 in which the semiconductor device 211A has been mounted.

As shown in FIGS. 89(A) and 89(B), the wiring board 245, to which the semiconductor device 211 and the frame 213 are attached, is loaded onto the mold 224. The mold 224B used in the present embodiment has an upper mold 225A which has a cavity 250 in which the semiconductor element 211 and the frame 213 are accommodated.

After the wiring board 245 is loaded onto the mold 224B, as shown in FIG. 89(C), a first lower mold half body 228 having an upper portion on which a sealing resin 227 is provided through a heat radiating plate 233 is moved up, so that the sealing resin 227 is compressed and molded. Thus, as shown in FIG. 89(D), the semiconductor element 211 and a given area on the lower surface of the wiring board 245 are sealed by the sealing resin 215. Simultaneously, the heat radiating plate 233 is bonded to the sealing resin 215.

After the sealing resin 215 partially is formed on the wiring board 245, the wiring board 245 is separated from the mold 224B. FIG. 90(E) shows the wiring board 245 which has been separated from the mold 224B. As shown in this figure, the wiring board 224 has the extending portions 246 laterally extending from the sides of the base portion 251. The base portion 251 is flush with the extending portions 246 in the state observed immediately after the separating step is completed. In the present embodiment, an adhesive 247 is provided on the upper surfaces of the extending portions 246.

After providing the adhesive 247, a step of bending the extending portions 246 is carried out. In the bending step, as shown in FIG. 90(F), the extending portions 246 are bent in the directions indicated by the arrows, and the bent extending portions 246 are bonded to the upper surface of the frame 213 by a second adhesive 247.

FIG. 90(G) shows the wiring board 245 observed after the bending step is completed. By the step of bending the extending portions 246 so as to be located on the upper surface of the frame 213, the lands 249 on which the protruding electrodes 214 are to be provided are located on the upper portion of the frame 213.

Then, a protruding electrode forming step is executed so that the protruding electrodes 214 are formed on the lands 249 on the upper portion of the frame 213 by, for example, the transfer method. Hence, the semiconductor device 210E is obtained. The method of fabricating the semiconductor device 210E forms the sealing resin 215 by using the compression molding as in the case of the fabrication method of the thirtieth embodiment, and improves the reliability of the device 210B. The process for providing the extending portions 246 on the upper surface of the frame 213 can easily be obtained by merely bending the extending portions 246.

Figure 91:
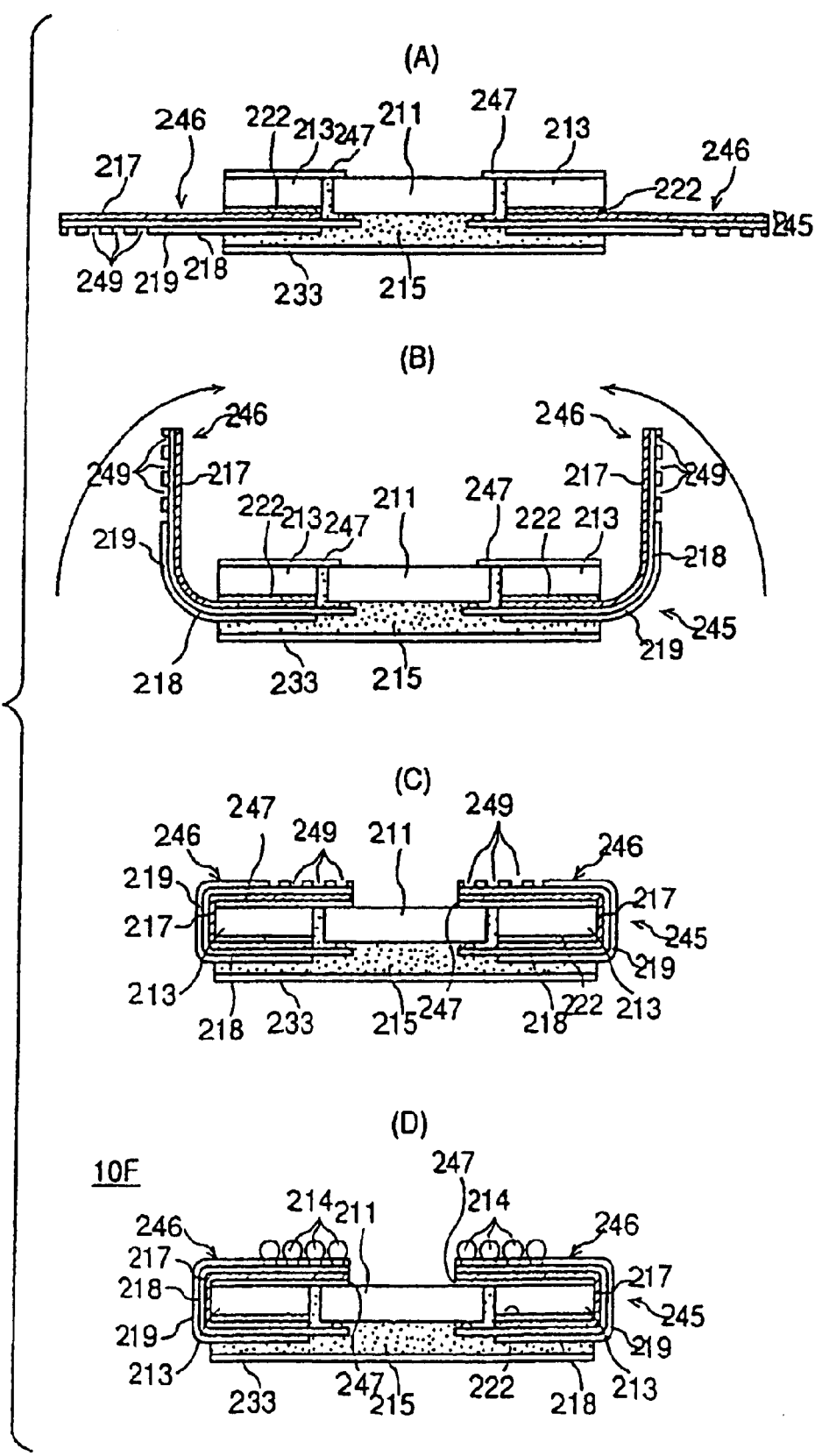
FIG. 91 is a diagram showing a semiconductor device and its fabrication method according to a thirty sixth embodiment of the present invention.

A description will be given of a semiconductor device and its fabrication method according to the thirty sixth embodiment of the present invention. FIG. 91 shows a semiconductor device 210F and its fabrication method according to the thirty sixth embodiment of the present invention. In FIG. 91, parts that have the same structures as those shown in FIGS. 88 through 90 are given the same reference numbers and a description thereof will be omitted.

FIG. 91(D) shows the semiconductor device 210F according to the thirty sixth embodiment of the present invention. The semiconductor device 210F has the same structure as the semiconductor device 210E according to the thirty fifth embodiment. The fabrication method according to the thirty sixth embodiment differs from that according to the thirty fifth embodiment in that the second adhesive 247 is provided to the frame 213 rather than the wiring board 245, as shown in FIGS. 91(A) and 91(B). That is, the second adhesive 247 can be provided to either the wiring board 245 or the frame 213.

Figure 92:
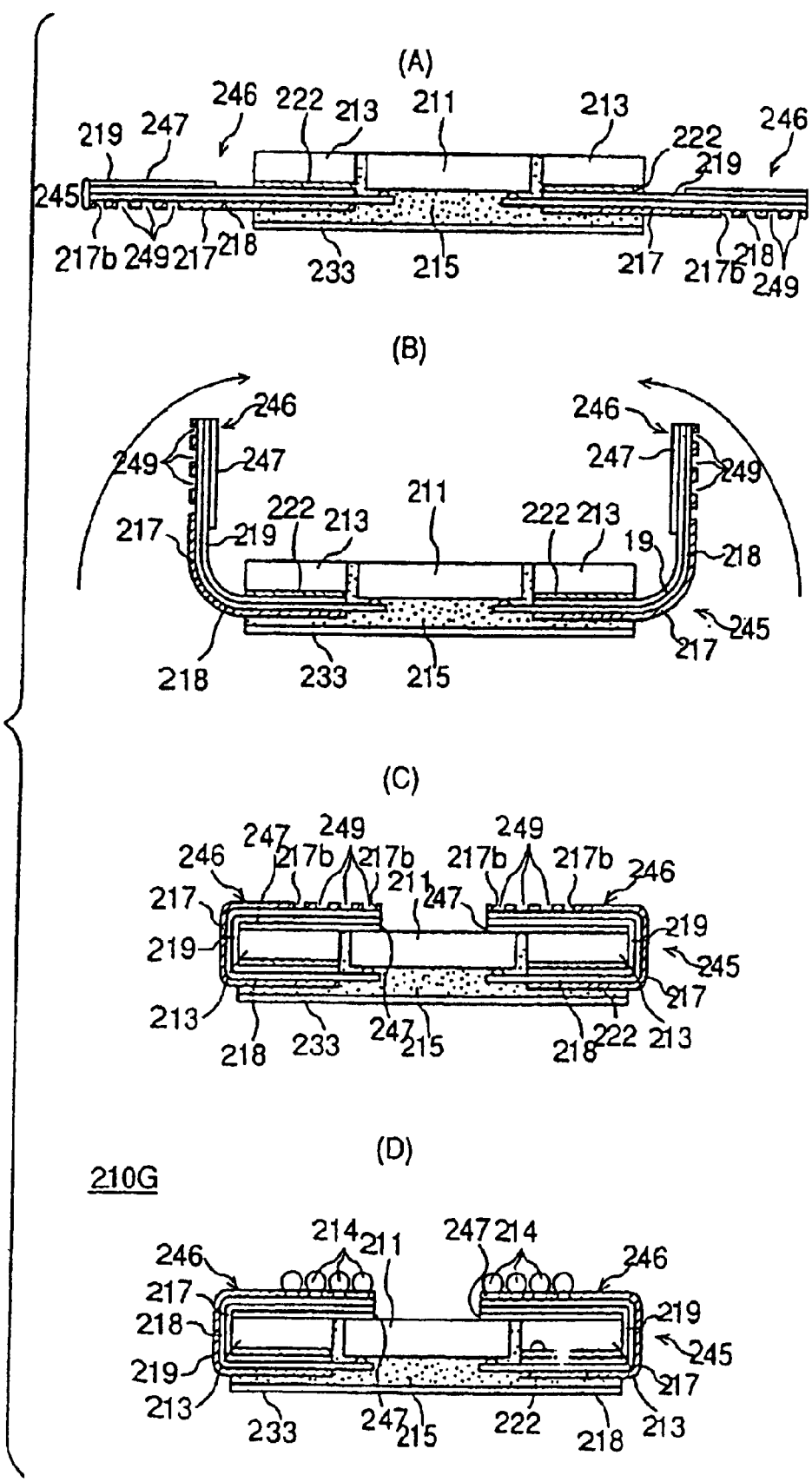
FIG. 92 is a diagram showing a semiconductor device and its fabrication method according to a thirty seventh embodiment of the present invention.

A description will be given of a semiconductor device and its fabrication method according to the thirty seventh embodiment of the present invention. FIG. 92 shows a semiconductor device 210G and its fabrication method according to the thirty seventh embodiment. In FIG. 92, parts that have the same structures as those shown in FIGS. 88 through 90 are given the same reference numbers, and a description thereof will be omitted.

FIG. 92(D) shows the semiconductor device 210E according to the thirty seventh embodiment of the present invention. The semiconductor device 210G differs from the semiconductor devices 210E and 210F in that the siring board 245 is turned upside down.

More particularly, as shown in FIG. 92(A), the wiring board 245 has the base film 217, leads 218 and the insulating film 219 stacked in that order. Hence, the base film 217 has connection holes 217b for connecting the protruding electrodes 214 to the leads 218 when the extending portions 246 are bent and located on the upper portion of the frame 213.

Even when the wiring board 245 of the semiconductor device 210E or 210F is turned upside down and arranged as shown in FIG. 92(A), the semiconductor device 210G has the same effects as those of the semiconductor devices 210E and 210F. The present embodiment does not necessarily require the insulating film 219. In this case, the frame 213 and the adhesives 222 and 247 are formed of substances having electrically insulating performance. Hence, the production cost will be reduced.

Figure 93:
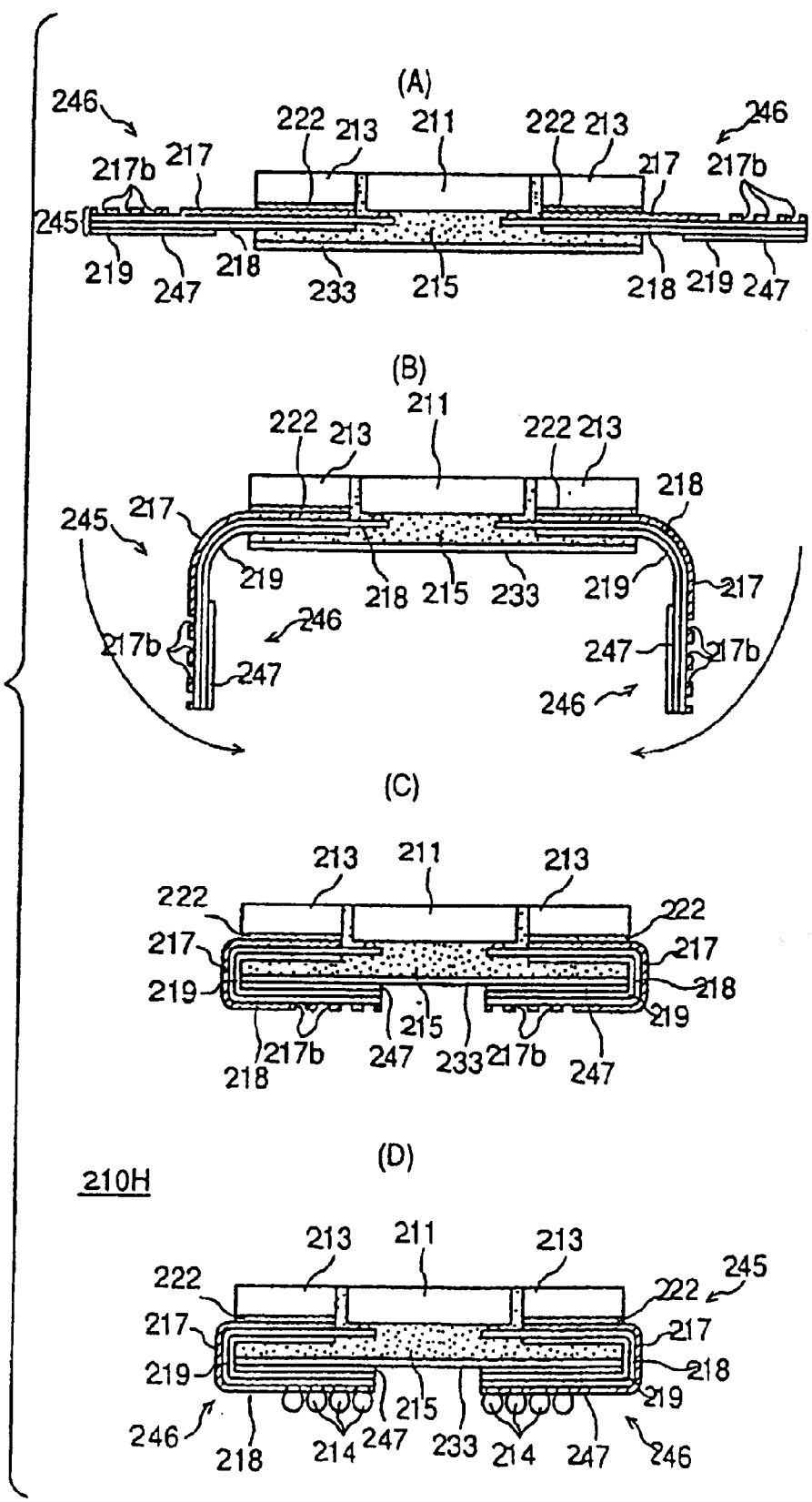
FIG. 93 is a diagram showing a semiconductor device and its fabrication method according to a thirty eighth embodiment of the present invention.

A description will be given of a semiconductor device and its production method according to the thirty eighth embodiment of the present invention. FIG. 93 shows a semiconductor device 210H and its fabrication method according to the thirty eighth embodiment of the present invention. In FIG. 93, parts that have the same structures as those shown in FIGS. 88 through 90 are given the same reference numbers, and a description thereof will be omitted.

FIG. 93(D) shows the semiconductor device 210H according to the thirty eighth embodiment of the present invention. The semiconductor device 210H is characterized by bending the extending portions 246 towards the heat radiating plate 233 rather than the upper surface of the frame 213 employed in the semiconductor devices 210E, 210F and 210G. As shown in FIG. 93(A), the wiring board 245 used in the present embodiment has the base film 217, leads 218 and the insulating film stacked in that order from the top thereof. Thus, by bending the extending portions 246 towards the heat radiating plate 233, the base film 217 is exposed below the semiconductor device 210H and the insulating film 219 faces the heat radiating plate 233. Hence, the base film 217 has the connection holes 217b for connecting the protruding electrodes 214 and the leads 218. The adhesive 247 is provided to the insulating 219.

As indicated by the arrows in FIG. 93(B), the wiring boards 245 to which the connection holes 217b and the second adhesive 247 are provided are bent towards the heat radiating plate 233. Hence, the extending portions 246 are fixed to the heat radiating plate 233 by the second adhesive 247, and the connection holes 217b are opened downwards. Then, the protruding electrodes 214 electrically connected to the leads 218 are formed in the connection holes 217b by the transfer method or the like. Hence, the semiconductor device 210H shown in FIG. 93(D) can be obtained.

The semiconductor device 210H thus obtained has the extending portions 246 located below the heat radiating plate 233, so that the semiconductor element 211 is exposed to the outside. Hence, heat generated in the semiconductor element 211 can efficiently be radiated, and the semiconductor device 210H has improved heat radiating performance.

The extending portions 246 of the semiconductor device 210H are bent and the protruding electrodes 214 are provided thereon. Hence, the semiconductor device 210H can be down sized.

Figure 94:
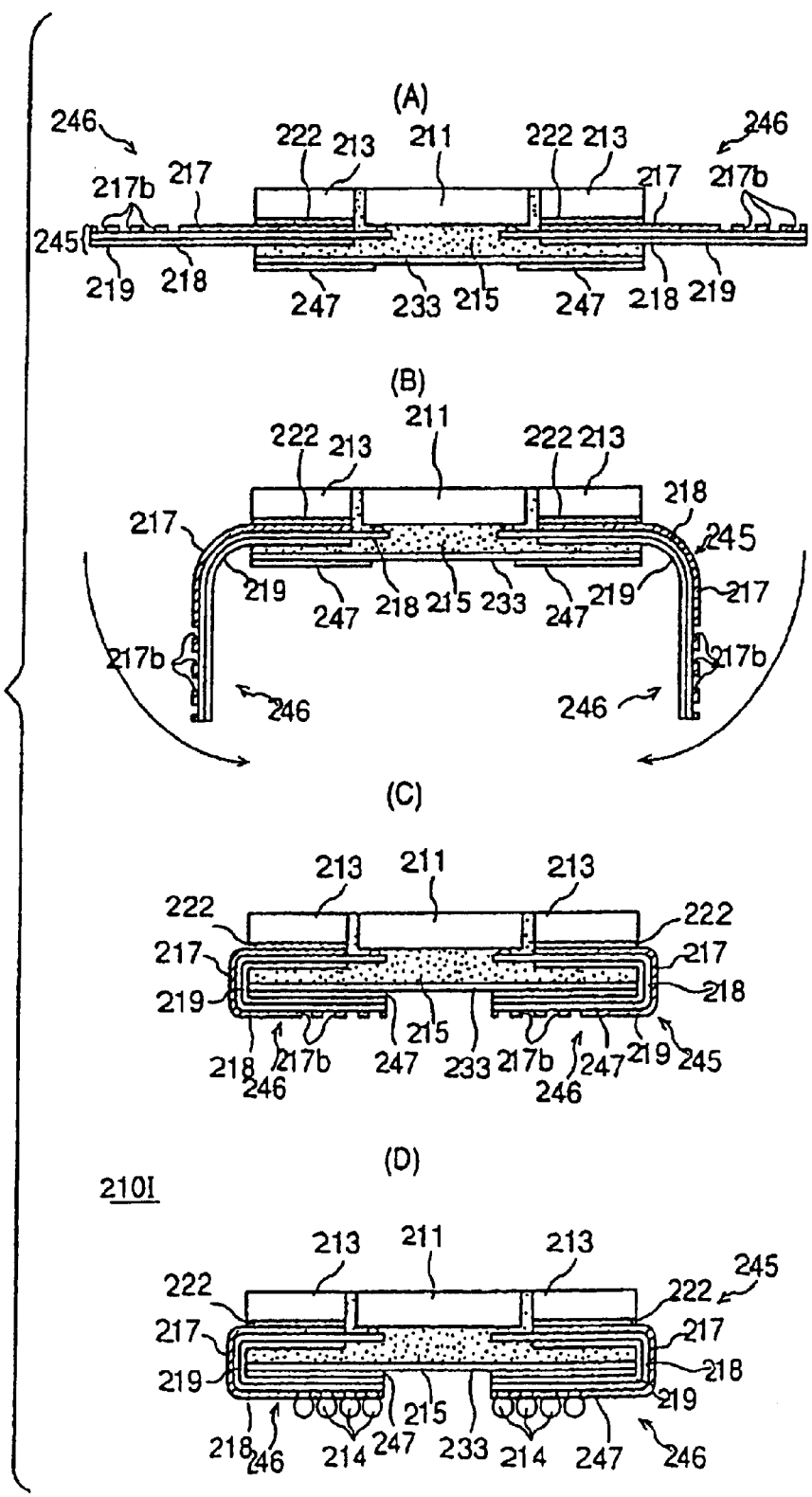
FIG. 94 is a diagram showing a semiconductor device and its fabrication method according to a thirty ninth embodiment of the present invention.

A description will be given of a semiconductor device and its fabrication method according to the thirty ninth embodiment of the present invention. In FIG. 94, parts that have the same structures as those shown in FIGS. 88 through 90 are given the same reference numbers, and a description thereof will be omitted.

FIG. 94(D) shows a semiconductor device 210I according to the thirty ninth embodiment of the present invention. The semiconductor device 210I has the same structure as the semiconductor device 210H according to the thirty eighth embodiment of the present invention. The method for fabricating the semiconductor device 210I differs from that for fabricating the semiconductor device 210H in that the second adhesive 247 is provided to the heat radiating plate 233 rather than the wiring board 245, as shown in FIGS. 94(A) and 94(B). That is, the second adhesive 247 may be provided to the wiring board 245 or the heat radiating plate 233.

Figure 95:
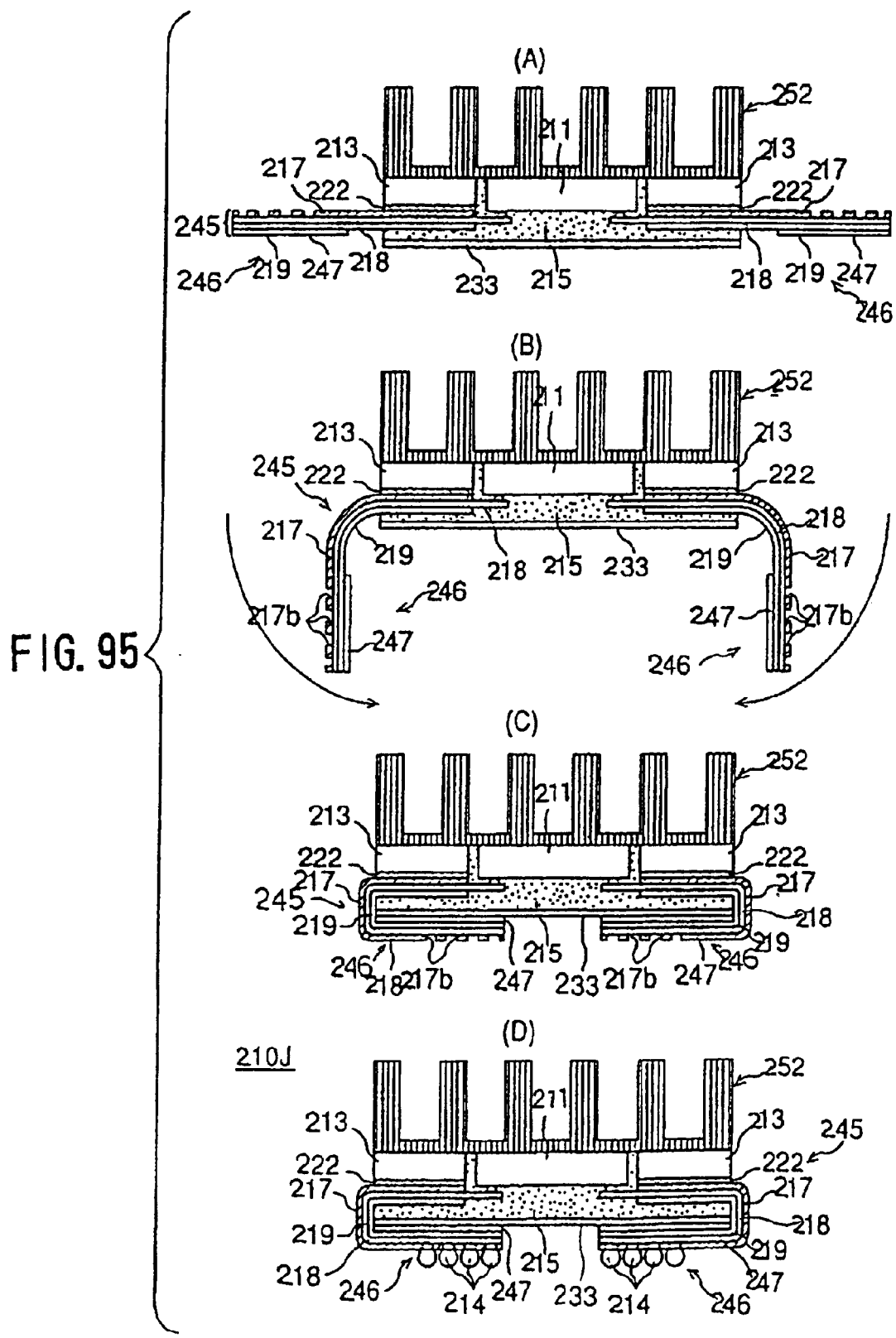
FIG. 95 is a diagram showing a semiconductor device and its fabrication method according to a fortieth embodiment of the present invention.

A description will be given a semiconductor device and its fabrication method according to the fortieth embodiment of the present invention. FIG. 95 shows a semiconductor device 210J and its fabrication method according to the fortieth embodiment of the present invention. In FIG. 95, parts that have the same structures as those shown in FIGS. 88 through 90 and FIG. 94 are given the same reference numbers, and a description thereof will be omitted.

FIG. 95(D) shows the semiconductor device 210J according to the fortieth embodiment of the present invention, which is characterized by arranging a heat radiating film 252 to the semiconductor device 210I described with reference to FIG. 94. The heat radiating film 252 is fixed to the semiconductor element 211 and the upper surface of the frame 213 by, for example, an adhesive.

As described above, the semiconductor device 210J has the same wiring board substrate as the semiconductor device 210I, and thus the extending portions 246 are bent towards the heat radiating plate 233 arranged below the semiconductor element 211. Hence, the upper surface of the semiconductor element 211 is exposed.

By arranging the heat radiating film 252 to the exposed portion of the semiconductor element 211, heat generated in the semiconductor element 211 can efficiently be radiated, as compared to the arrangement shown in FIG. 94 in which the upper surface of the semiconductor element 211 is exposed.

Since the upper surface of the semiconductor element 211 is covered by the heat radiating fin 252, the fin 252 also functions as a protection member which protects the semiconductor element 211. Hence, the heat radiating fin 252 improves the reliability of the semiconductor device 210J.

Figure 96:
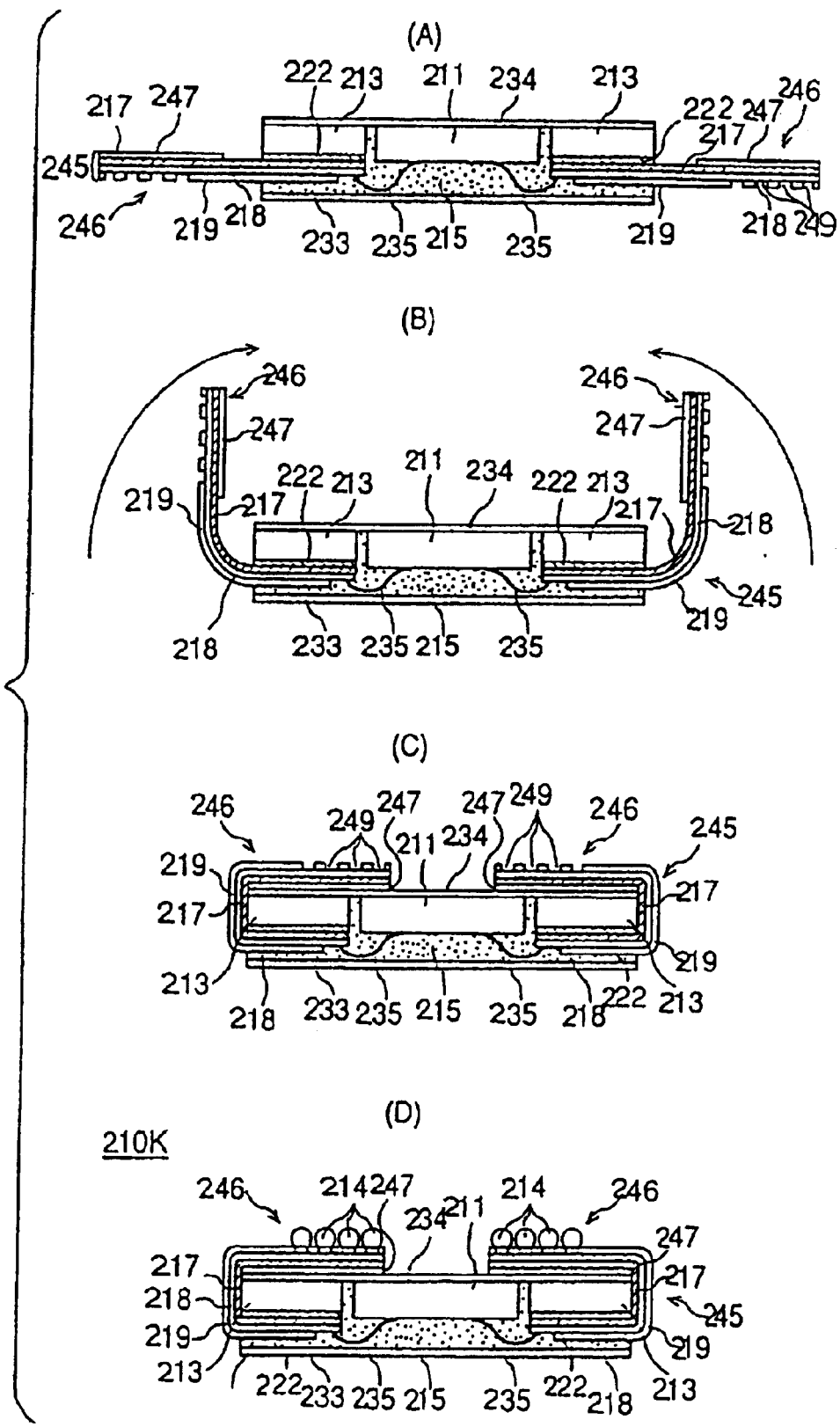
FIG. 96 is a diagram showing a semiconductor device and its fabrication method according to a forty first embodiment of the present invention.

A description will be given of a semiconductor device and its fabrication method according to a forty first embodiment of the present invention. FIG. 96 shows a semiconductor device 210K and its fabrication method according to the forty first embodiment of the present invention. In FIG. 96, parts that have the same structures as those shown in FIGS. 84, and 88 through 90 are given the same reference numbers, and a description thereof will be omitted.

FIG. 96(D) shows the semiconductor device 210K according to the forty first embodiment of the present invention. The semiconductor device 210K has a structure similar to that of the semiconductor device according to the thirty second embodiment described with reference to FIG. 84 and is, more particularly, characterized by providing a second heat radiating plate 234 to the upper surface of the frame 213. The second heat radiating plate 234 is formed of a metal having a good heat radiating performance such as aluminum as in the case of the first heat radiating plate 233.

The heat radiating plates 233 and 234 are provided so as to sandwich the semiconductor element 211, so that heat generated in the semiconductor element 211 can efficiently be radiated. Thus, the semiconductor device 210K has improved reliability.

The semiconductor device 210K can be fabricated as follows. The semiconductor device 210K employs wires 235 as means for connecting the semiconductor element 211 and the wiring board 245. Hence, the second heat radiating plate 234 is bonded to the upper surface of the frame 213 by, for example, an adhesive so that these components are unified. Hence, a bottom portion defined by the second heat radiating plate 234 is defined in the cavity 223 formed in the frame 213.

Then, the semiconductor element 211 is bonded to the second heat radiating plate 234 in the cavity 223 by an adhesive 236. Further, the wiring board 245 is bonded to the lower surface of the frame 213. Then, the wires 235 are bonded between the leads 218 of the wiring board 245 and the semiconductor element 211 by the wire bonding process.

After the wire bonding process is completed, the sealing resin 215 is formed by the compression molding method as in the case of the aforementioned embodiments. Since the heat radiating plate 234 is provided on the semiconductor element 211 and the upper portion of the frame 213, the sealing resin 215 does not directly contact the upper mold 225, and the detachability can be improved. FIG. 96(A) shows the wiring board 245 to which the heat radiating plate 234, wires 235 and the sealing resin 215 are arranged. The present embodiment employs the heat radiating plate 234, which may be replaced by a plate member having a comparatively low heat radiating performance.

As shown in FIGS. 96(B) and 96(C), the extending portions 246 provided to the wiring board 245 are bent towards the heat radiating plate 234, and are fixed thereto by a second adhesive 247. Then, the protruding electrodes 214 are provided to land portions 249 exposed in the extending portions 246 by the transfer method. Hence, the semiconductor device 210K shown in FIG. 96(D) is obtained.

Figure 97:
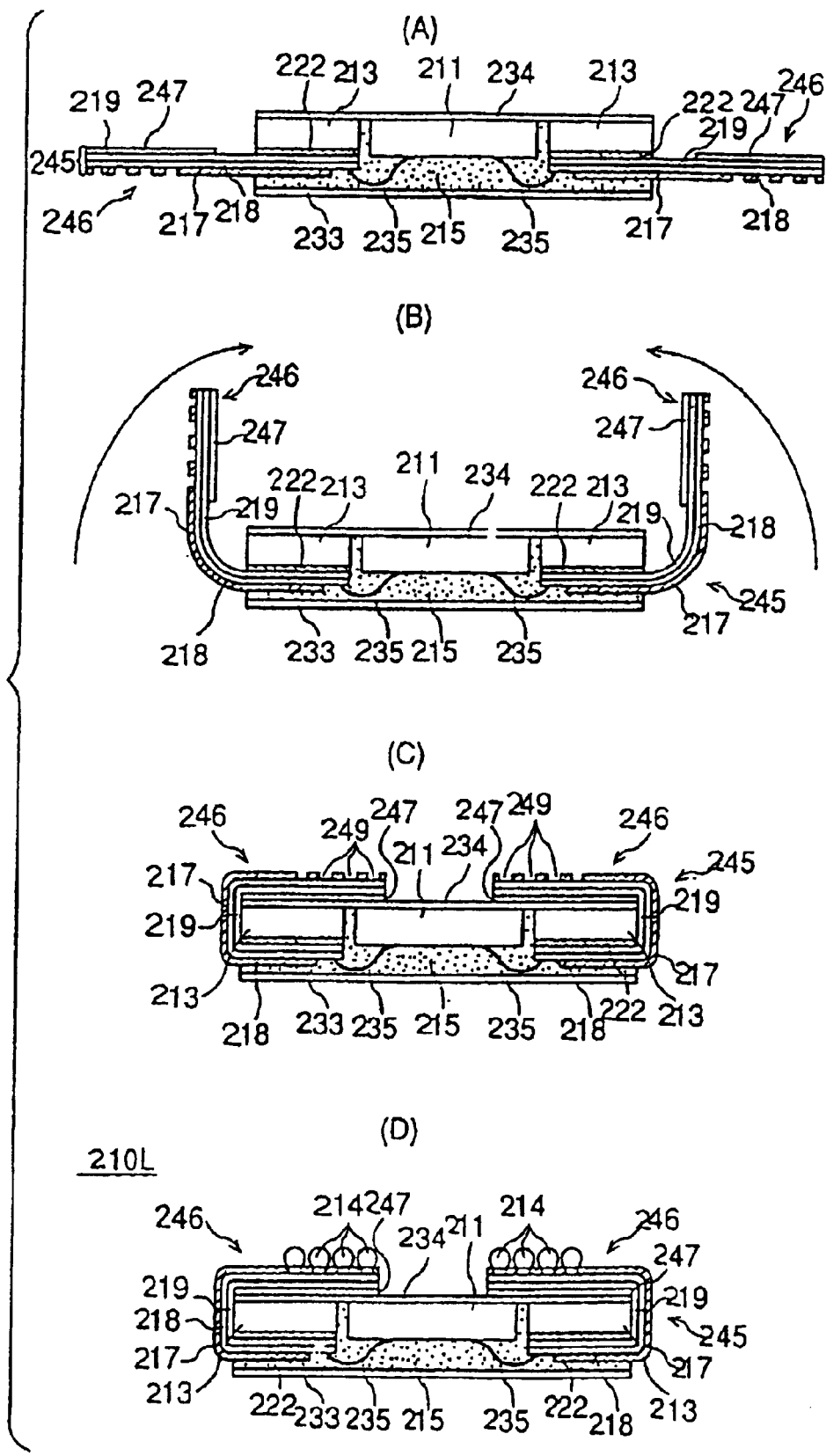
FIG. 97 is a diagram showing a semiconductor device and its fabrication method according to a forty second embodiment of the present invention.
Figure 98:
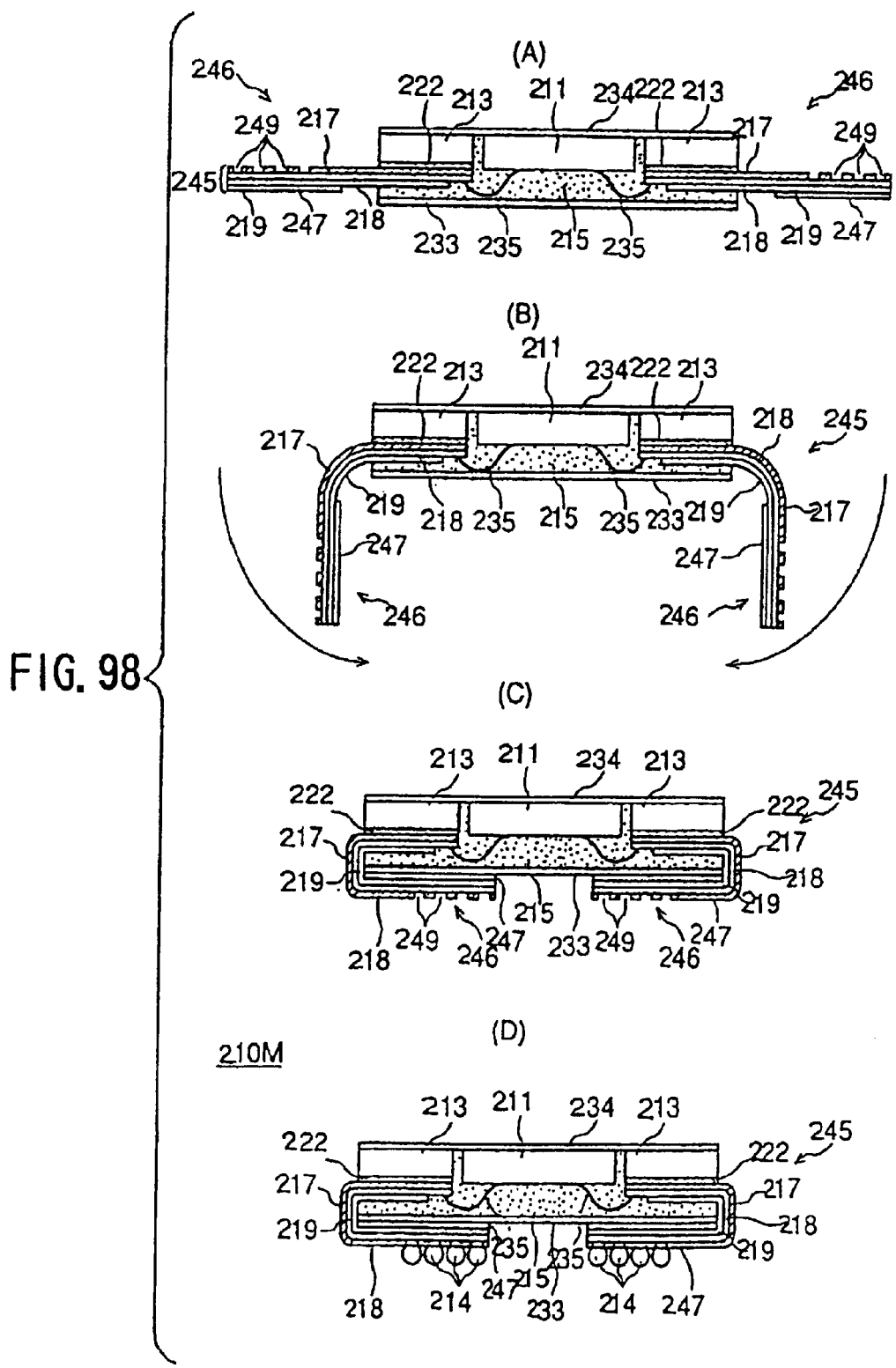
FIG. 98 is a diagram showing a semiconductor device and its fabrication method according to a forty third embodiment of the present invention.

A description will be given of semiconductor devices and fabrication methods thereof according to forty second and forty third embodiments of the present invention. FIG. 97 is a diagram showing a semiconductor device 210L and its fabrication method according to the forty second embodiment of the present invention. FIG. 98 is a diagram showing a semiconductor device 210M and it fabrication method according to the forty third embodiment of the present invention. In FIGS. 97 and 98, parts that have the same structures as those shown in FIGS. 88 through 90 and 96 are given the same reference numbers, and a description thereof will be omitted.

FIG. 97(D) shows the semiconductor device 210L according to the forty second embodiment of the present invention. The semiconductor device 210L has an arrangement in which the second heat radiating plate 234 is provided to the upper surface of the frame 213, as in the case of the semiconductor device 210K according to the forty first embodiment. The semiconductor device 210L has the wiring board 245 arranged by turning the wiring board 245 of the semiconductor device 210K upside down.

That is, as shown in FIG. 97(A), the wiring board 245 has the base film 217, the leads 218 and the insulating film 219 stacked in that order from the lowermost layer side. Even by turning the wiring board 245 upside down, the same effects as those of the semiconductor device 210K can be obtained.

The extending portions 246 of the semiconductor device 210L are bent towards the second heat radiating plate 234. The present embodiment does not necessarily require the insulating film 219, which can be omitted when the frame 213 and the adhesives 222 and 247 are formed of substances having electrically insulating performance.

FIG. 98(D) shows the semiconductor device 210M according to the fourth third embodiment of the present invention. The semiconductor device 210M has an arrangement in which the second heat radiating plate 234 is provided on the upper surface of the frame 213 as in the case of the semiconductor device 210K. However, the semiconductor device 210M is characterized in that the extending portions 246 are bent towards the heat radiating plate 233 in contrary to the semiconductor devices 210K and 210L. The method of bending the extending portions 246 and bonding them is the same as that for the semiconductor device 210H according to the thirty eighth embodiment described with reference to FIG. 93, and therefore a description thereof will be omitted.

According to the semiconductor device 210M, the extending portions 246 are located below the heat radiating plate 233, which is thus exposed to the outside. Hence, heat generated in the semiconductor element 211 can efficiently be radiated through the second heat radiating plate 234, and the heat radiating performance of the semiconductor device 210M can be improved. Further, the extending portions 246 are bent, on which the protruding electrodes 214 are formed. Hence, the semiconductor device 210M can be down sized.

Figure 99:
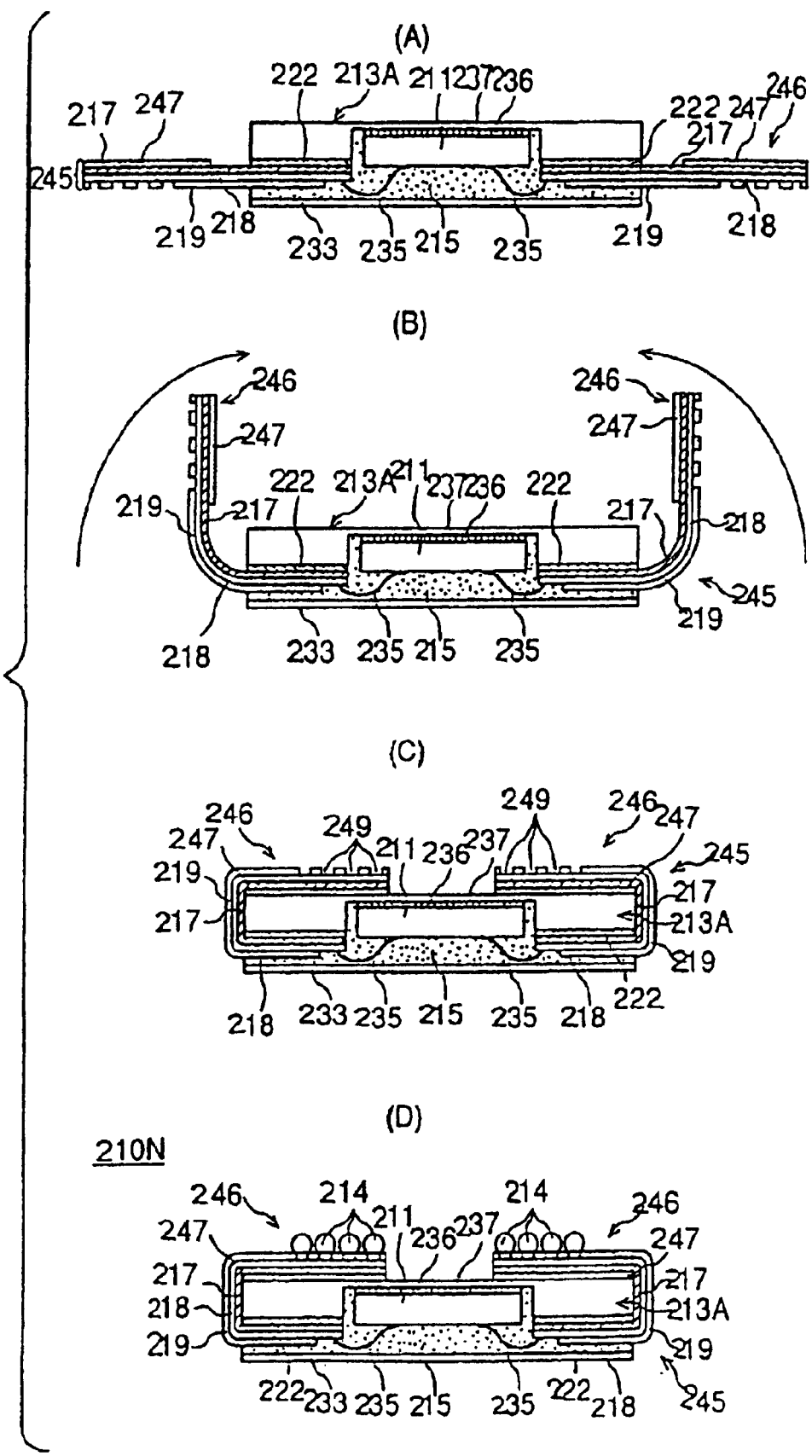
FIG. 99 is a diagram showing a semiconductor device and its fabrication method according to a forty fourth embodiment of the present invention.

A description will now be given of a semiconductor device and its fabrication method according to a forty fourth embodiment of the present invention. FIG. 99 is a diagram showing a semiconductor device 210N and its fabrication method according to the forty fourth embodiment of the present invention. In FIG. 99, parts that have the same structures as those shown in FIG. 37 and 88 through 90 are given the same reference numbers, and a description thereof will be omitted.

FIG. 99(D) shows the semiconductor device 210N according to the forty fourth embodiment of the present invention. A frame 213A used in the semiconductor device 210N has an integrated arrangement of the second heat radiating plate 234 and the frame 213 of the semiconductor device 210K described with reference to FIG. 96. A cavity 223A formed in the frame 213A includes a bottom portion 237.

The semiconductor element 211 is fixed to the bottom portion 237 by the adhesive 236, and the wiring board 245 is provided on the lower surface of the frame 213A. Hence, wire bonding between the semiconductor element 211 and the wiring board 245 can be made. The semiconductor device 210N has a reduced number of components and a reduced number of fabrication steps, as compared to the semiconductor device 210K according to the forty first embodiment. Hence, the cost of fabricating the semiconductor device 210N can be reduced.

The method for fabricating the semiconductor device 210N will be described below. The semiconductor device 210N employs the wires 235 as means for electrically connecting the semiconductor element 211 and the wiring board 245. Hence, semiconductor element 211 is bonded to the bottom portion 235 formed by the frame 213A by the adhesive 236, and the wiring board 245 is bonded to the lower surface of the frame 213A. Then, the wires 235 are provided between the leads 218 of the wiring board 245 and the semiconductor element 211 by the wire bonding process.

After the wire bonding process, the sealing resin 215 is formed by the compression molding method as the case of the aforementioned embodiments. The frame 213A is flush due to the bottom portion 237, and thus the sealing resin 215 does not directly contact the upper mold 225. Thus, the detachability can be improved. FIG. 99(A) shows the wiring board 245 to which the heat radiating plate 234, the wires 235 and the sealing resin 215 are arranged.

Then, as shown in FIGS. 96(B) and 96(C), the extending portions 246 of the wiring board 245 are bent towards the upper surface of the frame 213A, and are fixed to the heat radiating plate 234 by the adhesive 247. Then, the protruding electrodes 214 are provided on lands 249 exposed on the extending portions 246 by the transfer method. Thus, the semiconductor device 210N shown in FIG. 99(D) can be obtained.

Figure 100:
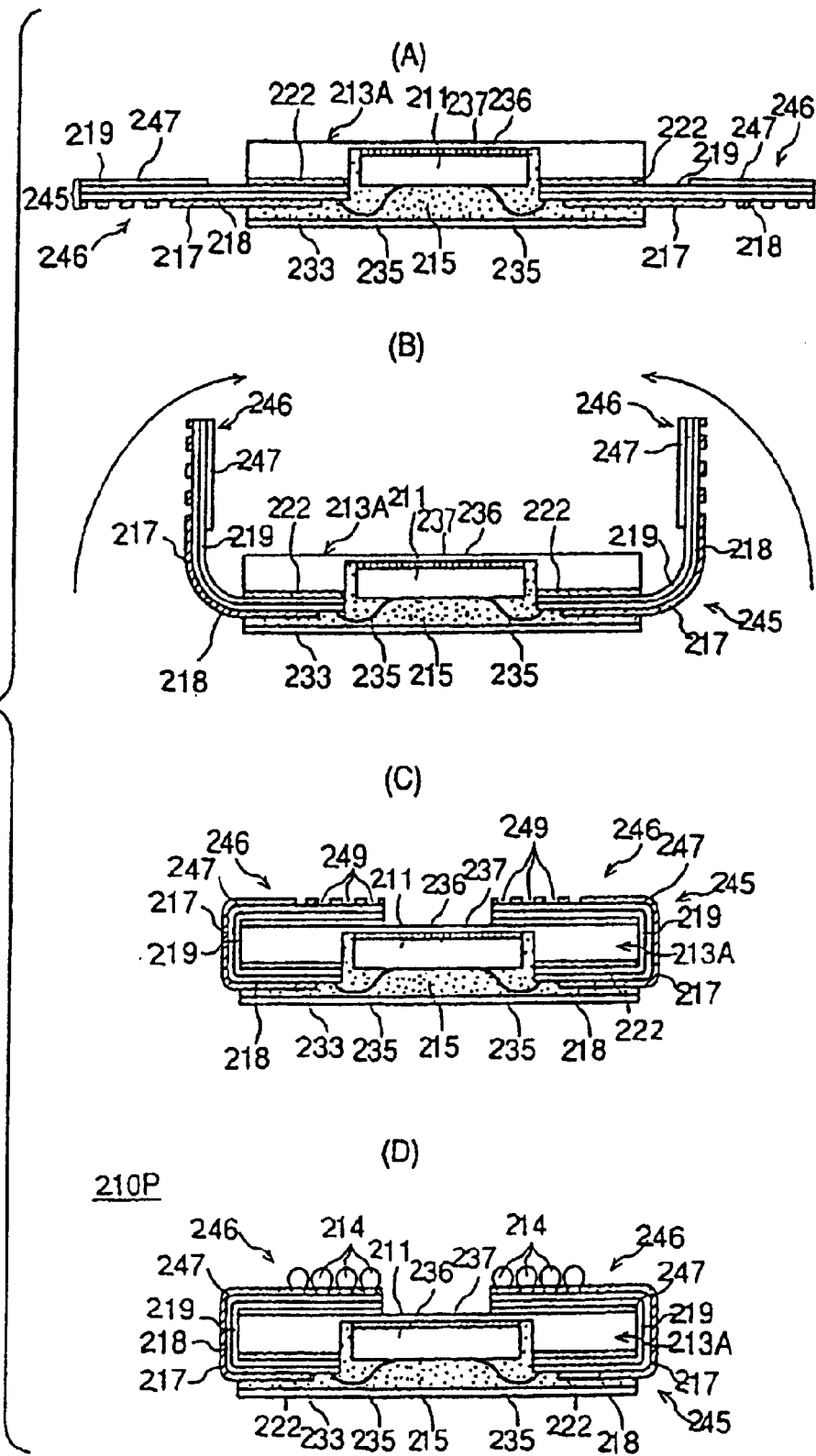
FIG. 100 is a diagram showing a semiconductor device and its fabrication method according to a forty fifth embodiment of the present invention.
Figure 101:
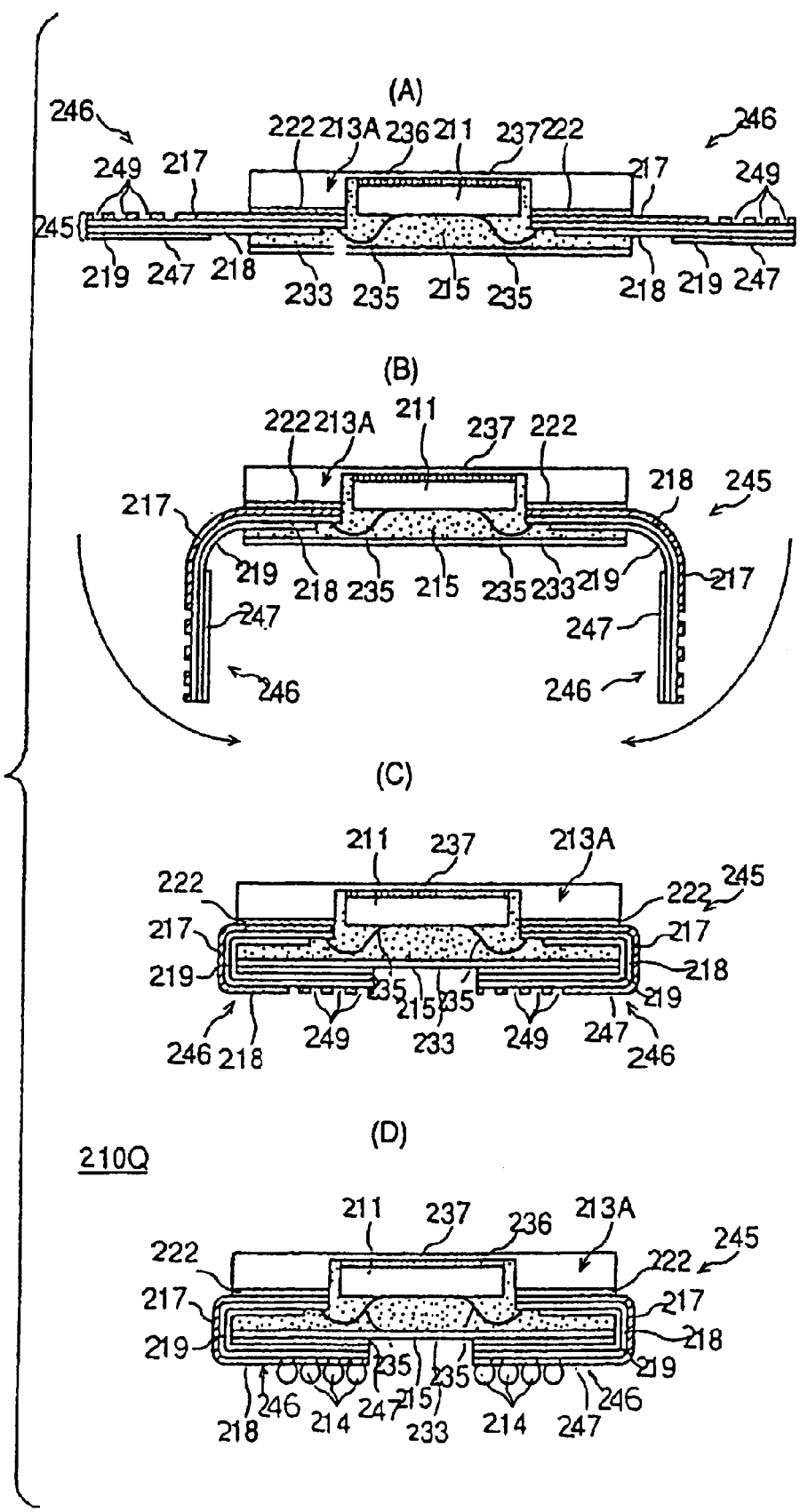
FIG. 101 is a diagram showing a semiconductor device and its fabrication method according to a forty sixth embodiment of the present invention.

A description will now be given of semiconductor devices and fabrication methods thereof according to forty fifth and forty sixth embodiments of the present invention. FIG. 100 is a diagram showing a semiconductor device 210P and its fabrication method according to the forty fifth embodiment of the present invention. FIG. 101 is a diagram showing a semiconductor device 210Q and its fabrication method according to the forty sixth embodiment of the present invention. In FIGS. 100 and 101, parts that have the same structures as those shown in FIGS. 88 through 90 and 99 are given the same reference numbers, and a description thereof will be omitted.

FIG. 100(D) shows the semiconductor device 210P according to the forty fifth embodiment of the present invention. The semiconductor device 210P has an arrangement in which the bottom portion 237 is integrally formed in the frame 213A as in the case of the semiconductor device 210N according to the forty fourth embodiment. The semiconductor device 210P has the wiring board 245 obtained by turning the wiring board 245 of the semiconductor device 210N upside down.

That is, as shown in FIG. 100(A), the wiring board 245 has the base film 217, the leads 218 and the insulating film 219 stacked in that order from the lowermost layer side. The semiconductor device 210P has the same effects as those of the semiconductor device 210N even by turning the wiring board 245 upside down. The extending portions 246 are bent towards the upper side of the frame 213A. The present embodiment does not necessarily require the insulating layer 219, which can be omitted by forming the frame 213A and the adhesives 222 and 247 of electrically insulating substances.

FIG. 101(D) shows the semiconductor device 210Q according to the forty sixth embodiment of the present invention. The semiconductor device 210A has an arrangement in which the bottom portion 237 is integrally formed in the frame 213A as in the case of the semiconductor device 44 according to the forty fourth embodiment. The semiconductor device 210Q is characterized by bending the extending portions 246 towards the heat radiating plate 233 rather than the upper surface of the frame 213A of the semiconductor devices 210N and 210P. The method for bending the extending portions 246 and attaching them to the heat radiating plate 233 is the same as that for the semiconductor device 210H according to the thirty eighth embodiment described with reference to FIG. 93.

According to the semiconductor device 210Q, the extending portions 246 are located below the heat radiating plate 233 and the protruding electrodes 214 are provided on the above extending portions 246. Hence, the semiconductor device 210Q can be down sized. There are no components provided on the upper portion of the frame 213A. Hence, when the frame 213A is formed of a substance having a good heat radiating performance, heat generated in the semiconductor element 211 can efficiently be radiated through the second heat radiating plate 234, so that the semiconductor device 210Q has improved heat radiating performance.

Figure 102:
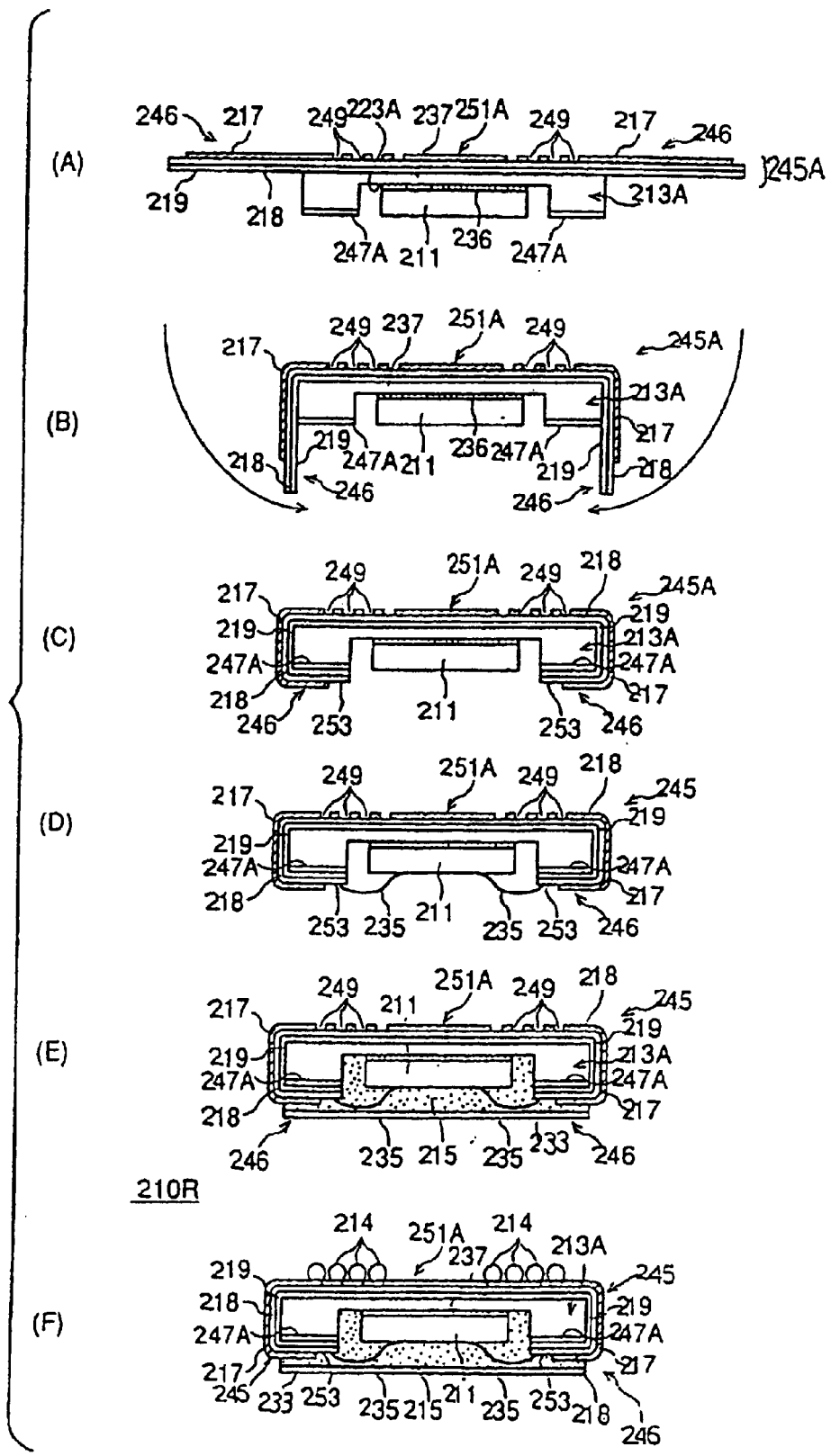
FIG. 102 is a diagram showing a semiconductor device and its fabrication method according to a forty seventh embodiment of the present invention.

A description will be given of a semiconductor device and its fabrication method according to the forty seventh embodiment of the present invention. FIG. 102 is a diagram showing a semiconductor device 210R and its fabrication method according to the forty seventh embodiment of the present invention. In FIG. 102, parts that have the same structures as those shown in FIGS. 68 through 90 and 99 are given the same reference numbers, and a description thereof will be omitted.

FIG. 47(F) shows the semiconductor device 210R according to the forty seventh embodiment of the present invention. The frame 213A of the semiconductor device 210R has the same structure as that of the semiconductor device 210N described with reference to FIG. 99. That is, the frame 213A has the integrally formed bottom portion 237.

Figure 106:
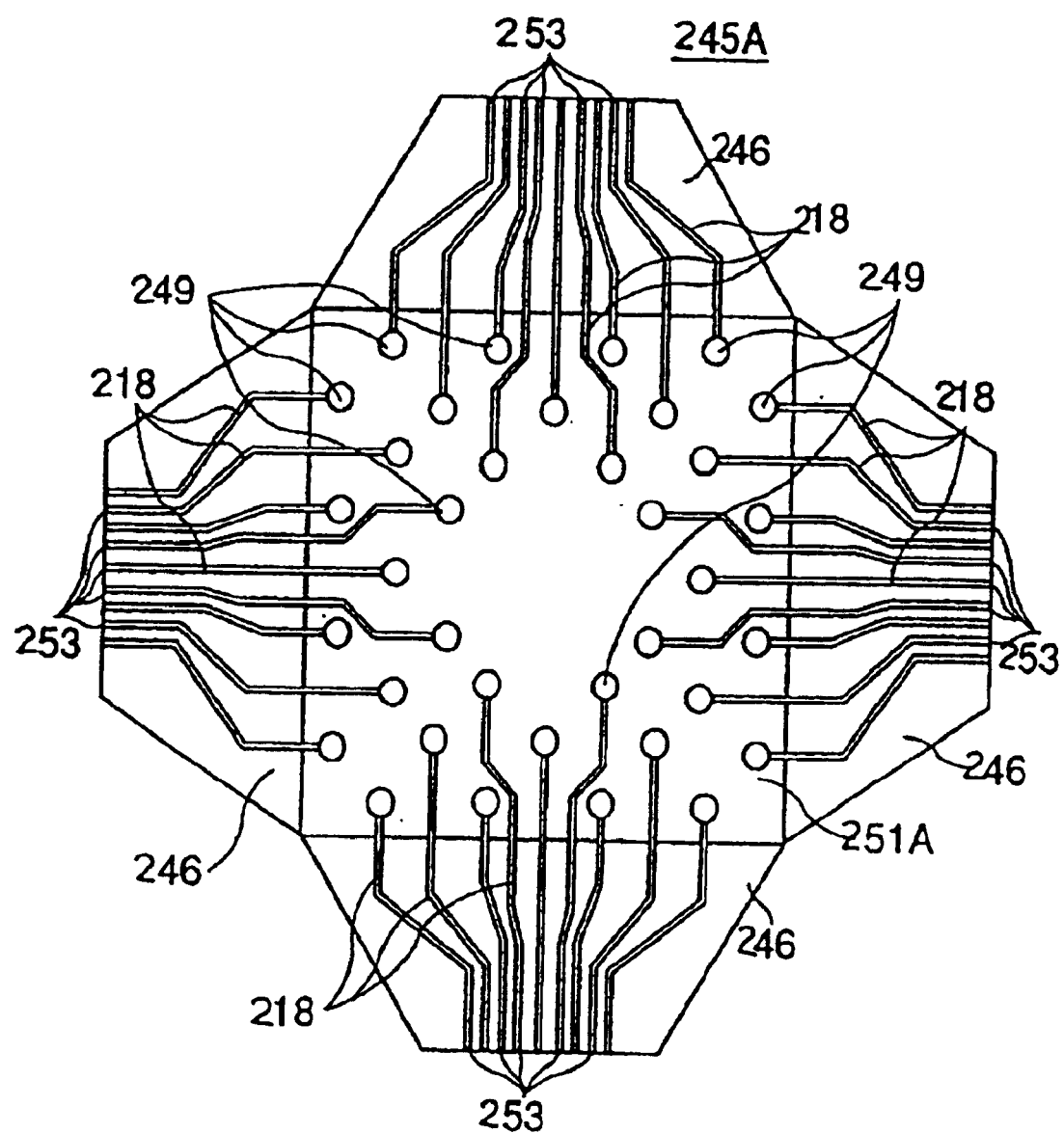
FIG. 106 is a diagram showing a still further embodiment of a wiring board (part 4).

A wiring board 245A used in the present embodiment is different from the wiring board 245 shown in FIGS. 89(A) and 103 in that the wiring board 245A does not have the attachment hole 248 for attaching the semiconductor element 211. An enlarged view of the wiring board 245A employed in the semiconductor device 210R is shown in FIG. 106.

As shown in this figure, lands 249 are provided on a base portion 251A of the wiring board 245A. Connection electrodes 253, which are to be wire-bonded to the semiconductor element 211 are provided in outer edge portions of the extending portions extending to four peripheral edges of the base portion 251A. The connection electrodes 253 and the lands 249 are electrically connected by the leads 218 formed on the extending portions 246 and the base portion 251.

As shown in FIG. 102(A), the base portion 251A is positioned on the bottom portion 237 of the frame 213A, and the wiring board 245A is positioned on the bottom portion 237 by an adhesive (not shown). In this state, the extending portions 246 extend further out than the external periphery of the frame 213A. The semiconductor element 211 is mounted in the cavity 223A formed in the frame 213A. An adhesive 247A for fixing the extending portions 246 to the frame 213A is provided to the lower surface of the frame 213A.

After the base portion 251A of the wiring board 245A is fixed to the bottom portion 237 of the frame 213A, a step of bending the extending portions 246 is carried out without execution of the resin sealing step employed in the aforementioned embodiments. More particularly, as indicated by the arrows in FIG. 102(B), the extending portions 246 are bent and are then fixed to the frame 213A by the adhesive 247A.

Thus, as shown in FIG. 102(C), the connection electrodes 253 formed on the extending portions 246 become close to the semiconductor element 211. Then, the wires 235 are provided between the connection electrodes 253 and the semiconductor element 211 by the wire bonding process. FIG. 102(D) shows a state in which the wires 235 are provided between the connection electrodes 253 and the semiconductor element 211.

According to the present embodiment, a resin sealing step of forming the sealing resin 215 is carried out after the step of bending the extending portions 246 and the wire bonding step of bonding the wires 235. FIG. 102(E) shows the wiring board 245A to which the sealing resin 215 is provided. The resin sealing step can be carried out by using the aforementioned mold 224, so that the sealing resin 215 is formed by the compression molding process. In the present embodiment, the heat radiating plate 233 is provided at the same time as the sealing resin 215 is formed (see FIG. 82).

After the sealing resin 215 is formed, the protruding electrodes 214 are formed on the lands 249 by, for example, the transfer method. Thus, the semiconductor device 210R shown in FIG. 102(F) can be obtained. In the semiconductor device 210R thus fabricated, the protruding electrodes 214 are positioned at the side of the bottom portion 237 of the frame 213A, and the cavity 223A is not formed in these positions. Hence, the whole area of the bottom portion 237 can be used to arrange the protruding electrodes 214. Hence, the protruding electrodes 214 may be arranged at a wide pitch or an increased number of protruding electrodes 214 may be arranged.

A description will now be given, with reference to FIGS. 104 through 110, of other embodiments of the wiring boards 245 used in the semiconductor devices 210E through 210R. In FIGS. 104 through 110, parts that have the same structures as those of the wiring board 245 described with reference to FIG. 103 are given the same reference numbers, and a description thereof will be omitted.

Figure 104:
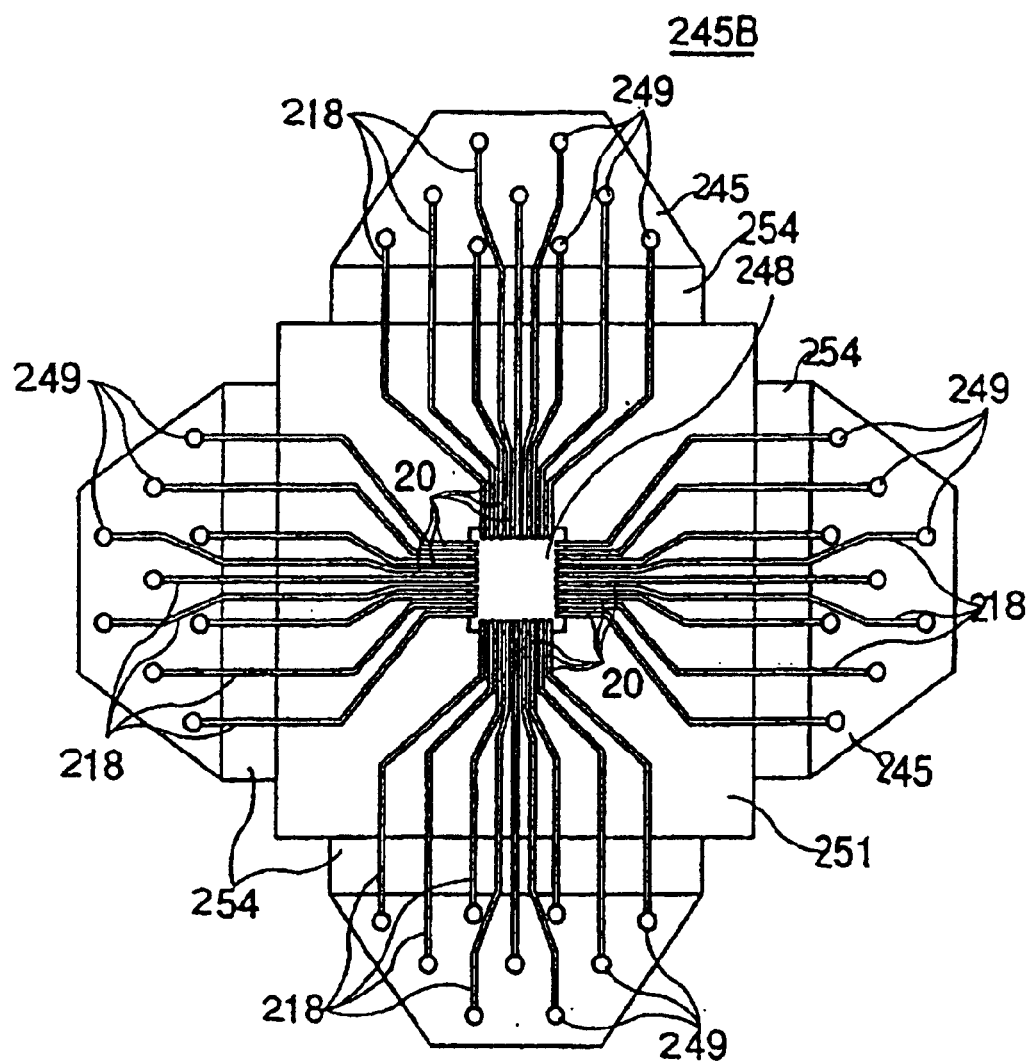
FIG. 104 is a diagram showing yet another embodiment of a wiring board (part 2).

A wiring board 245B shown in FIG. 104 is of a type in which the semiconductor chip 211 is flip-chip bonded (hereinafter referred to as TAB type). Hence, the inner lead portions 220 protrude within the attachment hole 248.

The wiring board 245B is characterized in that the portions of the base film 217 on the portions that are bent in the bending step are removed. By removing the base film 217, the leads 218 are exposed and the mechanical strength thereof is degraded. Hence, solder resists 254 which are liable to be bent are provided to the portions in which the base film 217 is removed.

Hence, the wiring board 245B thus structured can be prevented from expanding at the bent portions, so that the contactability between the wiring board 245B and the frames 213, 213A and the heat radiating plates 233 and 234 can be improved. Hence, it is possible to prevent the wiring board 245B from flaking off from the frames 213, 213A and the heat radiating plates 233 and 234 and to thus improve the reliability of the semiconductor devices 210E through 210R. Further, improvement in the contactability with the frames 231, 213A and the heat radiating plates 233 and 234 leads to down sizing of the semiconductor devices 210E through 210R.

Figure 105:
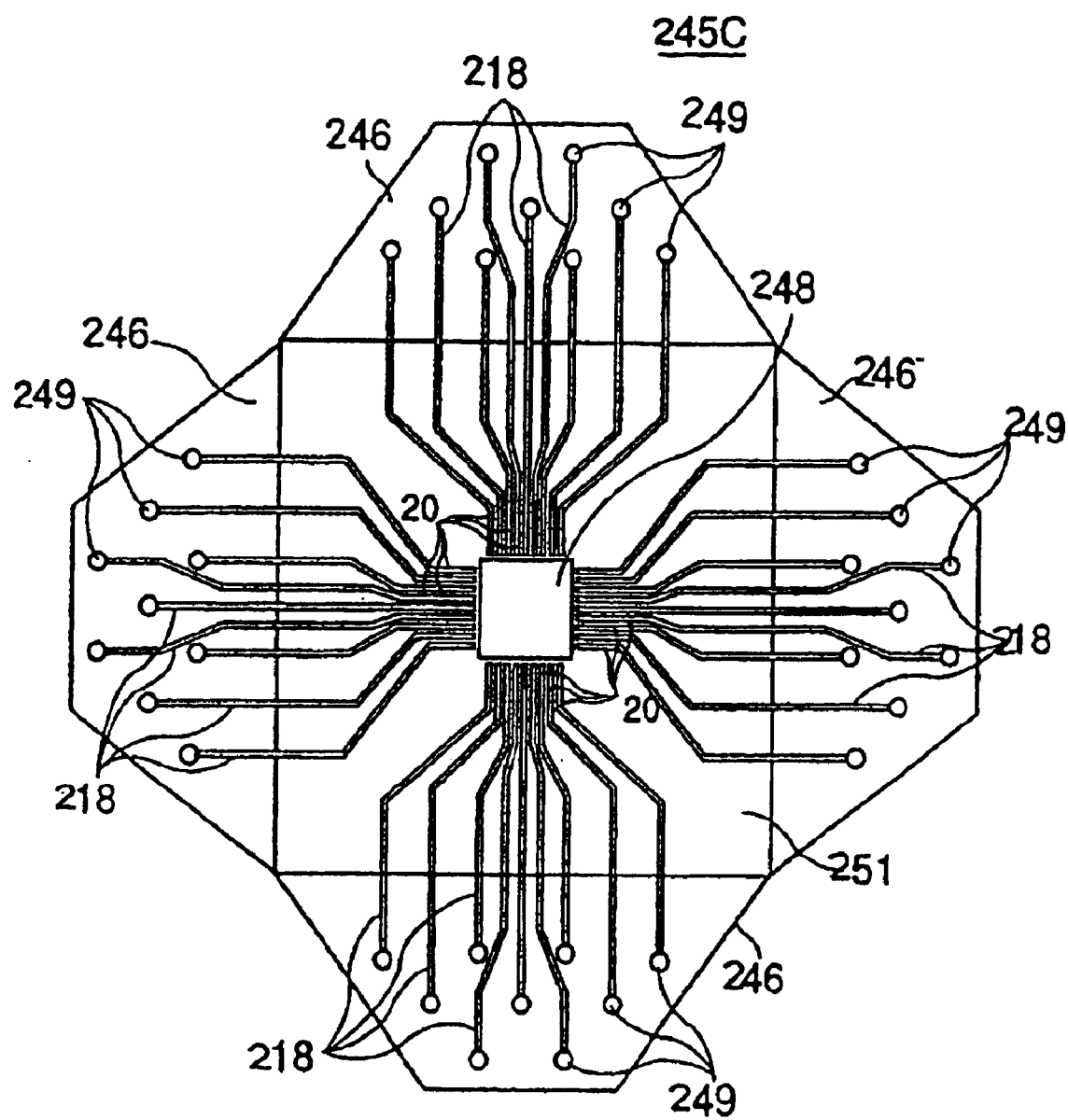
FIG. 105 is a diagram showing a further embodiment of a wiring board (part 3).

A wiring board 245C shown in FIG. 105 is of a type in which the semiconductor element 211 are bonded to the leads by the wiring bonding method (hereinafter referred to as a wire connection type). Hence, the wiring board 245C differs from the wiring boards 245 and 245A of the TAB type shown in FIGS. 103 and 104 in that the inner lead portions 220 do not protrude within the loading hole 248. The wiring board 245A shown in FIG. 106 has been described previously, and a description thereof will be omitted here.

Figure 107:
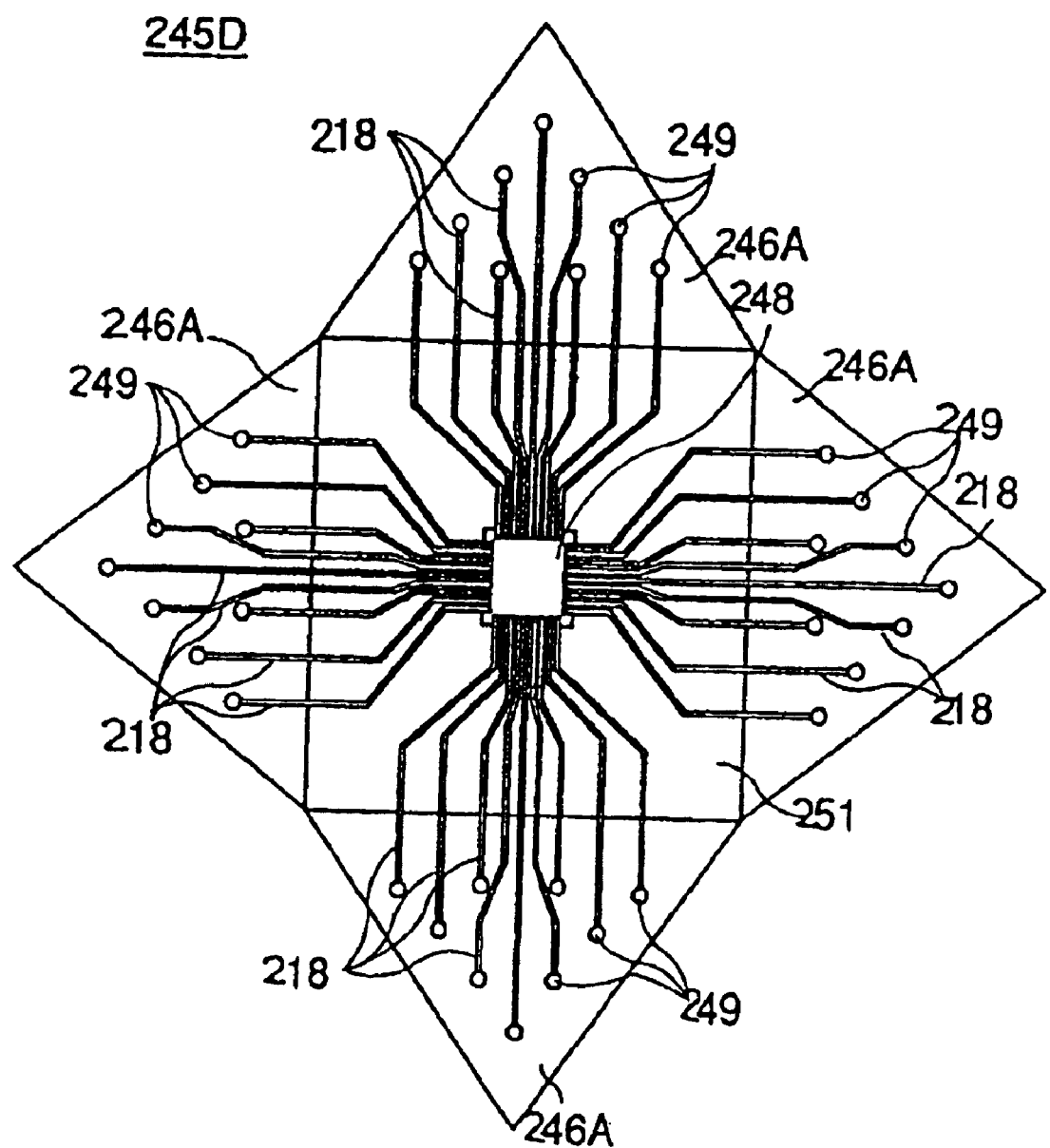
FIG. 107 is a diagram showing yet another embodiment of a wiring board (part 5).

A wiring board 245D shown in FIG. 107 is of the TAB type, and is characterized in that each of the extending portions 246A has a triangular shape. Hence, pads 249 can be arranged along slant edges of the triangular shape. Hence, the adjacent pads 249 (that is, the protruding electrodes 214) can be arranged at a comparatively wide pitch. Thus, the pads 249 can easily be formed, and no problem will occur even if it is required to arrange an increased number of protruding electrodes 214. The extending portions 246A shown in FIG. 107 have a triangular shape, but are not limited thereto. That is, the extending portions 246A can be formed in an arbitrary shape which makes it possible to arrange the pads 249 at a wide pitch.

Figure 108:
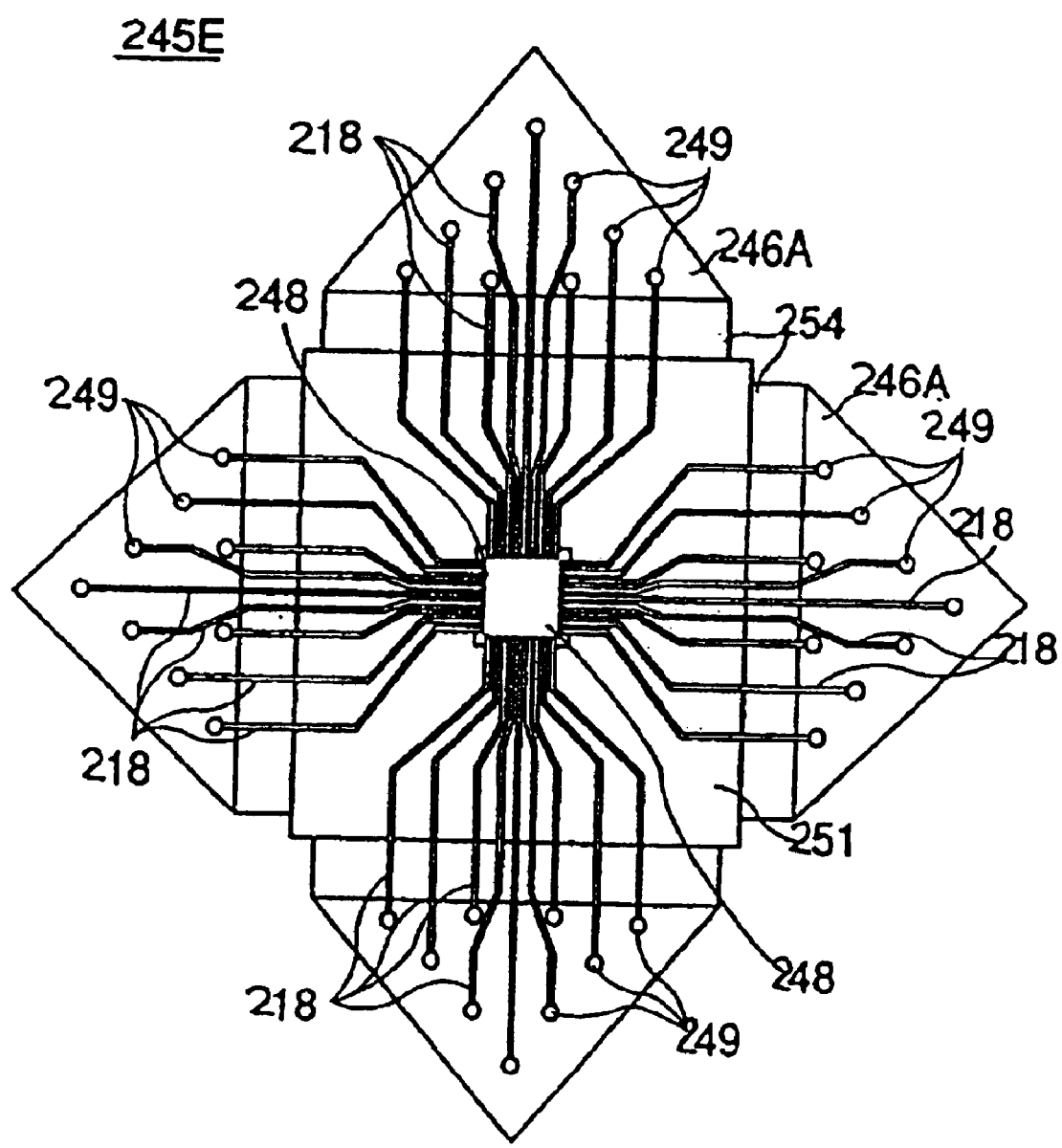
FIG. 108 is a diagram showing another embodiment of a wiring board (part 6).

A wiring board 245E shown in FIG. 108 is of the TAB type, and is characterized in that the extending portions 246A have a triangular shape and the base film 217 does not have any portion that is to be bent. The wiring board 245E in the present embodiment makes it possible to prevent the wiring board 245E from flaking off from the frames 213, 213A and the heat radiating plates 233 and 234, so that the semiconductor device can be down sized and the reliability thereof can be improved. Further, the pads 249 can easily be arranged so that the semiconductor device can meet the requirement of increasing the integration density of the semiconductor element 211. The solder resists 254 for protecting the leads 218 are arranged in the positions in which the base film 217 should be removed.

Figure 109:
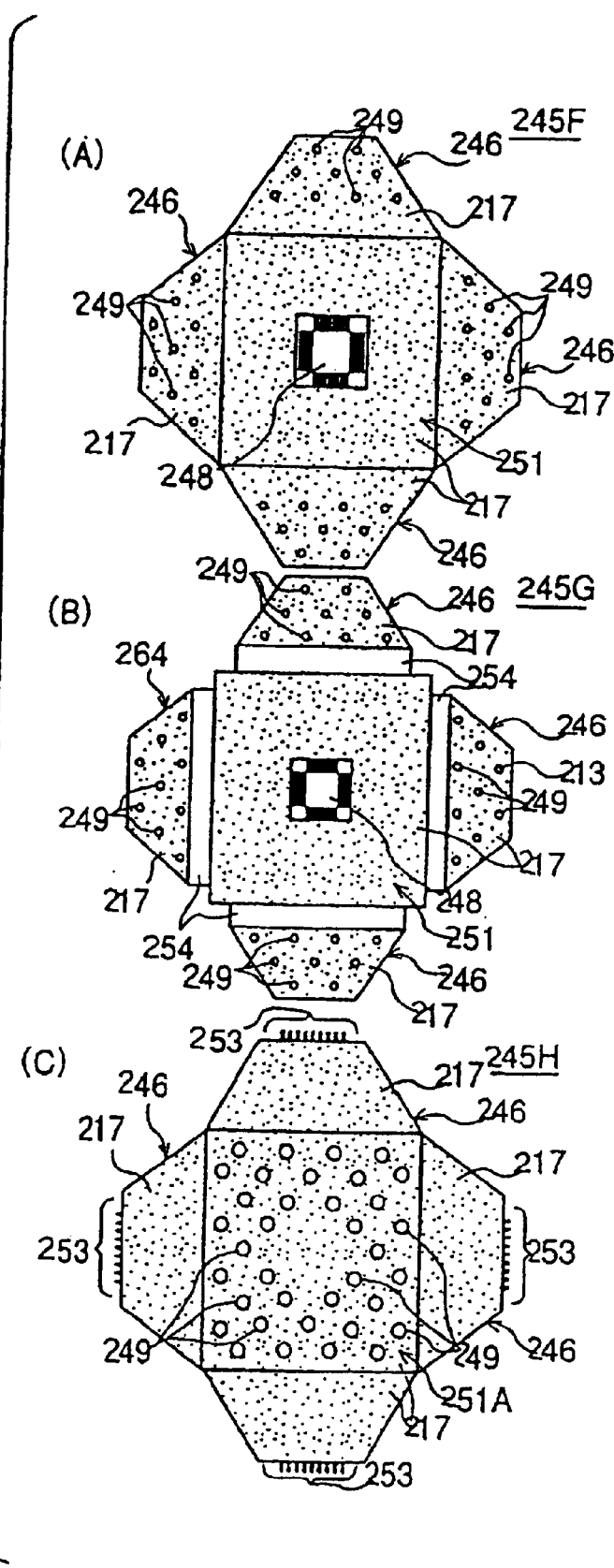
FIG. 109 is a diagram showing a further embodiment of a wiring board (part 7.

Wring boards 245F, 245G and 245H shown in FIG. 109 are of the TAB type, and are characterized in that the lands 249 are formed by providing connection holes in the base film 217 (indicated by a pear-skin illustration). The wiring board 245F shown in FIG. 109(A) has an arrangement in which the extending portions 246 and the base portion 251 are integrally formed. The wiring board 245G shown in FIG. 109(B) has an arrangement in which the portions of the base film 217 which are to be bent are removed and therefore the solder resists 254 are provided. The wiring board 245H shown in FIG. 109(C) has an arrangement in which the lands 249 are formed on the base portion 251A.

The wiring boards 245F and 245G can be applied to the aforementioned semiconductor devices 210G (see FIG. 92), 210H (see FIG. 93), 210J (see FIG. 95), 210L (see FIG. 97), 210 M (see FIG. 98), 210P (see FIG. 100), and 210Q (see FIG. 101). The wiring board 245H can be applied to the semiconductor device 210R (see FIG. 102).

Figure 110:
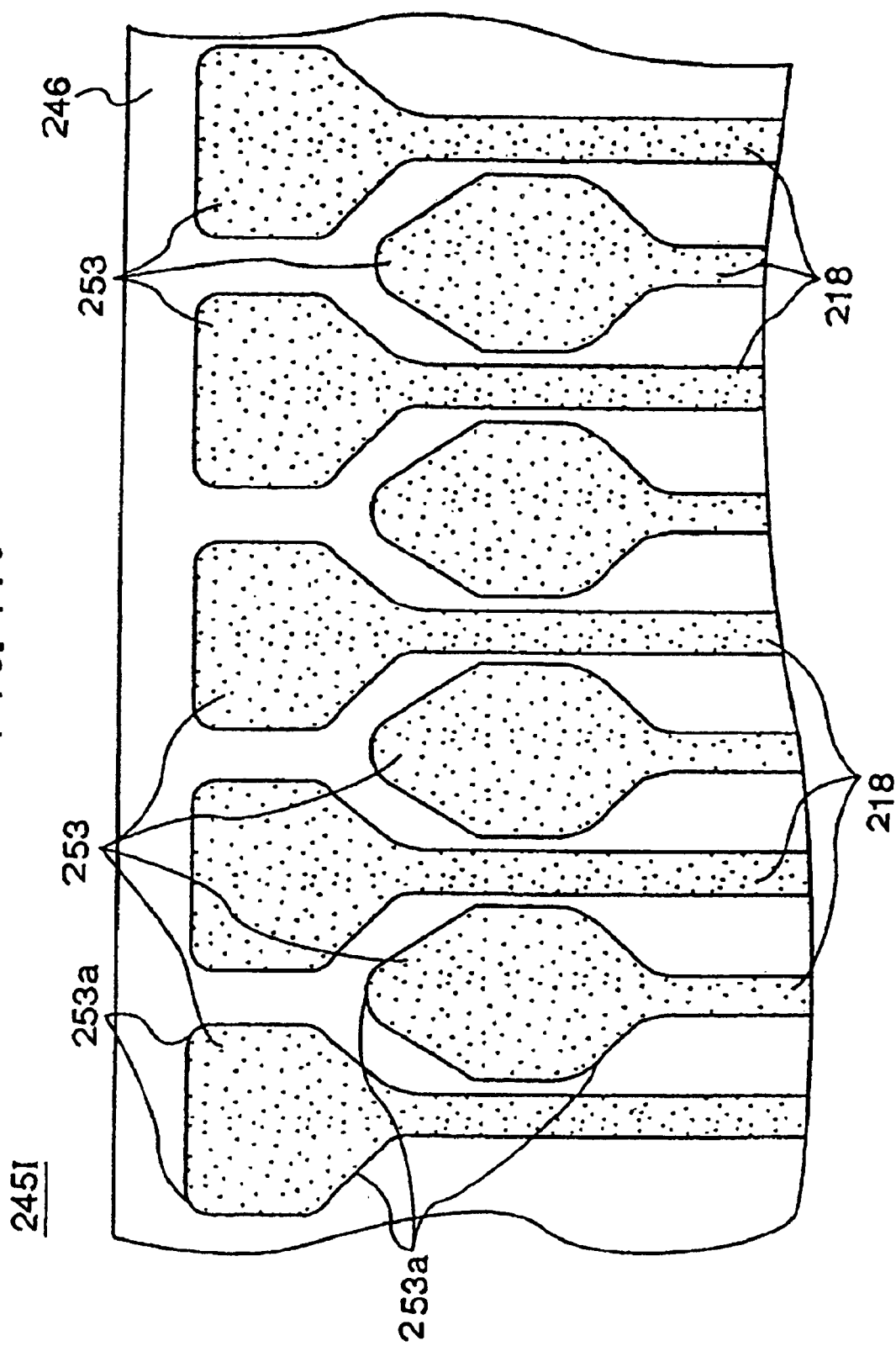
FIG. 110 is a diagram showing a variation of the wiring board shown in FIG. 106.

FIG. 110 shows a wiring board 245I which corresponds to a variation of the wiring board 245A described with reference to FIG. 106, and particularly shows an enlargement view of the connection electrodes 253 (indicated by a pear-skin illustration).

The wiring board 245I is characterized in that the connection electrodes 253 are arranged in an interdigital formation and corner portions 253a of the connection electrodes 253 are curved. The interdigital formation of arrangement of the connection electrodes 253 makes it possible to widen the area of each of the connection electrodes 253 and to simplify the wire bonding process (electrical connection process) for making connections to the semiconductor element 211.

The curved corner portions 253a of the connection electrodes 253 function to decentralize stress generated when a bonding tool (ultrasonic welding tool) used for bonding the wires 235 and the connection electrodes 253. Hence, the electrical connections between the wires 235 and the connection electrodes 253 can definitely be made.

Figure 111:
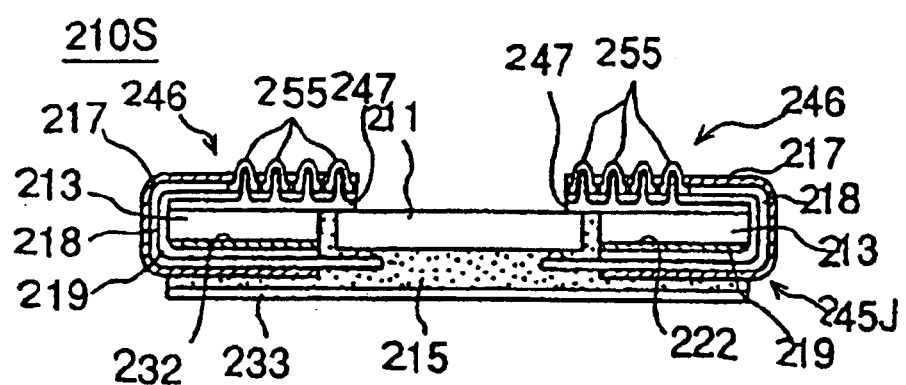
FIG. 111 is a diagram showing a semiconductor device according to a forty eighth embodiment of the present invention.
Figure 112:
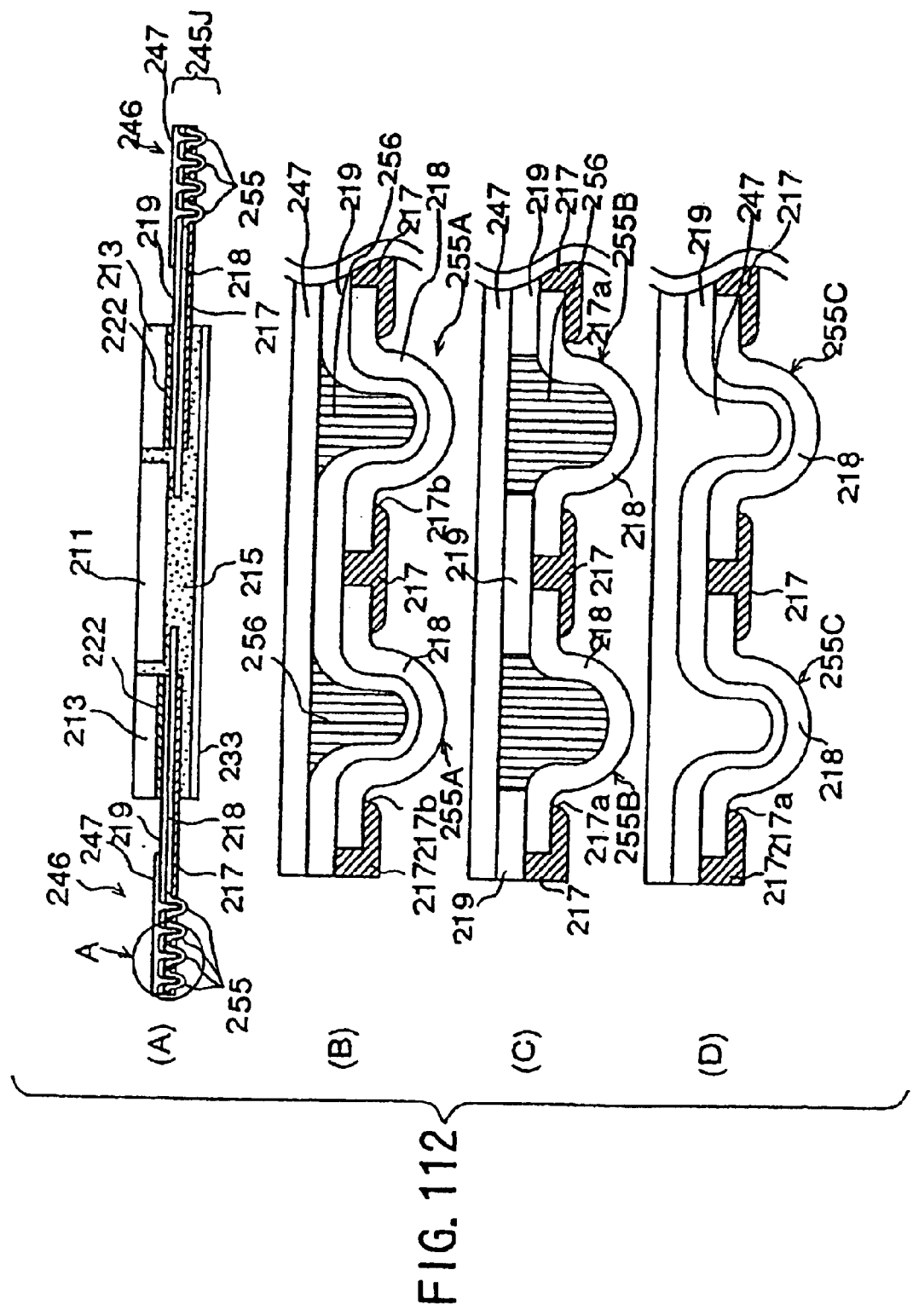
FIG. 112 is a diagram (part 1) showing a method for fabricating the semiconductor device according to the forty eighth embodiment of the present invention.
Figure 113:
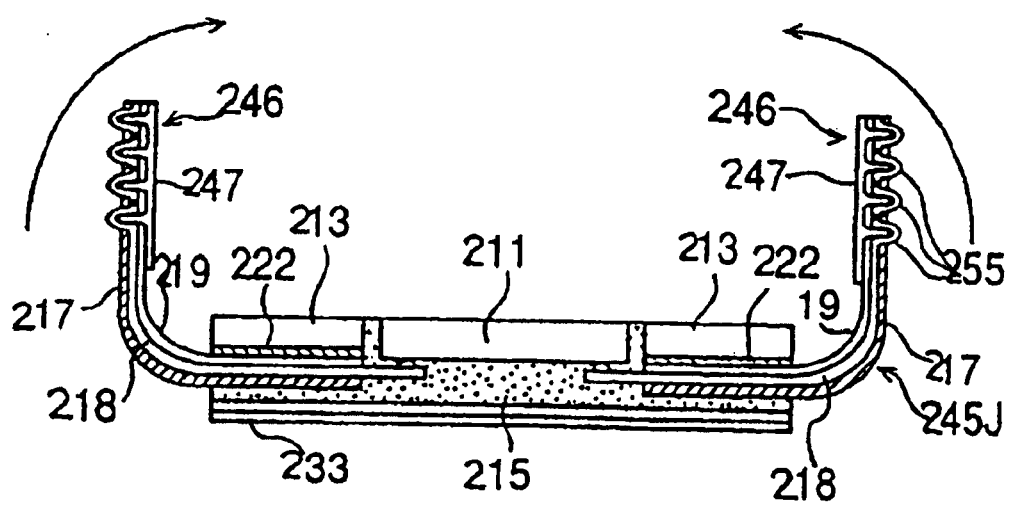
FIG. 113 is a diagram (part 2) showing a method for fabricating the semiconductor device according to the forty eighth embodiment of the present invention.

A description will now be given, with reference to FIGS. 111 through 113, of a semiconductor device and its fabrication method according to a forty eighth embodiment of the present invention. In FIGS. 111 through 113, parts that have the same structures as those of the semiconductor device 210E according to the thirty fifth embodiment shown in FIGS. 88 through 90 are given the same reference numbers, and a description thereof will be omitted.

FIG. 111 shows a semiconductor device 210S according to the forty eighth embodiment of the present invention, and FIGS. 112 and 113 show a method for fabricating the semiconductor device 210S. The semiconductor device 210S is characterized by using mechanical bumps 255 as protruding electrodes. The mechanical bumps 255 are obtained by deformation-processing or plastic-deforming leads 218 formed in the wiring board 245J, so that the deformed portions of the leads 218 protrude from the surface of the wiring board 245J and thus serve as protruding electrodes.

The use of the mechanical bumps 255 does not need ball members necessary for the transfer method employed in the aforementioned embodiments. Hence, the number of components can be reduced and the fabrication process can be simplified. The deformation-processing step requires a simple step of, for example, pressing the leads 218 by a punch (tool) or the like, Hence, the mechanical bumps 255 (protruding electrodes) can easily be formed at low cost.

A description will be given of the method for fabricating the semiconductor device 210S. FIG. 112(A) shows the wiring board 245J in which the mechanical bumps 255 are formed after the resin sealing step is executed. As shown in this figure, the mechanical bumps 255 are formed in the extending portions 246 of the wiring board 245J.

An enlarged view of a portion indicated by an arrow A shown in FIG. 112(A) is shown in FIGS. 112(B) through 112(D). As shown in these figures, the mechanical bumps 255 can have various structures.

Mechanical bumps 255A shown in FIG. 112(B) are characterized as follows. The leads 218 are pressed (deformation processing) integrally with the insulating film 219. Thereby, the pressed and deformed portions of the leads 218 and the insulating film 219 protrude from the connection hole 217b. Further, cores 256 are provided to resultant recess portions formed on the back surface of the deformed portions. Thus, the cores 256 have a shape which corresponds to the recess portions formed in the back surfaces of the mechanical bumps 255.

The insulating film 219 is subjected to the deformation processing together with the leads 218, and is not required to be removed. Hence, the step of forming the mechanical bumps 255A is simple. Further, the cores 256 arranged in the recess portions prevent the mechanical bumps 255A from being deformed even when the mechanical bumps 255A receives a pressure at the time of mounting the semiconductor device 210S.

In the structure shown in FIG. 112(C), mechanical bumps 255B are formed by removing the insulating film 219 and pressing the leads 218 (by deformation processing). The cores 256 are provided to the resultant recess portions formed on the back sides of the mechanical bumps 255B.

The mechanical bumps 255B are obtained by pressing the leads 218 only, and can be formed in a shape with high precision, as compared to the structure shown in FIG. 112(B) in which the insulating film 219 is pressed together with the leads 218. If the insulating film 219 does not have a uniform thickness, the shapes of the mechanical bumps 255B may be affected by the uneven thickness. The structure shown in FIG. 112(C) is not affected by the thickness of the insulating film 219, so that the mechanical bumps 255B can be formed with high precision.

The structure shown in FIG. 112(D) is characterized in that the cores 256 used in the structure shown in FIG. 112(B) are not used, but the second adhesive 247 is provided in the recess portions formed on the back side of the mechanical bumps 255C.

The second adhesive 247 functions to fix the extending portions 246 to the frame 213 and is hardened so as to have a given rigidity. Hence, the second adhesive 247 provided in the recess portions functions as the cores 256.

The use of the second adhesive 247 as the cores 256 makes it possible to reduce the number of components, as compared to the structures shown in FIGS. 112(B) and 112(C), and to simplify the step of forming the mechanical bumps 255C, After the mechanical bumps 255 are formed in the wiring board 245J by any of the above-mentioned methods, the semiconductor element 211 is flip-chip bonded to the wiring board 245J. Subsequently, a resin sealing step using the compression molding method is carried out, so that a state shown in FIG. 112(A) can be obtained. Then, a bending step is performed as shown in FIG. 113, and the extending portions 246 are bent towards the upper surface of the frame 213 and is fixed thereto by the second adhesive 247. Thus, the semiconductor device 210S shown in FIG. 111 can be obtained.

Figure 114:
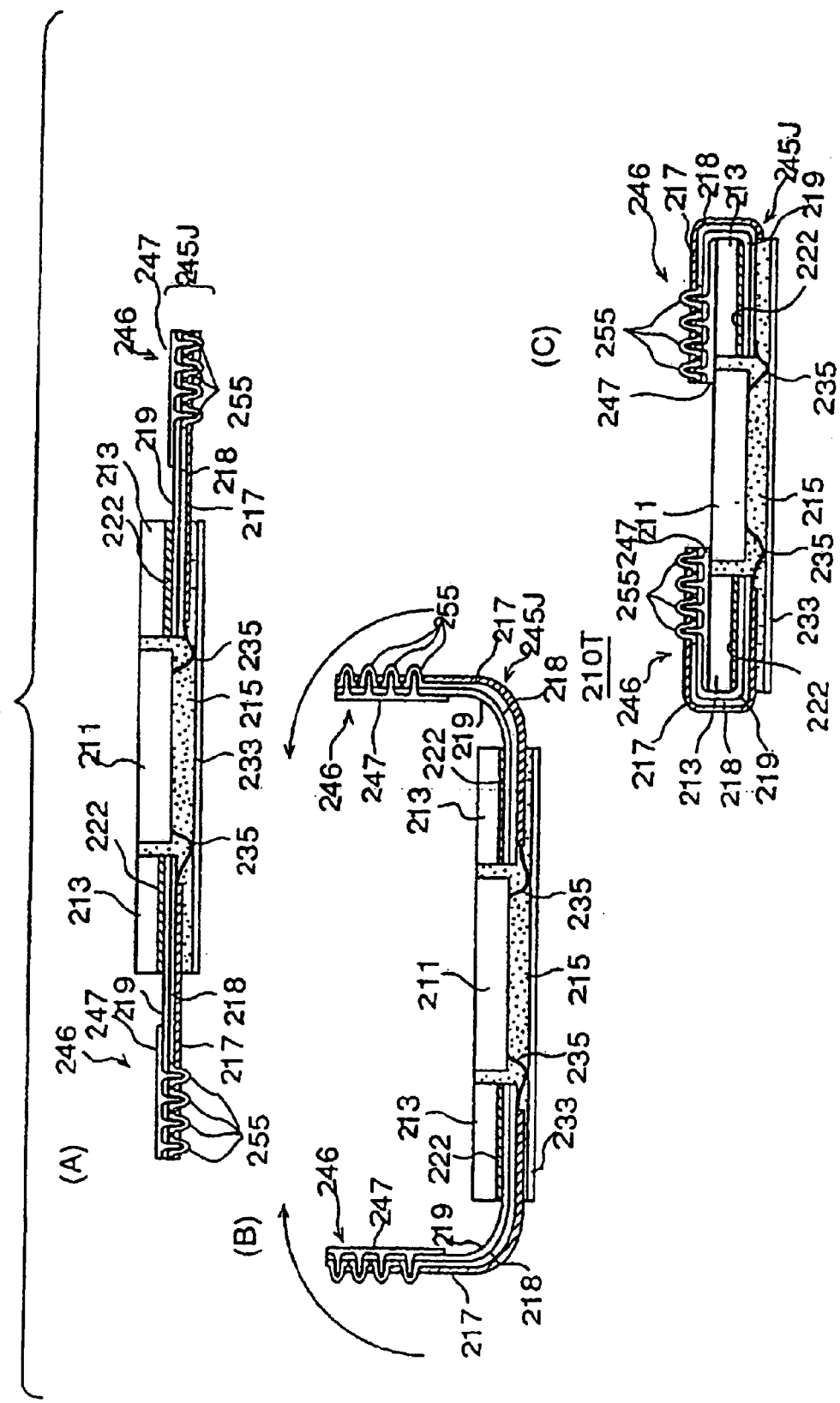
FIG. 114 is a diagram showing a semiconductor device and its fabrication method according to a forty ninth embodiment of the present invention.

FIG. 114 shows a semiconductor device 210T and its fabrication method according to a forty ninth embodiment of the present invention. The semiconductor device 210S and its fabrication method described with reference to FIGS. 111 through 113 employ the flip-chip bonding in order to connect the semiconductor element 211 and the wiring board 245J.

In contrast, as shown in FIG. 114, the forty ninth embodiment is characterized by connecting the semiconductor element 211 and the wiring board 245J by the wires 235. Even when the mechanical bumps 255 are employed, the semiconductor element 211 and the wiring board 245J can be connected by the TAB method or the wire bonding method. The semiconductor device 210T and its fabrication method are the same as the semiconductor device 210S and its fabrication method described with reference to FIGS. 111 through 113 except for the arrangement of the connections between the semiconductor element 211 and the wiring board 245J, and thus a description thereof will be omitted.

Figure 115:
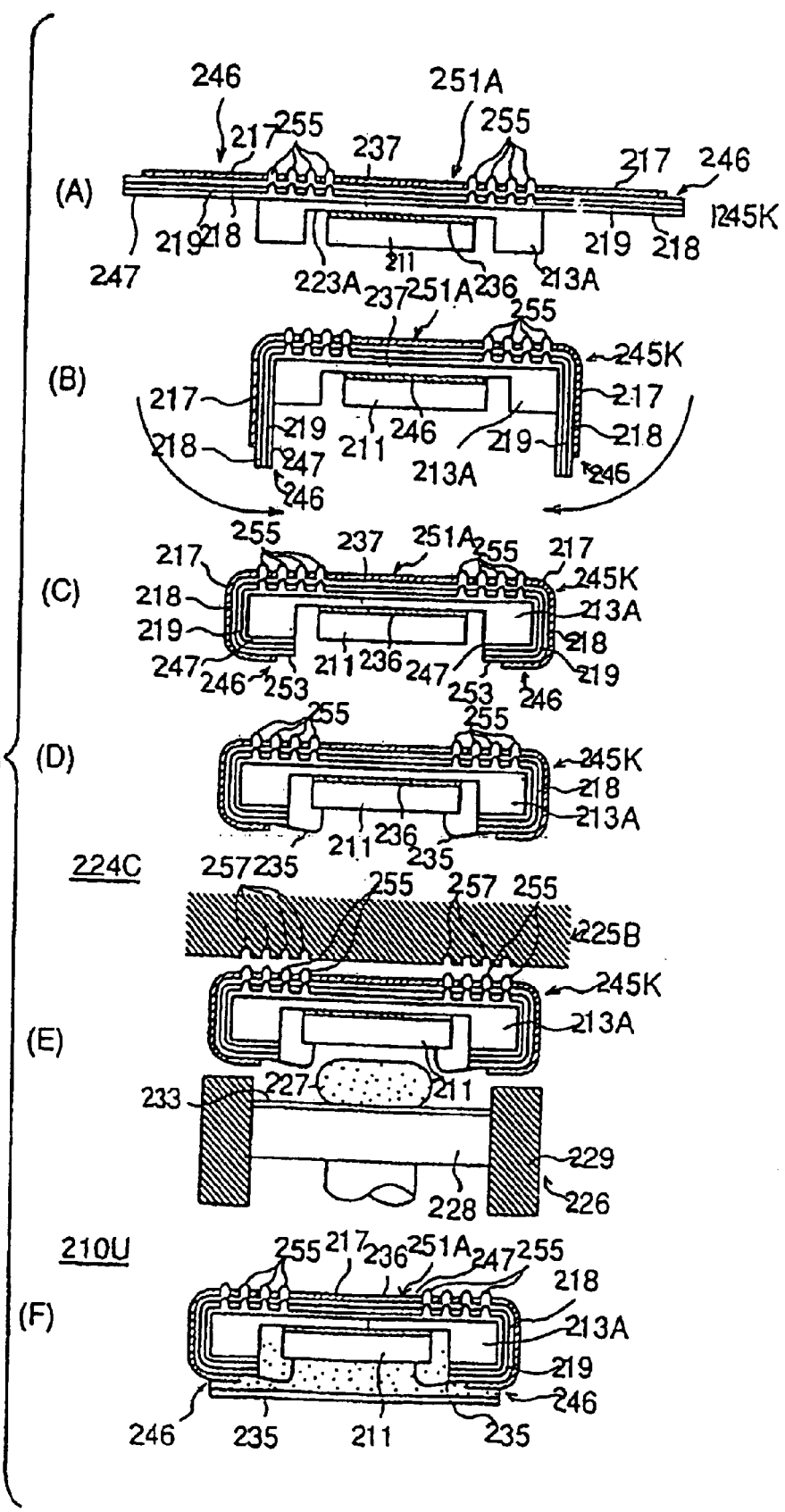
FIG. 115 is a diagram showing a semiconductor device and its fabrication method according to a fiftieth embodiment of the present invention.

A description will be given of a semiconductor device and its fabrication method according to a fiftieth embodiment of the present invention. FIG. 115 is a diagram showing a semiconductor device 210U and its fabrication method according to the fiftieth embodiment of the present invention. In FIG. 115, parts that have the same structures as those shown in FIGS. 102, 111 and 112 are given the same reference numbers, and a description thereof will be omitted.

FIG. 115(F) shows the semiconductor device 210U according to the fiftieth embodiment of the present invention. The frame 213A used in the semiconductor device 210U has the same structure as that of the semiconductor device 210R described with reference to FIG. 102. That is, the frame 213A includes the integrally formed bottom portion 237. A wiring board 245K used in the present embodiment has an arrangement in which the protruding electrodes 255 are formed on base portion 251A.

As shown in FIG. 115(A), the base portion 251A is positioned on the bottom portion 237 of the frame 213A, and is fixed thereto by the second adhesive 247. The extending portions 246 extend outwards from the outer periphery of the frame 213A. The semiconductor element 211 is mounted by the adhesive 236 within the cavity 223A formed in the frame 213A.

After the base portion 251A of the wiring board 245A is fixed to the bottom portion 237 of the frame 213A, the extending portions 246 are bent as shown in FIGS. 115(B) and 115(C), and the extending portions 246 are fixed to the frame 213A by the adhesive 247A. Then, the wires 235 are provided between the connection electrodes 253 and the semiconductor element 211 by the wire bonding method. FIG. 115(D) shows a state in which the wires 235 are provided between the connection electrodes 253 and the semiconductor element 211.

After the wires 235 are provided, a resin sealing step is performed. FIG. 115(E) shows a state in which the wiring board 245K is loaded onto the mold 224C. In the present embodiment, the mechanical bumps 255 are formed on the wiring board 245K preceding to the resin sealing step. Thus, inserting holes 257 into which the mechanical bumps 255 are inserted are formed in an upper mold 225B of the mold 224C.

The sealing resin 215 is shaped by the compression-molding method. In the present embodiment, the heat radiating plate 233 is arranged at the same time as the sealing resin 215 is formed. By forming the sealing resin 215, the semiconductor device 210U shown in FIG. 115(F) can be obtained.

The semiconductor device 210U has the same advantages as the semiconductor device 210R shown in FIG. 102. More particularly, the mechanical bumps 255 are positioned on the side of the bottom portion 237 of the frame 213A, and the cavity 223A is not formed at the positions. Hence, the whole area of the bottom portion 237 can be used to arrange the mechanical bumps 255. Hence, the mechanical bumps 255 can be arranged at a comparatively wide pitch and an increased number of mechanical bumps 255 can be arranged on the bottom portion 237.

Figure 116:
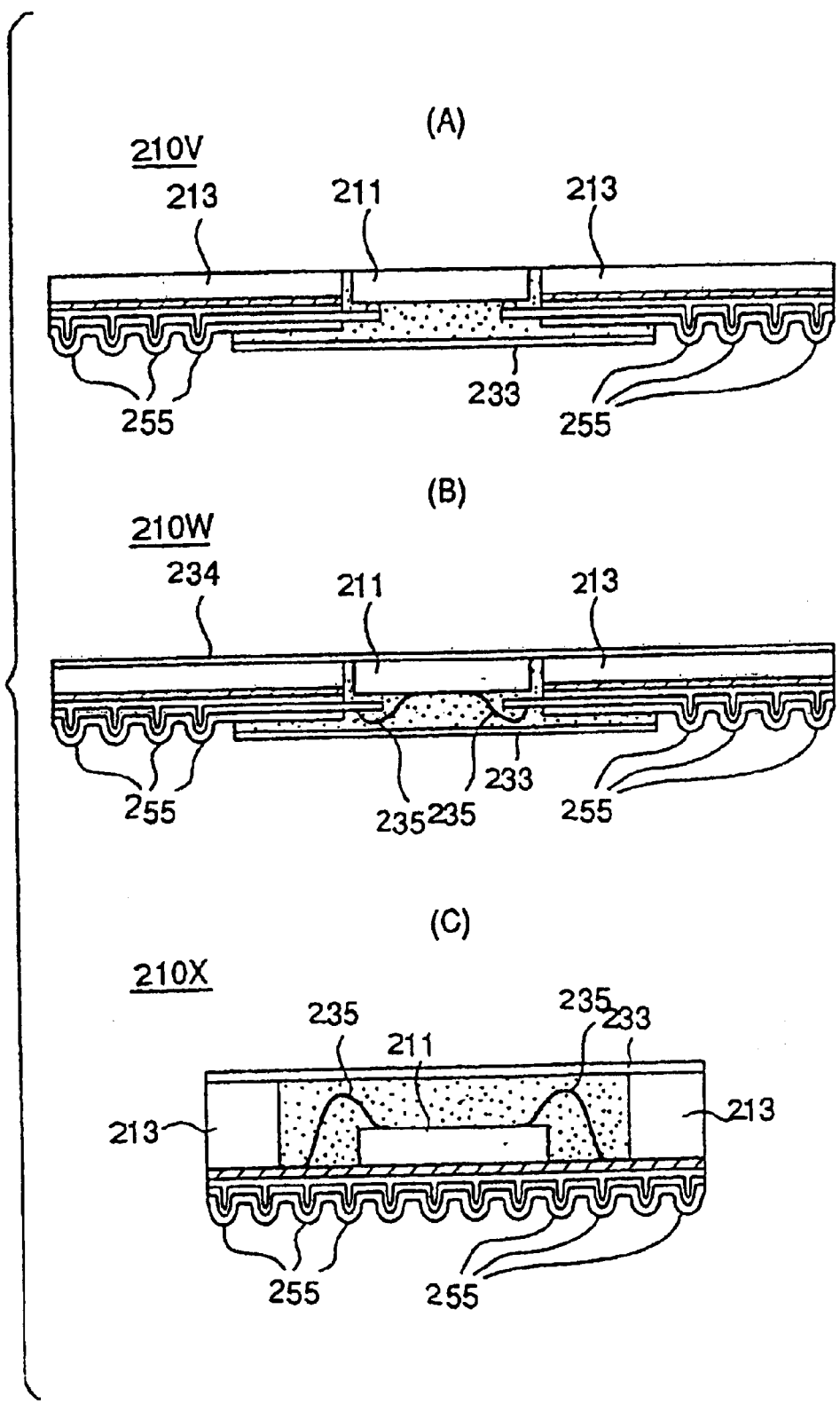
FIG. 116 is a diagram showing semiconductor devices according to fifty first through fifty third embodiments of the present invention.

FIG. 116 is a diagram showing various semiconductor devices equipped with the mechanical bumps 255. FIG. 116(A) shows a semiconductor device 210V, which has an arrangement in which the mechanical bumps 255 are applied, as protruding electrodes, to the semiconductor device 10A of the thirty first embodiment described with reference to FIG. 81. FIG. 116(B) shows a semiconductor device 210W, which has an arrangement in which the mechanical bumps 255 are applied, as protruding electrodes, to the semiconductor device 10B of the thirty second embodiment described with reference to FIG. 84. FIG. 116(C) shows a semiconductor device 210X, which has an arrangement in which the mechanical bumps 255 are applied, as protruding electrodes, to the semiconductor device 210D of the thirty fourth embodiment described with reference to FIG. 116(C).

As shown in FIG. 116, the mechanical bumps 255 can be applied to the semiconductor devices 210V–210X which do not have the extending portions 246 which are not bent. The structures of the semiconductor devices 210V–210X shown in FIG. 116 other than the mechanical bumps 255 are the same as those of the aforementioned semiconductor devices 210A, 210B and 210D, and a description thereof will be omitted.

Figure 117:
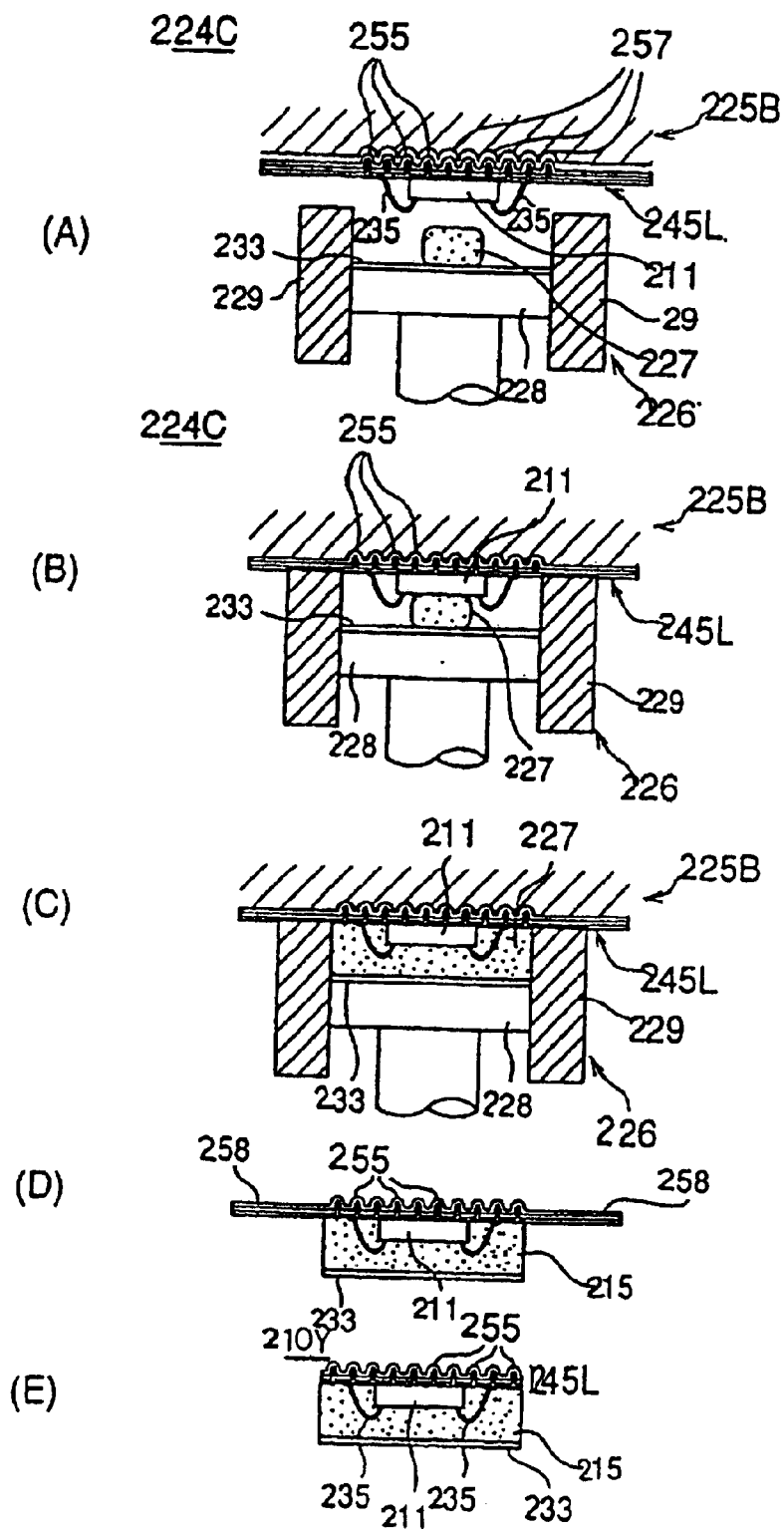
FIG. 117 is a diagram showing various semiconductor devices to which mechanical bumps are applied.

FIG. 117(E) shows a semiconductor device 210Y according to fifty first embodiment of the present invention, which is characterized in that the frame 213 or 213A used in the aforementioned embodiments is not used. Hence, the semiconductor element 211 is supported by only the sealing resin 215. Hence, it is possible to further facilitate down sizing of the semiconductor device 210Y and to reduce the fabrication cost and simplify the assembly work due to a reduction in the number of components.

A description will be given of a method for fabricating the semiconductor device 210Y. In the following description, the semiconductor device 210Y has the mechanical bumps 255 as protruding electrodes. However, the following method can be applied to semiconductor devices having protruding electrodes other than the mechanical bumps.

FIG. 117(A) shows a state in which the mechanical bumps 255 are already formed and a wiring board 246L to which the semiconductor element 211 is provided is loaded to the mold 224C. In the present embodiment, the semiconductor element 211 and the wiring board 246L are electrically connected together by the wires 235. The mold 224C has the inserting holes 257 into which the mechanical bumps 255 are inserted, as in the case shown in FIG. 115(E).

The wiring board 246L is loaded onto the mold 224C, and the upper mold 225B and the lower mold 226 are moved so as to be close to each other. Then, as shown in FIG. 117(B), the wiring board 246L is clamped between the upper mold 225B and the lower mold 226.

Then, as shown in FIG. 117(C), the first lower mold half body 228 is moved up, and the sealing resin 227 seals the semiconductor element 211 and the wire 235 with a predetermined compression pressure. That is, the sealing resin 215 is formed by the compression molding method. The resin sealing step is carried out in a state in which the heat radiating plate 233 is placed on the first lower mold half body 228. Hence, the heat radiating resin 215 can be provided at the same time as the sealing resin 215 is formed.

FIG. 117(D) shows a state in which the wiring board 245L to which the sealing resin 215 is provided is detached from the mold 224C. In this state, there are unnecessary extending portions 258 extending from the side portions of the sealing resin 215. The unnecessary portions 258 are out and removed after the separating process, so that the semiconductor device 210Y shown in FIG. 117(E) can be obtained.

FIG. 116 shows a semiconductor device 310A according to a fifty fourth embodiment of the present invention. FIG. 118(A) shows a cross-sectional view of the semiconductor device 310A, and FIG. 118(B) is a side view of the semiconductor device 310A.

The semiconductor device 310A has a very simple structure, which is generally made up of a semiconductor element 312, an electrode board 314A, a sealing resin 316A and protruding terminals 318. The semiconductor device 312 (semiconductor chip) has a semiconductor substrate in which electronic circuits are formed. A plurality of bump electrodes 322 are formed on the mounting surface of the semiconductor element 312. The bump electrodes 322 has an arrangement in which solder balls are arranged by the transfer method, and are bonded to the electrode board 314 by the flip-flop bonding. Alternatively a reflow process may be employed.

By bonding the semiconductor element 312 and the electrode plate 314 in the flip-chip bonding formation, it is possible to reduce the space necessary for bonding, as compared to the use of wires and to thus down size the semiconductor device 310A. Further, it is possible to reduce the wiring length in the bonded portions the impedance and thus improve the electrical performance. Further, it is possible to narrow the pitch at which the bump electrodes 322 are arranged and realize an increased number of pins.

Figure 119:
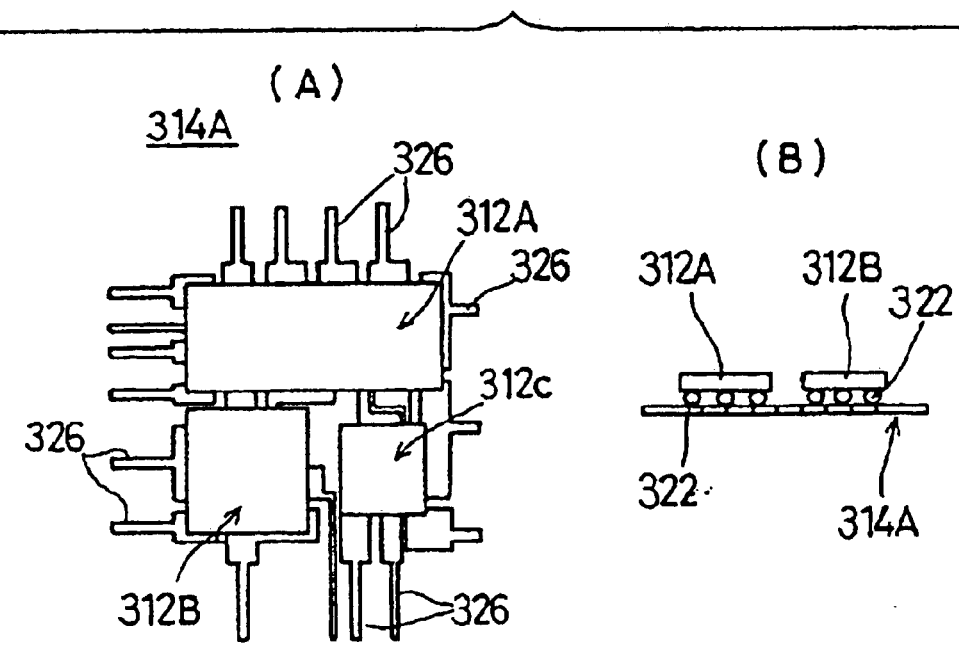
FIG. 119 is a diagram (part 1) showing a method for fabricating the semiconductor device according to the fifty fourth embodiment of the present invention.
Figure 120:
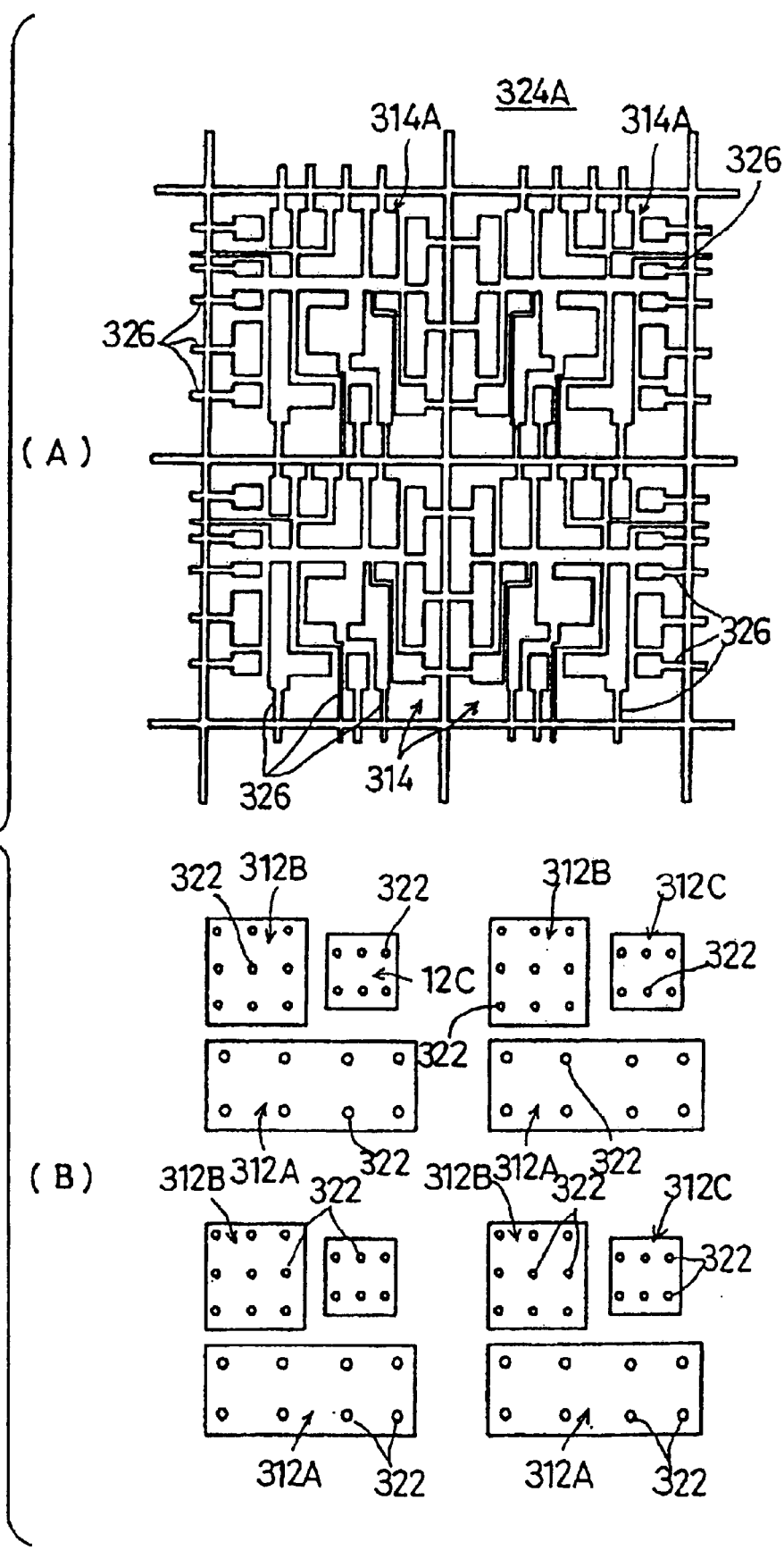

The electrode plate 314 functions as an interposer and is formed of an electrically conductive substance such as a copper alloy. As shown in FIG. 119(A), the electrode plate 314 includes a plurality of metallic plate patterns 326 having predetermined pattern shapes (as will be described later FIG. 119(A) shows the electrode plate 314 in a lead frame formation.

The metallic plate patterns 326 has a lower surface to which the bump electrodes 322 of the semiconductor element 312 are bonded, and an upper surface to which the protruding terminals 318 are bonded. Thus the metallic plate patterns 326 function to electrically connect the blimp electrodes 322 and the protruding terminals 318. As shown in FIG. 118(B), end portions of the metallic plate patterns 326 are exposed from the side surfaces of the sealing resin 316A, and form side terminals 320.

The protruding terminals 318 are, for example, ball bumps made of solder (protruding electrodes) and are bonded to the electrode plate 314. The protruding terminals 318 are electrically connected to the existing bump electrodes 322 through the metallic plate patterns 326.

The sealing resin 316A is formed so as to cover the semiconductor element 312, the electrode plate 314 and parts of the protruding terminals 318. The sealing resin 316A is formed of resin having electrically insulating performance such as polyimide and epoxy, and a minimum size sufficient to cover and protect the semiconductor element 312. Hence, the down-sizing of the semiconductor device 310A can be realized.

In the state observed after the sealing resin 316A is formed, a back surface 328 of the semiconductor element 312 is exposed from the sealing resin 316A. There are no electronic circuits in the back surface of the semiconductor element 312, which has a comparatively large mechanical strength. Hence, there is no problem in the arrangement in which the back surface 328 is exposed from the sealing resin 316A. The above arrangement functions to improve the heat radiating performance of the semiconductor device 310A because heat generated in the semiconductor element 312 can be radiated from the back surface 328 to the outside.

In the state in which the sealing resin 316A is formed, the end portions of the electrode plate 314 are exposed from the side surfaces of the sealing resin 316A so that side terminals 320 can be formed. Hence, it is impossible to use, together with the protruding terminals 318, side terminals 320 as external connection terminals for making connections to another board or device.

Figure 128:
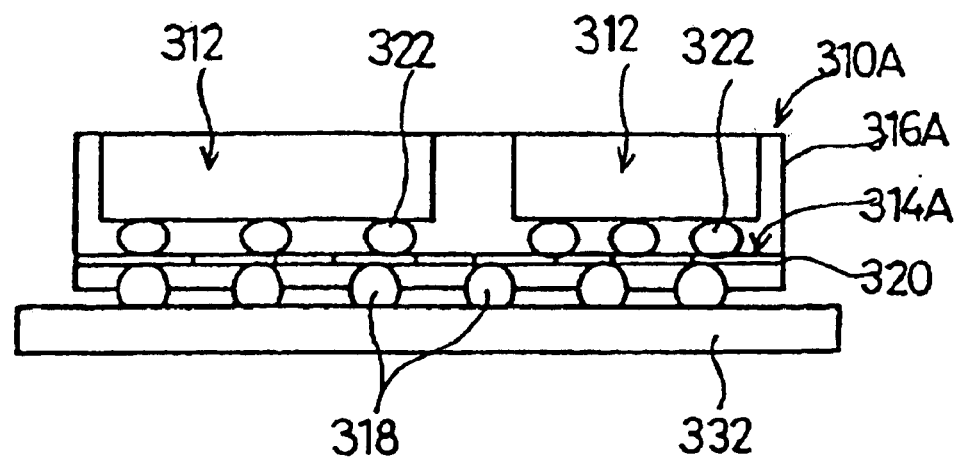

FIG. 128 shows a mounting arrangement of the semiconductor device according to the fifty fourth embodiment, and more particularly, shows a state in which the semiconductor device 310A is mounted on a mounting board 332. As shown in FIG. 128, the protruding terminals 418 are positioned between the bottom surface of the sealing resin 316A and the mounting board 332, and cannot be visually observed or connected to a test tool such as a probe from the outside of the device.

The semiconductor device 310A has the side terminals 320 which are exposed from the side surfaces of the sealing resin 316A. Hence, even after the semiconductor device 312 is mounted on the mounting board 322, it is still possible to test the semiconductor device 310A by using the side t terminals 320. Hence, it is possible to detect a defective semiconductor device and to improve the yield and reliability.

Turning to FIG. 118 again, a further description will be given of the semiconductor device 310A.

The above-mentioned sealing resin 316A covers not only the semiconductor element 312 but also the interfaces at which the protruding terminals 318 of the electrode plate 314. Hence, the protruding terminals 318 are protected by the sealing resin 316A. Hence, it is possible to prevent the protruding terminals 318 from flaking off from the semiconductor device 310A due to external force. Since the sealing resin 316A has electrically insulating performance, it is possible to prevent the adjacent protruding terminals from being short-circuited particularly in an arrangement in which the protruding terminals 318 are arranged at a high density (that is, at a narrow pitch).

The protruding terminals 318 protrude from the sealing resin 316A. Hence, it is possible to definitely connect the protruding terminals 318 to the mounting board 332. Further, the semiconductor device 310A can be handled as in the case of the BGA (Ball Grid Array) as shown in FIG. 128. Hence, the mounting reliability can be improved.

The electrode plate 314A of the semiconductor device 310A will be drawn to attention.

As has been described previously, the electrode plate 314A is a metallic plate. Thus, when the metallic plate 314A is provided in the sealing resin 316A for protecting the semiconductor element 312, the metallic plate 314A functions as a reinforcement member which reinforces the electrode plate. Hence, it is possible to more definitely protect the semiconductor element 312 and improve the reliability of the semiconductor device 310A. The electrode plate 314A is positioned between the semiconductor element 312 and the protruding electrodes 318 and the side terminals 320 serving as the external connection ends. Hence, the routing of wiring between the semiconductor element 312, the protruding terminals 318 and the side terminals 320 can be realized within the semiconductor device 310A. This is different from a conventional arrangement in which external connection ends are directly connected to the semiconductor device. According to the present embodiment arrangement, the electrode plate 314 increases the degree of freedom in layout of terminals of the semiconductor device 312 and external connection terminals (protruding terminals 318 and side terminals 320).

The electrode plate 314A is formed of an electrically conductive metal, which generally has better thermal conductivity than the sealing resin 316A. Hence, heat generated in the semiconductor element 312 can be radiated through the electrode plate 314A. Hence, it is possible to efficiently radiate heat generated in the semiconductor element 312 and thus ensure the stable operation of the semiconductor element 312.

A description will be given of a method for fabricating the semiconductor device 310A.

Figure 118:
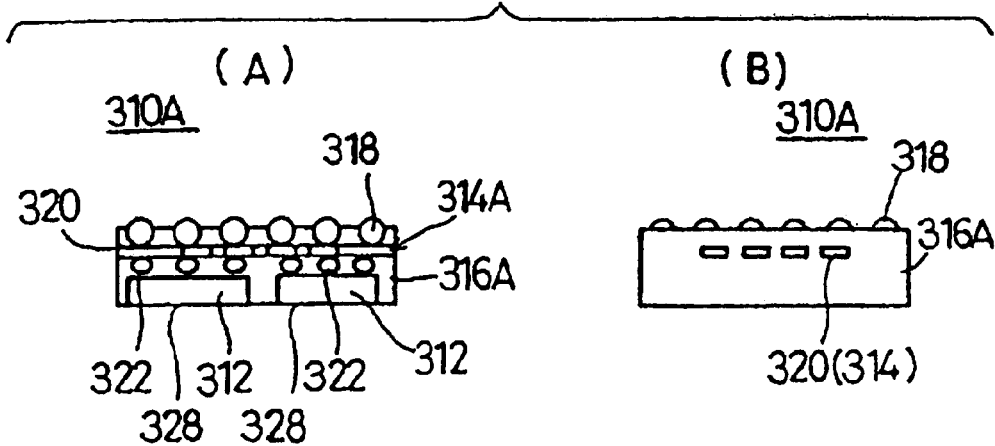
FIG. 118 is a diagram showing a semiconductor device according to a fifth fourth embodiment of the present invention.

FIGS. 119 through 122 are diagrams showing the method for fabricating the semiconductor device 310A. In FIGS. 119 through 122, parts that have the same structures as those shown in FIG. 118 are given the same reference numbers.

The fabrication method of the present embodiment includes an electrode plate forming step, a chip mounting step, a protruding terminal forming step, a sealing resin forming step and a cutting step. In the electrode plate forming step, a pattern forming process is carried out for a metallic base formed of a copper alloy (for example, a Cu—Ni—Sn system) which is generally used to form the lead frames. Thereby, a lead frame 234A having a plurality of electrode plates 314 is formed. The pattern forming process performed in the electrode plate forming step uses an etching method or press processing method.

The etching method and press processing method are generally used to form the lead frames. Hence, by applying the etching method or the press processing method to the step of forming the lead frames, the lead frame 324A can be formed without any increase in the facility.

FIG. 119(A) is a diagram of an enlarged view of a part of the lead frame 324A, in which four electrode plates 314A are depicted. According to the present embodiment fabrication method, a plurality of electrode plates 314A can be obtained from the lead frame 324A.

The electrode plates 314A have a plurality of metallic plate patterns 326, which can be processed to have arbitrary wiring patterns in the pattern forming step. Hence, the routing of wires can be realized by using the electrode plates 314A, so that the layout of external connection terminals formed on the electrode plates 314A can be determined with a large degree of freedom.

FIG. 119(B) shows a semiconductor element 312 (312A–312C) provided on the electrode plates (the lead frame 324A). In the present embodiment, three semiconductor elements 312A through 312C are mounted on a single electrode plate 314A. The semiconductor elements 312A–312C are equipped with the bump electrodes 322 used for making electrical connections to the respective electrode plates 314A.

As shown in FIG. 119(B), the sizes of the semiconductor elements 312A–312C may not be required to be equal to each other. The metallic plate patterns 326 formed on the electrode plates 314A are configured so as to correspond to the positions in which the bump electrodes 322 are to be formed.

After the electrode plate forming step is completed, the chip mounting step is performed, in which the semiconductor elements 312A through 312C are mounted on the electrode plates 314A and are electrically connected thereto. FIGS. 120(A) and 120(B) show a state in which the semiconductor elements 312A–312C are mounted on the respective electrode plates 314A.

The present embodiment employs the flip-chip bonding method as means for bonding the semiconductor elements 312A–312C to the electrodes 314A so that the electrode plates 314A are directly bonded to the bump electrodes 322. Hence, it is possible to reduce the bonding areas between the semiconductor elements 312A–312C and the electrode plates 314A and reduce the connection impedance.

Figure 121:
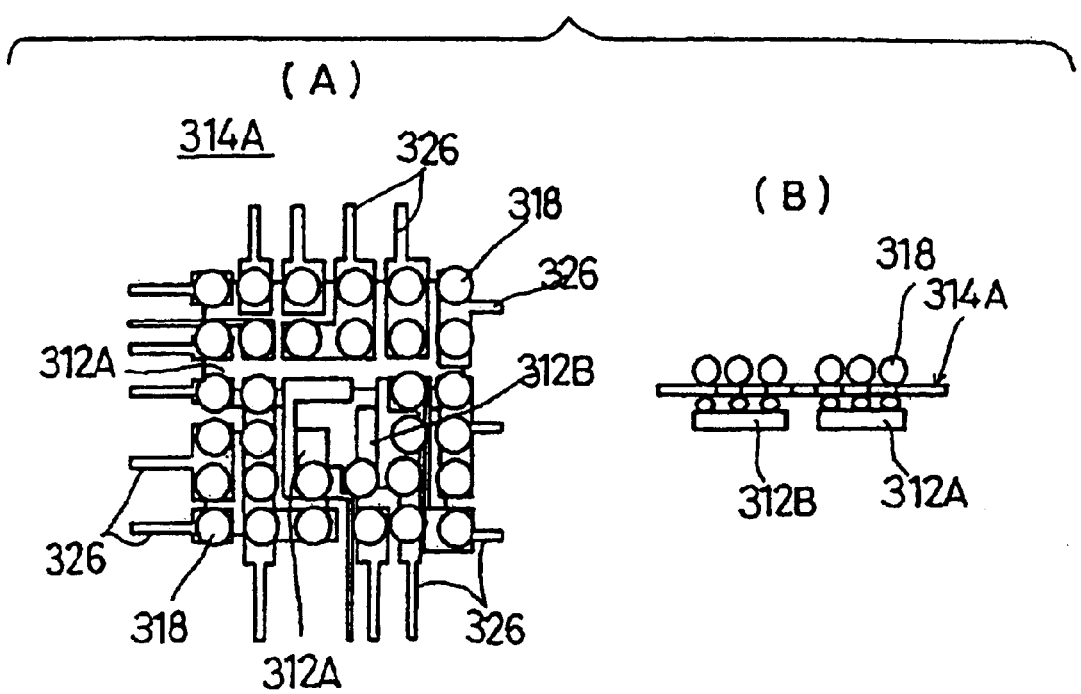

After the chip mounting step is completed, the protruding terminal forming step is carried out, in which the protruding terminals 318 are formed in given positions of the metallic plate patterns 326 forming the electrode plates 314A. The protruding terminals 318 are formed of solder balls, which are bonded to the metallic plate patterns 326 by, for example, the transfer method. FIG. 121 shows the electrode plate 314A on which the protruding terminals 318 are arranged. The protruding terminals 318 are arranged in a matrix formation by appropriately selecting the wiring patterns of the metallic plate patterns 326.

After the above protruding terminal forming step is completed, the sealing resin forming step is carried out, in which the lead frame 324A, to which the semiconductor elements 312 (312A–312C) and the protruding terminals 318 are provided, is loaded onto the mold and the sealing resin 316A is formed by the compression molding method. Thus, the semiconductor elements 312 and the electrode plates 314A are sealed by the sealing resin 316A. Hence, the semiconductor elements 312 and the electrode plates 314A can be protected by the sealing resin 316A, so that the reliability of the semiconductor device 310A can be improved.

Figure 122:
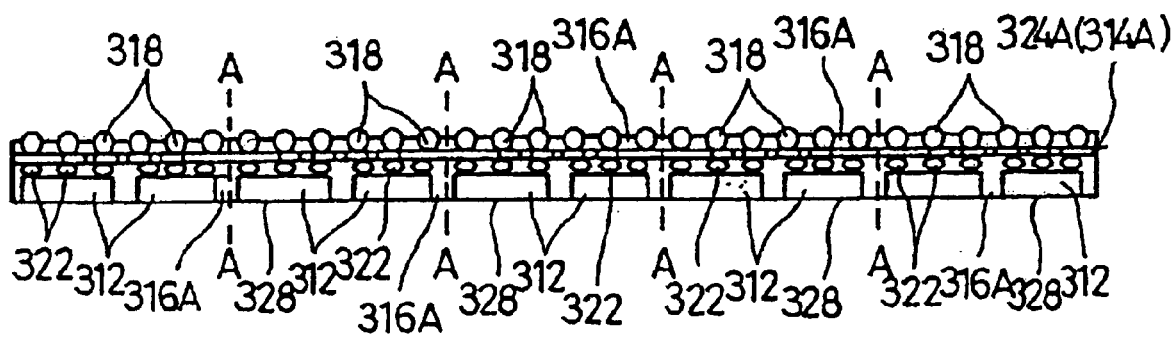

FIG. 122 shows the lead frame 324A to which the sealing resin 316A is formed. As shown, the back surfaces of the semiconductor elements 312 (312A–312C) are exposed from the sealing resin 316A, and predetermined end portions of the protruding terminals 316A protrude from the sealing resin 316A. By exposing the back surfaces of the semiconductor elements 312 from the sealing resin 316A, it is possible to improve the heat radiating efficiency. By protruding the end portions of the protruding terminals 318 from the sealing resin 316A, the mounting performance can be improved.

After the sealing resin forming step is completed, the cutting step is executed. The sealing resin 316A and the lead frame 324A (electrode plates 314A) are cut at the boundaries of the semiconductor devices (indicated by lines A—A shown in FIG. 122). Hence, a plurality of semiconductor devices shown in FIG. 18 can be obtained.

By cutting the lead frame 324A (electrode plates 314A) together with the sealing resin 316A, the electrode plates 314A are exposed in the side surfaces of the sealing resins 316A, and the exposed portions of the electrode plates 314A function as the side terminals 320, which can be used for external connection terminals.

A description will be given of a semiconductor device 310B according to a fifty fifth embodiment of the present invention.

Figure 123:
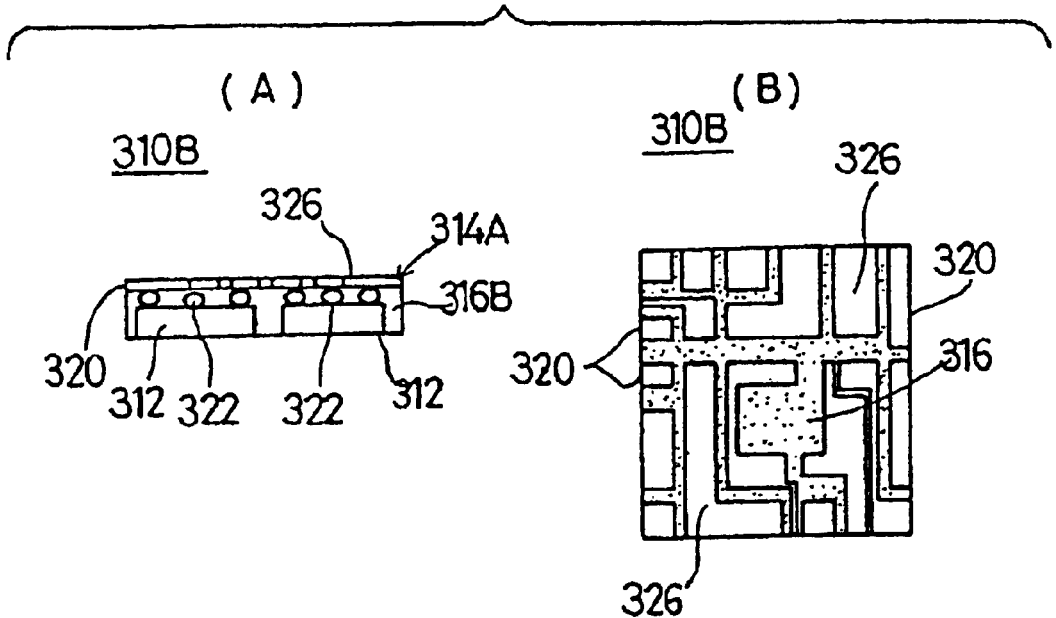

FIG. 123 is a diagram showing the semiconductor device 310B according to the fifty fifth embodiment. More particularly, FIG. 123(A) shows a cross section of the semiconductor device 310B, and FIG. 123(B) shows a bottom surface thereof. In FIG. 123, parts that have the same structures as those of the semiconductor device 310A according to the fifty fourth embodiment described with reference to FIG. 118 are given the same reference numbers, and a description thereof will be omitted.

In the aforementioned semiconductor device 310A according to the fifty fourth embodiment of the present invention, the protruding terminals 318 are exposed from the sealing resin 316A. In contrast, the semiconductor device 310B is characterized in that the electrode plate 314A is directly exposed from the sealing resin 316B without providing the protruding terminals 318.

Since the semiconductor device 310B does not have the protruding terminals 318, it is possible to reduce the number of components and simplify the fabrication process. The electrode plate 341A is exposed from not only the side surfaces of the sealing resin 316B but also the bottom surface, and thus form the external connection terminals. Hence, the mounting using any of the side and bottom surfaces can be realized.

Figure 130:
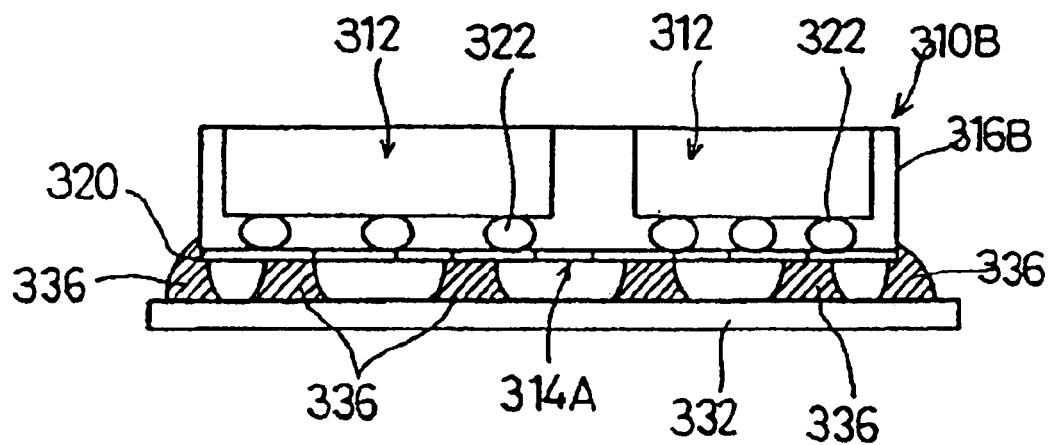

FIG. 130 shows an arrangement in which the semiconductor device 310B is mounted on the mounting board 332. As shown in this figure, the semiconductor device 310B is mounted on the mounting board 332 using solders 336 in a face-down formation. The solders 336 extend not only to the bottom portion of the electrode plate 314A but also to the side terminals 320, so that solder bonding can be realized.

The semiconductor device 310B can be mounted using the side terminals 320 only as in the case of a semiconductor device 310C of to a fifty sixth embodiment which will be described later. Hence, the semiconductor device 310B has an improved degree of freedom in mounting.

Figure 124:
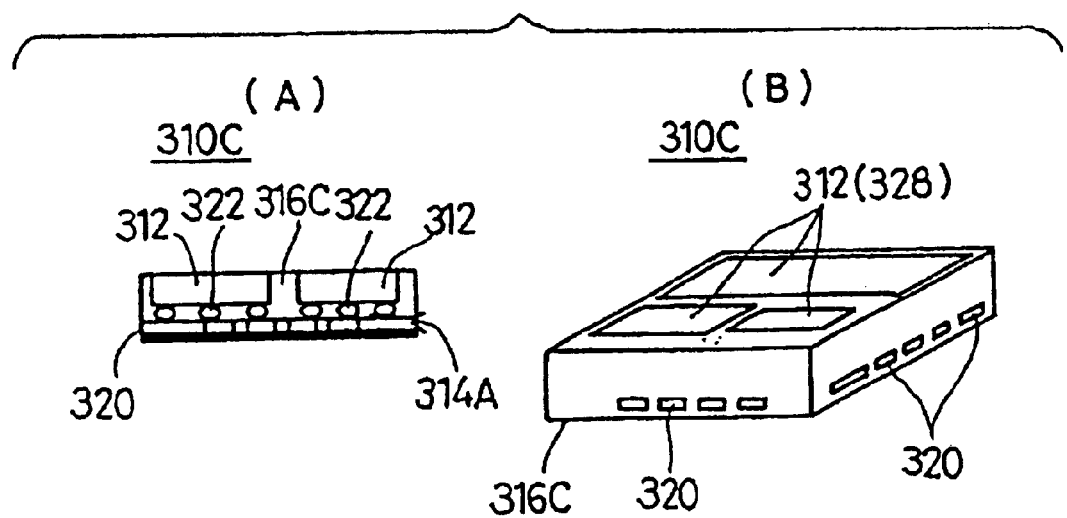

A description will now be given of a semiconductor device 310C according to the fifty sixth embodiment. More particularly, FIG. 124(A) shows a cross section of the semiconductor device 310B and FIG. 124(B) shows an upper surface thereof.

In the aforementioned semiconductor device 310B according to the fifty fifth embodiment, the side surface and side end portions of the electrode plate 314 are directly exposed from the sealing resin 316B. In contrast, the semiconductor device 310C is characterized in that only the side portions of the electrode plate 314A are exposed from the sealing resin 316C whereby the side terminals 320 can be formed.

The electrode plate 314A of the semiconductor device 310C is embedded in the sealing resin 316C while the side terminals 320 remain. Hence, it is possible to prevent the electrode plate 314A from flaking off from the sealing resin 316C due to thermal stress and external force and to thus improve the reliability of the semiconductor device 310C.

A description will now be given of a semiconductor device 310D according to a fifty seventh embodiment.

Figure 125:
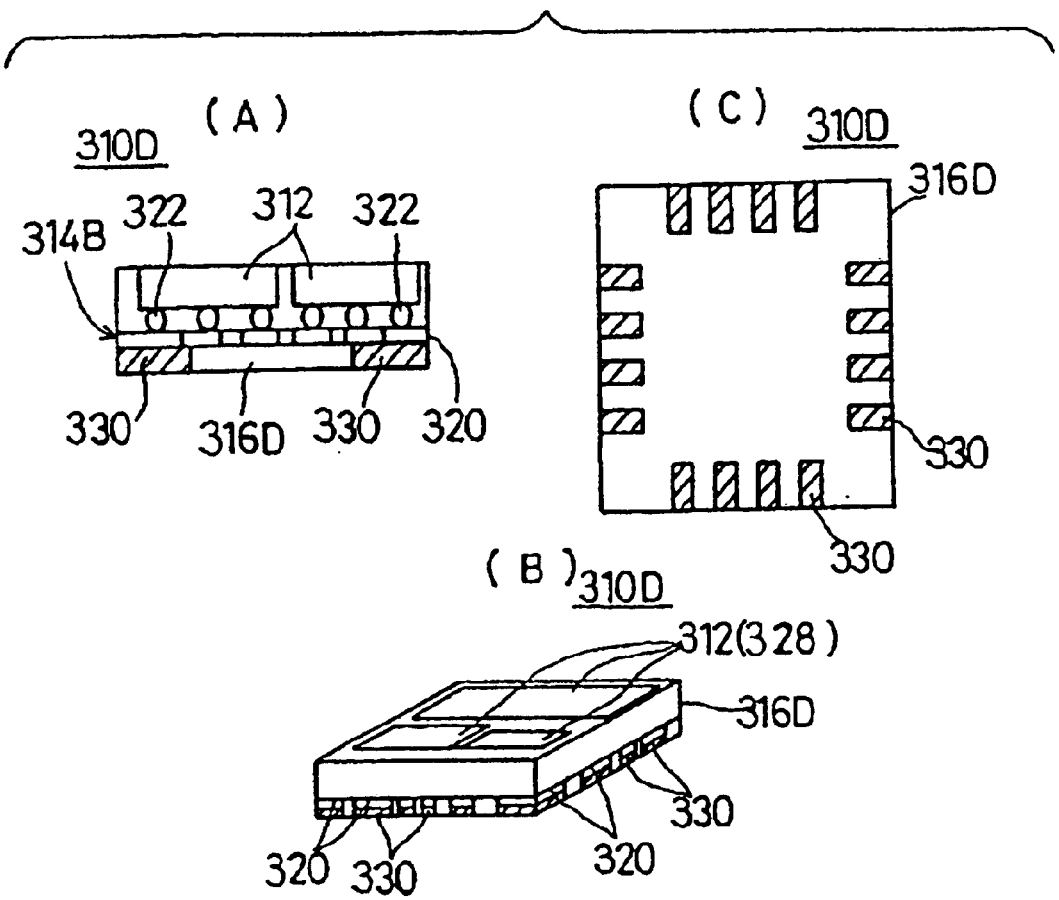

225 is a diagram of the semiconductor device 310D according to the fifty seventh embodiment. More particularly, FIG. 125(A) shows a cross section of the semiconductor device 310D, FIG. 125(B) shows an upper surface thereof, and FIG. 125(C) shows a bottom surface thereof.

The semiconductor device 310D is characterized by forming protruding terminals 330 in an electrode plate 314B. The protruding terminals 330 are shaped by press-processing the electrode plate 314B. Thus, the protruding terminals 330 and the electrode plate 314B are integrally formed. Alternatively, another electrically conductive member may be attached.

The step of forming the protruding terminals 330 is totally performed in the aforementioned electrode plate forming step. Hence, the formation of the protruding terminals 330 does not make the fabrication process complex. Further, the number of components can be reduced, as compared to an arrangement in which the protruding terminals 330 are formed by another member.

As shown in FIGS. 125(A) and 125(B), the protruding terminals 330 are exposed from the bottom surface of the sealing resin 316D. Hence, the protruding terminals 330 can be made to function as external connection terminals.

FIG. 134 shows a state in which the semiconductor device 310D is mounted on the mounting board 332. As shown, the semiconductor device 310D is mounted on the mounting board 332 by using solders 354. The protruding terminals 330 are exposed from the bottom and side surfaces of the sealing resin 316D. Hence, the contact areas to the solders 354 can be increased, and the protruding terminals 330 can definitely be connected to the mounting board 332.

Except for the protruding terminals 330 and the side terminals 320, the electrode plate 314B is embedded in the sealing resin 316D. Hence, the adjacent protruding terminals 330 can be electrically isolated from each other by the sealing resin 316D. Hence, it is possible to prevent the adjacent protruding terminals 330 from being short-circuited by the solders 354 at the time of mounting and to thus improve the reliability of mounting.

Figure 126:
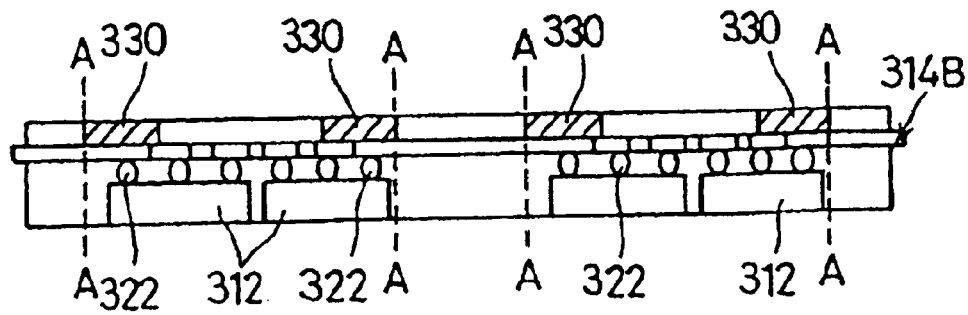
Figure 127:
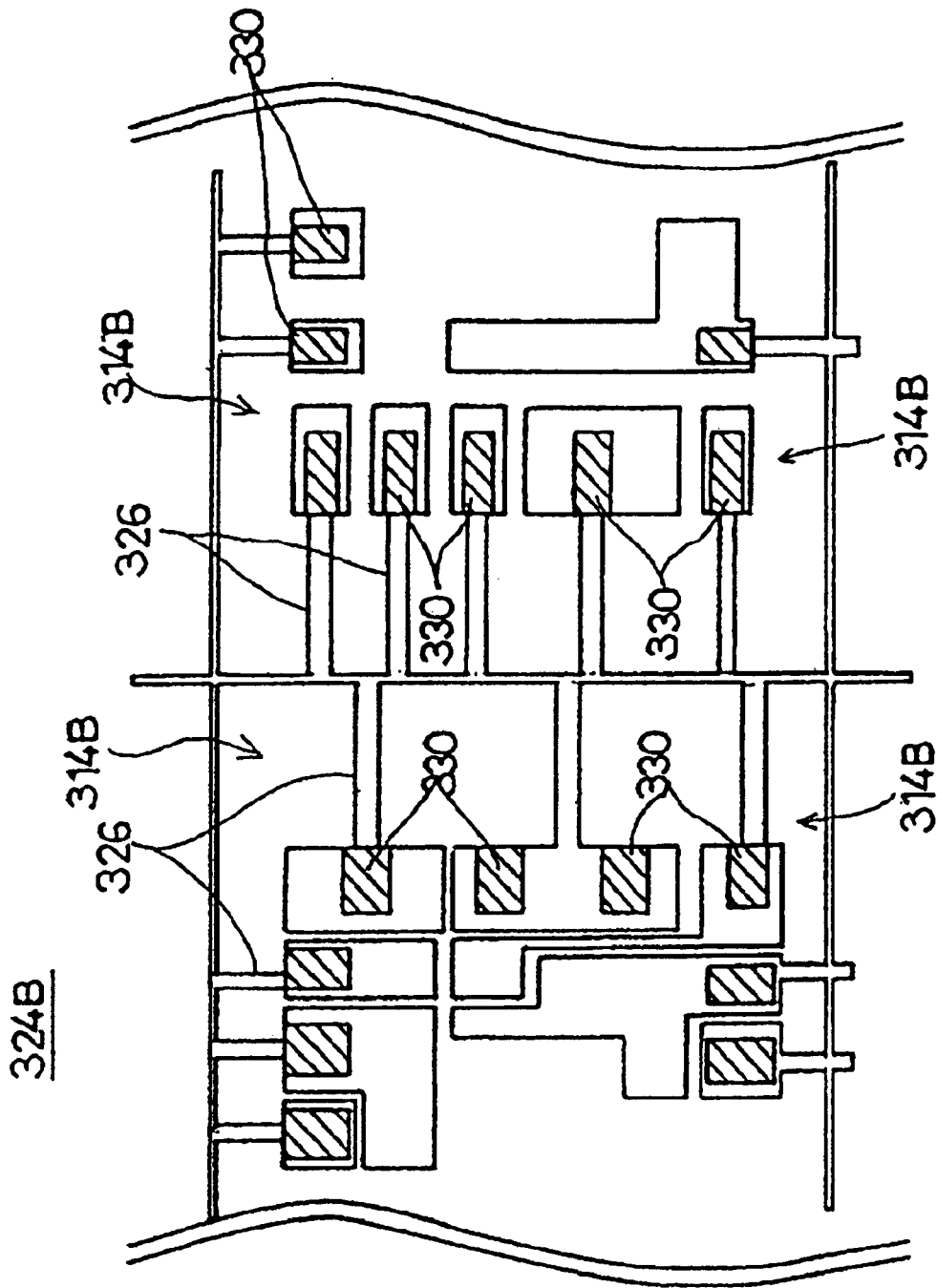

FIGS. 126 and 127 show a method for fabricating the semiconductor device according to the fifty fifth embodiment of the present invention, and more particularly the method of fabricating the semiconductor device 310D.

The fabricating method of the present invention has the steps that are the same as those of the fabrication method according to the fifty fourth embodiment described with reference to FIGS. 119 through 122 except for an electrode forming step, a sealing resin forming step and a cutting step. The following is directed to the electrode plate forming step.

In the present electrode plate forming step, the protruding terminals 330 are press-processed at the same times as the lead frame 324B having the electrode plates 314B is formed. the cutting step of the individual electrode plates 314B and the press processing for the formation of the protruding terminals 330 can be simultaneously carried out by selecting the structure of the mold for forming the lead frame 324B.

FIG. 126 shows the lead frame 324B formed by the electrode plate forming step. In this figure, hatched portions denote the protruding terminals 330, which protrude from the electrode plate 314B. According to the present embodiment, the protruding terminals 330 can be formed at the same time as the electrode plate 314B is formed. Hence, the process for fabricating the semiconductor device 310D can be simplified.

As shown in FIG. 127, the sealing resin forming step is carried out wherein the sealing resin 316D is formed so that the protruding terminals 330 are exposed from the sealing resin 316D. In order to easily obtain the above arrangement, the cavity surface of the mold used in the sealing resin forming step is made to come into contact with the protruding terminals 330.

The cutting positions in the cutting step are indicated by the broken lines A—A shown in FIG. 127, and are selected so that the side surfaces of the protruding terminals 330 are exposed from the sealing resin 316D. Hence, as shown in FIG. 134, the solders 354 extend up to the side surfaces of the protruding terminals 330 at the time of mounting, so that definite soldering can be realized.

A description will now be given of mounting arrangements in which the semiconductor devices 310A–310D are mounted on the mounting board 332.

FIGS. 128 through 134 show mounting arrangements of the semiconductor devices 310A–310D according to fifty fourth through sixtieth embodiments of the present invention. A description of the following has been described and will be omitted: the mounting arrangement for mounting the semiconductor device 310A according to the fifty fourth embodiment shown in FIG. 128, the mounting arrangement for mounting the semiconductor device 310B according to the fifty sixth embodiment shown in FIG. 130, and the mounting structure for mounting the semiconductor device 310D according to the sixtieth embodiment shown in FIG. 134.

Figure 129:
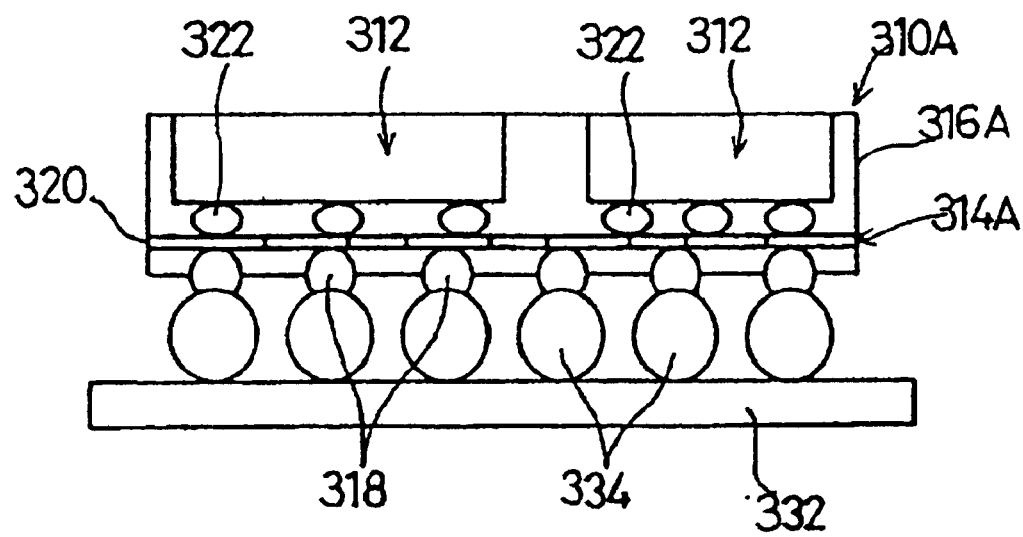

FIG. 129 shows a mounting arrangement for the semiconductor device according to the fifty fifth embodiment.

The present mounting arrangement shown FIG. 129 employs the semiconductor device 310A according to the fifty fourth embodiment by way of example, and is characterized in that mounting bumps 334 are provided to the protruding terminals 318 for external connections, and the semiconductor device 310A is bonded to the mounting board 332 through the mounting bumps 334.

By bonding the semiconductor device 310A to the mounting board 332 through the mounting bumps 334, the semiconductor device 310A can be mounted in the same manner as the BGA (Ball Grid Array) type semiconductor device, and can meet a requirement for improvement in the mounting performance and the use of an increased number of pins.

Since the protruding terminals 318 are formed on the electrode plate 314A, there is a limit on the volumes of the protruding terminals 318. However, the mounting bumps 334 are allowed to have an arbitrary volume. Hence, by maximizing the volumes of the mounting bumps 334 within a range in which the adjacent mounting bumps 334 are not short-circuited, the performance of bonding between the semiconductor device 310A and the mounting board 332 can be improved and thus the reliability thereof can be improved. The mounting arrangement of the present embodiment can be applied to the semiconductor devices 310A, 310B and 310D.

Figure 131:
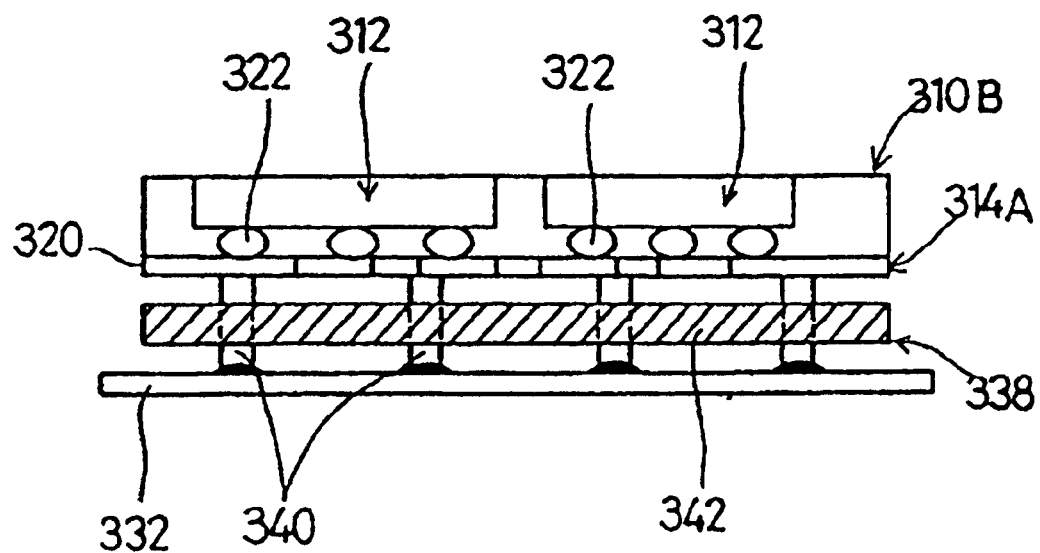

FIG. 131 shows a mounting arrangement for the semiconductor device according to the fifty seventh embodiment of the present invention.

The present mounting arrangement employs the semiconductor device 310B according to the fifty fifth embodiment by way of example, and is characterized by bonding the semiconductor device 310B to the mounting board 332 by using a mounting member 338.

The mounting member 338 is made up of connection pins 340 and a positioning member 342. The connection pins 340 are formed of flexible electrically conductive substance (for example, a spring member having electrical conductivity), and are arranged in the positions corresponding to those in which the external connection terminals of the electrode plate 314A are located. The positioning member 342 is made of a flexible and insulating substance such as silicon rubber, and functions to position the connection pins 340 in the above given positions.

The mounting member 338 thus configured is used so that the upper ends of the connection pins 340 are bonded to the electrode plate 314A of the semiconductor device 310B (for example, soldering), and the lower ends of the connection pins 340 are bonded to the mounting board 332.

As described above, the connection pins 340 are interposed between the external connection terminals and the mounting board. The connection pins 340 are flexible and thus absorb stress generated at the interface between the semiconductor device 310B and the mounting board 332 due to the difference in thermal expansion coefficient therebetween at the time of, for example, heating the device. If the connection pins 340 are formed of a material having flexibility, the positioning member 342 will absorb the above stress.

Hence, even if the above stress is applied, the bonded condition between the semiconductor device 310B and the mounting board 332 can definitely be maintained, and the reliability of the mounting can be improved. The positioning member 342 supporting the connection pins 340 is flexible, and thus does not prevent the connection pins 340 from being flexibly deformed. Hence, the positioning member 342 can definitely absorb the stress.

Since the connection pins 340 are positioned by the positioning member 342, it is not required to position the connection pins 340 with respect to the semiconductor device 310B (the electrode plate 314A) and with respect to the mounting board 332. Hence, the mounting operation can easily be performed. The present mounting arrangement can be applied to the other semiconductor devices 310A, 310B and 310D.

FIG. 132 shows a mounting arrangement for the semiconductor device according to the fifty eighth embodiment of the present invention.

The present mounting arrangement employs the semiconductor device 310C according to the fifty sixth embodiment by way of example, and is characterized by mounting the semiconductor device 310C on the mounting board 332 through a socket 344.

The socket 344 is made up of an attachment portion 346 to which the semiconductor device 310C is attached, and lead parts 348 provided so as to be connected to the side terminals 346 exposed from the side surfaces of the sealing resin 316C. The semiconductor device is attached to the attachment portion 346, and the upper portions of the lead parts 348 and the side terminals of the semiconductor device 310C are electrically connected together, Then, the lower portion of the lead portion 348 is bonded to the mounting board 332 (for example, soldering). Hence, the semiconductor device 310C is mounted on the mounting board 332 through the socket 344.

By mounting the semiconductor device 310C on the mounting board 332 through the socket 344, the attachment and detachment of the semiconductor device 310C with respect to the mounting board 332 can be realized by merely attaching and detaching the semiconductor device 310C to and from the socket 344. Hence, even if the semiconductor device 310C is required to be replaced by new one, for example, in the maintenance work, the above replacement can easily be realized.

The lead parts 348 attached to the socket 344 are arranged to the sides of the attachment portion 346. Further, the side terminals 320 of the semiconductor device 310C are exposed from the sealing resin 316C. Hence, the lead parts 348 and the side terminals 320 face each other in the state in which the semiconductor device 310C is attached to the attachment portion 346. Thus, connections between the lead parts 348 and the semiconductor device 310C can be made without extending and routing the lead parts 348. Hence, the structure of the socket 344 can be simplified.

FIG. 133 shows a mounting arrangement for the semiconductor device according to the fifty ninth embodiment of the present invention.

The present mounting arrangement mounts the semiconductor device 310C on the mounting board 332 by using lead parts 350 as in the case of the mounting arrangement according to the aforementioned fifty eighth embodiment, and is characterized in that a die stage 352 is substituted for the attachment portion 346.

A socket 351 used in the present embodiment is made up of the lead parts 350 and the die stage 352, which are integrally formed by a lead frame member. The die stage 352 supports the semiconductor device 310C, and the lead parts 350 are arranged on the outer periphery thereof. The portions of the lead parts 350 that face the semiconductor device 310C are partially bent so as to be electrically connected to the side terminals 320.

Even by using the above socket 351, the semiconductor device 310C can be attached to and detached from the mounting board as in the case of the mounting arrangement according to the fifty eighth embodiment. The lead parts 350 and the die stage 352 of the socket 351 are integrally formed, so that the number of components can be reduced and the socket 351 can easily be produced.

A description will now be given of a semiconductor device 310E according to a fifty eighth embodiment of the present invention.

FIG. 135 is a cross-sectional view of the semiconductor device 310E according to the fifty eighth embodiment of the present invention. The semiconductor device 310E is characterized in that a heat radiating plate (heat radiating member) 356 is provided on the upper surface of the semiconductor device 310A according to the aforementioned fifty fourth embodiment.

The heat radiating plate 356 is formed of a light substance having a good thermal conductivity such as aluminum. The heat radiating plate 356 is bonded to the semiconductor elements 312 and the sealing resin 316A by an adhesive having a high thermal conductivity. By arranging the heat radiating plate 356 on the sealing resin 316A in a position close to the semiconductor elements 312, it is possible to efficiently radiate heat generated in the semiconductor elements 312.

The back surfaces 328 of the semiconductor elements 312 are exposed from the sealing resin 316A, and the heat radiating plate 356 is directly attached to the exposed back surfaces 328. That is, the sealing resin 316A having poor thermal conductivity is not interposed between the heat radiating plate 356 and the semiconductor elements 312, so that the heat radiating performance can further be improved.

A description will now be given of a method for fabricating the semiconductor device 310E thus configured (the fabrication method according to the fifty sixth embodiment).

FIGS. 136 through 141 are diagrams showing the method of fabricating the semiconductor device 310E. In FIGS. 136 through 141, parts that have the same structures as those used for explaining the fabrication method of the fifty fourth embodiment with reference to FIGS. 119 through 122 are given the same reference numbers, and a description thereof will be omitted.

The present fabrication method is characterized by applying a chip attachment step to the fabrication method of the fifty fourth embodiment. The chip attachment step attaches the semiconductor elements 312 to the heat radiating member 356 before the chip mounting step. Further, the present fabrication method includes the same electrode plate forming step, the chip mounting step, the protruding terminal forming step, the sealing resin forming step and the cutting step as those of the fifty fourth embodiment.

FIG. 136 is a diagram of an enlarged view of a part of the lead frame 324A obtained by the electrode plate forming step. Each area enclosed by the broken lines in FIG. 136 corresponds to one semiconductor device 310E (hereinafter the area is referred to as bonding attachment area 358).

FIG. 137 shows the chip attachment step, in which the heat radiating plates 356 each having the same area as that of each of the attachment areas 358 are formed. Then, the semiconductor elements 312 (312A–312C) are placed on the heat radiating plates 356 in positions corresponding to arrangement positions on the electrode plates 314A in which the semiconductor elements 312 are to be located. Hence, the semiconductor elements 312 (312A–312C) are fixed to the arrangement positions on the electrode plates 314A, so that three semiconductor elements 312A–312C can be handled as a whole.

The heat radiating plates 356 are separated so as to have the size corresponding to that of the attachment areas 358. As shown in FIG. 138, it is possible to use joint members 360 which join the heat radiating plates 356 so that the heat radiating plates 356 are located in positions of the attachment areas 358 of the lead frame 324A.

After the above chip attachment step is completed, the chip mounting step and the protruding terminal forming step are carried out. FIGS. 139 and 140 show the lead frame 324A observed after the chip mounting step and the protruding terminal forming step are completed. More particularly, FIG. 139 is a diagram of an enlarged view of a part of the lead frame 324A to which the heat radiating plate 356 is attached, and FIG. 140 shows the entire lead frame 324A.

In the chip mounting step, the heat radiating plate 356 on which the semiconductor elements 312 (312A–321C) are attached is arranged to the lead frame 324A, so that the semiconductor elements 312A–312C are mounted on the electrode plate 314A and are electrically connected thereto. As has been described previously, the chip attachment step of attaching the semiconductor elements 312 (312A–312C) to the heat radiating plate 356 is executed prior to the chip mounting step. Hence, in the chip mounting step, the heat radiating plate 356 is placed on and attached to the attachment areas 358 of the lead frame 324A. Hence, the semiconductor elements 312 (312A–312C) can be mounted on the electrode plate 314 at one time.

Hence, the chip mounting step is not required to position the individual semiconductor devices 312 (312A–312C), but the heat radiating plate 356 having a large size and the electrode plate 314 (lead frame 324A) are merely positioned. Hence, the positioning operation can easily be carried out.

By using the arrangement shown in FIG. 138 in which the heat radiating plates 356 are joined by the joint members 360 so as to be located in the positions of the attachment areas 358, a further increased number of semiconductor devices 312 can be positioned on the electrode plate 314 (lead frame 324A). Hence, the positioning operation can be made easier and the fabrication efficiency of the semiconductor devices 310E can be improved.

After the chip mounting step and the protruding terminal forming step are completed, the sealing resin forming step is performed. In the sealing resin forming step, the lead frame 324A to which the semiconductor elements 312 (312A–312C) and the protruding terminals 318 are arranged is loaded onto the mold, and the sealing resin 316A is formed by the compression molding process. Since the heat radiating plate 356 is provided to the electrode plates 314A, the heat radiating plate 356 can be used as a part of the lower mold.

FIG. 141 shows the lead frame 324A to which the sealing resin 316A is formed. As shown in this figure, the sealing resin 316A is formed further in than the near radiating member 356, so that good separating performance can be obtained. After the above sealing resin forming step is completed, the cutting step is executed so that the arrangement is cut along the lines A—A shown in FIG. 141. Thus, the semiconductor devices 310E can be obtained.

A description will now be given of a semiconductor device 310F according to a fifty ninth embodiment of the present invention.

FIG. 142 is a cross-sectional view of the semiconductor device 310F according to the fifty ninth embodiment of the present invention. The semiconductor device 310F is characterized by arranging a heat radiating fin part 362 on the heat radiating plate 356 of the semiconductor device 310E according to the fifty eighth embodiment. Since the hear radiating fin part 362 has a large number of heat radiating fins 361, the heat radiating area is increased. The heat radiating fin 362 is bonded to the upper portion of the heat radiating plate 356 by an adhesive having a good thermal conductivity. Hence, the heat radiating efficiency is further improved, and the semiconductor elements 312 can be cooled efficiently.

A description will now be given of semiconductor devices 310G–310J according to sixtieth through sixty third embodiments of the present invention, which are characterized by arranging the heat radiating plate in order to efficiently radiate heat generated in the semiconductor elements 312.

FIG. 143 shows the semiconductor device 310G according to the sixtieth embodiment of the present invention. The semiconductor device 310G has a structure in which the heat radiating plate 356 is attached to the semiconductor device 310B (see FIG. 123) according to the aforementioned fifty fifth embodiment. FIG. 144 shows the semiconductor device 310H according to the sixty first embodiment, which has the mounting member 338 (see FIG. 131) used in the mounting arrangement according to the aforementioned fifty seventh embodiment. Further, the heat radiating plate 356 is attached to the semiconductor elements 312.

FIG. 145 shows the semiconductor device 310I according to the sixty second embodiment of the present invention, which has an arrangement in which the heat radiating plate 356 is attached to the semiconductor device 310C (see FIG. 124) according to the aforementioned fifty sixth embodiment. FIG. 146 shows the semiconductor device 310J according to the sixty third embodiment, which has an arrangement in which the heat radiating plate 356 is attached to the semiconductor device 310D (see FIG. 125) according to the aforementioned fifty seventh embodiment. The heat radiating efficiency can be improved by arranging the heat radiating plate 356 to each of the semiconductor devices 310G–310J.

A description will now be given of a semiconductor device 310K according to a sixty fourth embodiment of the present invention.

FIG. 147 is a diagram showing the semiconductor device 310K according to the sixty fourth embodiment. More particularly, FIG. 147(A) shows a cross section of the semiconductor device 310K, and FIG. 147(B) shows a bottom surface of the semiconductor device 310K. The semiconductor device 310K is made up of a semiconductor device main body 370, an interposer 372A, an anisotropic electrically conductive film 374, and external connection terminals 376.

The semiconductor device main body 370 is made up of a semiconductor element 378, protruding electrodes 380 and a resin layer 382. The semiconductor element 378 (semiconductor chip) has electronic circuits formed in a semiconductor substrate, and a large number of protruding electrodes 480 is arranged on the mounting surface of the semiconductor element 378. The protruding electrodes 380 are formed by solder balls processed by the process, and function as external connection electrodes.

The resin layer 382 (indicated by a pear-skin illustration) is formed of thermohardening resin such as polyimide, epoxy (PPS, PEK, PES and thermoplastic resin such as heat-resistant liquid crystal resin), is provided on the whole bump formation surface of the semiconductor element 378. Hence, the protruding electrodes 380 arranged on the semiconductor element 378 are sealed by the resin layer 382 so that ends of the protruding electrodes 380 are exposed from the resin layer 382. That is, the resin layer 382 is provided to the semiconductor element 378 so as to seal the protruding electrodes 380 except for the ends thereof.

The semiconductor device main body 370 having the above structure has a chip-size package structure in which the whole size thereof is approximately equal to the size of the semiconductor chip element 378. In addition, the semiconductor device main body 370 has the resin layer 382 formed on the semiconductor element 378, the resin layer 382 sealing the protruding electrodes 380 except for the ends thereof. Hence, the protruding electrodes 380 that are liable to be affected are protected by the resin layer 382, which has the same functions as those of the under fill resin 306.

The interposer 372A functions as an intermediate member which electrically connects the semiconductor device main body 370 and the external connection terminals 376, and is made up of a wiring pattern 384A and a base member 386A. The present invention is characterized in that a TAB (Tape Automated Bonding) tape is utilized as the interposer 372A. Generally, the TAB tape is supplied as a component of the semiconductor devices at a low cost. Thus, the cost of fabricating the semiconductor devices 310K can be reduced.

The wiring pattern 384A having the interposer 372A is, for example, a printed circuit pattern of copper. The base member 386A is formed of an insulating resin such as polyimide, and has through holes 388 located in positions corresponding to the positions the protruding electrodes 380 of the semiconductor device main body 370.

The anisotropic conductive film 374 has a flexible resin having adhesiveness in which a electrically conductive filler is mixed. Hence, the anisotropic conductive film 374 has both the adhesiveness and electrical conductivity in the direction in which a pressure is applied. The anisotropic conductive film 374 is interposed between the semiconductor device main body 370 and the interposer 372A.

Thus, the semiconductor device main body 370 and the interposer 372A are bonded together due to the adhesiveness of the anisotropic conductive film 374. In the above bonding step, the semiconductor device main body 370 is pressed towards the interposer 372a, and is thus electrically connected to the interposer 372A by the anisotropic conductive film 374.

The external connection terminals 376 are formed by solder balls, and are connected to the wiring pattern 384A via the holes 388 formed in the base member 336A. The external connection terminals 376 is arranged on the surface opposite to the mounting surface of the semiconductor device main body 370 in order to avoid a situation in which the terminals 376 prevents mounting of the semiconductor device main body 370.

Further, the semiconductor device 310K is arranged so that the pitch at which the protruding electrodes 380 formed on the main body 370 are arranged is equal to the pitch at which the external connection terminals 376 formed on the interposer 372A are arranged. Hence, the area of the anisotropic conductive film 374 and the interposer 372A obtained when vertically viewing them is approximately equal to the area of the semiconductor device main body 370 obtained when vertically viewing it.

Since the arrangement pitch of the protruding electrodes 380 formed on the main body 370 is equal to that of the external connection terminals 376 formed on the interposer 372A, so that the anisotropic conductive film 374 and the interposer 372A can have reduced sizes and thus the semiconductor device 310K can be down sized.

The above interposer 372A has the wiring pattern 384A formed on the base member 386A. Hence, an arbitrary pattern can be formed on the base member 386A as the wiring pattern 384A. That is, the wiring pattern 384A can arbitrarily be routed on the base member 386A.

Hence, it is possible to arbitrarily determine the positions of the external connection terminals 376 irrespective of the positions of the protruding electrodes 380 formed on the semiconductor device 370. That is, a large degree of freedom in arrangement of the external connection terminals can be obtained. Thus, it is possible to easily design the semiconductor device main body 370 and the wiring implemented on the mounting board on which the semiconductor device 310K is mounted.

As has been described previously, the anisotropic conductive film 374 has adhesiveness and electrical conductivity in the direction on which the pressure is applied. Hence, it is possible to connect the semiconductor device main body 370 and the interposer 372A by the anisotropic conductive film 374. The adhesiveness of the anisotropic conductive film 374 mechanically bonds the semiconductor device main body 370 and the interposer 372A, and the anisotropic conductivity thereof electrically bonds (connects) the semiconductor main body 370 and the interposer 372A together.

The anisotropic conductive film 374 has both the adhesiveness and conductivity, so that the number of components and the number of fabrication steps can be reduced, as compared to the arrangement in which the functions are separately realized by the respective components.

The anisotropic conductive film 374 is flexible and is interposed between the semiconductor device main body 370 and the interposer 372A. Thus, the anisotropic conductive film 374 can function as a buffer film and can relax stress (thermal stress) generated between the semiconductor device main body 370 and the interposer 372A. Thus, the reliability of the semiconductor device 310K can be improved.

A description will be given of a method for fabricating the semiconductor device 310K.

FIG. 148 shows the method for fabricating the semiconductor device 310K (according to the fifty seventh embodiment). As shown in this figure, the semiconductor device main body 370, the anisotropic conductive film 374 and the interposer 372A are formed beforehand. Then, as shown, the semiconductor device main body 370 and the interposer 372A are positioned, and the anisotropic conductive film 374 is interposed therebetween. Thereafter, the semiconductor device main body 370 is pressed towards the interposer 372A.

Thus, the semiconductor device main body 370 and the interposer 372A are mechanically bonded due to the adhesiveness of the anisotropic conductive film 374, and are electrically bonded (connected) due to the conductivity thereof. Hence, according to the present fabrication method, the mechanical bonding process and electrical connecting process can simultaneously be executed, so that the process for fabricating the semiconductor device 310K can be simplified.

After the semiconductor device main body 370 and the interposer 372A are jointed together, the external connection terminals 376 of solder balls are bonded to the interposer 372 by the transfer process. In the transfer process, the external connection terminals 376 are placed in a heated atmosphere, and are thus fused. Thus, the terminals 376 enter the holes 388 and are electrically connected to the wiring, pattern 384A of the interposer 372.

Since the external connection terminals 376 enter the holes 388 formed in the interposer 372, the bonding of the terminals 376 and the interposer 372A can be strengthened. Hence, it is possible to prevent the external connection terminals 376 from flaking off the interposer 372A and to thus improve the reliability of the semiconductor device 310K.

A description will now be given of a semiconductor device 310L according to a sixty fifth embodiment of the present invention.

FIG. 149 is a diagram of an enlarged view of an essential part of the semiconductor device 310L according to the sixty fifth embodiment. In FIG. 149, parts that have the same structures as those of the semiconductor device 310K according to the sixty fourth embodiment described with reference to FIG. 149 are given the same reference numbers, and a description thereof will be omitted.

The present semiconductor device 310L is characterized by providing an insulating member 394 having a given thickness on the interposer 372A. The insulating member 394 is formed of an insulating resin, for example, a polyimide-system resin, and has connection holes 396 located in positions corresponding to the positions of the protruding electrodes 380 provided on the semiconductor device main body 370.

When the semiconductor device main body 370 is pressed towards the interposer 374A when it is loaded onto the interposer 372a, the anisotropic conductive film 374 is deformed and urged due to the applied pressure. The anisotropic conductive film 374 is urged so that it enters the connection holes 396 having a comparatively narrow size. Hence, the internal pressure in the connection holes 396 is increased.

Since the pressure exerted on the anisotropic conductive film 374 in the connection holes 396 is particularly increased, the density of the conductive filler mixed in the anisotropic conductive film 374 is also increased. Hence, the electrical conductivity of the anisotropic conductive film 374 in the connection holes 396 can be enhanced. Thus, the semiconductor device 370 and the interposer 372A can definitely be connected electrically.

FIGS. 150 and 151 show a method of fabricating the semiconductor device 310L (the fabrication method according to the fifty eighth embodiment). In FIGS. 150 and 151, parts that have the same structures as those shown in FIG. 148 used to describe the fabrication method according to the fifty seventh embodiment are given the same reference numbers, and a description thereof will be omitted. The following fabrication method is directed to providing a large, number of semiconductor devices 310L.

First, there are prepared a wafer 390 on which semiconductor device main bodies 370 are formed, and a TAB tape 392 on which the anisotropic conductive film 374 and a plurality of interposers 372A are formed. The insulating film 394 is provided on the upper surface (on which the waver 390 is provided) of the TAB tape 392 and are located in positions facing the semiconductor device main body 370. The insulating member 394 can be formed by utilizing the photoresist formation technique. The connection holes 396 are formed in the insulating film 394 so that the holes 396 are located in positions corresponding to positions of the protruding electrodes 380.

Then, as shown in FIG. 150, the protruding electrodes 380 and the connection holes 396 are positioned, and the anisotropic conductive film 374 is interposed between the wafer 390 and the TAB tale 392. Then, the wafer 390 is pressed towards the TAB tale 392.

Thus, the wafer 390 and the TAB tale 392 are mechanically bonded due to the adhesiveness of the anisotropic conductive film 374. Further, the protruding electrodes 380 are electrically bonded (connected) to the wiring pattern 384A due to the anisotropic conductivity of the anisotropic conductive film 374. As has been described previously, the conductivity of the anisotropic film 374 is improved within the connection holes 396. Thus, the protruding electrodes 380 and the wiring pattern 384 can definitely be connected electrically.

FIG. 151 shows a state in which the wafer 390 and the TAB tale 392 are bonded together. After the step of bonding the wafer 390 and the TAB tale 392 is completed, the cutting step is carried out in which the assembly is cut along broken lines A—A shown in FIG. 151. Hence, the individual semiconductor device main bodies 370 and the interposers 372A are formed so that a plurality of semiconductor devices 310L as shown in FIG. 149 can be obtained.

According to the present fabrication method, the mechanical bonding process and the electrically connecting process for the semiconductor device main bodies 370 and the interposers 372A can be performed simultaneously. Hence, the fabrication method for the semiconductor devices 310L can be simplified. Additionally, the present method can provide a large number of semiconductor devices 310L by a single sequence, and thus has high production efficiency.

Generally, it is said that the use of an electrical connection arrangement using an anisotropic conductive film degrades the yield. In contrast, the present embodiments arranges the insulating member 394, in which the holes 396 are formed at the positions corresponding to the semiconductor device main body 370 (protruding electrodes 380). Hence, the electrical connections between the protruding electrodes 380 and the wiring pattern 384A can definitely be made. Thus, the semiconductor device 310L has improved reliability.

A description will now be given of a semiconductor device 310M according to a sixty sixth embodiment of the present invention.

FIG. 152 shows the semiconductor device 310M according to the sixty sixth embodiment. More particularly, FIG. 152(A) shows a cross section of the semiconductor device 310M, and FIG. 152(B) shows a bottom surface thereof. In FIG. 152, parts that have the same structures as those of the semiconductor device 310K according to the sixty fourth embodiment described with reference to FIG. 147 are given the same reference numbers, and a description thereof will be omitted.

In the semiconductor device 310K, the arrangement pitch for the protruding electrodes 380 formed on the semiconductor device main body 370 is equal to the arrangement pitch for the external connection terminals 376 arranged on the interposer 372A.

In contrast, the semiconductor device 310M is characterized in that the arrangement pitch for the external connection terminals 376 formed on an interposer 372B is greater than that for the protruding electrodes 380 formed on the semiconductor main body 370. Accordingly, the interposer 372B has an area greater than that of the semiconductor device main body 370.

Hence, it is possible to improve the degree of freedom in routing a wiring pattern 384B on the interposer 372B. More particularly, as shown in FIG. 152(B), the positions in which the holes 396 for the protruding electrodes 380 are formed are spaced apart from the positions of the external connection terminals 376. Hence, the connection holes 396 and the external connection terminals 376 can be connected to the wiring pattern 384B.

Thus, the degree of freedom in layout of the external connection terminals 376 can be improved and it is easy to design the arrangement of the terminals. Even if the pitch between the adjacent protruding electrodes 330 is reduced due to an increase in the integration density of the semiconductor device main body 370, the protruding electrodes 380 can be provided in positions different from those of the external connection terminals 376. Hence, the arrangement can meet the requirement for reduction in the pitch.

FIG. 153 is a diagram showing a method for fabricating the above-mentioned semiconductor device 310M (the fabrication method according to the fifty ninth embodiment). FIG. 153 is directed to a method for fabricating the semiconductor device 310M one by one rather than the method for fabricating a plurality of semiconductor devices 310M simultaneously.

In the present fabrication method, the semiconductor device main body 370, the anisotropic conductive film 374 and the interposer 372B are formed beforehand. Then, the protruding electrodes 380 and the connection holes 396 are positioned. Thereafter, the anisotropic conductive film 374 is interposed between the semiconductor device main body 370 and the interposer 372B. Then, the semiconductor device main body 370 is pressed towards the interposer 372B.

Hence, the semiconductor device main body 370 and the interposer 372B are mechanically bonded due to the adhesiveness of the anisotropic conductive film 374 and are electrically connected due to the anisotropic conductivity thereof. Thus, the semiconductor device 310M shown in FIG. 152 is obtained.

According to the present embodiment, the mechanical bonding process and electrically connecting process for the semiconductor device main body 370 and the interposer. 372B can be executed simultaneously. Thus, the method for fabricating the semiconductor device 310M can be simplified.

A description will now be given of a semiconductor device 310N according to a sixty seventh embodiment of the present invention.

FIG. 54 is a cross-sectional view of the semiconductor device 310N according to the sixty seventh embodiment of the present invention. In FIG. 154, parts that have the same structures as those of the semiconductor device 310k according to the sixty fourth embodiment described with reference to FIG. 147 are given the same reference numbers, and a description thereof will be omitted.

In the semiconductor device 310K according to the aforementioned sixty fourth embodiment, the anisotropic conductive film 374 is used to mechanically and electrically connect the semiconductor device main body 370 and the interposer 372A together.

In contrast, the present semiconductor device 310N is characterized by using, instead of the anisotropic conductive film 374, an adhesive 398 and an electrically conductive paste 3100 (electrically conductive member).

The adhesive 398 is, for example, an insulating resin such as a polyimide-system resin, and is required to have a given flexibility after it is hardened. The adhesive 398 is interposed between the semiconductor device main body 370 and the interposer 372A, and fires them together. Through holes 3102 are formed in the adhesive 398 and are located in positions corresponding to the positions of the protruding electrodes 380.

The conductive paste 3100 has a given viscosity, and may enter the through holes 3102. The conductive paste 3100 entering in the through holes 3102 electrically connects the semiconductor device main body 370 and the interposer 372A together. More particularly, the conductive paste 3100 electrically connects the protruding electrodes 380 and the wiring pattern 384A, and thus the semiconductor device main body 370 is electrically connected to the interposer 372A.

In the semiconductor device 310N, the adhesive 398 mechanically connects the semiconductor device main body 370 and the interposer 372A, and the conductive paste 3100 electrically bonds (connects) them. By forming the mechanical connection and the electrical connection by the respective, separate members (adhesive 398 and the conductive paste 3100), it is possible to select substances optimal to the respective functions (mechanically connecting function and the eclectically connecting function). Hence, the mechanical connection and the electrical connection between the semiconductor device main body 370 and the interposer 372A can definitely be established, and the reliability of the semiconductor device 310N can be improved.

The adhesive 398 has a given flexibility even after it is hardened, and is interposed between the semiconductor device main body 370 and the interposer 372A. Hence, the adhesive 398 functions as a buffer film. Hence, the adhesive 398 functions to relax stress at the interface between the semiconductor device main body 370 and the interposer 372A. In the semiconductor device 310N, the arrangement pitch for the protruding electrodes 380 is equal to that for the external connection terminals 376. Thus, the semiconductor device 310N can be down sized.

FIGS. 155 through 157 show a method for fabricating the semiconductor device 310N (fabrication method according to the sixtieth embodiment). In FIGS. 155 through 157, parts that have the same structures as those shown in FIGS. 150 and 151 used to describe the fabrication method according to the fifty eighth embodiment are given the same reference numbers, and a description thereof will be omitted. The present fabrication method described below is directed to fabricating a large number of semiconductor devices 310N simultaneously.

First, there are prepared the wafer 390 on which semiconductor device main bodies 370 are formed, and the TAB tape 392 on which the anisotropic conductive film 374 and a plurality of interposers 372B are formed.

The protruding electrodes 380 are coated with conductive paste 3100 at the time of forming the semiconductor device main bodies 370. The through holes 3102 are formed in the adhesive 398 and are located in the positions corresponding to the positions of the protruding electrodes 380. Further, the insulating member 394 is provided on the upper surface (to which the wafer 390 is attached) of the TAB tape 392 and is located in a position facing the semiconductor device main bodies 370.

The insulating member 394 can be formed by utilizing the photoresist forming technique. When the insulating member 394 is formed, the connection holes 396 are formed therein so as to be located in positions corresponding to those of the protruding electrodes 380.

After the positioning between the protruding electrodes 380 and the connection holes 396, the adhesive 398 is interposed between the wafer 390 and the TAB tape 392, and the wafer 390 is fixed to the TAB tape 392. Hence, the wafer 390 and the TAB tape 392 are mechanically connected together by the adhesive 398. The conductive paste 3100 enters the through holes 3102 and the connection holes 396, so that the protruding electrodes 380 and the wiring pattern 384A are electrically connected. FIG. 156 shows a state in which the wafer 390 and the TAB tape 392 are bonded together.

After the step of bonding the wafer 390 and the TAB tale 392 is completed, the assembly is cut along broken lines A—A shown in FIG. 16. Hence, the individual semiconductor devices 370 and the interposers 372B are formed, and the semiconductor devices 310N shown in FIG. 154 are obtained (the semiconductor device 310N shown in FIG. 154 does not have the insulating member 394).

The above fabrication method simultaneously produces a large number of semiconductor devices 310N. Alternatively, the semiconductor devices 310N can be produced one by one as shown in FIG. 157.

A description will now be given of a semiconductor device 310P according to a sixty eighth embodiment of the present invention.

FIG. 158 is a cross-sectional view of the semiconductor device 310P according to the sixty eighth embodiment of the present invention. In FIG. 158, parts that have the same structures as those of the semiconductor device 310N according to the sixty seventh embodiment described with reference to FIG. 154 are given the same reference numbers, and a description thereof will be omitted.

In the aforementioned semiconductor device 310N according to the sixty seventh embodiment, the arrangement pitch for the protruding electrodes 380 formed on the semiconductor device main body 370 is equal to the arrangement pitch for the external connection terminals 376 provided on the interposer 372A in order to down size the semiconductor device 310N.

In contrast, in the present semiconductor device 310P, the arrangement pitch for the external connection terminals 376 provided on the interposer 372B is greater than that for the protruding electrodes 380 formed on the semiconductor device main body 370. Accordingly, the area of the interposer 372B is wider than that of the semiconductor device main body 370.

Hence, it is possible to improve the degree of freedom in routing the wiring pattern 384B on the interposer 372B. Hence, the degree of freedom in layout of the external connection terminals 376 can be improved and it becomes easy to design the layout of the terminals. Even if the protruding electrodes 380 are required to be arranged at a reduced pitch, the present arrangement can meet the above requirement.

FIG. 159 is a diagram showing a method for fabricating the above-mentioned semiconductor device 310P (fabrication method according to the sixty first embodiment). The present method is directed to fabricating the semiconductor devices 310P one by one.

First, there are prepared the semiconductor device main body 370, the adhesive 398 and the interposer 372B beforehand. The protruding electrodes 380 are coated with the conductive paste 3100 at the time of forming the semiconductor device 370. The through holes 3102 are formed in the adhesive 398 and are located in positions corresponding to those of the protruding electrodes 380. Further, the connection holes 396 are formed in the insulating member 394 and are located in the positions corresponding to those of the protruding electrodes 380.

After the positioning between the protruding electrodes 380 and the connection holes 396 is carried out, the adhesive 398 is interposed between the semiconductor device main body 370 and the interposer 372B. Hence, the adhesive 398 mechanically connects the semiconductor device main body 370 to the interposer 372B. The conductive paste 3100 enters the through holes 3102 and the connection holes 396, so that the protruding electrodes 380 and the wiring patterns 384A are electrically connected. Thus, the semiconductor device 310P shown in FIG. 158 can be obtained.

A description will now be given of a semiconductor device 310Q according to a sixty ninth embodiment of the present invention.

FIG. 160 is a cross-sectional view of the semiconductor device 310Q according to the sixty ninth embodiment. In FIG. 160, parts that have the same structures as those of the semiconductor device 310N according to the sixty seventh embodiment described with reference to FIG. 154 are given the same reference numbers, and a description thereof will be omitted.

In the aforementioned semiconductor device 310N, the conductive paste 3100 is used as a conductive member, and electrically connects the semiconductor devise main body 370 and the interposer 372A. In contrast, the present semiconductor device 310Q is characterized by providing stud bumps (an electrically conductive member) instead of the conductive paste 3100.

The stud bumps 3104 are arranged in predetermined positions (which face the protruding electrodes 380) on the wiring pattern 384A formed in the interposer 372A. The stud bumps 3104 are formed by the wire bonding technique. More particularly, a wire bonding apparatus is used. First, a gold ball is formed on an end of a gold wire extending from a capillary of the wire bonding apparatus. Next, the gold ball is pressed to a given position on the wiring pattern 384A.

Then, the capillary is ultrasonic-vibrated so that the gold ball is welded to the wiring pattern 384A. Thereafter, the gold wire is clamped and the capillary is moved up so that the gold wire is cut. Thus, the stud bump 3104 is formed on the wiring pattern 384A. The stud bump 3104 is connected to the projection electrode 380 via the through hole 3102, so that the semiconductor device main body 370 is electrically connected to the interposer 372A.

As described above, in the semiconductor device 310Q, the adhesive 398 mechanically bonds the semiconductor device main body 370 and the interposer 372A. The stud bumps 3104 electrically bond (connect) the semiconductor device main body 370 and the interposer 372A. By separately realizing the mechanical connection and the electrical connection by the respective members (adhesive 398 and the stud bumps 3104), it is possible to definitely realize the mechanical and electrical connections between the semiconductor device main body 370 and the interposer 372A. Hence, the reliability of the semiconductor device 310Q can be improved.

In the connected sate, the stud bumps 3104 fall in the projection electrodes 380, so that the electrical connections therebetween can definitely be made. In the semiconductor device 310Q, the arrangement pitch for the protruding electrodes 380 is equal to that for the external connection terminals 376. Hence, the semiconductor device 310Q can be down sized.

FIGS. 161 through 163 show a method for fabricating the semiconductor device 310Q (fabrication method according to a sixty second embodiment). In FIGS. 161 through 163, parts that have the same structures as those sown in FIGS. 155 through 157 used to describe the fabrication method according to the sixtieth embodiment are given the same reference numbers, and a description thereof will be omitted. The present embodiment is directed to fabricating a large number of semiconductor devices 310Q at one time.

First, provided are the wafer 390 on which the semiconductor device main bodies 370 are arranged, and the TAB tape 392 on which the anisotropic conductive film 374 and a plurality of interposers 372B are formed.

At the time of forming the TAB tape 392, the insulating member 394 is formed on the upper surface (to which the wafer 390 is attached) of the TAB tape 392 and is located in positions facing the semiconductor device main bodies 370. At the time of forming the insulating member 394, the connection holes 396 are formed in the insulating film 394 and are located in positions corresponding to those of the protruding electrodes 380. Further, the stud bumps 3104 are formed on the wiring pattern 384A within the connection holes 396.

After the positioning between the protruding electrodes 380 and the connection holes 396, the adhesive 398 is interposed between the wafer 390 and the TAB tape 392, and the wafer 390 is fixed to the TAB tape 392. Hence, the wafer 390 and the TAB tape 392 are mechanically connected together by the adhesive 398. Further, the stud bumps 3104 fall in the protruding electrodes 380 via the through holes 3102 and the connection holes 396. Hence, the protruding electrodes 380 and the wiring pattern 384A are electrically bonded (connected) by the stud bumps 3104. FIG. 162 shows a state in which the wafer 390 and the TAB tape 392 are bonded together.

After the step of bonding the wafer 390 and the TAB tale 392 is completed, the assembly is cut along broken lines A—A shown in FIG. 162. Hence, the individual semiconductor devices 370 and the interposers 372B are formed, and the semiconductor devices 310Q shown in FIG. 160 are obtained (the semiconductor device 310Q shown in FIG. 160 does not have the insulating member 394).

The above fabrication method produces a large number of semiconductor devices 310Q at one time. Alternatively, it is possible to fabricate the semiconductor devices 310Q one by one, as shown in FIG. 163.

A description will now be given of a semiconductor device 310R according to a seventieth embodiment of the present invention.

FIG. 164 is a cross-sectional view of the semiconductor device 310R according to the seventieth embodiment of the present invention. In FIG. 164, parts that have the same structures as those of the semiconductor device 310Q according to the sixty ninth embodiment described with reference to FIG. 160 are given the same reference numbers, and a description thereof will be omitted.

In the semiconductor device 310Q according to the sixty ninth embodiment, the arrangement pitch for the protruding electrodes 380 formed on the semiconductor device main body 370 is equal to that for the external connection terminals 376 disposed on the interposer 372A in order to down size the semiconductor device.

In contrast, the present semiconductor device 310R is characterized in that the arrangement pitch for the external connection terminals 376 disposed on the interposer 372B is greater than that for the protruding electrodes 380 formed on the semiconductor device main body 370. Accordingly, the area of the interposer 372B is wider than that of the semiconductor device main body 370.

Hence, the degree of freedom in routing the wiring pattern 384B on the interposer 372B can further be improved since the external connection terminals 376 are arranged at a pitch greater than that at which the protruding electrodes 380 are arranged. Thus, the degree of freedom in layout of the external connection terminals 376 can be improved and the terminals can easily be designed. Further, the present embodiment can meet a requirement for reducing the pitch at which the protruding electrodes 380 are arranged.

FIG. 165 is a diagram showing a method for fabricating the above-mentioned semiconductor device 310Q (fabrication method according to the sixty third embodiment). The present embodiment is directed to producing the semiconductor devices 310Q one by one rather than producing them at one time.

In First, the semiconductor device 370, the adhesive 398 and the interposer 372B are prepared beforehand. The through holes 3102 are formed in the adhesive 398 so as to be located in positions corresponding to those of the protruding electrodes 380. The insulating member 394 is formed to the interposer 372B, and the holes 396 are formed in the insulating member 394 so as to be located in positions corresponding to those of the protruding electrodes 380. Further, the stud bumps 3104 are formed on the wiring pattern 384A exposed in the connection holes 396 by the wire bonding technique.

Then, the positioning between the protruding electrodes 380 and the connection holes 396 is carried out, and the adhesive 398 is interposed between the semiconductor device main body 370 and the interposer 372B. Then, the semiconductor device main body 370 is pressed against the interposer 372B and is thus fixed thereto. Hence, the semiconductor device main body 370 and the interposer 372B are mechanically bonded by the adhesive 398. The stud bumps 3104 fall in the protruding electrodes 380 through the through holes 3102 and the connection holes 396. Thus, the protruding electrodes 380 and the wiring pattern 384A are electrically bonded (connected) by the stud bumps 3104, so that the semiconductor device 310R shown in FIG. 164 can finally be obtained.

A description will now be given of a semiconductor device 310S according to a seventy first embodiment of the present invention.

FIG. 166 is a cross-sectional view of the semiconductor device 310S according to the seventy first embodiment of the present invention. In FIG. 166, parts that have the same structures as those of the semiconductor device 310N according to the sixty seventh embodiment described with reference to FIG. 154 are given the same reference numbers, and a description thereof will be omitted.

In the aforementioned semiconductor devices 310N–310R according to the sixty seventh through seventieth embodiments, the conductive paste 3100 or the stud bumps 3104 are used, as the electrically conductive members, to electrically connect the semiconductor device main body 370 and the interposer 372A. In contrast, the present semiconductor device 310S is characterized in that flying leads 3106 (electrically conductive members) are substituted for the conductive paste 1300 or the stud bumps 3104.

The flying leads 3106 are integrally formed with a wiring pattern 384C formed in the interposer 372C, and obliquely extend upwards from the outer periphery of the interposer 372C (towards the semiconductor device main body 370). The flying leads 3106 are positioned so as to correspond to the protruding electrodes 380.

The flying leads 3106 are formed as follows. Portions of a base member 386C corresponding to the flying leads 3106 of the interposer 372C are removed by dry etching. Then, a wiring pattern 337C is obliquely bent upwards. Hence, the flying leads 3106 are formed in the outer periphery of the interposer 372C.

The flying leads 3106 bypass the positions in which the adhesive 398 is provided, and are connected to the protruding electrodes 380. Hence, the semiconductor device main body 370 and the interposer 372A are electrically connected. The positions in which the protruding electrodes 380 and the flying leads 3106 are connected are sealed by cover resins 3108. Hence, it is possible to prevent the flying leads 3106 from being deformed due to external force and to improve the reliability of the semiconductor device 310S.

As described above, in the present semiconductor device 310S, the adhesive 398 mechanically bonds the semiconductor device main body 370 and the interposer 372C, and the stud bumps 3104 electrically bond (connect) the semiconductor device main body 370 and the interposer 372C. By separately implementing the mechanical connection and the electrical connection by the respective members (adhesive 398 and the flying leads 3106), it is possible to definitely realize the mechanical and electrical connections between the semiconductor device main body 370 and the interposer 372A and to thus improve the reliability of the semiconductor device 310Q.

The adhesive 398 is not provided in the positions in which the flying leads 3106 and the protruding electrodes 380 are connected, so that the reliability of the connections therebetween can be improved. Further, the flying leads 3106 have spring performance and thus contact the protruding electrodes 380 with a pressure. This also contributes to improving the reliability of the electrical connections between the flying leads 3016 and the protruding electrodes 380.

FIGS. 167 through 171 show a method for fabricating the semiconductor device 310S (fabrication, method according to a sixty fourth embodiment). In FIGS. 167 through 171, parts that have the same structures as those shown in FIGS. 155 through 157 used to describe the fabrication method of the sixtieth embodiment are given the same reference numbers, and a description thereof will be omitted. The present fabrication method is directed to producing a large number of semiconductor devices 310S at one time.

First, as shown in FIG. 167, the wafer 390 on which the semiconductor device main bodies 370 are arranged, the adhesives 398 and the interposers 372C are formed. At the time of forming the interposers 372C, the flying leads 3016 are formed.

The protruding electrodes 380 and the flying leads 3106 are positioned, and then the adhesives 398 are interposed between the wafer 390 and the interposers 372C. Then, the interposers 372C are pressured against the wafer 390 and are thus fixed thereto. Thus, as shown in FIG. 168, the wafer 390 and the interposers 372C are mechanically bonded by the adhesives 398. The flying leads 390 are pressed by the protruding electrodes 380, and are thus connected thereto definitely.

After the wafer 390 and the interposers 372C are mechanically bonded by the adhesives 398 and the protruding electrodes 380 and the flying leads 3106 are electrically connected, the cover resins 3108 are formed between the wafer 390 and the interposers 372C so that at least the connections between the protruding electrodes 380 and the flying leads 3106 are covered. The cover resins 3108 may be formed by potting or molding. FIG. 168 shows a state in which the cover resins 3108 have been formed.

After the cover resins 3018 are formed, a cutting process is carried out so that the assembly is cut along broken lines A—A shown in FIG. 169. Hence, a plurality of semiconductor devices 310S as shown in FIG. 166 can be obtained simultaneously. Although the above-mentioned present fabrication method is directed to producing a large number of semiconductor devices 310Q at one time, it is possible to separately produce the semiconductor devices 310S one by one, as shown in FIGS. 170 and 171.

A description will now be given of a semiconductor device 310T according to a seventy second embodiment of the present invention.

FIG. 172(A) is a cross-sectional view of the semiconductor device 10T according to the seventy second embodiment. In FIG. 172, parts that have the same structures as those of the semiconductor device 310N according to the sixty seventh embodiment described with reference to FIG. 154 are given the same reference numbers, and a description thereof will be omitted. In the aforementioned semiconductor devices 310N–310S according to the sixty seventh through seventy first embodiments, the conductive paste 3100, the stud bumps 3104 or the flying leads 3106 are used as the conductive members, by which the semiconductor main body 370 and the interposers 372A or 372B are electrically bonded (connected).

In contrast, the present semiconductor device 310T is characterized in that connection pins 3110 and a positioning member 3112 are provided in an interposer 372D as conductive members rather than the conductive paste 3100 or the stud bumps 3104.

The present interposer 372D is generally made up of the connection pins 3110, the positioning member 3112, an adhesive 3114 and a base member 3116. The connection pins 3110 are located in positions corresponding to those of the protruding electrodes 380. In the assembled state, the upper ends of the connection pins 3110 are bonded to the protruding electrodes 380, and the lower ends thereof are bonded to the external connection terminals 376. The positioning member 3112 functions to position the connection pins 3110 in the positions of the protruding electrodes 380, and are formed of a flexible substance such as silicon rubber.

As described above, the positioning member 3112 holding the connection pins 3110 is bonded to the base member 3116 by the adhesive 3114. The base member 3116 has the holes 388 located in positions facing the positions of the protruding electrodes 380. The connection pins 3110 are connected to the external connection terminals 376 via the holes 388. FIG. 172(B) shows an enlarged view of a connecting portion in which the connection pin 3110 and the external connection terminal 376 are connected. As shown in this figure, the connection pin 3110 falls in the external connection terminal 376, and is electrically connected thereto definitely.

In the semiconductor device 310T thus structured, the upper ends of the connection pins 3110 are connected to the protruding electrodes 380, and the lower ends thereof are connected to the external connection terminals 376. Hence, the connection pins 3110 are interposed between the protruding electrodes 380 and the external connection terminals 376.

The connection pins 3110 are flexible and are capable of absorbing stress generated due to the difference in the terminal expansion coefficient between the semiconductor device main body 370 and the interposer 372D. Hence, the connections between the external connection terminals 376 and the protruding electrodes 380 can definitely be maintained irrespective of stress.

The connection pins 3110 are positioned so as to correspond to the protruding electrodes 380 by the positioning member 3112. Hence, the positioning process is not required which positions the connection points 3110 and the protruding electrodes 380 or the external connection terminals 376 at the time of mounting. Hence, the mounting operation can easily be executed.

Since the positioning member 3112 is formed of a flexible substance, the positioning member 3112 follows deformations of the connection pins 3110, and is thus capable of absorbing stress generated between the semiconductor device main body 370 and the interposer 372D.

FIGS. 173 through 175 show a method for fabricating the semiconductor device 310T (fabrication method according to a sixty fifth embodiment). In FIGS. 173 through 175, parts that have the same structures as those shown in FIGS. 155 through 157 used to describe the fabrication method of the sixtieth embodiment are given the same reference numbers, and a description thereof will be omitted. The present embodiment is directed to producing a large number of semiconductor devices 310T at one time.

First, as shown in FIG. 173, the wafer 390 on which a plurality of semiconductor device main bodies 370 are provided, the positioning member 3112 holding the connection pins 3110, the adhesive 3114 and the base member 3116. The holes 388 and the through holes 3102 are formed in the adhesive 3114 and the base member 3116 so as to be located in positions corresponding to those of the protruding electrodes 380.

Then, the protruding electrodes 380 and the positioning pins 3110 are positioned, and the wafer 390 is pressed, while being heated, against the interposer 372D (the connection pins 3110, positioning member 3112, adhesive 3114 and the base member 3116). Thus, as shown in FIG. 174, the upper ends of the connection pins 3110 fall in the protruding electrodes 380, and the lower ends thereof fall in the external connection terminals 376. Hence, the protruding electrodes 380 and the external connection terminals 376 are electrically connected through the connection pins 3110.

After the step of connecting the protruding electrodes 380 and the external connection terminals 376 as described above, the assembly is cut along broken lines A—A shown in FIG. 174. Hence, the semiconductor devices 310T shown in FIG. 172(A) can be obtained at one time. Although the above fabrication method is directed to producing the semiconductor devices 310T at one time, it is possible to separately produce the semiconductor devices 310T one by one, as shown in FIG. 175.

A description will be given of a semiconductor device 310U according to a seventy third embodiment of the present invention.

FIG. 176 is a cross-sectional view of the semiconductor device 310U according to the seventy third embodiment of the present invention. In FIG. 176, parts that have the same structures as those of the semiconductor device 310T according to the seventy second embodiment described with reference to FIG. 172 are given the same reference numbers, and a description thereof will be omitted.

In the semiconductor device 310T according to the seventy second embodiment, the arrangement pitch for the protruding electrodes 380 formed on the semiconductor device main body 370 is equal to that for the connection pins 3110 provided in the interposer 372D.

In contrast, in the present semiconductor device 310U, the arrangement pitch for the external connection terminals 376 formed in the interposer 372B is greater than that for the protruding electrodes 380 formed on the semiconductor device main body 370. Accordingly, the area of the interposer 372B is wider than that of the semiconductor device main body 370.

Since the arrangement pitch for the external connection terminals 376 is greater than that for the protruding electrodes 380, the degree of freedom in routing the wiring pattern 384B on the interposer 372B can further be improved. Thus, the degree of freedom in layout of the external connection terminals 376 can be improved and the terminals can easily be designed. Further, the present embodiment can meet a requirement for reducing the pitch at which the protruding electrodes 380 (connection pins 3110) are arranged.

FIG. 177 is a diagram showing a method for fabricating the above-mentioned semiconductor device 310T (fabrication method according to sixty sixth embodiment). The present embodiment is directed not to producing a large number of semiconductor devices 310T at one time but separately producing semiconductor devices 310T one by one.

First, semiconductor device main body 370, the positioning member 3112 holding the connection pins 3110, the adhesive 3114 and the interposer 372B are prepared beforehand. At this time, the through holes 3102 are formed in the adhesive 3114 so as to be located in positions corresponding to those of the protruding electrodes 380.

Then, the protruding electrodes 380 and the positioning pins 3112 are positioned, and the positioning pins 3112 and the connection holes 396 are positioned. Then, the semiconductor device main body 370 is pressed against the interposer 372B while being heated. Hence, the upper ends of the connection pins 3110 fall in the protruding electrodes 380, and the lower ends thereof fall in the external connection terminals 376. Hence, the protruding electrodes 380 and the external connection terminals 376 are electrically connected together through the connection pins 3110. Thus, the semiconductor device 310U shown in FIG. 176 can be obtained.

The embodiments of the present invention have been described. The present invention is not limited to the above-mentioned embodiments, and includes various variations and modifications.

What is claimed is:

1. A method for fabricating a semiconductor device comprising:

a resin sealing step of loading a substrate on which semiconductor elements having protruding electrodes are formed to a mold, and supplying a sealing resin to positions of the protruding electrodes so as to form a resin layer which seals the protruding electrodes and the substrate;

a protruding electrode exposing step of exposing at least ends of the protruding electrodes from the resin layer; and a separating step of cutting the substrate together with the resin layer so that the semiconductor elements are separated from each other, wherein the resin sealing step disposes a film between the protruding electrodes and the mold, which thus contacts the sealing resin through the film, the film used in the resin sealing step is formed of an elastically deformable substance, and the ends of the protruding electrodes are caused to fall in the film when the resin layer is formed by using the mold; and the film is detached from the resin layer in the protruding electrode exposing step so that the ends of the protruding electrodes can be exposed from the resin layer.

2. The method for fabricating the semiconductor device as claimed in claim 1, wherein:

the mold used in the resin sealing step comprises an upper mold which can be elevated, and a lower mold having a first lower mold half body which is kept stationary and a second lower mold half body which can be elevated with respect to the first lower mold half body; and the resin sealing step comprises:

a substrate loading step of placing the substrate on which the semiconductor elements having the protruding electrodes are arranged in a cavity defined by a cooperation of the first and second lower mold half bodies and providing the sealing resin in the cavity;

a resin layer forming step of moving down the upper mold and the second lower mold half body so that the sealing resin is heated, melted and compressed so that the resin layer sealing the protruding electrodes is formed; and a detaching step of moving up the first mold so as to detach the upper mold from the resin layer, and then moving down the second lower mold half body from the first lower mold half body so that the substrate to which the resin layer is provided is detached from the mold.

3. The method for fabricating the semiconductor device as claimed in claim 1, wherein:

an excess resin removing mechanism is provided in the mold used in the resin sealing step; and the excess resin removing mechanism removes excess resin and controls a pressure applied to the sealing resin in the mold.

4. The method for fabricating the semiconductor device as claimed in claim 1, wherein the sealing resin is provided to the film before the resin sealing step is executed.

5. The method for fabricating the semiconductor device as claimed in claim 4, wherein a plurality of sealing resins are provided to the film, and the resin sealing step is continuously carried out by moving of the film.

6. The method for fabricating the semiconductor device as claimed in claim 1, wherein a reinforcement plate is loaded onto the mold before the substrate is loaded onto the mold in the resin sealing step.

7. The method for fabricating the semiconductor device as claimed in claim 6, wherein the reinforcement plate comprises a substance having a heat radiating performance.

8. The method for fabricating the semiconductor device as claimed in claim 6, further comprising a reinforcement plate to which the sealing resin is provided beforehand in the resin sealing step.

9. The method for fabricating the semiconductor device as claimed in claim 8, wherein:

a frame extending towards the substrate in a state in which the reinforcement plate is loaded onto the mold is formed to define a recess portion; and the resin layer is formed on the substrate by using, as a cavity for resin sealing, the recess portion in the resin sealing step.

10. The method for fabricating the semiconductor device as claimed in claim 1, wherein:

the film used in the resin sealing step has projections located in positions corresponding to those of the protruding electrodes; and the resin layer is formed in a state in which the projections are pressed against the protruding electrodes.

11. The method for fabricating the semiconductor device as claimed in claim 1, wherein:

an external connection protruding electrode forming step is executed which forms external connection protruding electrodes on the ends of the protruding electrodes after the ends of the protruding electrodes are exposed from the resin layer in the protruding electrode exposing step.

12. The method for fabricating the semiconductor device as claimed in claim 11, wherein the protruding electrodes and the external connection protruding electrodes are bonded by using a bonding member having a characteristic of stress relaxation in the external connection protruding electrode forming step.

13. A method for fabricating a semiconductor device comprising:

a resin sealing step of loading a substrate on which semiconductor elements having protruding electrodes are formed to a mold, and supplying a sealing resin to positions of the protruding electrodes so as to form a resin layer which seals the protruding electrodes and the substrate;

a protruding electrode exposing step of exposing at least ends of the protruding electrodes from the resin layer; and a separating step of cutting the substrate together with the resin layer so that the semiconductor elements are separated from each other, wherein the resin sealing step disposes a film between the protruding electrodes and the mold, which thus contacts the sealing resin through the film, wherein:

cutting position grooves are formed, before the resin sealing step is carried out, in the substrate so as to be located in positions in which the substrate is cut in the separating step; and the substrate is cut in the cutting position grooves after being filled with the sealing resin.

14. A method for fabricating a semiconductor device comprising:

a resin sealing step of loading a substrate on which semiconductor elements having protruding electrodes are formed to a mold, and supplying a sealing resin to positions of the protruding electrodes so as to form a resin layer which seals the protruding electrodes and the substrate;

a protruding electrode exposing step of exposing at least ends of the protruding electrodes from the resin layer; and a separating step of cutting the substrate together with the resin layer so that the semiconductor elements are separated from each other, wherein the resin sealing step disposes a film between the protruding electrodes and the mold, which thus contacts the sealing resin through the film, wherein:

a pair of stress relaxing grooves is formed, prior to the resin sealing step, so as to sandwich a position in which the substrate is to be cut; and the substrate is cut in a position interposed between the pair of stress relaxing grooves in the separating step.

15. The method for fabricating the semiconductor device as claimed in claim 1, wherein positioning grooves are formed on a back surface of the resin layer of the substrate after the resin sealing step is executed and before the separating step is executed.

16. The method for fabricating the semiconductor device as claimed in claim 15, wherein the positioning grooves are formed by subjecting the back surface to half scribing.

17. The method for fabricating the semiconductor device as claimed in claim 1, wherein:

the film used in the resin sealing step has projection or recess portions located in positions in which the film is not interfered with the projecting electrodes; and recess or projection portions formed on the resin layer by the projection or recess portions are used for positioning after the resin sealing step is completed.

18. The method for fabricating the semiconductor device as claimed in claim 1, wherein the sealing resin is processed in positions in which positioning protruding electrodes are formed in order to discriminate the protruding electrodes and the positioning protruding electrodes from each other.

19. A method for fabricating the semiconductor as claimed in claim 2, wherein the resin sealing step further comprises a film disposing step of providing a non-adhesive process film between contact surfaces of the upper mold and the first lower mold half body and the second lower mold half body.

20. A method for fabricating a semiconductor device comprising:

a mold preparing step of preparing a mold including a first mold, and a second mold which is located so as to face the first mold, the second mold including a first half body having a shape corresponding to a shape of a substrate, and a second half body which is provided so as to surround the first half body and can be elevated with respect to the first half body, the first and second half bodies cooperating with each other so that a cavity to be filled with resin is defined;

a resin sealing step of placing the substrate on which a plurality of semiconductor elements equipped with protruding electrodes are formed in the mold and supplying resin to positions in which the protruding electrodes are provided so as to form a resin layer which seals the protruding electrodes and the substrate;

a protruding electrode exposing step of exposing at least end portions of the protruding electrodes from the resin layer; and a separating step of cutting the substrate together with the resin layer so that the semiconductor elements are separated into each other, wherein the resin sealing step disposes a film between the protruding electrodes and the mold, which thus contacts the sealing resin through the film and the film used in the resin sealing step is formed of an elastically deformable substance, and the ends of the protruding electrodes are caused to fall in the film when the resin layer is formed by using the mold; and the film is detached from the resin layer in the protruding electrode exposing step so that the ends of the protruding electrodes can be exposed from the resin layer.

21. The method for fabricating the semiconductor device as claimed in claim 1, wherein the sealing resin used in the resin sealing step has an amount which causes the resin layer to have a height approximately equal to that of the protruding electrodes.

22. The method for fabricating the semiconductor device as claimed in claim 1, wherein the resin sealing step uses a sheet-shaped resin as the sealing resin.

23. The method for fabricating the semiconductor device as claimed in claim 1, wherein the sealing resin used in the resin sealing step comprises a plurality of sealing resins having different characteristics.

24. The method for fabricating the semiconductor device as claimed in claim 1, wherein a second resin layer is formed so as to cover a back surface of the substrate after or at the same time as the first, resin layer is formed, in the resin sealing step, on the surface of the substrate on which the protruding electrodes are arranged.

* * * * *